(12) United States Patent
Chang et al.

(10) Patent No.: US 8,132,143 B2
(45) Date of Patent: Mar. 6, 2012

(54) ANALYTICAL SYNTHESIS METHOD FOR DESIGNING DDCC AND FDCCII-GROUNDED R AND C FILTER STRUCTURE WITH STABLE TRANSFER FUNCTION

(75) Inventors: Chun-Ming Chang, Chung-Li (TW); Shu-Hui Tu, Chung-Li (TW)

(73) Assignee: Chung Yuan Christian University, Chung-Li (TW)

( * ) Notice: Subject to any disclaimer, the term of this patent is extended or adjusted under 35 U.S.C. 154(b) by 312 days.

(21) Appl. No.: 12/493,184

(22) Filed: Jun. 27, 2009

(65) Prior Publication Data

US 2010/0005430 A1 Jan. 7, 2010

(51) Int. Cl.
*G06F 17/50* (2006.01)

(52) U.S. Cl. ........................................ 716/132; 716/101

(58) Field of Classification Search .................. 716/101, 716/132
See application file for complete search history.

(56) References Cited

U.S. PATENT DOCUMENTS 5,523,701 A * 6/1996 Smith et al. ............... 324/765.01
7,496,865 B2 * 2/2009 Chang et al. ................. 716/133

OTHER PUBLICATIONS

Acar; "Nth-order allpass voltage transfer function synthesis using $CCII_+$s: Signal-flow graph approach" Electronics Letters; vol. 32, No. 8; Apr. 11, 1996; pp. 727-729.*
Chang et al.; "Analytical Synthesis of Low-Sensitivity High-Order Voltage-Mode DDCC and FDCCII-Grounded R and C All-Pass Filter Structures"; IEEE Transactions on Circuits and Systems; vol. 54, No. 7; Jul. 2007; pp. 1430-1443.*

* cited by examiner

*Primary Examiner* — Naum Levin
(74) *Attorney, Agent, or Firm* — Chun-Ming Shih

(57) ABSTRACT

A voltage-mode nth-order differential difference current conveyor (DDCC) and fully differential current conveyor (FDCCII)-resistor and capacitor filter structures are proposed using a new effective analytical synthesis method (ASM), a succession of innovative algebra operations until a set of simple equations are produced, which are then realized using n integrators and a constraint sub-circuitry, A new ASM can effectively carry out (i) use of all the grounded capacitors and grounded resistors, and (ii) employment of the minimum number of active and passive components and then enjoys the low sensitivities, lower parasitics, power consumption, noise, and smaller chip area leading to simultaneously achieving two important features: (i) higher output performance and (ii) lower cost, without tradeoff. Moreover, the component value variations of all the relative sensitivities have the same incremental percentage or decrement.

12 Claims, 89 Drawing Sheets

ANALYTICAL SYNTHESIS METHOD FOR DESIGNING DDCC AND FDCCII-GROUNDED R AND C FILTER STRUCTURE WITH STABLE TRANSFER FUNCTION

REFERENCES

[1] C. Toumazou, and F. J. Lidgey, "Universal active filter using current conveyors", Electron. Lett., vol. 22, pp. 662-664, 1986.

[2] R. Senani, "New current-mode biquad filter", Int. J. Electron., vol. 73, pp. 735-742, 1992.

[3] Y. Sun, and J. K. Fidler, "Versatile active biquad based on second-generation current conveyors", Int. J. Electron., vol. 76, pp. 91-98, 1994.

[4] A. M. Soliman, "Kerwin-Huelsman-Newcomb circuit using current conveyors", Electron. Lett., vol. 30, pp. 2019-2020, 1994.

[5] A. Fabre, O. Saaid, F. Wiest, and C. Boucheron, "Current controlled band-pass filter based on translinear conveyors", Electron. Lett., vol. 31, pp. 1727-1728, 1995.

[6] S. Özoğuz, and E. O. Güneş, "Universal filter with three inputs using CCII+", Electron. Lett., vol. 32, pp. 2134-2135, 1996.

[7] Z. J. Lata, and P. B. Aronhime, "Cascadable current-mode biquads", Analog Integrated Circuits and Signal Processing, vol. 13, pp. 275-284, 1997.

[8] S. I. Liu, and J. L. Lee, "Voltage-mode universal filters using two current conveyors", Int. J. Electron., vol. 82, pp. 145-149, 1997.

[9] C. A. Papazoglou, and C. A. Karyabakas, "Noninteracting electronically tunable CCII-based current-mode biquadratic filters", IEE Proc.—Circuits, Devices, and Systems, vol. 144, pp. 178-184, 1997.

[10] S. Özoğuz, and C. Acar, "Universal current-mode filter with reduced number of active and passive components", Electron. Lett., vol. 33, pp. 948-949, 1997.

[11] S. H. Tu, C. M. Chang, and K. P. Liao, "Novel versatile insensitive universal current-mode biquad employing two second-generation current conveyors", Int. J. Electron., vol. 89, pp. 897-903, 2002.

[12] C. M. Chang, and H. P. Chen, "Universal capacitor-grounded voltage-mode filter with three inputs and a single output", Int. J. Electron., vol. 90, pp. 401-406, 2003.

[13] C. M. Chang, B. M. Al-Hashimi, C. L. Wang, and C. W. Hung, "Single fully differential current conveyor biquad filters" IEE Proc.—Circuits Devices Syst., vol. 150, pp 394-398, 2003.

[14] C. M. Chang, and H. P. Chen, "Single FDCCII-based tunable universal voltage-mode filter", Circuits, Systems, and Signal Processing, vol. 24, pp. 221-227, 2005.

[15] J. A. Svoboda, "Transfer function synthesis using current conveyors", Int. J. Electron., vol. 76, no. 4, pp. 611-614, 1994.

[16] E. O. Gunes, and F. Anday, "Realization of nth-order voltage transfer function using CCII+", Electron. Lett., vol. 31, no. 13, pp. 1022-1023, 1995.

[17] C. Acar, "Nth-order voltage transfer function synthesis using a commercially available active component: Signal-flow graph approach", Electron. Lett., vol. 32, no. 21, pp. 1933-1934, 1996

[18] C. Acar, "Nth-order lowpass voltage transfer function synthesis using CCII+s: signal-flow graph approach" Electron. Lett., vol. 32, no. 3, pp. 159-160, 1996

[19] C. Acar, "Nth-order allpass voltage transfer function synthesis using CCII+s: Signal-flow graph" Electron. Lett., vol. 32, no. 8, pp. 727-729, 1996

[20] C. Acar, and H. Kuntman, "Limitations on input signal level in current-mode active-RC filters using CCIIs", Electron. Lett., vol. 32, pp. 1461-1462, 1996

[21] C. Acar, and S. Özoğuz, "High-order voltage transfer function synthesis using CCII+based unity gain current amplifiers", Electron. Lett., vol. 32, no. 22, pp. 2030-2031, 1996

[22] C. Acar, and S. Özoğuz, "Nth-order voltage transfer function synthesis using a commercially available active component, CFA: signal-flow graph approach", Frequenz, vol. 54, no. 5-6, pp. 134-137, 2000.

[23] W. Chiu, S. I. Liu, H. W. Tsao, and J. J. Chen, "CMOS differential difference current conveyors and their applications." IEE Proc.—Circuits Devices Syst., vol. 143, pp. 91-96, 1996.

[24] H. O. Elwan and A. M. Soliman, "A Novel CMOS Differential Voltage Current Conveyor and its Applications", IEE Proceedings, Circuits, Devices and Systems, Vol. 144, pp 195-200, June 1997.

[25] A. El-Adawy, A. M. Soliman, and H. O. Elwan, "A novel fully differential current conveyor and applications for analog VLSI", IEEE Trans. Circuits Syst. II, vol. 47, pp. 306-313, 2000.

[26] C. M. Chang, and B. M. Al-Hashimi, "Analytical synthesis of current-mode high-order OTA-C filters", IEEE Trans. Circuits & Syst.-I, vol. 50, no. 9, pp. 1188-1192, September 2003.

[27] C. M. Chang, B. M. Al-Hashimi, Y. Sun, and J. N. Ross, "New high-order filter structures using single-ended-input OTAs and grounded capacitors", IEEE Trans. Circuits & Syst.-II, vol. 51, no. 9, pp. 458-463, September 2004.

[28] C. M. Chang, C. L. Hou, W. Y. Chung, J. W. Horng, and C. K. Tu, "Analytical synthesis of high-order single-input OTA-grounded C all-pass and band-reject filter structures", IEEE Trans. Circuits Syst.-I, vol. 53, no. 3, pp. 489-498, March 2006.

[29] C. M. Chang, "Analytical synthesis of the digitally programmable voltage-mode OTA-C universal biquad", IEEE Trans. Circuits Syst.-II, vol. 53, no. 8, pp. 607-611, August 2006.

[30] Shu-Hui Tu, Chun-Ming Chang, Neil J. Ross, M. N. S. Swamy, "Analytical synthesis of current-mode high-order single-ended-input OTA and equal-capacitor elliptic filter structures with the minimum number of components", IEEE Trans. Circuits & Syst.-I, vol. 54, no. 10, pp. 2195-2210, October 2007.

[31] Chun-Ming Chang, Ahmed M. Soliman, and M. N. S. Swamy, "Analytical synthesis of low sensitivity high-order voltage-mode DDCC and FDCCII-grounded R and C all-pass filter structures", IEEE Trans. Circuits & Syst.-I, vol. 54, no. 7, pp 1430-1443, July 2007.

[32] Chun-Ming Chang, and Hua-Pin Chen, "Single FDCCII-based tunable universal voltage-mode filter", Circuits, Systems, and Signal Processing, vol. 24, no. 2, pp. 221-227, 2005.

[33] Hua-Pin Chen, and Kuo-Hsiung Wu, "Voltage-mode DDCC-based multifunction filters", Journal of Circuits, Systems, and Computers, vol. 16, no. 1, pp. 93-104, 2007.

[34] Wei-Yuan Chiu, and jiun-Wei Horng, "High-input and low-output impedance voltage-mode universal biquadratic filter using DDCCs", IEEE Trans. Circuits & Syst.-II, vol. 54, no. 8, pp. 649-652, 2007.

[35] Jiun-Wei Horng, "High-input impedance voltage-mode universal biquadratic filter with three inputs using DDCCs", Circuits, Systems, and Signal Processing, vol. 27, pp. 553-562, 2008.

[36] Hua-Pin Chen, "Voltage-mode FDCCII-based universal filters", Int. J. Electron. Commun., vol. 62, pp. 320-323, 2008.

[37] C. M. Chang, C. N. Lee, C. L. Hou, J. W. Horng, and C. K. tu, "High-order DDCC-based general mixed-mode universal filter", IEE Proc.-Circuits, Devices, Syst., vol. 153, no. 5, pp. 511-516, 2006.

[38] R. Schaumann, M. E. Van Valkenburg, *Design of Analog Filters*. Oxford University Press, Oxford, 2001.

BACKGROUND

1. Field of the Invention

The present invention generally relates to filter design and more particularly to a resistor and capacitor filter circuit.

2. Description of Related Art

Over the last decade or so, numerous current conveyor-based second-order or high-order filters have been reported. Using signal-flow graph approach, several nth-order transfer function syntheses using current conveyors have been proposed. For example, four second-generation current conveyors, two floating and one grounded capacitors, and seven floating and two grounded resistors have been utilized to realize a third-order all-pass current conveyor filter. Four second-generation current conveyors, two floating and one grounded capacitors, and seven floating and one grounded resistors have been utilized to realize a third-order all-pass current conveyor filter. In order to let all the capacitors be grounded, five current feedback amplifiers (CFAs), each of which is equivalent to a plus-type second-generation current conveyor following a voltage buffer, and a few resistors, i.e., eight floating and three grounded resistors in addition to three grounded capacitors are necessary for synthesizing a third-order all-pass filter. It is apparent that the use of so many resistors used to synthesize the above all-pass filters is a problem and needs to be reduced to the minimum since the implemented area in an integrated circuit of a resistor is rather large and much bigger than several transistors.

Since the addition and subtraction operations of voltage-mode signals needs the realization, respectively, of addition and subtraction circuits, unlike in the case of current-mode signals, two recently introduced active elements, namely, differential difference current conveyors (DDCCs) and fully differential current conveyors (FDCCIIs), with the intrinsic voltage addition and subtraction ability, have become very attractive to be used in the design of voltage-mode filters.

On the other hand, the advantages of the Analytical Synthesis Methods have been clearly and effectively demonstrated recently in the realization of high-order current/voltage-mode Operational Trans-conductance Amplifier and Capacitor (OTA-C) filters, where a complicated nth-order transfer function is manipulated and decomposed by a succession of innovative algebraic operations until a set of simple equations are produced, which are then realized using n integrators and a constraint circuitry. In fact, the new Analytical Synthesis Method can be used in the design of any kind of linear system with a stable transfer function.

BRIEF SUMMARY

The present invention relates to nth-order differential difference current conveyors (DDCCs) and fully differential current conveyor grounded (FDCCII-grounded) capacitor and resistor filter structures using the analytical synthesis method to employ the minimum number of active and passive components.

In an embodiment provides, active elements DDCCs and FDCCIIs are employed with their ability to perform operations of voltage addition and subtraction, in conjunction with the Analytical Synthesis Method with its effective operations in simplifying the filter structure, in the realization of voltage-mode high-order filter structures, one voltage-mode second-order universal (low-pass, band-pass, high-pass, band-reject, and all-pass) filter structure, and one voltage-mode third-order elliptic filter structure. Only n DDCCs or (n−1) DDCCs and one FDCCII, n grounded capacitors and n grounded resistors, i.e., the minimum number of active and passive components may be employed in the design of the voltage-mode nth-order filter structures; only one DDCC, one FDCCII, two grounded capacitors and two grounded resistors, i.e. the minimum number of active and passive components, may be used in the synthesis of the voltage-mode second-order universal filer structure; and only three DDCCs, three grounded capacitors, and four grounded resistors are involved in the realization of the voltage-mode third-order elliptic filter structure. The grounded type resistors and capacitors may be the most well suited ones in integrated circuit implementation and have much lower parasitics than the floating type components. The minimum active and passive component count and the use of all grounded resistors and capacitors may lead to the lowest whole parasitics, the highest precise output signals, the lowest power dissipation, the lowest noise, and the smallest area in integrated circuit implementation, all of which simultaneously achieve the two important targets of circuit design: (i) the highest output performance, and (ii) the lowest cost.

The well-known doubly terminated LC ladder filter has very low sensitivities and hence, its response will not be influenced seriously by unpredictable variations of process parameters for monolithic integrated filters. In the proposed third-order all-pass structure, the sensitivities of its centre frequency to the various capacitance and conductances are simulated and illustrated to have the absolute value not larger than 0.58372. This value is smaller than 0.63008, the largest one of the sensitivities of the "second-order passive" all-pass filter with a lattice topology, and a little bit larger than 0.52505 of the third-order passive LC ladder low-pass filter. Furthermore, for the proposed third-order all-pass structure, since the sum of some of the individual sensitivities is zero, it is illustrated by theory and simulations that some groups of individual sensitivities to each trans-conductance and each capacitance of the transfer function of the new structure result in a near-null sum. If some or all of the process parameters in a monolithic integrated circuit have the same variation tendency, this characteristic will be very helpful in reducing the total sensitivity of part or the whole of the monolithic IC. Therefore, the proposed high-order voltage-mode DDCC and FDCCII grounded RC all-pass filter structure also enjoys the very low sensitivity property, which is achieved by passive LC ladder circuits.

The proposed filter structures enjoy the low sensitivities, low parasitics, low power consumption, low noise, and smaller chip area and achieve both of the two important features: (i) higher output performance and (ii) lower cost, without tradeoff.

In addition, the analytical synthesis methods, for realizing the above nth-order differential difference current conveyor (DDCC) and fully differential current conveyor (FDCCII)-grounded capacitor and resistor filter structures are involved in the present inventions, which are very effective for simultaneously achieving all the above mentioned benefits without any tradeoffs.

Moreover, the zero group sensitivity of the nth-order differential difference current conveyor (DDCC) and fully differential current conveyor (FDCCII)-grounded capacitor and resistor filter structures may be achieved if the component value variations of all the relative sensitivities have the same incremental percentage or decrement. Therefore, the scheme to obtain the same incremental percentage or decrement for some relative components becomes an interesting research topic, for reducing the group or the whole sensitivity to null, in the field of integrated circuit manufacturing.

BRIEF DESCRIPTION OF THE DRAWINGS

These and other features and advantages of the various embodiments disclosed herein will be better understood with respect to the following description and drawings, in which like numbers refer to like parts throughout, and in which:

FIG. 1-2 illustrates a circuit implementation of Eq. (1-9-n–2) including two nodes with the voltages ($V^*_{out}+V_{in}$) and $V_{n-2}$ according to an embodiment of the present invention;

FIG. 1-3 illustrates another circuit implementation of Eq. (9-n–2) without the node voltage ($V^*_{out}+V_{in}$) according to an embodiment of the present invention;

FIG. 1-4 illustrates a high-order DDCC and FDCCII-C all-pass filter structure I (equal capacitance type) when n is odd according to an embodiment of the present invention;

FIG. 1-5 illustrates a high-order DDCC and FDCCII-C all-pass filter structure II (equal conductance type) when n is odd according to an embodiment of the present invention;

FIG. 1-6 illustrates a third-order DDCC and FDCCII-based all-pass filter with equal capacitance according to an embodiment of the present invention;

FIG. 1-7 illustrates a high-order DDCC and FDCCII-C all-pass filter structure I (equal capacitance type) when n is even according to an embodiment of the present invention;

FIG. 1-8 illustrates a high-order DDCC and FDCCII-C all-pass filter structure II (equal conductance type) when n is even according to an embodiment of the present invention;

FIG. 1-9 illustrates a fourth-order DDCC and FDCCII-based all-pass filter with equal capacitance according to an embodiment of the present invention;

FIG. 1-10 illustrates a third-order all-pass filter according to a related art;

FIG. 1-11 illustrates a third-order all-pass filter according to another related art;

FIG. 1-12 illustrates a third-order all-pass filter according to yet another related art;

FIG. 1-13 illustrates a theory and simulation comparison of the new third-order all-pass filter according to an embodiment of the present invention;

FIG. 1-14 illustrates sensitivity frequency responses of fo to C1, G1, C2, C3, G2, and G3 according to an embodiment of the present invention;

FIG. 1-15 illustrates individual and group sensitivities of fo to C1 with +5%, G1 with +5%, and both C1 with +5% and G1 with +5% tolerances according to an embodiment of the present invention;

FIG. 1-16 illustrates individual and group sensitivities of fo to C2 with +5%, G2 with +5%, and both C2 with +5% and G2 with +5% tolerances FIG. 1-17 illustrates individual and group sensitivities of fo to C3 with +5%, G3 with +5%, and both C3 with +5% and G3+5% tolerances FIG. 1-18 illustrates a second-order passive all-pass filter according to still another related art;

FIG. 1.19 illustrates a third-order LC ladder low-pass filter according to still another related art;

FIG. 2-1 illustrates a single DDCC based circuitry realizing Eq. (2-7-1) according to another embodiment of the present invention;

FIG. 2-2 illustrates a single DDCC based circuitry realizing Eq. (2-7-n–1) according to another embodiment of the present invention;

FIG. 2-3 illustrates a single DDCC based circuitry realizing Eq. (2-7-n) according to another embodiment of the present invention;

FIG. 2-4 illustrates a DDCC based high-pass filter structure I according to another embodiment of the present invention;

FIG. 2-5 illustrates a DDCC based low-pass filter structure I according to another embodiment of the present invention;

FIG. 2-6 illustrates a DDCC based low-pass and high-pass filter structure I according to another embodiment of the present invention;

FIG. 3-1 illustrates a single DDCC based sub-circuitry realizing Eq. (3-7-1) according to yet another embodiment of the present invention;

FIG. 3-2 illustrates a single DDCC based sub-circuitry realized from Eq. (3-7-n–1) according to yet another embodiment of the present invention;

FIG. 3-3 illustrates a single DDCC based sub-circuitry realizing Eq. (3-7-n) according to yet another embodiment of the present invention;

FIG. 3-4 illustrates a DDCC based low-pass, band-pass, and high-pass filter structure I according to yet another embodiment of the present invention;

FIG. 3-5 illustrates a DDCC based low-pass, band-pass, and high-pass filter structure II according to yet another embodiment of the present invention;

FIG. 3-6 illustrates a single FDCCII-based sub-circuitry realized from (3-12) with one more node with the voltage $V^*_{out}+V_{in}$ according to yet another embodiment of the present invention;

FIG. 3-7 illustrates a DDCC and FDCCII-based band-pass and band-reject filter structure according to yet another embodiment of the present invention;

FIG. 3-8 illustrates a Circuit implementation of Eq. (3-17-n–1) and one more node voltage $V^*_{out}+V_{in}$ to yet another embodiment of the present invention;

FIG. 3-9 illustrates a DDCC and FDCCII-based all-pass filter structure I according to yet another embodiment of the present invention;

FIG. 3-10 illustrates a DDCC and FDCCII-based all-pass filter structure II according to yet another embodiment of the present invention;

FIG. 3-11 illustrates a simulated band-pass amplitude-frequency response of FIG. 3-7 with theoretical fo=1 MHz according to yet another embodiment of the present invention;

FIG. 3-12 illustrates a simulated band-pass amplitude-frequency response of FIG. 3-7 with theoretical fo=100 Hz according to yet another embodiment of the present invention;

FIG. 3-13 illustrates a simulated band-reject amplitude-frequency response of FIG. 3-7 with theoretical fo=1 MHz according to yet another embodiment of the present invention;

FIG. 3-14 illustrates a simulated band-reject amplitude-frequency response of FIG. 3-7 with theoretical fo=100 Hz according to yet another embodiment of the present invention;

FIG. 3-15 illustrates a simulated low-pass amplitude-frequency response of FIG. 3-5 with theoretical fo=1 MHz according to yet another embodiment of the present invention;

FIG. 3-16 illustrates a simulated low-pass amplitude-frequency response of FIG. 3-5 with theoretical fo=100 Hz according to yet another embodiment of the present invention;

FIG. 3-17 illustrates a simulated band-pass amplitude-frequency response of FIG. 3-5 with theoretical fo=1 MHz according to yet another embodiment of the present invention;

FIG. 3-18 illustrates a simulated band-pass amplitude-frequency response of FIG. 3-5 with theoretical fo=100 Hz according to yet another embodiment of the present invention;

FIG. 3-19 illustrates a simulated high-pass amplitude-frequency response of FIG. 3-5 with theoretical fo=1 MHz according to yet another embodiment of the present invention;

FIG. 3-20 illustrates a simulated high-pass amplitude-frequency response of FIG. 3-5 with theoretical fo=100 Hz according to yet another embodiment of the present invention;

FIG. 3-21 illustrates a DDCC and FDCCII based second-order all-pass phase-frequency response of FIG. 3-9 with theoretical fo=1 MHz according to yet another embodiment of the present invention;

FIG. 3-22 illustrates a DDCC and FDCCII based second-order all-pass phase-frequency response of FIG. 3-9 with theoretical fo=100 Hz according to yet another embodiment of the present invention;

FIG. 4-1 illustrates a DDCC based sub-circuitry realizing Eq. (4-7-1) according to still another embodiment of the present invention;

FIG. 4-2 illustrates a DDCC based sub-circuitry realized from Eq. (4-7-n−1) according to still another embodiment of the present invention;

FIG. 4-3 illustrates a DDCC based sub-circuitry realized from Eq. (4-7-n) according to still another embodiment of the present invention;

FIG. 4-4 illustrates a DDCC based low-pass, band-pass, and high-pass filter structure III according to still another embodiment of the present invention;

FIG. 4-5 illustrates a DDCC based low-pass, band-pass, and high-pass filter structure IV according to still another embodiment of the present invention;

FIG. 4-6 illustrates a FDCCII based sub-circuitry realizing Eq. (4-9-1) according to still another embodiment of the present invention;

FIG. 4-7 illustrates a FDCCII and DDCC based low-pass, band-pass, high-pass, and band-reject filter structure according to still another embodiment of the present invention;

FIG. 4-8 illustrates a simulated high-pass amplitude-frequency response of FIG. 4-7 with theoretical fo=1 MHz according to still another embodiment of the present invention;

FIG. 4-9 illustrates a simulated high-pass response (red line) of FIG. 4-7 with theoretical fo=100 Hz according to still another embodiment of the present invention;

FIG. 4-10 illustrates a simulated band-reject response (red line) of FIG. 4-7 with theoretical fo=1 MHz according to still another embodiment of the present invention;

FIG. 4-11 illustrates a simulated band-reject response (red line) of FIG. 4-7 with theoretical fo=100 Hz according to still another embodiment of the present invention;

FIG. 5-1 illustrates a third-order DDCC-based elliptic filter structure I according to still another embodiment of the present invention;

FIG. 5-2 illustrates a third-order DDCC-based elliptic filter structure II according to still another embodiment of the present invention;

FIG. 5-3 illustrates a third-order DDCC-based elliptic filter structure III according to still another embodiment of the present invention;

FIG. 5-4 illustrates a third-order DDCC-based elliptic filter structure IV according to still another embodiment of the present invention;

FIG. 5-5 illustrates an amplitude-frequency response of FIG. 5-1 (3rd-order elliptic filter) according to still another embodiment of the present invention;

FIG. 6-1 illustrates a DDCC-FDCCII based low-pass, band-pass, high-pass, and all-pass biquad according to still another embodiment of the present invention;

FIG. 6-2 illustrates a DDCC-FDCCII based low-pass, band-pass, high-pass, and band-reject biquad according to still another embodiment of the present invention;

FIG. 6-3 illustrates a DDCC-FDCCII based universal biquad according to still another embodiment of the present invention;

FIG. 6-4 illustrates a band-pass amplitude-frequency responses of FIG. 6-2 with fo=1 MHz according to still another embodiment of the present invention;

FIG. 6-5 illustrates Band-pass amplitude-frequency responses of FIG. 6-2 at 100 Hz to 1000 Hz according to still another embodiment of the present invention;

FIG. 7-1 illustrates Single DDCC based sub-circuitry realized from Eq. (7.7.1);

FIG. 7-2 illustrates Single DDCC based sub-circuitry realized from Eq. (6.7-n−1);

FIG. 7-3 illustrates Single DDCC based sub-circuitry realized from Eq. (6.7-n);

FIG. 7-4 illustrates Even-nth-order DDCC-based LP, BP, and HP filter structure;

FIG. 7-5 illustrates Single FDCCII-based sub-circuitry realized from reference [10] with one more node voltage $V^*_{out}+V_{in}$;

FIG. 7-6 illustrates Even-nth-order DDCC and FDCCII-based LP, BP, HP, and BR filter structure;

FIG. 7-7 illustrates Even-nth-order DDCC and FDCCII-based universal filter structure;

FIG. 7-8 illustrates Single DDCC based sub-circuitry realized from Eq. (7.21-1);

FIG. 7-9 illustrates Single DDCC based sub-circuitry realized from Eq. (7.21-i), i=n−1;

FIG. 7-10 illustrates Single DDCC based sub-circuitry realized from Eq. (7.21-n);

FIG. 7-11 illustrates Odd-nth-order DDCC based LP, BP, and HP filter structure;

FIG. 7-12 illustrates Single FDCCII based sub-circuitry realized from Eq. (7.21-i), i=2;

FIG. 7-13 illustrates Odd-nth-order DDCC and FDCCII based LP, BP, HP, and BR filter structure;

FIG. 7-14 illustrates Single DDCC-based sub-circuitry realized from Eqs. (7.31-1), (7.21-1), and (7.24);

FIG. 7-15 illustrates Single FDCCII-based sub-circuitry realized from Eqs. (7.31-2) and (7.21-i), i=2 with one more node voltage $V_{in}-V^*_{out}$;

FIG. 7-16 illustrates Single DDCC-based sub-circuitry realized from Eqs. (7.31-3) and (7.21-i), i=3;

FIG. 7-17 illustrates Odd-nth-order DDCC and FDCCII-based universal filter structure (LP, BP, HP, BR, AP).

Figure 1:
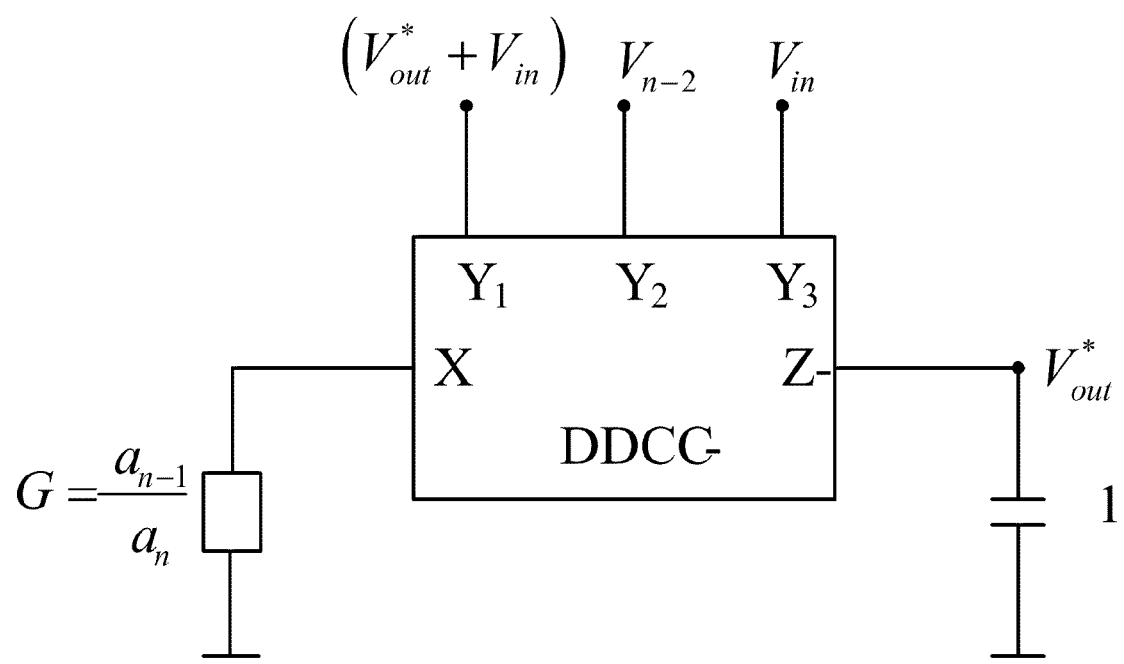
FIG. 1-1 illustrates an implementation of Eq. (1-9-n–1) according to an embodiment of the present invention.

Attachment 1 illustrates an analog layout result of FIG. 1-6;

Attachment 2 illustrates an analog layout of FIG. 1-10;

Attachment 3 illustrates an analog layout of FIG. 1-11; and

Attachment 4 illustrates an analog layout of FIG. 1-12.

DETAILED DESCRIPTION

In an embodiment of the present invention, the voltage-mode Differential Difference Current Conveyor (DDCC) and Fully Differential Current Conveyor (FDCCII)-Resistor and Capacitor filter structures are designed with the following listed criterias: filters have the minimum number of active (DDCC and FDCCII) and passive (Resistor and Capacitor) components for a given order to reduce total parasitics, power consumption, chip area, and noise; filters use grounded capacitors and grounded resistors both of which have much lower parasitics than floating capacitors and floating resistors and can straight absorb shunt capacitive and conductive parasitics.

Note that the DDCC and FDCCII-grounded R and C filter with the aforementioned criteria has the minimum non-ideal parasitic capacitance and conductance and the minimum noise, both of which lead to the most precise output signals, and the minimum power consumption and the minimum chip area, both of which lead to the lowest energy payment and the lowest manufacture cost, respectively.

In this embodiment, the new filter design method, i.e., the analytical synthesis method (ASM), shall be presented for the realization of the voltage-mode DDCC and FDCCII-R and C filter structures, where a complicated nth-order transfer function is manipulated and decomposed by a succession of innovative algebra operations until a set of simple equations are produced, which are then realized using n integrators and a constraint circuitry. In fact, the new Analytical Synthesis Method can be used in the design of any kind of linear system with a stable transfer function. The ASM is carried out according to the following steps. At step 1, the "decomposition" of a complicated nth-order function is transferred into a set of simple and realizable equations. At step 2, the "realization" of each simple equation obtained from step 1 are corresponded to simple sub-circuitries. At step 3, the all the simple sub-circuitries are combined for constructing a whole complicated circuit structure. Since (i) grounded resistors and capacitors are with much lower parasitics than floating resistors and capacitors, and (ii) the minimum number of active and passive components lead to the lowest total parasitics, power consumption, noise, and integrated circuit area, both of which simultaneously achieve the two important features of an ASM: (i) higher output performance, and (ii) the lower manufacture cost and energy consumption, without tradeoff.

In an embodiment, since some group sensitivity of the nth-order differential difference current conveyor (DDCC) and fully differential current conveyor (FDCCII)-grounded capacitor and resistor filter structure is equal to zero, if the component value variations of all the relative sensitivities have the same incremental percentage or decrement, the total sensitivity of one part of or even the whole filter structure has the possibility of being reduced to null. Therefore, the technique to obtain the same incremental percentage or decrement for some relative components in a group has become an interesting research topic, for reducing one part of or even the whole sensitivity of the filter structure, in the field of integrated circuit manufacturing.

The present invention includes 24 DDCC and FDCCII-grounded R and C filter structures (illustrated in FIGS. 1-4, 1-5, 1-6, 1-7, 1-8, 1-9, 2-4, 2-5, 2-6, 3-4, 3-5, 3-7, 3-9, 3-10, 4-4, 4-5, 4-7, 5-1, 5-2, 5-3, 5-4, 6-1, 6-2, and 6-3), the replacement of the above 24 DDCC and FDCCII-grounded R and C circuits by the equivalent active elements like the differential voltage current conveyors (DVCCs), and their corresponding analytical synthesis methods, all of which in the present invention are illustrated below. Moreover, a new concept for reducing one part of or the whole sensitivity of a circuit structure is proposed in the present invention, which is achieved in the field of integrated circuit manufacturing techniques if all the relative components have the same incremental percentage or decrement as their values need to be changed.

1. Analytical Synthesis of Low Sensitivity High-Order Voltage-Mode DDCC and FDCCII-Grounded R and C All-Pass Filter Structures 1.1 Analytical Synthesis Methods The advantages of the Analytical Synthesis Methods (ASMs) have been clearly and effectively demonstrated recently in the realization of high-order current/voltage-mode Operational Trans-conductance Amplifier and Capacitor (OTA-C) filters, where a complicated nth-order transfer function is manipulated and decomposed by a succession of innovative algebra operations until a set of simple equations are produced, which are then realized using n integrators and a constraint circuitry. In fact, the new Analytical Synthesis Method can be used in the design of any kind of linear system with a stable transfer function. The ASM is carried out according to the following steps. At step 1, the "decomposition" of a complicated nth-order function is transferred into a set of simple and realizable equations. At step 2, the "realization" of each simple equation obtained from step 1 are corresponded to simple sub-circuitries. At step 3, all of the simple sub-circuitries are combined for constructing a whole complicated circuit structure. This section describes new ASMs for the realization of high-order voltage-mode Differential Difference Current Conveyor (DDCC)-grounded Resistor and Capacitor all-pass filter structures. Since (i) grounded resistors and capacitors are with much lower parasitics than floating resistors and capacitors, and (ii) the minimum number of active and passive components lead to the lowest total parasitics, power consumption, noise, and integrated circuit area, both of which simultaneously achieves the two features of an ASM: (i) highest output performance, and (ii) lower manufacture cost and energy consumption, without tradeoff.

The general transfer function of an nth-order all-pass filter may be expressed by following equation:

$$\frac{V_{out}}{V_{in}} = \left( \frac{\sum_{i=0}^{i=n} (-1)^i a_i s^i}{(-1)^n \sum_{i=0}^{i=n} a_i s^i} \right) \quad (1\text{-}1)$$

Wherein, if n is odd, $$V_{out} - V_{in} \equiv V_{out}^* = \frac{-2a_{n-1}s^{n-1} - 2a_{n-3}s^{n-3} - \ldots - 2a_2 s^2 - 2a_0}{a_n s^n + a_{n-1}s^{n-1} + a_{n-2}s^{n-2} + \ldots + a_3 s^3 + a_2 s^2 + a_1 s + a_0} V_{in} \quad (1\text{-}2)$$

If n is even, $$V_{out} - V_{in} \equiv V_{out}^* = \frac{\begin{array}{c} -2a_{n-1}s^{n-1} - \\ 2a_{n-3}s^{n-3} - \ldots - 2a_3s^3 - 2a_1s \end{array}}{a_ns^n + a_{n-1}s^{n-1} + a_{n-2}s^{n-2} + \ldots + a_3s^3 + a_2s^2 + a_1s + a_0} V_{in} \quad (1\text{-}3)$$

Part I: Analytical Synthesis of Eq. (1-2)

Cross multiplying Eq. (1-2), and dividing by $a_{n-1}s^{n-1}$ provides, $$\left(\frac{a_n}{a_{n-1}}s + 1 + \frac{a_{n-2}}{a_{n-1}s} + \ldots + \frac{a_2}{a_{n-1}s^{n-3}} + \frac{a_1}{a_{n-1}s^{n-2}} + \frac{a_0}{a_{n-1}s^{n-1}}\right)V_{out}^* = \left(-2 - \frac{2a_{n-3}}{a_{n-1}s^2} - \frac{2a_{n-5}}{a_{n-1}s^4} - \ldots - \frac{2a_2}{a_{n-1}s^{n-3}} - \frac{2a_0}{a_{n-1}s^{n-1}}\right)V_{in} \quad (1\text{-}4)$$

Rearranging Eq. (1-4), $$\left(\frac{a_n}{a_{n-1}}s + 1\right)V_{out}^* + \left(\frac{a_{n-2}}{a_{n-1}s} + \frac{a_{n-3}}{a_{n-1}s^2} + \ldots + \frac{a_2}{a_{n-1}s^{n-3}} + \frac{a_1}{a_{n-1}s^{n-2}} + \frac{a_0}{a_{n-1}s^{n-1}}\right)V_{out}^* + \left(\frac{2a_{n-3}}{a_{n-1}s^2} + \frac{2a_{n-5}}{a_{n-1}s^4} + \ldots + \frac{2a_2}{a_{n-1}s^{n-3}} + \frac{2a_0}{a_{n-1}s^{n-1}}\right)V_{in} = -2V_{in} \quad (1\text{-}5)$$

where $$\left(\frac{a_{n-2}}{a_{n-1}s} + \frac{a_{n-3}}{a_{n-1}s^2}\right)V_{out}^* + \left(\frac{2a_{n-3}}{a_{n-1}s^2}\right)V_{in} + \left(\frac{a_{n-4}}{a_{n-1}s^3} + \frac{a_{n-5}}{a_{n-1}s^4}\right)V_{out}^* + \left(\frac{2a_{n-5}}{a_{n-1}s^4}\right)V_{in} = \left(\frac{1}{a_{n-1}s}\right)\left[\left(\frac{a_{n-3}}{s}\right)\left[\left(\frac{1}{a_{n-3}s}\right)\left[\left(\frac{a_{n-5}}{s}\right)(2V_{in} + V_{out}^*) + a_{n-4}V_{out}^*\right] + (2V_{in} + V_{out}^*)\right] + a_{n-2}V_{out}^*\right] \quad (1\text{-}6)$$

$$\left(\frac{a_{n-6}}{a_{n-1}s^5} + \frac{a_{n-7}}{a_{n-1}s^6}\right)V_{out}^* + \left(\frac{2a_{n-7}}{a_{n-1}s^6}\right)V_{in} = \left(\frac{1}{a_{n-1}s}\right)\left(\frac{a_{n-3}}{s}\right)\left(\frac{1}{a_{n-3}s}\right)\left[\left(\frac{1}{a_{n-5}s}\right)\left[\left[\left(\frac{a_{n-7}}{s}\right)(2V_{in} + V_{out}^*) + a_{n-6}V_{out}^*\right]\right]\right] \quad (1\text{-}7)$$

Equations (1-6), and (1-7) can also be combined and obtain a combination form similar to Eq. (1-6). Then, in general, Eq. (1-5) can be re-arranged and combined obtain the following Eq. (1-6) and illustrated as below.

Therefore, the following n simple equations can be derived from Eq. (1-8) by letting the new node voltages, Vn, where n=0, 1, 2 ..., and n−2.

$$\left(\frac{a_0}{a_1}\right)(2V_{in} + V_{out}^*) \equiv -sV_0 \quad (1\text{-}9\text{-}0)$$

$$\left(\frac{a_1}{a_2}\right)[-V_0 + V_{out}^*] \equiv -sV_1 \quad (1\text{-}9\text{-}1)$$

$$\left(\frac{a_2}{a_3}\right)[-V_1 + (2V_{in} + V_{out}^*)] \equiv -sV_2 \quad (1\text{-}9\text{-}2)$$

$$\left(\frac{a_3}{a_4}\right)[-V_2 + V_{out}^*] \equiv -sV_3 \quad (1\text{-}9\text{-}3)$$

$$\left(\frac{a_4}{a_5}\right)[-V_3 + (2V_{in} + V_{out}^*)] \equiv -sV_4 \quad (1\text{-}9\text{-}4)$$

...

$$\left(\frac{a_{n-4}}{a_{n-3}}\right)[-V_{n-5} + V_{out}^*] \equiv -sV_{n-4} \quad (1\text{-}9\text{-}n\text{-}4)$$

$$\left(\frac{a_{n-3}}{a_{n-2}}\right)[-V_{n-4} + (2V_{in} + V_{out}^*)] \equiv -sV_{n-3} \quad (1\text{-}9\text{-}n\text{-}3)$$

$$\left(\frac{a_{n-2}}{a_{n-1}}\right)[-V_{n-3} + V_{out}^*] \equiv -sV_{n-2} \quad (1\text{-}9\text{-}n\text{-}2)$$

Then, Eq. (1-8) becomes $$\left(\frac{a_n}{a_{n-1}}s + 1\right)V_{out}^* - V_{n-2} = -2V_{in},$$

which can be re-arranged as $$\left(\frac{a_{n-1}}{a_n}\right)[-V_{n-2} + (2V_{in} + V_{out}^*)] \equiv -sV_{out}^* \quad (1\text{-}9\text{-}n\text{-}1)$$

Note that only two types of equations exist in the n equations illustrated in Eqs. (1-9-0) to (1-9-n-1). The simple equation (1-9-n-1) can be realized by using a negative type of differential difference current conveyor (DDCC−), whose input-output characteristics are Iz−=−Ix, IY1=0, IY2=0, IY3=0, and Vx=VY1−VY2+VY3, a grounded capacitor and a ground resistor illustrated in FIG. 1-1. Eqs. (1-9-0), (1-9-2), (1-9-4), ..., and (1-9-n-3) similar to Eq. (1-9-n-1) have the same circuit structure as that illustrated in FIG. 1-1 but with only different capacitances and different node voltages.

The other type of circuit implementation realized from Eqs. (1-9-1), (1-9-3), ..., and (1-9-n-2), which needs to have a node with the node voltages (V*$_{out}$+V$_{in}$) and Vn−2 to connect with terminals Y1 and Y2, respectively, of the minus-type DDCC illustrated in FIG. 1-1, has the realized circuit struc- $$\left(\frac{a_n}{a_{n-1}}s + 1\right)V_{out}^* + \left(\frac{1}{a_{n-1}s}\right)\left[\left(\frac{a_{n-3}}{s}\right)\left(\frac{1}{a_{n-3}s}\right)\left[\begin{array}{c}\ldots \\ \left[\left(\frac{a_2}{s}\right)\left[\left(\frac{1}{a_2s}\right)\left[\left(\frac{a_0}{s}\right)(2V_{in} + V_{out}^*) + a_1V_{out}^*\right] + (2V_{in} + V_{out}^*)\right] + a_3V_{out}^*\right] \\ \ldots \\ (2V_{in} + V_{out}^*)\end{array}\right] + a_{n-2}V_{out}^*\right] = -2V_{in} \quad (1\text{-}8)$$

ture illustrated in FIG. 1-2 using a single fully differential current conveyor (FDCCII), whose input-output characteristics are illustrated as follows.

$$\begin{bmatrix} V_{X+} \\ V_{X-} \\ I_{Z+} \\ I_{Z-} \end{bmatrix} = \begin{bmatrix} 0 & 0 & 1 & -1 & 1 & 0 \\ 0 & 0 & -1 & 1 & 0 & 1 \\ 1 & 0 & 0 & 0 & 0 & 0 \\ 0 & 1 & 0 & 0 & 0 & 0 \end{bmatrix} \begin{bmatrix} I_{X+} \\ I_{X-} \\ V_{Y1} \\ V_{Y2} \\ V_{Y3} \\ V_{Y4} \end{bmatrix} \quad (1\text{-}10)$$

The combination of all implementations realized from Eq. (9-0) to Eq. (9-n-1) constructs the high-order voltage-mode DDCC and FDCCII-grounded resistor and capacitor filter structure illustrated in FIG. 1-4. It should be noted that the voltage signal ($V^*_{out}+V_{in}$) generated by the circuit implementation illustrated in FIG. 1-2 is repeatedly used in the structure. However, this voltage signal need not be separately generated again and again. The voltage signal can be used repeatedly. Then, except the top FDCCII which generates the voltage signal ($V^*_{out}+V_{in}$), the circuit implementation illustrated in FIG. 1-2 can be simplified and replaced with the circuit illustrated in FIG. 1-3 without the voltage signal ($V^*_{out}+V_{in}$), using a positive-type DDCC (whose input-output characteristics are Iz+=+Ix, IY1=0, IY2=0, IY3=0, and Vx=VY1−VY2+VY3). Having done the replacement, the high-order DDCC and FDCCII-grounded resistor and capacitor filter structure I (equal capacitance type for avoiding the difficulty to precisely fabricate the different value capacitance in integrated circuits) illustrated in FIG. 1-4, which can be transferred, using the following two types of the equivalent equations (1-9-n-2') and (1-9-n-1') derived from Eqs. (1-9-n-2) and (1-9-n-1), respectively, $$(1)[-V_{n-3} + V^*_{out}] \equiv -s\left(\frac{a_{n-1}}{a_{n-2}}\right)V_{n-2} \quad (1\text{-}9\text{-}n\text{-}2')$$

-continued $$(1)[-V_{n-2} + (2V_{in} + V^*_{out})] \equiv -s\left(\frac{a_n}{a_{n-1}}\right)V^*_{out} \quad (1\text{-}9\text{-}n\text{-}1')$$

to another filter structure II (equal conductance type for employing a single bias circuitry and then simplifying the circuit implementation when using a transconductor to replace a resistor) illustrated in FIG. 1-5. It uses n−1 DDCCs, a single FDCCII, n grounded capacitors, and n grounded resistors, the latter two terms of which are the minimum passive components used to realize the denominator of Eq. (1-1), for synthesizing an nth-order all-pass transfer function. The complete all-pass output signal can be obtained from the output node with the voltage signal ($V^*_{out}+V_{in}$).

To illustrate the synthesis method, the structure generation of a third-order all-pass filter is considered. The synthesis method uses Eqs. (1-9-0) to (1-9-2). Implementing these three equations using FIGS. 1-1 to 1-3, the third-order DDCC and FDCCII-based all-pass filter with equal capacitance is illustrated in FIG. 1-6 with the following transfer function $$\frac{(V'_{out} + V_{in})}{V_{in}} = \frac{a_3 s^3 - a_2 s^2 + a_1 s - a_0}{a_3 s^3 + a_2 s^2 + a_1 s + a_0} \quad (1\text{-}11)$$

Only three active elements, three grounded capacitors and three grounded resistors are the least active and passive component counts when compared to the recently reported work used in the third-order all-pass filter design.

Part II: Analytical Synthesis of Eq. (1-3)
Cross multiplying Eq. (1-3), and dividing by $a_{n-1}s^{n-1}$, $$\left(\frac{a_n}{a_{n-1}}s + 1 + \frac{a_{n-2}}{a_{n-1}s} + \ldots + \frac{a_2}{a_{n-1}s^{n-3}} + \frac{a_1}{a_{n-1}s^{n-2}} + \frac{a_0}{a_{n-1}s^{n-1}}\right)V^*_{out} = \quad (1\text{-}12)$$

$$\left(-2 - \frac{2a_{n-3}}{a_{n-1}s^2} - \frac{2a_{n-5}}{a_{n-1}s^4} - \ldots - \frac{2a_3}{a_{n-1}s^{n-4}} - \frac{2a_1}{a_{n-1}s^{n-2}}\right)V_{in}$$

Rearranging Eq. (1-12), $$\left(\frac{a_n}{a_{n-1}}s + 1\right)V^*_{out} + \left(\frac{a_{n-2}}{a_{n-1}s} + \frac{a_{n-3}}{a_{n-1}s^2} + \ldots + \frac{a_2}{a_{n-1}s^{n-3}} + \frac{a_1}{a_{n-1}s^{n-2}} + \frac{a_0}{a_{n-1}s^{n-1}}\right)V^*_{out} + \quad (1\text{-}13)$$

$$\left(\frac{2a_{n-3}}{a_{n-1}s^2} + \frac{2a_{n-5}}{a_{n-1}s^4} + \ldots + \frac{2a_3}{a_{n-1}s^{n-4}} + \frac{2a_1}{a_{n-1}s^{n-2}}\right)V_{in} = -2V_{in}$$

where $$\left(\frac{a_{n-2}}{a_{n-1}s} + \frac{a_{n-3}}{a_{n-1}s^2}\right)V^*_{out} + \left(\frac{2a_{n-3}}{a_{n-1}s^2}\right)V_{in} + \left(\frac{a_{n-4}}{a_{n-1}s^3} + \frac{a_{n-5}}{a_{n-1}s^4}\right)V^*_{out} + \left(\frac{2a_{n-5}}{a_{n-1}s^4}\right)V_{in} = \quad (1\text{-}14)$$

$$\left(\frac{1}{a_{n-1}s}\right)\left[\left(\frac{a_{n-3}}{s}\right)\left[\left(\frac{1}{a_{n-3}s}\right)\left[\left(\frac{a_{n-5}}{s}\right)(2V_{in} + V^*_{out}) + \atop a_{n-4}V^*_{out}\right] + (2V_{in} + V^*_{out})\right] + \atop a_{n-4}V^*_{out}\right]$$

and $$\left(\frac{a_{n-6}}{a_{n-1}s^5} + \frac{a_{n-7}}{a_{n-1}s^6}\right)V^*_{out} + \left(\frac{2a_{n-7}}{a_{n-1}s^6}\right)V_{in} = \left(\frac{1}{a_{n-1}s}\right)\left[\left(\frac{a_{n-3}}{s}\right)\left[\left(\frac{1}{a_{n-3}s}\right)\left[\left(\frac{a_{n-5}}{s}\right)\left[\left(\frac{1}{a_{n-5}s}\right)\left[\left(\frac{a_{n-7}}{s}\right)(2V_{in} + V^*_{out}) + \atop a_{n-6}V^*_{out}\right]\right]\right]\right]\right] \quad (1\text{-}15)$$

Eqs. (1-14), and (1-15) can also be combined to obtain a combination form similar to Eq. (1-14). Then, in general, Eq. (1-13) can be re-arranged and combined to obtain equation similar to Eq. (1-14) as expressed below.

$$\left(\frac{a_n}{a_{n-1}}s+1\right)V_{out}^* + \left(\frac{1}{a_{n-1}s}\right)\left[\left(\frac{a_{n-3}}{s}\right)\left(\frac{1}{a_{n-3}s}\right)\left[\cdots\left[\left(\frac{a_1}{s}\right)\left(\frac{1}{a_1 s}\right)\left[\binom{0}{s}(2V_{in}+V_{out}^*)+\begin{bmatrix}0\\a_0 V_{out}^*\end{bmatrix}\right]+\right]+\right]+\right] = -2V_{in} \quad (1\text{-}16)$$

Therefore, the following n simple equations derived from Eq. (1-16) can be obtained by letting the new node voltages, $V_n$, where $n=-1, 0, 1, 2 \ldots,$ and $n-3$.

$$\left(\frac{a_0}{a_1}\right)[-0+V_{out}^*] \equiv -sV_{-1} \quad (1\text{-}17\text{-}1)$$

$$\left(\frac{a_1}{a_2}\right)(-V_{-1}+2V_{in}+V_{out}^*) \equiv -sV_0 \quad (1\text{-}17\text{-}0)$$

$$\left(\frac{a_2}{a_3}\right)[-V_0+V_{out}^*] \equiv -sV_1 \quad (1\text{-}17\text{-}1)$$

$$\left(\frac{a_3}{a_4}\right)[-V_1+(2V_{in}+V_{out}^*)] \equiv -sV_2 \quad (1\text{-}17\text{-}2)$$

$$\left(\frac{a_4}{a_5}\right)[-V_2+V_{out}^*] \equiv -sV_3 \quad (1\text{-}17\text{-}3)$$

$$\left(\frac{a_5}{a_6}\right)[-V_3+(2V_{in}+V_{out}^*)] \equiv -sV_4 \quad (1\text{-}17\text{-}4)$$

$\ldots$ $$\left(\frac{a_{n-4}}{a_{n-3}}\right)[-V_{n-6}+V_{out}^*] \equiv -sV_{n-5} \quad (1\text{-}17\text{-}n\text{-}4)$$

$$\left(\frac{a_{n-3}}{a_{n-2}}\right)[-V_{n-5}+(2V_{in}+V_{out}^*)] \equiv -sV_{n-4} \quad (1\text{-}17\text{-}n\text{-}3)$$

$$\left(\frac{a_{n-2}}{a_{n-1}}\right)[-V_{n-4}+V_{out}^*] \equiv -sV_{n-3} \quad (1\text{-}17\text{-}n\text{-}2)$$

Then, Eq. (16) becomes $$\left(\frac{a_n}{a_{n-1}}s+1\right)V_{out}^* - V_{n-3} = -2V_{in}$$

which can be re-arranged as:

$$\left(\frac{a_{n-1}}{a_n}\right)[-V_{n-3}+(2V_{in}+V_{out}^*)] \equiv -sV_{out}^* \quad (1\text{-}17\text{-}n\text{-}1)$$

There are two different types, both of which are the same as those presented in Eqs. (1-9-0) to (1-9-n-1), of equations existed in Eqs. (1-17-1) to (1-17-n-1). Then FIGS. 1-1 to 1-3 can also be applied to implement Eqs. (1-17-1) to (1-17-n-1). The combination of the implementations of Eqs. (1-17-1) to (1-17-n-1) is illustrated in FIG. 1-7. The equal capacitance filter structure illustrated in FIG. 1-7 can be easily transferred to the equal conductance filter structure, illustrated in FIG. 1-8, as the odd case presented above.

To illustrate the synthesis method, the structure generation of a fourth-order all-pass filter is considered. The synthesis method uses Eqs. (1-17-1) to (1-17-2). Implementing these four equations using FIGS. 1-1 to 1-3, the fourth-order DDCC and FDCCII-based all-pass filter is illustrated in FIG. 1-8 with the following transfer function $$\frac{(V_{out}^* + V_{in})}{V_{in}} = \frac{a_4 s^4 - a_3 s^3 + a_2 s^2 - a_1 s + a_0}{a_4 s^4 + a_3 s^3 + a_2 s^2 + a_1 s + a_0} \quad (1\text{-}18)$$

Only four active elements, four grounded capacitors and four grounded resistors, are the least active and passive component counts when compared to the recently reported work used in the fourth-order all-pass filter design.

1.2 Low Sensitivities

In the above section, although each conductance for FIG. 1-4 (resp. FIG. 1-7) is assigned with equal capacitance or each capacitance for FIG. 1-5 (resp. FIG. 1-8) with equal conductance a special value, in fact, all of the capacitances and conductances can be given flexibly. The restriction of the values of the conductances and the capacitances illustrated in FIGS. 1-4 and 1-5 (resp. FIGS. 1-7 and 1-8) is used for being consistent with the derivation process and the original given transfer functions illustrated in Eq. (1-2) (resp. Eq. (1-3)). If the values of the grounded conductors, $a0/a1$, $a1/a2$, $a2/a3 \ldots a_{n-2}/a_{n-1}$, $a_{n-1}/a_n$, in FIGS. 1-4 and 1-7 by G1, G2, G3 $\ldots$ Gn-1, and Gn and the corresponding values of the capacitances are replaced by C1, C2, C3 $\ldots$ Cn-1, and Cn, respectively, then circuit analysis yields the following transfer functions of FIGS. 1-4 and 1-7 and FIGS. 1-5 and 1-8, respectively:

$$\frac{V_{out}^*}{V_{in}} = \frac{(-2)\left[\sum_{i=0}^{n-1} s^{2i}\left(\prod_{j=1}^{2i} C_j\right)\left(\prod_{k=2i+1}^{n} G_k\right)\right]}{s^n\left(\prod_{j=1}^{n} C_j\right) + \sum_{i=1}^{n-1}\left[s^i\left(\prod_{j=1}^{i} C_j\right)\left(\prod_{k=i+1}^{n} G_k\right)\right] + \left(\prod_{k=1}^{n} G_k\right)} \quad (1\text{-}19)$$

$$= \frac{\sum_{i=0}^{n} s^i B_i}{\sum_{i=0}^{n} s^i A_i} \text{ if } n \text{ is odd.}$$

-continued $$\frac{V_{out}^*}{V_{in}} = \frac{(-2)\left[\sum_{i=0}^{i=\frac{n}{2}-1} s^{2i+1}\left(\prod_{j=1}^{2i+1} C_j\right)\left(\prod_{k=2i+2}^{n} G_k\right)\right]}{s^n\left(\prod_{j=1}^{n} C_j\right) + \sum_{i=1}^{n-1}\left[s^i\left(\prod_{j=1}^{i} C_j\right)\left(\prod_{k=i+1}^{n} G_k\right)\right] + \left(\prod_{k=1}^{n} G\right)} \quad (1\text{-}20)$$

$$= \frac{\sum_{i=0}^{n} s^i B_i}{\sum_{i=0}^{n} s^i A_i} \text{ if } n \text{ is even.}$$

The denominator and numerator coefficient sensitivities to $C_j$ and $g_k$ are easily calculated to equal unity or zero, all of which are small.

The sensitivities of the transfer function of the proposed third-order all-pass filter structure illustrated in FIG. 1-6 to each individual capacitance and conductance are illustrated as follows. Circuit analysis for FIG. 1-6 yields the following transfer function $$H_A(s) = \frac{V_{out}^*}{V_{in}} \quad (1\text{-}21)$$

$$= \frac{-2s^2 C_1 C_2 G_3 - 2 G_1 G_2 G_3}{s^3 C_1 C_2 C_3 + s^2 C_1 C_2 C_3 + s C_1 G_2 G_3 + G_1 G_2 G_3}$$

$$\equiv \frac{-2s^2 \alpha_2 - 2\alpha_0}{s^3 \alpha_3 + s^2 \alpha_2 + s\alpha_1 + \alpha_0}$$

which leads to the third-order all-pass transfer function of the node voltage ($V^*_{out}+V_{in}$), illustrated in FIG. 6, and the input voltage Vin as follows.

$$\frac{(V_{out}^* + V_{in})}{V_{in}} = \frac{V_{out}}{V_{in}} \quad (1\text{-}22)$$

$$= \frac{s^3 C_1 C_2 C_3 - s^2 C_1 C_2 G_3 + s C_1 G_2 G_3 - G_1 G_2 G_3}{s^3 C_1 C_2 C_3 + s^2 C_1 C_2 G_3 + s C_1 G_2 G_3 + G_1 G_2 G_3}$$

Then, the sensitivities of HA to the components are $$S_{C_1}^{H_A} = \frac{s^2 \alpha_2}{s^2 \alpha_2 + \alpha_0} - \frac{s^3 \alpha_3 + s^2 \alpha_2 + s\alpha_1}{s^3 \alpha_3 + s^2 \alpha_2 + s\alpha_1 + \alpha_0} \quad (1\text{-}23)$$

$$S_{C_2}^{H_A} = \frac{s^2 \alpha_2}{s^2 \alpha_2 + \alpha_0} - \frac{s^3 \alpha_3 + s^2 \alpha_2}{s^3 \alpha_3 + s^2 \alpha_2 + s\alpha_1 + \alpha_0}$$

$$S_{C_3}^{H_A} = -\frac{s^3 \alpha_3}{s^3 \alpha_3 + s^2 \alpha_2 + s\alpha_1 + \alpha_0}$$

$$S_{G_1}^{H_A} = -\frac{\alpha_0}{s^2 \alpha_2 + \alpha_0} - \frac{\alpha_0}{s^3 \alpha_3 + s^2 \alpha_2 + s\alpha_1 + \alpha_0}$$

$$S_{G_2}^{H_A} = \frac{\alpha_0}{s^2 \alpha_2 + \alpha_0} - \frac{s\alpha_1 + \alpha_0}{s^3 \alpha_3 + s^2 \alpha_2 + s\alpha_1 + \alpha_0}$$

$$S_{G_3}^{H_A} = 1 - \frac{s^2 \alpha_2 + s\alpha_1 + \alpha_0}{s^3 \alpha_3 + s^2 \alpha_2 + s\alpha_1 + \alpha_0}$$

The standard sensitivity analysis above gives the fractional change in the complex magnitude of the transfer function normalized by the fractional change in the component value. Although the transfer function response includes the variations of filtering parameters like fo, the centre frequency, these filtering parameters can not be easily found in an equation derived from the nth-order transfer function. It is really interesting to look at how the parameters describe the filter transfer function shape when the centre frequency fo changes with the various components. The sensitivity frequency responses of fo to each components, C1, C2, C3, G1, G2, and G3 are then illustrated in Sec. V, respectively, to present the following answers: all of the individual sensitivities for fo to each component are low; and all of the sensitivity frequency responses for fo to each component are approximately equal from 10 k Hz to 2 M Hz.

Moreover, it is very interesting that the sum total of some group sensitivities in Eq. (1-23) has a null. They are $$S_{C_1}^{H_A}+S_{G_1}^{H_A}=0, S_{C_2}^{H_A}+S_{G_2}^{H_A}=0, S_{C_3}^{H_A}+S_{G_3}^{H_A}=0,$$

$$S_{C_1}^{H_A}+S_{G_1}^{H_A}+S_{C_2}^{H_A}+S_{G_2}^{H_A}+S_{C_3}^{H_A}+S_{G_3}^{H_A}=0 \quad (1\text{-}24)$$

The above null relationships lead to zero group sensitivities if the component value variations of all the relative sensitivities have the same incremental percentage or decrement. Therefore, the technique to obtain the same incremental percentage or decrement for some group components has become an interesting research topic in the field of integrated circuits manufacture although it is almost impossible to cancel out the on-chip component variation due to the non-systematic (stochastic) variations. Note that the sensitivity simulations in the following section will illustrate that the largest sensitivity of the new third-order all-pass filter structure illustrated in FIG. 1-6 is 0.58372, which is a little bit smaller than 0.63008 of a second-order passive LC lattice all-pass filter, and a little bit larger than 0.52505 of a third-order passive LC ladder low-pass filter.

1.3 Comparison to Previous Work

FIG. 1-6 illustrates how the new filter structure provides third-order all-pass response. It can be seen that the filter has two DDCCs, one FDCCII, three grounded capacitors, and three grounded resistors. In general the new filter structure, illustrated in FIGS. 1-4 and 1-5, for a given order of n, has n−1 DDCCs, one FDCCII, n grounded capacitors, and n grounded resistors. FIGS. 1-10, 1-11, and 1-12 illustrate the third-order all-pass filter circuits derived from the filter structures illustrated in the related art. It can be seen that the circuit (FIG. 1-6) derived from the new structure employs one and two fewer current conveyor(s) than the circuits illustrated in FIGS. 1-10, 1-11, and FIG. 1-12, respectively. It can be seen that the new filter structures (FIGS. 1-4 to 1-9), which can realize all-pass filters, have the least number of current conveyors, n, compared to n+1 (FIGS. 1-10 and 1-11), and n+2 (FIG. 1-12), and the least number of resistors, n, compared to 2n+2 (FIG. 1-11), 2n+3 (FIG. 1-10), and 3n+2 (FIG. 1-12). Moreover, the (FIGS. 1-4 to 1-9) uses all grounded capacitors unlike those in FIG. 1-10 and FIG. 1-11. Table 1-1 illustrates the comparison with recently reported third-order current conveyor-based all-pass filters in terms of the analog layout area and the power consumption. H-spice simulations result in the power consumptions, 15.4 mW, 46.5 mW, 47.6 mW, and 60.2 mW, for the new third-order all-pass filter illustrated in FIG. 1-6, and the previous third-order all-pass filters illustrated in FIGS. 1-10, 1-11, and 1-12, respectively, using the component values: the capacitance 4 pF and the resistances, 3.979 kΩ, 7.958 kΩ, and 15.716 kΩ. As can be seen, the power consumption of the new one is much lower and only about 33.3%, 35%, and 40% of those dissipated by the previous ones as illustrated in FIGS. 1-10, 1-11 and 1-12 respectively. The analog layout areas of the new third-order all-pass filter, illustrated in FIG. 1-6, and the previous third-order all-pass filters, illustrated in FIGS. 1-10, 1-11, and 1-12, are 151157.25(=1223.45×123.55) μm2, 77685.25(=436.55×156.45) μm2, 80572.65(=515.5×156.3) μm2, and 202250.07(=475.1×425.7) μm2, respectively, and illustrated in FIGS. 1-13 to 1-16. It is noted that an FDCCII, a DDCC−, a CCII+, and a CFA have the layout areas, 102916.455(=835.7×123.15) μm2, 4260.09 (=100.95×42.2) μm2, 8078.525 (=68.9×117.25) μm2, and 18537.225 (=158.1×117.25) μm2, respectively, all of which imply that the FDCCII is much bigger in size than the other three active elements and the DDCC− is the smallest one in the above four different kinds of active elements. Since the new nth-order all-pass filter structure uses n−1 DDCC but only one FDCCII, the disadvantage of the big FDCCII used is less dominant when the order is getting higher.

TABLE 1-1

Comparison with recently reported current conveyor-based all-pass filters

| Case | Parameter Power (mW) | Area (μm²) |
|---|---|---|
| 3rd-order in FIG. 1-10 of reference [19] | 15.4 | 151157.25 (= 1223.45 × 123.55) |
| 3rd-order in FIG. 1-11 of reference [21] | 46.5 | 77685.25 (= 436.55 × 156.45) |
| 3rd-order in FIG. 1-12 of reference [22] | 47.6 | 80572.65 (= 515.5 × 156.3) |
| 3rd-order in FIG. 1-6 of present invention | 60.2 | 202250.07 (= 475.1 × 425.7) |

Another parameter which needs comparison when considering different filter structures is the spread of filter component values which may be large for high-order filters. A wider spread of filter component values leads to increase the total capacitance value or the total power dissipation due to the need of larger biasing currents. In other words, a worse implementation carried out in CMOS processes which will create larger chip area or the quadratic current ratios. To give insight into what the component spread of the new filter structure is, as an example, we have compared the component spread of third-order Butterworth all-pass filters realized using the circuits in the related art and the new third-order filter illustrated in FIG. 1-6. The common third-order Butterworth all-pass transfer function is given by $$\frac{V_{out}}{V_{in}} = (\pm 1)\frac{s^3 - 2s^2 + 2s - 1}{s^3 + 2s^2 + 2s + 1} \quad (1\text{-}25)$$

The transfer functions of the new third-order all-pass filter in FIG. 1-6 and the recently reported third-order all-pass filters in references [19, 21, 22] are presented in Eqs. (1-22), and (1-26) to (1-28), respectively.

$$\frac{V_{out}}{V_{in}} = \frac{\begin{bmatrix} -s^3 C_1 C_2 C_3 G_8 ++ \\ \left(\frac{s^2 C_1 C_2 G_3 G_5 (G_7 + G_8 + G_9)}{(G_5 + G_{10})} - \right) + \\ s^2 C_1 C_2 G_3 G_8 \\ \left(\frac{s C_1 G_2 G_3 G_5 (G_7 + G_8 + G_9)}{(G_5 + G_{10})} - \right) + \\ s C_1 G_2 G_3 G_7 - s C_1 G_2 G_3 G_8 \\ G_1 G_2 G_3 G_9 \end{bmatrix}}{G_{11}\left(\begin{matrix} s^3 C_1 C_2 C_3 + s^2 C_1 C_2 G_3 + \\ s C_1 G_2 G_3 + G_1 G_2 G_3 \end{matrix}\right)} \quad (1\text{-}26)$$

$$\frac{V_{out}}{V_{in}} = \frac{\begin{bmatrix} (-G_7)\left(\begin{matrix}s^3 C_1 C_2 C_3 + s^2 C_1 C_2 G_4 + \\ s C_1 G_3 G_4 + G_2 G_3 G_4\end{matrix}\right) + \\ (G_5)(s^2 C_1 C_2 G_4 + s C_1 G_3 G_4 + G_2 G_3 G_4) ++ \\ (-G_6)(s C_1 G_3 G_4 + G_2 G_3 G_4) + G_1 G_2 G_3 G_4 \end{bmatrix}}{(G_8)\left(\begin{matrix}s^3 C_1 C_2 C_3 + s^2 C_1 C_2 G_4 + \\ s C_1 G_3 G_4 + G_2 G_3 G_4\end{matrix}\right)} \quad (1\text{-}27)$$

$$\frac{V_{out}}{V_{in}} = \frac{\begin{bmatrix} (-G_6)\left(\begin{matrix}s^3 C_1 C_2 C_3 + s^2 C_1 C_2 G_9 + \\ s C_1 G_2 G_{10} + G_2 G_3 G_{11}\end{matrix}\right) + \\ (G_1)(s^2 C_1 C_2 G_7 + s C_1 G_2 G_8 + G_2 G_3 G_4) \end{bmatrix}}{(-G_5)\left(\begin{matrix}s^3 C_1 C_2 C_3 + s^2 C_1 C_2 G_9 + \\ s C_1 G_2 G_{10} + G_2 G_3 G_{11}\end{matrix}\right)} \quad (1\text{-}28)$$

Table 1-2 gives the component spread for equal denominator conductance (GD) and equal capacitance (C) designs for the comparison of the third-order Butterworth all-pass filters designed using the new analytical synthesis method (FIG. 1-6) and those reported in the related art. In Table 1-2, GD and GN represent the conductances in the denominator and the numerator, respectively. The comparison results over all are illustrated as below.

The filters illustrated in FIGS. 1-10 and 1-11 have the larger component spread for both equal capacitance and equal denominator conductance designs.

The filter illustrated in FIG. 1-12 has the smaller component spread for equal capacitance design.

The new proposed filter illustrated in FIG. 1-6 has the smaller component spread for equal denominator conductance design.

TABLE 1-2

Component spread comparison of third-order all-pass Butterworth filters

| | Spread | | | | | |
|---|---|---|---|---|---|---|
| | Equal GD | | | | Equal C | |
| Case | GNmin | GNmax | Cmin | Cmax | Gmin | Gmax |
| FIG. 1-10 | 1 | 2 | 0.5 | 2 | 0.5 | 2 |
| FIG. 1-11 | 1 | 2 | 0.5 | 2 | 0.5 | 2 |
| FIG. 1-12 | 1 | 2 | 0.5 | 2 | 1 | 2 |
| FIG. 1-6 | 1 | 1 | 0.5 | 2 | 0.5 | 2 |

Finally, only the new third-order all-pass filter has high input impedance good for cascadability with the former stage circuit. Moreover, it should be noted that a voltage follower may be necessary at the output of each of the above three filters illustrated in FIGS. 1-6, 1-10, and 1-11 (except the one illustrated in FIG. 1-12) to buffer the output and avoid the effects of load capacitance or resistance changing the response of the filter.

1.4 H-Spice Simulations

To verify the theoretical analysis of the proposed equal capacitance filter structures illustrated in FIG. 1-6, a third-order all-pass filter has been simulated using the H-Spice with TSMC035 process (±1.65V supply voltages), and the CMOS implementations of the DDCC and FDCCII presented in the related art. The component values are given by all C=20 pF, $R1=3.98$ k$\Omega$, $R2=7.96$ k$\Omega$, and $R3=15.9$ k$\Omega$. The simulated all-pass phase-frequency response is illustrated in FIG. 1-17 with simulated fo=986.54 k Hz (1.35% error when compared with the theoretical 1 MHz). As can be seen, there is a close agreement between theory and simulation. On the other hand, the sensitivity simulations have also been done. The sensitivity simulations with +5% C1, +5% C2, +5% C3, +5% R1, +5% R2, and +5% R3 tolerances have fo=976.9 k, 976.8 k, 977.5 k, 958.3 k, and 976.9 k Hz, with −0.97%, −2.81%, −0.98%, −0.91%, −2.86%, and −0.97% errors (compared with the nominal fo=986.54 k Hz), respectively. These illustrate that all of the individual sensitivities are very low. In addition to these, the sensitivity frequency responses for fo to each component from 10 k Hz to 2 M Hz are illustrated in Table 1-3 and FIG. 1-18, all of which illustrate that the individual sensitivity is not larger than 0.58372 and independent of the frequency. And we note that the group sensitivity simulations for both +5% C1 and +5% G1, both +5% C2 and +5% G2, and both +5% C3 and +5% G3 tolerances have fo=986.56 k, 986.96 k, and 985.87 k Hz, with very low 0.002%, 0.04%, and −0.065% errors, respectively, all of which are near 0% error, illustrated in FIGS. 1-19 to 1-21, and meet the theoretical predictions in Eq. (1-24). Note that the individual sensitivities to C1, C2, C3, C4, L1, L2, L3, L4, and R of the symmetrical lattice topology, illustrated in FIG. 1-22, a second-order passive all-pass filter, are −0.50325, −0.02742, 0.01146, 0.00001, −0.46386, −0.02821, −0.63008, 0.00000, and 0.00018, respectively, based on the given element values: $C1=C4=1.13$ nF, $C2=C4=172$ pF, $L1=L4=15.5$ μH, $L2=L3=102$ μH and $R=300\Omega$ with the nominal central frequency fo=1.212 MHz. And the total sensitivity for each component with 10% tolerance is −0.86127 unlike the approximate null group sensitivity for the new third-order all-pass filter illustrated in FIG. 1-6. A doubly terminated third-order low-pass LC filter illustrated in FIG. 1-23 is simulated and illustrates that the individual sensitivities to C1, L1, L2, Ri, and Ro are −0.52505, −0.21801, −0.23006, −0.05614, and −0.05969, respectively, based on the given element values: $C1=2.673$ nF, $L1=L2=6.68$ μH, $Ri=Ro=50\Omega$ with the nominal central frequency fo=1.81186 MHz. And the total sensitivity for each component with 10% tolerance is 0.000789 like the approximate null group sensitivity for the new third-order all-pass filter illustrated in FIG. 1-6. Moreover, it is noted that the largest individual sensitivity with absolute value, 0.58372, of the new third-order all-pass filter illustrated in FIG. 1-6 is a little bit lower than that, 0.63008, of the second-order passive all-pass filter illustrated in FIG. 1-22, and a little bit higher than that, 0.52505, of the third-order passive LC ladder low-pass filter illustrated in FIG. 1-23.

1.5 Conclusions

New Analytical Synthesis Method by using a succession of innovative algebra manipulation operations to decompose a complicated nth-order all-pass filter transfer function into a set of simple and realizable equations is illustrated for reducing the component count and spread of the recently reported nth-order voltage-mode current conveyor based all-pass filter structures. The two important features: (i) higher performance and (ii) lower cost, of the presented filter structures are (i) the use of only n active elements, n capacitors and n resistors i.e., the minimum number of active and passive components, for an nth-order filter structure, and (ii) the use of all grounded capacitors and all grounded resistors, both of which are with much lower parasitics than floating capacitors and floating resistors. The new filter structures also offer both structure types of equal capacitance for easier integrated circuit fabrication and equal conductance for simpler biasing circuitry and the same accuracy and the same parasitic capacitance for each realized transconductor. The attractive advantages of very low individual sensitivities like the passive LC filters, very low power consumption when compared to the previous work, have been proved by using H-Spice simulations. Finally, the voltage-mode realization can also be easily transferred to the trans-admittance-mode one by first disconnecting the loop including the X− and Z− terminals of the single FDCCII, then adding a grounded resistor at terminal X−, and then taking out the output current signal Iout from terminal Z−.

TABLE 1-3

Sensitivities of centre frequency to each component for the new 3rd-order AP filter

| Case | Sensi. (10 kHz) | Sensi. (50 kHz) | Sensi. (0.1 MHz) | Sensi. (0.5 MHz) | Sensi. (1 MHz) | Sensi. (1.5 MHz) | Sensi. (2 MHz) |
|---|---|---|---|---|---|---|---|
| C1 + 10% | −0.19388 | −0.19414 | −0.19351 | −0.19289 | −0.19093 | −0.18992 | −0.18841 |
| C2 + 10% | −0.55143 | −0.55126 | −0.55044 | −0.54778 | −0.55392 | −0.53856 | −0.53493 |
| C3 + 10% | −0.18718 | −0.18764 | −0.18728 | −0.18879 | −0.20005 | −0.1906 | −0.19089 |
| G1 + 10% | 0.18608 | 0.18612 | 0.18644 | 0.18617 | 0.19178 | 0.18965 | 0.19121 |
| G2 + 10% | 0.58365 | 0.58337 | 0.58372 | 0.58250 | 0.58225 | 0.58265 | 0.58302 |
| G3 + 10% | 0.18848 | 0.18838 | 0.18848 | 0.16655 | 0.18602 | 0.18585 | 0.18450 |

2. Analytical Synthesis of High-Order Voltage-Mode DDCC and FDCCII-Grounded R and C Low-Pass and High-Pass Filter Structure The advantages of the Analytical Synthesis Methods (ASMs) have been clearly and effectively demonstrated in the realization of high-order current/voltage-mode Operational Trans-conductance Amplifier and Capacitor (OTA-C) filters, where a complicated nth-order transfer function is manipulated and decomposed by a succession of innovative algebra operations until a set of simple equations are produced, which are then realized using n integrators and a constraint circuitry. In fact, the new Analytical Synthesis Method can be used in the design of any kind of linear system with a stable transfer function. The ASM is carried out according to the following steps. At step 1, the "decomposition" of a complicated nth-order function is transferred into a set of simple and realizable equations. At step 2, the "realization" of each simple equation obtained from step 1 are corresponded to simple sub-circuitries. At step 3, all of the simple sub-circuitries are combined for constructing a whole complicated circuit structure. This section describes new ASMs for the realization of high-order voltage-mode Differential Difference Current Conveyor (DDCC)-grounded resistor and capacitor low-pass and/or high-pass filter structures. Since (i) grounded resistors and capacitors are with much lower parasitics than floating resistors and capacitors, and (ii) the minimum number of active and passive components lead to the lowest total parasitics, power consumption, noise, and integrated circuit area, both of which simultaneously achieve the two features of an ASM: (i) higher out performance, and (ii) lower manufacture cost and energy consumption, without tradeoff.

The general transfer function of an nth-order high-pass filter can be expressed as:

$$\frac{V_{out}}{V_{in}} = \left( \frac{a_n s^n}{\sum_{i=0}^{i=n} a_i s^i} \right) \quad (2\text{-}1)$$

Let $$V_{out} - V_{in} \equiv V_{out}^* = \frac{\left( \frac{-a_{n-1}s^{n-1} - a_{n-2}s^{n-2} - \ldots -}{a_i s^i - \ldots - a_1 s - a_0} \right) V_{in}}{a_n s^n + a_{n-1} s^{n-1} + a_{n-2} s^{n-2} + \ldots + a_3 s^3 + a_2 s^2 + a_1 s + a_0} \quad (2\text{-}2)$$

Cross multiplying Eq. (2-2), and dividing by $a_{n-1}s^{n-1}$, we get $$\left( \frac{a_n}{a_{n-1}} s + 1 + \frac{a_{n-2}}{a_{n-1}s} + \ldots + \frac{a_2}{a_{n-1}s^{n-3}} + \frac{a_1}{a_{n-1}s^{n-2}} + \frac{a_0}{a_{n-1}s^{n-1}} \right) V_{out}^* = \quad (2\text{-}3)$$

$$\left( -1 - \frac{a_{n-2}}{a_{n-1}s} - \frac{a_{n-3}}{a_{n-1}s^2} - \ldots - \frac{a_i}{a_{n-1}s^{n-1-i}} \ldots - \frac{a_1}{a_{n-1}s^{n-2}} - \frac{a_0}{a_{n-1}s^{n-1}} \right) V_{in}$$

Rearranging Eq. (2-3), we have $$\left( \frac{a_n}{a_{n-1}} s + 1 \right) V_{out}^* + \quad (2\text{-}4)$$

$$\left( \frac{a_{n-2}}{a_{n-1}s} + \frac{a_{n-3}}{a_{n-1}s^2} + \ldots + \frac{a_1}{a_{n-1}s^{n-2}} + \frac{a_0}{a_{n-1}s^{n-1}} \right) V_{out}^* +$$

$$\left( \frac{a_{n-2}}{a_{n-1}s} + \frac{a_{n-3}}{a_{n-1}s^2} + \ldots + \frac{a_i}{a_{n-1}s^{n-1-i}} + \ldots + \frac{a_1}{a_{n-1}s^{n-2}} + \frac{a_0}{a_{n-1}s^{2}} \right)$$

$$V_{in} = -V_{in}$$

Since $$\left( \frac{a_{n-2}}{a_{n-1}s} \right) V_{out}^* + \left( \frac{a_{n-2}}{a_{n-1}s} \right) V_{in} + \left( \frac{a_{n-3}}{a_{n-1}s^2} \right) V_{out}^* + \left( \frac{a_{n-3}}{a_{n-1}s^2} \right) V_{in} = \quad (2\text{-}5)$$

$$\left( \frac{a_{n-2}}{a_{n-1}s} \right) (V_{out}^* + V_{in}) + \left( \frac{a_{n-2}}{a_{n-1}s} \right) \left( \frac{a_{n-3}}{a_{n-2}s} \right) (V_{out}^* + V_{in}) =$$

$$\left( \frac{a_{n-2}}{a_{n-1}s} \right) \left[ (V_{out}^* + V_{in}) + \left( \frac{a_{n-3}}{a_{n-2}s} \right) (V_{out}^* + V_{in}) \right]$$

applying the combination of (2-5), Eq. (2-4) becomes:

$$\left( \frac{a_n}{a_{n-1}} s + 1 \right) V_{out}^* + \quad (2\text{-}6)$$

$$\left( \frac{a_{n-2}}{a_{n-1}s} \right) \left[ \begin{array}{l} (V_{out}^* + V_{in}) + \\ \ldots \left( \frac{a_i}{a_{i-1}s} \right) \left[ \begin{array}{l} (V_{out}^* + V_{in}) + \\ \ldots \left( \frac{a_i}{a_2 s} \right) \left[ \begin{array}{l} (V_{out}^* + V_{in}) + \\ \left( \frac{a_0}{a_1 s} \right) (V_{out}^* + V_{in}) \end{array} \right] \ldots \end{array} \right] \ldots \end{array} \right] =$$

$$-V_{in}$$

ASM I-1: Therefore, the following n simple equations derived from Eq. (2-6) can be obtained by letting the new node voltages, Vn, where n=1, 2 . . . , and n–1.

$$\left( \frac{a_0}{a_1} \right) (V_{out}^* + V_{in}) \equiv sV_1 \quad (2\text{-}7\text{-}1)$$

$$\left( \frac{a_1}{a_2} \right) [V_{out}^* + V_{in} + V_1] \equiv sV_2 \quad (2\text{-}7\text{-}2)$$

$$\left( \frac{a_2}{a_3} \right) [V_{out}^* + V_{in} + V_2] \equiv sV_3 \quad (2\text{-}7\text{-}3)$$

...

$$\left( \frac{a_{i-1}}{a_i} \right) [V_{out}^* + V_{in} + V_{i-1}] \equiv sV_i \quad (2\text{-}7\text{-}i)$$

...

$$\left( \frac{a_{n-3}}{a_{n-2}} \right) [V_{out}^* + V_{in} + V_{n-3}] \equiv sV_{n-2} \quad (2\text{-}7\text{-}n\text{-}2)$$

$$\left( \frac{a_{n-2}}{a_{n-1}} \right) [V_{out}^* + V_{in} + V_{n-2}] \equiv sV_{n-1} \quad (2\text{-}7\text{-}n\text{-}1)$$

Then, Eq. (2-6) becomes $$\left( \frac{a_n}{a_{n-1}} s + 1 \right) V_{out}^* + V_{n-1} = -V_{in},$$

which can be re-arranged as $$\left( \frac{a_{n-1}}{a_n} \right) [V_{out}^* + V_{in} + V_{n-1}] \equiv -sV_{out}^* \quad (2\text{-}7\text{-}n)$$

Note that (i) the final equation (2-7-n) is with the output voltage, $V^*_{out}$; and (ii) the first equation (2-7-1) is with the second output voltage, $V^*_{out}+V_{in}$, both of which are used in the design of the differential difference current conveyor (DDCC) based filter structure. The input-output characteristics of a DDCC in references [23, 24] are illustrated in the following matrix equation:

$$\begin{bmatrix} V_X \\ I_{Y1} \\ I_{Y2} \\ I_{Y3} \\ I_{Z\pm} \end{bmatrix} = \begin{bmatrix} 0 & 1 & -1 & 1 & 0 \\ 0 & 0 & 0 & 0 & 0 \\ 0 & 0 & 0 & 0 & 0 \\ 0 & 0 & 0 & 0 & 0 \\ \pm 1 & 0 & 0 & 0 & 0 \end{bmatrix} \begin{bmatrix} I_X \\ V_{Y1} \\ V_{Y2} \\ V_{Y3} \\ V_{Z\pm} \end{bmatrix} \quad (2\text{-}8)$$

In (2-8), the + or − sign of the ±1 denotes the type of the DDCC. The + and − signs lead to the plus and minus-type DDCCs, respectively. Observing (2-7-1) to (2-7-n), based upon the definition of a DDCC illustrated in Eq. (2-8), i.e., Vx=VY1−VY2+VY3, in which only two terms can be given by positive signals, we need to apply the second output voltage $V^*_{out}+V_{in}$ to do the realization accordingly. Then, (2-7-1), (2-7-n-1), and (2-7-n) can be realized using a single DDCC as those illustrated in FIGS. 2-1 to 2-3, respectively.

Figures 1, 2:
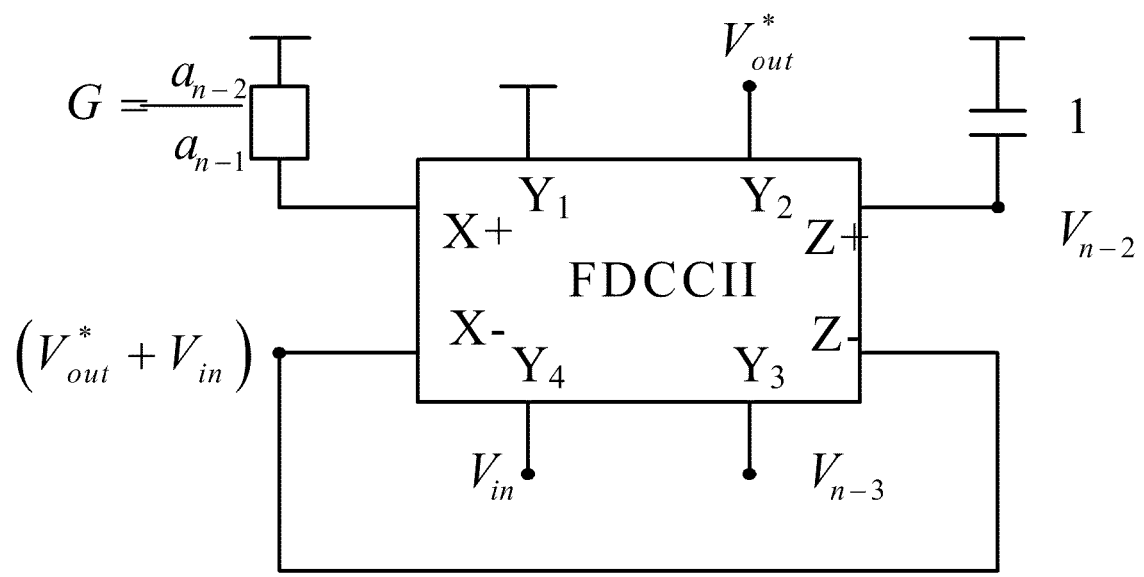
Figures 1, 2, 3:
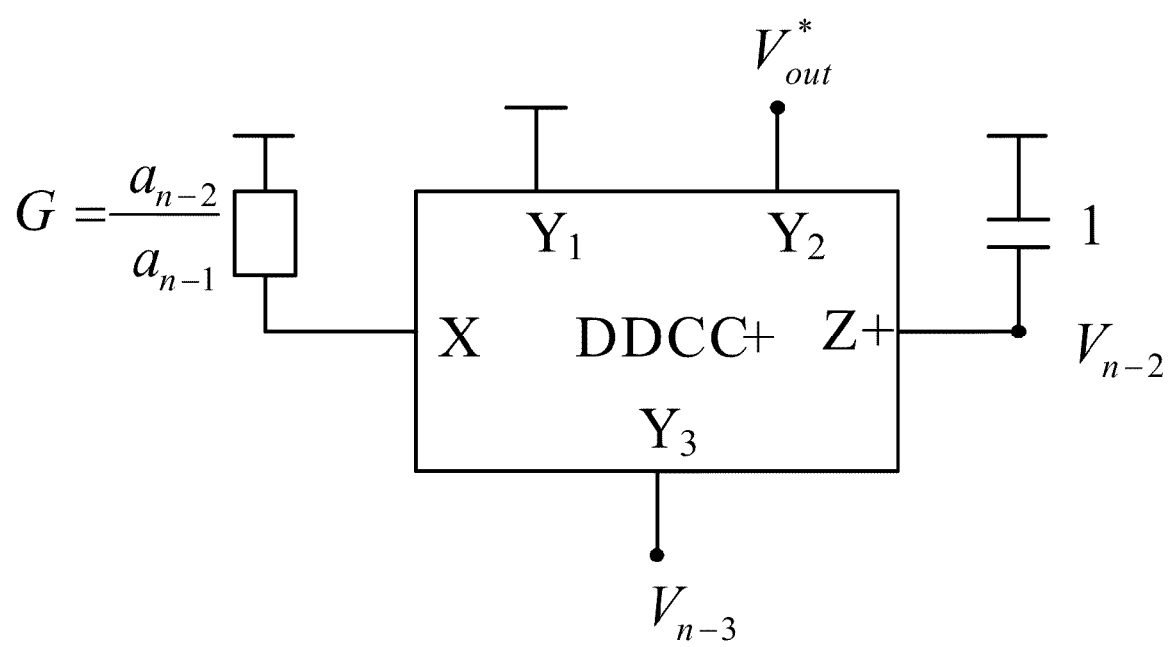
Figures 1, 2, 3, 4:
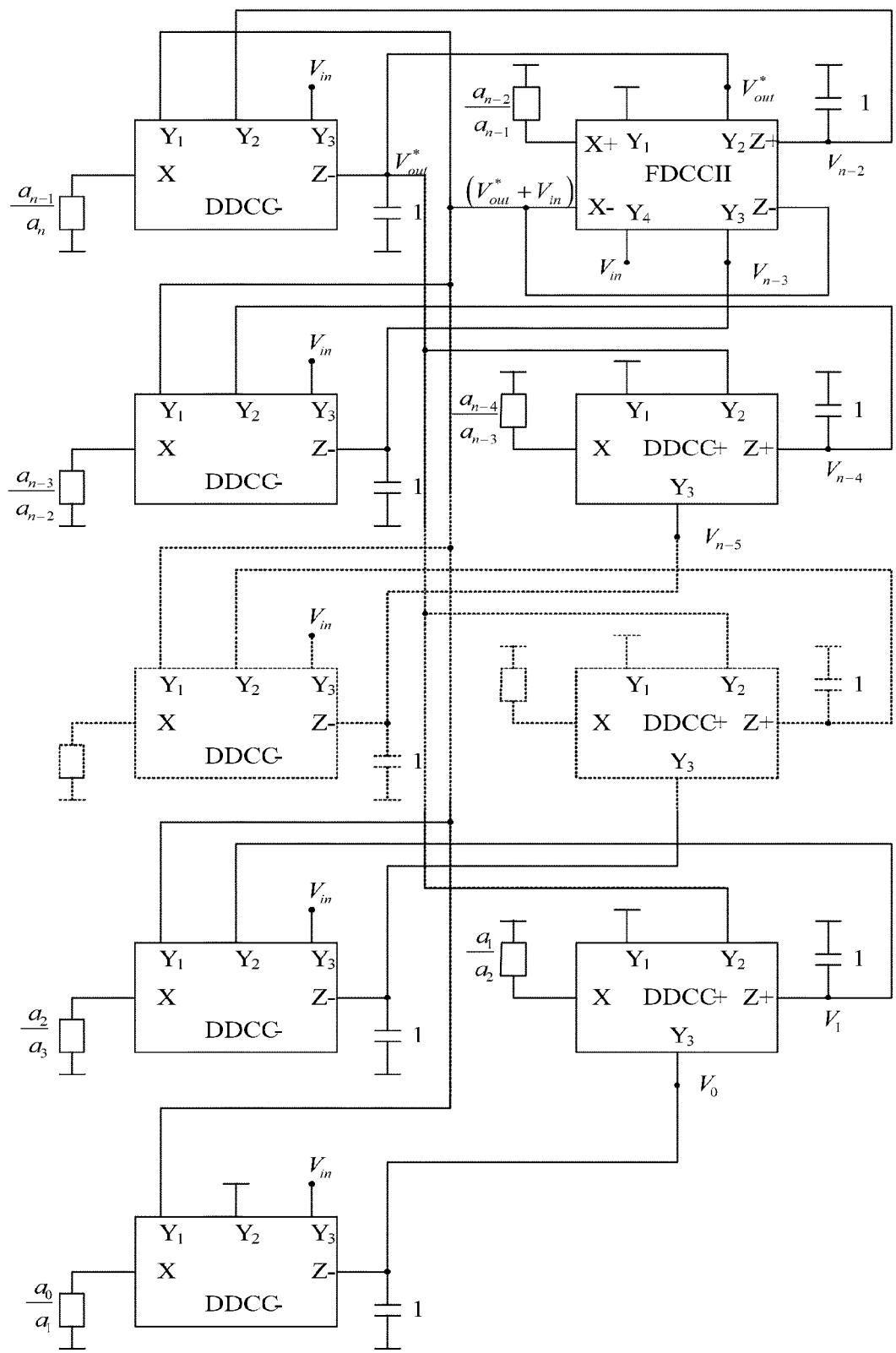

It can be noted that the first output voltage, $V^*_{out}$, generated from FIG. 2-3 can be the input voltage signal of FIG. 2-1, and the second output voltage, $V^*_{out}+V_{in}$, generated from FIG. 2-1 can be the input voltage signal of both FIGS. 2-2 and 2-3. The combination of the n realizations for (2-7-1) to (2-7-n) in those equations is illustrated in FIG. 2-4 employing n−1 plus-type DDCCs, one minus-type DDCC, n grounded capacitors, and n grounded resistors. The main advantages, leading to achieve the two features: (i) higher performance and (ii) lower cost, of the presented filter structure are (i) the use of only n active elements, n capacitors and n resistors i.e., the minimum number of active and passive components, for an nth-order filter structure, and (ii) the use of all grounded capacitors and all grounded resistors, both of which are with much lower parasitics than floating capacitors and floating resistors. Note that the second output signal, $V^*_{out}+V_{in}$, illustrated in FIG. 2-4 is an nth-order high-pass filtering signal (referring to (2-2)). Observing (2-2), an inverting low-pass transfer function can be obtained from the output voltage, $V^*_{out}$, by deleting the terms with the underline in (2-2). The realization of the nth-order inverting low-pass filtering signal can be synthesized from (2-7-1) to (2-7-n) after deleting the terms with the underline and illustrated in FIG. 2-5. FIG. 2-6 is the combination of both FIGS. 2-4 and 2-5 using two switches SLP and SHP. As SLP (resp. SHP) is closed and SHP (resp. SHP) is open, $V^*_{out}$ (resp. $V^*_{out}+V_{in}$) has an nth-order inverting low-pass (resp. non-inverting high-pass) filtering output signal. The inverting band-pass filtering output signal cannot be realized using the filter structure illustrated in FIG. 2-6 due to the three positive terms in the bracket (leading to the difficulty to realize them using VX=VY1−VY2+VY3) in (2-7-2) to (2-7-n). Note that the filter structure of FIG. 2-6 is digitally programmable.

3. Analytical Synthesis of High-Order Voltage-Mode DDCC and FDCCII-Grounded R and C Multifunction Filter Structures The advantages of the Analytical Synthesis Methods (ASMs) have been clearly and effectively demonstrated in the realization of high-order current/voltage-mode Operational Trans-conductance Amplifier and Capacitor (OTA-C) filters, where a complicated nth-order transfer function is manipulated and decomposed by a succession of innovative algebra operations until a set of simple equations are produced, which are then realized using n integrators and a constraint circuitry. In fact, the new Analytical Synthesis Method can be used in the design of any kind of linear system with a stable transfer function. The ASM is carried out according to the following steps. At step 1, the "decomposition" of a complicated nth-order transfer function into a set of simple and realizable equations. At step 2, the "realization" of each simple equation obtained from step 1 to a corresponding simple sub-circuitry. At step 3, the "combination" of all the simple sub-circuitries for constructing the whole complicated circuit structure. This section describes new ASMs for the realization of high-order voltage-mode differential difference current conveyor (DDCC)-grounded resistor and capacitor low-pass, band-pass, high-pass, or band-reject, or all-pass filter structures. Since (i) grounded resistors and capacitors are with much lower parasitics than floating resistors and capacitors, and (ii) the minimum number of active and passive components lead to the lowest total parasitics, power consumption, noise, and integrated circuit area, both of which simultaneously achieve the features of an ASM: (i) highest output performance, and (ii) lowest manufacture cost and energy payment, without tradeoff.

The general transfer function of an nth-order high-pass filter is:

$$\frac{V_{out}}{V_{in}} = \left(\frac{a_n s^n}{\sum_{i=0}^{i=n} a_i s^i}\right) \quad (3\text{-}1)$$

Let $$V_{out} - V_{in} \equiv V^*_{out} = \frac{\left(\begin{array}{c}-a_{n-1}s^{n-1} - a_{n-2}s^{n-2} - \ldots - \\ a_i s^i - \ldots - a_1 s - a_0\end{array}\right)V_{in}}{a_n s^n + a_{n-1}s^{n-1} + a_{n-2}s^{n-2} + \ldots + a_3 s^3 + a_2 s^2 + a_1 s + a_0} \quad (3\text{-}2)$$

Cross multiplying Eq. (3-2), and dividing by $a_{n-1}s^{n-1}$, we get $$\left(\frac{a_n}{a_{n-1}}s + 1 + \frac{a_{n-2}}{a_{n-1}s} + \ldots + \frac{a_2}{a_{n-1}s^{n-3}} + \frac{a_1}{a_{n-1}s^{n-2}} + \frac{a_0}{a_{n-1}s^{n-1}}\right)V^*_{out} = \left(\begin{array}{c}-1 - \frac{a_{n-2}}{a_{n-1}s} - \frac{a_{n-3}}{a_{n-1}s^2} - \ldots - \frac{a_i}{a_{n-1}s^{n-1-i}} - \ldots \\ \frac{a_1}{a_{n-1}s^{n-2}} - \frac{a_0}{a_{n-1}s^{n-1}}\end{array}\right)V_{in} \quad (3\text{-}3)$$

Rearranging Eq. (3-3), we have $$\left(\frac{a_n}{a_{n-1}}s + 1\right)V^*_{out} + \quad (3\text{-}4)$$
$$\left(\frac{a_{n-2}}{a_{n-1}s} + \frac{a_{n-3}}{a_{n-1}s^2} + \ldots + \frac{a_1}{a_{n-1}s^{n-2}} + \frac{a_0}{a_{n-1}s^{n-1}}\right)V^*_{out} +$$
$$\left(\frac{a_{n-2}}{a_{n-1}s} + \frac{a_{n-3}}{a_{n-1}s^2} + \ldots + \frac{a_1}{a_{n-1}s^{n-1-i}} + \ldots + \frac{a_1}{a_{n-1}s^{n-2}} + \frac{a_0}{a_{n-1}s^{n-1}}\right)$$
$$V_{in} = -V_{in}$$

Since $$\left(\frac{a_{n-2}}{a_{n-1}s}\right)V^*_{out} + \left(\frac{a_{n-2}}{a_{n-1}s}\right)V_{in} + \left(\frac{a_{n-3}}{a_{n-1}s^2}\right)V^*_{out} + \left(\frac{a_{n-3}}{a_{n-1}s^2}\right)V_{in} = \quad (3\text{-}5)$$
$$\left(\frac{a_{n-2}}{a_{n-1}s}\right)(V^*_{out} + V_{in}) + \left(\frac{a_{n-2}}{a_{n-1}s}\right)\left(\frac{a_{n-3}}{a_{n-2}s}\right)(V^*_{out} + V_{in}) =$$
$$\left(\frac{a_{n-2}}{a_{n-1}s}\right)\left[(V^*_{out} + V_{in}) + \left(\frac{a_{n-3}}{a_{n-2}s}\right)(V^*_{out} + V_{in})\right]$$

applying the combination of (3-5), Eq. (3-4) becomes $$\left(\frac{a_n}{a_{n-1}}s + 1\right)V^*_{out} + \quad (3\text{-}6)$$
$$\left(\frac{a_{n-2}}{a_{n-1}s}\right)\left[\begin{array}{c}(V^*_{out} + V_{in}) + \ldots \\ \left(\frac{a_i}{a_{i+1}s}\right)\left[\begin{array}{c}(V^*_{out} + V_{in}) + \ldots \\ \left(\frac{a_1}{a_2 s}\right)\left[\begin{array}{c}(V^*_{out} + V_{in}) + \\ \left(\frac{a_0}{a_1 s}\right)(V^*_{out} + V_{in})\end{array}\right]\end{array}\right]\ldots\end{array}\right] = -V_{in}$$

On the other hand, we can obtain another n simple equations derived from Eq. (3-6) by letting another new node voltages, Vn, where n=1, 2 . . . , and n−1, as follows.

$$\left(\frac{a_0}{a_1}\right)(V_{out}^* + V_{in}) \equiv -sV_1 \qquad (3\text{-}7\text{-}1)$$

$$\left(\frac{a_1}{a_2}\right)[V_{out}^* + \underline{V_{in}} - V_1] \equiv -sV_2 \qquad (3\text{-}7\text{-}2)$$

$$\left(\frac{a_2}{a_3}\right)[V_{out}^* + \underline{V_{in}} - V_2] \equiv -sV_3 \qquad (3\text{-}7\text{-}3)$$

...

$$\left(\frac{a_{i-1}}{a_i}\right)[V_{out}^* + \underline{V_{in}} - V_{i-1}] \equiv -sV_i \qquad (3\text{-}7\text{-}i)$$

...

$$\left(\frac{a_{n-3}}{a_{n-2}}\right)[V_{out}^* + \underline{V_{in}} - V_{n-3}] \equiv -sV_{n-2} \qquad (3\text{-}7\text{-}n\text{-}2)$$

$$\left(\frac{a_{n-2}}{a_{n-1}}\right)[V_{out}^* + \underline{V_{in}} - V_{n-2}] \equiv -sV_{n-1} \qquad (3\text{-}7\text{-}n\text{-}1)$$

Then, Eq. (3-6) becomes $$\left(\frac{a_n}{a_{n-1}}s + 1\right)V_{out}^* - V_{n-1} = -\underline{V_{in}}$$

which can be re-arranged as $$\left(\frac{a_{n-1}}{a_n}\right)[V_{out}^* + \underline{V_{in}} - V_{n-1}] \equiv -sV_{out}^* \qquad (3\text{-}7\text{-}n)$$

The synthesis of (3-7-1) to (3-7-n) is different from and much easier than that of (2-7-1) to (2-7-n) when using VX=VY1−VY2+VY3. The realized sub-circuitries of (3-7-1), (3-7-n−1), and (3-7-n) are illustrated in FIGS. 3-1 to 3-3, respectively.

Then, the combination of the sub-circuitries realized from (3-7-1) to (3-7-n) is illustrated in FIG. 3-4 employing n minus-type DDCCs, n grounded capacitors, and n grounded resistors. Similarly (referring to section 2), the output voltage $V^*_{out}$ and $V^*_{out}+V_{in}$ supply the nth-order low-pass (if the input voltage signal is supplied only from the Y3 terminal of the top DDCC) or band-pass (if the input voltage signal is supplied only from the Y3 terminal of one of the i-th DDCCs where i is not 0 or n) and high-pass (if the input voltage signal is supplied from the Y3 terminal of all the DDCCs) filtering output signals, respectively.

Note that (3-2) can be re-written as below.

$$V_{out} - V_{in} \equiv V_{out}^* \qquad (3\text{-}8)$$

$$= \frac{\begin{bmatrix} (-a_{n-1}s^{n-1})V_{in}^{n-1} + (-a_{n-2}s^{n-2})V_{in}^{n-2} + \ldots + \\ (-a_2s^2)V_{in}^2 + (-a_1s)V_{in}^1 + (-a_0)V_{in}^0 \end{bmatrix}}{a_n s^n + a_{n-1}s^{n-1} + a_{n-2}s^{n-2} + \ldots + a_3 s^3 + a_2 s^2 + a_1 s + a_0}$$

The input voltage signal Vin illustrated in (3-2) has been differentiated by $V_{in}^0, V_{in}^1, \ldots, V_{in}^{n-2}$, and $V_{in}^{n-1}$ illustrated in (3-8). Then, (3-7-1) to (3-7-n) become $$\left(\frac{a_0}{a_1}\right)(V_{out}^* + V_{in}^0) \equiv -sV_1 \qquad (3\text{-}9\text{-}1)$$

$$\left(\frac{a_1}{a_2}\right)[V_{out}^* + V_{in}^1 - V_1] \equiv -sV_2 \qquad (3\text{-}9\text{-}2)$$

$$\left(\frac{a_2}{a_3}\right)[V_{out}^* + V_{in}^2 - V_2] \equiv -sV_3 \qquad (3\text{-}9\text{-}3)$$

...

$$\left(\frac{a_{i-1}}{a_i}\right)[V_{out}^* + V_{in}^{i-1} - V_{i-1}] \equiv -sV_i \qquad (3\text{-}9\text{-}i)$$

...

$$\left(\frac{a_{n-3}}{a_{n-2}}\right)[V_{out}^* + V_{in}^{n-3} - V_{n-3}] \equiv -sV_{n-2} \qquad (3\text{-}9\text{-}n\text{-}2)$$

$$\left(\frac{a_{n-2}}{a_{n-1}}\right)[V_{out}^* + V_{in}^{n-2} - V_{n-2}] \equiv -sV_{n-1} \qquad (3\text{-}9\text{-}n\text{-}1)$$

$$\left(\frac{a_{n-1}}{a_n}\right)[V_{out}^* + V_{in}^{n-1} - V_{n-1}] \equiv -sV_{out}^* \qquad (3\text{-}9\text{-}n)$$

Figures 1, 2, 3, 4, 5:
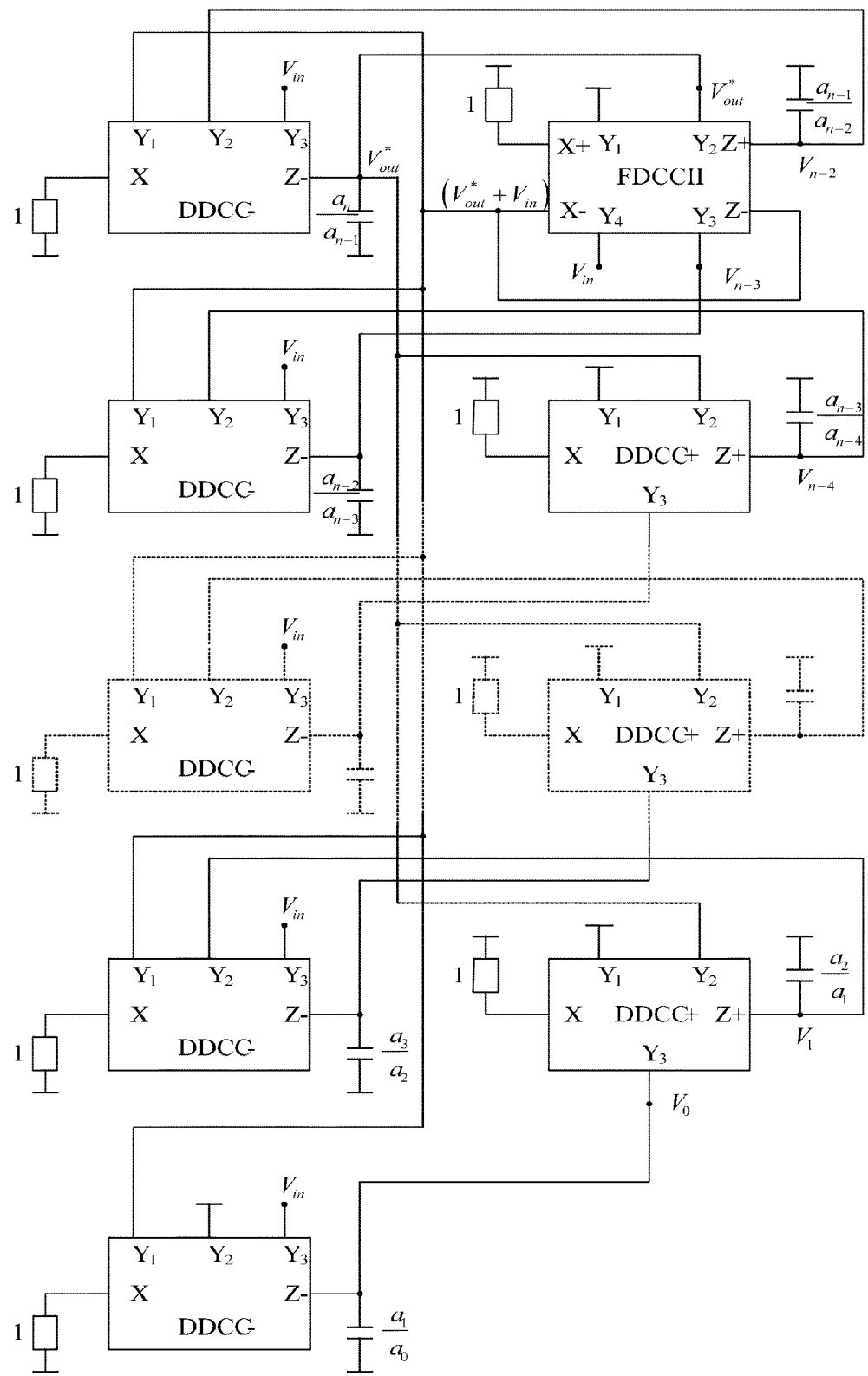

Similar to FIG. 3-4, the realization of (3-9-1) to (3-9-n) is illustrated in FIG. 3-5. Note that there are n input voltage terminals with n differentiated input voltages, i.e., $V_{in}^0, V_{in}^1, \ldots, V_{in}^{n-2}$, and $V_{in}^{n-1}$, illustrated in FIG. 3-5 which is the realization of (3-8). Therefore, (i) the inverting low-pass filtering signal from the output voltage, $V^*_{out}$ can be synthesized, by only letting $V_{in}^0$ be Vin and the others of the n differentiated input voltages be zero, and (ii) the inverting band-pass filtering signal from the output voltage, $V^*_{out}$, by only letting one of $V_{in}^i$ (where i is not 0 or n) be Vin and the others of the n differentiated input voltages be zero, (iii) the non-inverting high-pass filtering signal from the second output voltage, $V^*_{out}+V_{in}$, by letting all the $V_{in}^0, V_{in}^1, \ldots, V_{in}^{n-2}$, and $V_{in}^{n-1}$ be Vin.

An nth-order band-reject filtering function is represented as $$\frac{V_{out}}{V_{in}} = \left(\frac{a_n s^n + a_0}{\sum_{i=0}^{i=n} a_i s^i}\right) \qquad (3\text{-}10)$$

Let $$V_{out} - V_{in} \equiv V_{out}^* \qquad (3\text{-}11)$$

$$= \frac{\begin{bmatrix} (-a_{n-1}s^{n-1})V_{in}^{n-1} + (-a_{n-2}s^{n-2})V_{in}^{n-2} + \ldots + \\ (-a_i s^i)V_{in}^i + \ldots + (-a_2 s^2)V_{in}^2 + (-a_1 s)V_{in}^1 \end{bmatrix}}{a_n s^n + a_{n-1}s^{n-1} + a_{n-2}s^{n-2} + \ldots + a_3 s^3 + a_2 s^2 + a_1 s + a_0}$$

(3-11) is similar to (3-8) but without the constant (s0) term in the numerator and can be decomposed into (3-9-2) to (3-9-n) but (3-9-1) which should be replaced by $$\left(\frac{a_0}{a_1}\right)(V_{out}^*) \equiv -sV_1 \qquad (3\text{-}12)$$

Since the important equation, $V^*_{out}+V_{in}$, for realizing the band-reject filtering function, the top DDCC in FIG. 3-5 must be replaced with an FDCCII-based sub-circuitry illustrated in FIG. 3-6.

Then, FIG. 3-7 illustrated can realize nth-order band-pass and band-reject filtering functions.

The general transfer function of an nth-order all-pass filter is:

$$\frac{V_{out}}{V_{in}} = \left(\frac{\sum_{i=0}^{i=n}(-1)^i a_i s^i}{(-1)^n \sum_{i=0}^{i=n} a_i s^i}\right) \quad (3\text{-}13)$$

Then, if n is an odd integer, $$V_{out} - V_{in} \equiv V_{out}^* \quad (3\text{-}14)$$

$$= \frac{-2a_{n-1}s^{n-1} - 2a_{n-3}s^{n-3} - \ldots - 2a_2 s^2 - 2a_0}{a_n s^n + a_{n-1}s^{n-1} + a_{n-2}s^{n-2} + \ldots + a_3 s^3 + a_2 s^2 + a_1 s + a_0} V_{in}$$

If $n$ is an even integer, $$V_{out} - V_{in} \equiv V_{out}^* \quad (3\text{-}15)$$

$$= \frac{-2a_{n-1}s^{n-1} - 2a_{n-3}s^{n-3} - \ldots - 2a_3 s^3 - 2a_1 s}{a_n s^n + a_{n-1}s^{n-1} + a_{n-2}s^{n-2} + \ldots + a_3 s^3 + a_2 s^2 + a_1 s + a_0} V_{in}$$

(3-14), the equation with odd nth order, can be decomposed into (3-16) as follows.

$$\left(\frac{a_n}{a_{n-1}} s + 1\right) V_{out}^* + \quad (3\text{-}16)$$

$$\left(\frac{1}{a_{n-1}s}\right)\left[\left(\frac{a_{n-3}}{s}\right) + \left[\left(\frac{1}{a_{n-3}s}\right) + \left[\ldots + \left[\left(\frac{a_2}{s}\right) + \left[\left(\frac{1}{a_2 s}\right) + \left[\left(\frac{a_0}{s}\right)(2V_{in} + V_{out}^*) + a_1 V_{out}^*\right]\right]\right](2V_{in} + V_{out}^*)\right] \ldots \right] a_3 V_{out}^* \right] (2V_{in} + V_{out}^*) \right] a_{n-2} V_{out}^* \right] = -2V_{in}$$

Therefore, the following n simple equations can be derived from (3-16) by letting the new node voltages, Vn, where n=0, 1, 2 . . . , and n–2.

$$\left(\frac{a_0}{a_1}\right)(2V_{in} + V_{out}^*) \equiv -sV_1 \quad (3\text{-}17\text{-}1)$$

$$\left(\frac{a_1}{a_2}\right)[-V_1 + V_{out}^*] \equiv -sV_2 \quad (3\text{-}17\text{-}2)$$

$$\left(\frac{a_2}{a_3}\right)[-V_2 + (2V_{in} + V_{out}^*)] \equiv -sV_3 \quad (3\text{-}17\text{-}3)$$

$$\left(\frac{a_3}{a_4}\right)[-V_3 + V_{out}^*] \equiv -sV_4 \quad (3\text{-}17\text{-}4)$$

$$\left(\frac{a_4}{a_5}\right)[-V_4 + (2V_{in} + V_{out}^*)] \equiv -sV_5 \quad (3\text{-}17\text{-}5)$$

…

-continued $$\left(\frac{a_{n-4}}{a_{n-3}}\right)[-V_{n-4} + V_{out}^*] \equiv -sV_{n-3} \quad (3\text{-}17\text{-}n\text{-}3)$$

$$\left(\frac{a_{n-3}}{a_{n-2}}\right)[-V_{n-3} + (2V_{in} + V_{out}^*)] \equiv -sV_{n-2} \quad (3\text{-}17\text{-}n\text{-}2)$$

$$\left(\frac{a_{n-2}}{a_{n-1}}\right)[-V_{n-2} + V_{out}^*] \equiv -sV_{n-1} \quad (3\text{-}17\text{-}n\text{-}1)$$

Then, (3-16) becomes $$\left(\frac{a_n}{a_{n-1}} s + 1\right) V_{out}^* - V_{n-1} = -2V_{in}$$

which can be re-arranged as $$\left(\frac{a_{n-1}}{a_n}\right)[-V_{n-1} + (2V_{in} + V_{out}^*)] \equiv -sV_{out}^* \quad (3\text{-}17\text{-}n)$$

Comparing (3-17) with (3-9), it is found that $V^*_{out}+V_{in}^i$ (3-9) is replaced by $V^*_{out}+2V_{in}$ for (3-17-1), (3-17-3), (3-17-5), . . . , (3-17-n–2), and (3-17-n), or replaced by only $V^*_{out}$ for (3-17-2), (3-17-4), . . . , (3-17-n–3), and (3-17-n–1). Considering both (3-9-n) and (3-17-n) (resp. (3-9-n–1) and (3-17-n–1)), only $V^*_{out}+V_{in}^{n-1}$ (3-9-n) (resp. $V^*_{out}+V_{in}^{n-2}$ (3-9-n–1)) should be replaced by $V^*_{out}+2V_{in}$ in (3-17-n) (resp. only $V^*_{out}$ in (3-17-n–1)). Then, the signal, $V^*_{out}+V_{in}$, but not the signal, $V^*_{out}$, is provided to the Y1 terminal of the bottom minus type DDCC in FIG. 3-5 (resp. only need to get rid of the input voltage signal, $V_{in}^{n-2}$, from the Y3 terminal of the minus type DDCC just next to the bottom). Therefore, the addition of one more voltage signal, $V^*_{out}+V_{in}$, is needed for the whole design, the realization of (3-17-n–1) is then replaced by that illustrated in FIG. 3-8 for producing the signal $V^*_{out}+V_{in}$.

Note that only one node voltage $V^*_{out}+V_{in}$ is needed for the whole design, in other words, only one of the series equations of (3-17-2), (3-17-4), . . . , (3-17-n–1) should be realized using the sub-circuitry illustrated in FIG. 3-8 and the realization of the others keeps the same illustrated in the figure corresponding to (3-9). Finally, the realization of (3-17) is then illustrated in FIG. 3-9, which is equivalent to the all-pass filter structure illustrated in a related art.

Similarly, (3-15) can be derived as (3-18) illustrated as below.

$$\left(\frac{a_n}{a_{n-1}}s+1\right)V^*_{out}+\left(\frac{1}{a_{n-1}s}\right)\left[\left(\frac{a_{n-3}}{s}\right)\left(\frac{1}{a_{n-3}s}\right)\left[\left(\frac{a_1}{s}\right)\left(\frac{1}{a_{n-1}s}\right)\left(\frac{2V_{in}+}{V^*_{out}}\right)+\left(\frac{0}{s}\right)\atop a_0 V^*_{out}\right]+\cdots\atop (2V_{in}+V^*_{out})\right]+\cdots\atop a_{n-2}V^*_{out}\right]=-2V_{in} \quad (3\text{-}18)$$

Then, the following n simple equations from Eq. (3-18) can be obtained by letting the new node voltages, Vn, where n=1, 2 . . . , n−2, and n−1.

$$\left(\frac{a_0}{a_1}\right)[-0+V^*_{out}]\equiv -sV_1 \quad (3\text{-}19\text{-}1)$$

$$\left(\frac{a_1}{a_2}\right)(-V+2V_{in}+V^*_{out})\equiv -sV_2 \quad (3\text{-}19\text{-}2)$$

$$\left(\frac{a_2}{a_3}\right)[-V_2+V^*_{out}]\equiv -sV_3 \quad (3\text{-}19\text{-}3)$$

$$\left(\frac{a_3}{a_4}\right)[-V_3+(2V_{in}+V^*_{out})]\equiv -sV_4 \quad (3\text{-}19\text{-}4)$$

$$\left(\frac{a_4}{a_5}\right)[-V_4+V^*_{out}]\equiv -sV_5 \quad (3\text{-}19\text{-}5)$$

$$\left(\frac{a_5}{a_6}\right)[-V_5+(2V_{in}+V^*_{out})]\equiv -sV_6 \quad (3\text{-}19\text{-}6)$$

...

$$\left(\frac{a_{n-4}}{a_{n-3}}\right)[-V_{n-4}+V^*_{out}]\equiv -sV_{n-3} \quad (3\text{-}19\text{-}n\text{-}3)$$

$$\left(\frac{a_{n-3}}{a_{n-2}}\right)[-V_{n-3}+(2V_{in}+V^*_{out})]\equiv -sV_{n-2} \quad (3\text{-}19\text{-}n\text{-}2)$$

$$\left(\frac{a_{n-2}}{a_{n-1}}\right)[-V_{n-2}+V^*_{out}]\equiv -sV_{n-1} \quad (3\text{-}19\text{-}n\text{-}1)$$

Then, Eq. (3-18) becomes $$\left(\frac{a_n}{a_{n-1}}s+1\right)V^*_{out}-V_{n-1}=-2V_{in}$$

which can be re-arranged as $$\left(\frac{a_{n-1}}{a_n}\right)[-V_{n-1}+(2V_{in}+V^*_{out})]\equiv -sV^*_{out} \quad (3\text{-}19\text{-}n)$$

Note that there are only two types of equations in the above n equations, and are similar to the ones that we considered before when dealing with Eqs. (3-17-1) to (3-17-n). Hence, the sub-circuitries illustrated in FIG. 3-8 can also be used in the realization of (3-19-1) to (3-19-n), whose combination is illustrated in FIG. 3-10.

To verify the theoretical analysis of the proposed equal capacitance filter structures illustrated in FIG. 3-7, a second-order band-pass and band-reject filter has been simulated using the H-Spice with TSMC035 process (±1.65V supply voltages), and the CMOS implementations of the DDCC and FDCCII presented in the related art. The component values are C=30 pF (for theoretical central frequency 1 MHz) and 300 nF (for theoretical central frequency 100 Hz), a2/a1=3.75 kΩ, and a1/a0=7.50 kΩ. The simulated and band-pass (resp. band-reject) amplitude-frequency responses with theoretical central frequencies 1 MHz and 100 Hz are illustrated in FIGS. 3-11 and 3-12 (resp. FIGS. 3-13 and 3-14), respectively, with simulated fo=1.0233 MHz (error 2.33%) and 100 Hz (no error) (resp. fo=exact 1.0000 MHz and exact 100 Hz), and the peaks, 1.0004 and 0.9963 (resp. the deepest values 14.36 m and 4.10 m), respectively. As can be seen, there is a close agreement between the theory and simulation.

To verify the theoretical analysis of the proposed equal capacitance filter structures illustrated in FIG. 3-5, a second-order low-pass, band-pass and high-pass filter has been simulated using the H-Spice with TSMC035 process (±1.65V supply voltages), and the CMOS implementations of the DDCC and FDCCII presented in the related art. The component values are given by C=40 pF (for theoretical resonance frequency 1 MHz) and 400 nF (for theoretical resonance frequency 100 Hz), a1/a2=355.4 μS, and a0/a1=177.7 μS. The simulated low-pass, band-pass and high-pass amplitude-frequency responses with theoretical resonance frequencies 1 MHz and 100 Hz are illustrated in FIGS. 3-15 to 3-20, respectively, with simulated f3 dB=1.0021 MHz (error 0.21%) and 99.775 Hz (error 0.225%) for low-pass responses, fo=1.00 MHz (no error) and 100 Hz (no error) for band-pass responses, and f3 dB=0.950 MHz (error 5.0%) and 99.93 Hz (error 0.07%) for high-pass responses, and the peaks, 0.9993 and 0.9992 for low-pass responses, and 1.011 and 0.9992 for band-pass responses, respectively. As can be seen, there is a close agreement between the theory and simulation.

To verify the theoretical analysis of the proposed equal capacitance filter structures illustrated in FIGS. 3-15(3-9), a third-order all-pass filter has been simulated using the H-Spice with TSMC035 process (±1.65V supply voltages), and the CMOS implementations of the DDCC and FDCCII presented in references [23, 24]. The component values are given by C=40 pF, a2/a3=502.65 μS, a1/a2=251.33 μS, and a0/a1=125.66 μS. The simulated all-pass phase-frequency responses with theoretical central frequencies 1 MHz and 100 Hz are illustrated in FIGS. 3-21 and 3-22, respectively. As can be seen, there is a close agreement between the theory and simulation.

4. Analytical Synthesis of High-Order Voltage-Mode DDCC and FDCCII-Grounded R and C Multifunction Filter Structures The advantages of the Analytical Synthesis Methods (ASMs) have been clearly and effectively demonstrated recently in the realization of high-order current/voltage-mode Operational Trans-conductance Amplifier and Capacitor (OTA-C) filters, where a complicated nth-order transfer function is manipulated and decomposed by a succession of innovative algebra operations until a set of simple equations are produced, which are then realized using n integrators and a constraint circuitry. In fact, the new Analytical Synthesis Method can be used in the design of any kind of linear system with a stable transfer function. The ASM is carried out according to the following steps. At step 1, the "decomposition" of a complicated nth-order function is transferred into a set of simple and realizable equations. At step 2, the "realization" of each simple equation obtained from step 1 are corresponded to simple sub-circuitries. At step 3, all of the simple sub-circuitries for constructing the whole complicated circuit structure. This section describes new ASMs for the realization of high-order voltage-mode Differential Difference Current Conveyor (DDCC) and Fully Differential Current Conveyor (FDCCII)-grounded Resistor and Capacitor low-pass, band-pass, high-pass, and/or band-reject filter structures. Since (i) grounded resistors and capacitors are with much lower parasitics than floating resistors and capacitors, and (ii) the minimum number of active and passive components lead to the lowest total parasitics, power consumption, noise, and integrated circuit area, both of which simultaneously achieve the two features of an ASM: (i) higher output performance, and (ii) lower manufacture cost and energy consumption, without tradeoff.

The general transfer function of an nth-order high-pass filter is:

$$\frac{V_{out}}{V_{in}} = \left(\frac{a_n s^n}{\sum_{i=0}^{i=n} a_i s^i}\right) \quad (4\text{-}1)$$

Let $$V_{in} - V_{out} \equiv V_{out}^* \quad (4\text{-}2)$$

$$= \frac{(a_{n-1}s^{n-1} + a_{n-2}s^{n-2} + \ldots + a_2 s^2 + a_1 s + a_0)V_{in}}{a_n s^n + a_{n-1}s^{n-1} + a_{n-2}s^{n-2} + \ldots + a_3 s^3 + a_2 s^2 + a_1 s + a_0}$$

Cross multiplying Eq. (4-2), and dividing by $a_{n-1}s^{n-1}$, we get $$\left(\frac{a_n}{a_{n-1}}s + 1 + \frac{a_{n-2}}{a_{n-1}s} + \ldots + \frac{a_2}{a_{n-1}s^{n-3}} + \frac{a_1}{a_{n-1}s^{n-2}} + \frac{a_0}{a_{n-1}s^{n-1}}\right)V_{out}^* = \quad (4\text{-}3)$$

$$\left(1 + \frac{a_{n-2}}{a_{n-1}s} + \frac{a_{n-3}}{a_{n-1}s^2} + \ldots + \frac{a_2}{a_{n-1}s^{n-3}} + \frac{a_1}{a_{n-1}s^{n-2}} + \frac{a_0}{a_{n-1}s^{n-1}}\right)V_{in}$$

Rearranging Eq. (4-3), we have $$\left(\frac{a_n}{a_{n-1}}s + 1\right)V_{out}^* + \quad (4\text{-}4)$$

$$\left(\frac{a_{n-2}}{a_{n-1}s} + \frac{a_{n-3}}{a_{n-1}s^2} + \ldots + \frac{a_1}{a_{n-1}s^{n-2}} + \frac{a_0}{a_{n-1}s^{n-1}}\right)V_{out}^* +$$

$$\left(-\frac{a_{n-2}}{a_{n-1}s} - \frac{a_{n-3}}{a_{n-1}s^2} - \ldots - \frac{a_2}{a_{n-1}s^{n-3}} - \frac{a_1}{a_{n-1}s^{n-2}} - \frac{a_0}{a_{n-1}s^{n-1}}\right)$$

$$V_{in} = V_{in}$$

Since $$\left(\frac{a_n}{a_{n-1}}\right)V_{out}^* + \left(-\frac{a_{n-2}}{a_{n-1}s}\right)V_{in} + \left(\frac{a_{n-3}}{a_{n-1}s^2}\right)V_{out}^* + \left(-\frac{a_{n-3}}{a_{n-1}s^2}\right)V_{in} = \quad (4\text{-}5)$$

$$\left(\frac{a_{n-2}}{a_{n-1}s}\right)(V_{out}^* - V_{in}) + \left(\frac{a_{n-2}}{a_{n-1}s}\right)\left(\frac{a_{n-3}}{a_{n-2}s}\right)(V_{out}^* - V_{in}) =$$

$$\left(\frac{a_{n-2}}{a_{n-1}s}\right)\left[\left(\begin{array}{c}V_{out}^* - \\ V_{in}\end{array}\right) + \left(\frac{a_{n-3}}{a_{n-2}s}\right)(V_{out}^* - V_{in})\right]$$

applying the combination of (4-5), Eq. (4-4) becomes $$\left(\frac{a_n}{a_{n-1}}s + 1\right)V_{out}^* + \quad (4\text{-}6)$$

$$\left(\frac{a_{n-2}}{a_{n-1}s}\right)\left[\begin{array}{c}(V_{out}^* + V_{in}) + \\ \left(\frac{a_{n-3}}{a_{n-2}s}\right)\left[\begin{array}{c}(V_{out}^* + V_{in}) + \\ \ldots \left(\frac{a_1}{a_2 s}\right)\left[\begin{array}{c}(V_{out}^* + V_{in}) + \\ \left(\frac{a_0}{a_1 s}\right)(V_{out}^* - V_{in})\end{array}\right] \ldots\end{array}\right]\end{array}\right] = V_{in}$$

Therefore, the following n simple equations can be derived from Eq. (4-6) by letting the new node voltages, Vn, where n=1, 2 ..., and n−1, as follows.

$$\left(\frac{a_0}{a_1}\right)(V_{out}^* - V_{in}) \equiv sV_1 \quad (4\text{-}7\text{-}1)$$

$$\left(\frac{a_1}{a_2}\right)(V_{out}^* - V_{in} + V_1) \equiv sV_2 \quad (4\text{-}7\text{-}2)$$

$$\left(\frac{a_2}{a_3}\right)[V_{out}^* - V_{in} + V_2] \equiv sV_3 \quad (4\text{-}7\text{-}3)$$

...

$$\left(\frac{a_{i-1}}{a_i}\right)[V_{out}^* - V_{in} + V_{i-1}] \equiv sV_i \quad (4\text{-}7\text{-}i)$$

...

$$\left(\frac{a_{n-3}}{a_{n-2}}\right)[V_{out}^* - V_{in} + V_{n-3}] \equiv sV_{n-2} \quad (4\text{-}7\text{-}n\text{-}2)$$

$$\left(\frac{a_{n-2}}{a_{n-1}}\right)[V_{out}^* - V_{in} + V_{n-2}] \equiv sV_{n-1} \quad (4\text{-}7\text{-}n\text{-}1)$$

Then, Eq. (4-6) becomes $$\left(\frac{a_n}{a_n}s + 1\right)V_{out}^* + V_{n-1} = V_{in}$$

which can be re-arranged as $$\left(\frac{a_{n-1}}{a_n}\right)[V_{out}^* - V_{in} + V_{n-1}] \equiv -sV_{out}^* \quad (4\text{-}7\text{-}n)$$

Equations (4-7-1), (4-7-n−1), and (4-7-n) can be realized using a single DDCC as the sub-circuitries illustrated in FIGS. 4-1 to 4-3, respectively.

The combination of the realized circuitries from (4-7-1) to (4-7-n) is illustrated in FIG. 4-4.

If equation (4-2) is replaced by equation (4-8) as below, $$V_{in} - V_{out} \equiv V_{out}^* = \frac{\begin{bmatrix} (a_{n-1}s^{n-1})V_{in}^{n-1} + (a_{n-2}s^{n-2})V_{in}^{n-2} + \ldots + \\ (a_2s^2)V_{in}^2 + (a_1s)V_{in}^1 + (a_0)V_{in}^0 \end{bmatrix}}{a_n s^n + a_{n-1}s^{n-1} + a_{n-2}s^{n-2} + \ldots + a_3s^3 + a_2s^2 + a_1s + a_0} \quad (4\text{-}8)$$

Then, equation (4-7-1) to equation (4-7-n) become $$\left(\frac{a_0}{a_1}\right)(V_{out}^* - V_{in}^0) \equiv -sV_1 \quad (4\text{-}9\text{-}1)$$

$$\left(\frac{a_1}{a_2}\right)[V_{out}^* - V_{in}^1 + V_1] \equiv sV_2 \quad (4\text{-}9\text{-}2)$$

$$\left(\frac{a_2}{a_3}\right)[V_{out}^* - V_{in}^2 + V_2] \equiv sV_3 \quad (4\text{-}9\text{-}3)$$

$$\ldots$$

$$\left(\frac{a_{i-1}}{a_i}\right)[V_{out}^* - V_{in}^{i-1} + V_{i-1}] \equiv sV_i \quad (4\text{-}9\text{-}i)$$

$$\ldots$$

$$\left(\frac{a_{n-3}}{a_{n-2}}\right)[V_{out}^* - V_{in}^{n-3} + V_{n-3}] \equiv sV_{n-2} \quad (4\text{-}9\text{-}n\text{-}2)$$

$$\left(\frac{a_{n-2}}{a_{n-1}}\right)[V_{out}^* - V_{in}^{n-2} + V_{n-2}] \equiv sV_{n-1} \quad (4\text{-}9\text{-}n\text{-}1)$$

$$\left(\frac{a_{n-1}}{a_n}\right)[V_{out}^* - V_{in}^{n-1} + V_{n-1}] \equiv -sV_{out}^* \quad (4\text{-}9\text{-}n)$$

The realization of equations (4-9-1) to (4-9-n) is then illustrated in FIG. 4-5. Note there are n input voltage terminals with n different input voltages, i.e., $V_{in}^0, V_{in}^1, \ldots, V_{in}^{n-2}$, and $V_{in}^{n-1}$ in FIG. 4-5 which is the realization of equation (4-8). Therefore, we can synthesize (i) the inverting low-pass filtering signal from the output voltage, $V^*_{out}$, by only letting $V_{in}^0$ be Vin and the others of the n different input voltages be zero, and (ii) the inverting band-pass filtering signal from the output voltage, $V^*_{out}$, by only letting one of $V_{in}^i$ (where the i is not 0 or n) be Vin and the others of the n different input voltages be zero, (iii) the non-inverting high-pass filtering signal from the second output voltage, $V_{in}^0 - V^*_{out}$, by letting all the $V_{in}^0, V_{in}^1, \ldots, V_{in}^{n-2}$, and $V_{in}^{n-1}$ be Vin.

The band-reject filtering function is the inverse of the band-pass filtering function and is feasible using the voltage difference between Vin and Vband-pass as follows. Let the band-pass and the band-reject filtering functions be $$V_{BP} = \frac{a_i s^i}{a_n s^n + a_{n-1}s^{n-1} + \ldots + a_1 s + a_0} V_{in} \quad (4\text{-}10)$$

and $$V_{BR} = V_{in} - V_{BP} \quad (4\text{-}11)$$

in which i is the number between 0 and n but not 0 or n. For constructing a band-reject filtering signal, the realization of equation (4-9-1) might be expanded as FIG. 4-6 using the new active element, the fully differential current conveyor (FDCCII) in the related art in order to attain one more node with the node voltage ($V_{in} - V^*_{out}$) for generating the band-reject filtering signal as the band-pass filtering signal can be extracted out from the node voltage $V^*_{out}$ (Note that at the moment, $V_{in}^0 = 0$). The voltage-mode nth-order FDCCII and DDCC based low-pass, band-pass, high-pass, and band-reject filter structure is illustrated in FIG. 4-7 which can synthesize (i) the inverting low-pass filtering signal from the output voltage, $V^*_{out}$, by only letting $V_{in}^0$ be Vin and the others of the n different node voltages be zero, and (ii) the inverting band-pass filtering signal from the output voltage, $V^*_{out}$, by only letting one of $V_{in}^i$ (where the i is not 0 or n) be Vin and the others be zero, (iii) the non-inverting high-pass filtering signal from the second output voltage, $V_{in} - V^*_{out}$, by letting all the $V_{in}^0, V_{in}^1, \ldots,$ and $V_{in}^{n-1}$ be Vin, and (iv) the non-inverting band-reject filtering signal from the second output voltage, $V_{in} - V^*_{out}$, by only letting one of $V_{in}^i$ (where the i is not 0 or n) be Vin and the others of the n different node voltages be zero.

To verify the theoretical analysis of the proposed equal capacitance filter structures illustrated in FIG. 4-7, a second-order high-pass and band-reject filter has been simulated using the H-Spice with TSMC035 process (±1.65V supply voltages), and the CMOS implementations of the DDCC and FDCCII presented in the related art. The component values are C=30 pF (for theoretical central frequency 1 MHz) and 300 nF (for theoretical central frequency 100 Hz), a2/a1=3.75 kΩ, and a1/a0=7.50 kΩ. The simulated and high-pass (resp. band-reject) amplitude-frequency responses with theoretical central frequencies 1 MHz and 100 Hz are illustrated in FIGS. 4-8 and 4-9 (resp. FIGS. 4-10 and 4-11), with simulated fo=1.0044 MHz (error 0.44%) and 100.995 Hz (error 0.995%) (resp. fo=977.24 kHz with 2.276% error and exact 100 Hz without error), respectively, and the deepest values 28.69 m and 9.70 m for the band-reject filtering responses. As can be seen, there is a close agreement between the theory and simulation.

5. Analytical Synthesis of Third-Order Voltage-Mode DDCC-Grounded R and C Elliptic Filter Structure The advantages of the Analytical Synthesis Methods (ASMs) in the related art have been clearly and effectively demonstrated in the realization of high-order current/voltage-mode Operational Trans-conductance Amplifier and Capacitor (OTA-C) filters, where a complicated nth-order transfer function is manipulated and decomposed by a succession of innovative algebra operations until a set of simple equations are produced, which are then realized using n integrators and a constraint circuitry. In fact, the new Analytical Synthesis Method can be used in the design of any kind of linear system with a stable transfer function. The ASM is carried out according to the following steps. At step 1, the "decomposition" of a complicated nth-order function is transferred into a set of simple and realizable equations. At step 2, the "realization" of each simple equation obtained from step 1 are corresponded simple sub-circuitries. At step 3, all of the simple sub-circuitries are combined for constructing a whole complicated circuit structure. This section describes new ASMs for the realization of the third-order voltage-mode Differential Difference Current Conveyor (DDCC)-grounded Resistor and Capacitor filter structure. Since (i) grounded resistors and capacitors are with much lower parasitics than floating resistors and capacitors, and (ii) the minimum number of active and passive components lead to the lowest total parasitics, power consumption, noise, and integrated circuit area, both of which simultaneously achieve the two features of an ASM: (i) higher output performance, and (ii) lower manufacture cost and energy consumption, without tradeoff.

The transfer function of a voltage-mode third-order elliptic filter is:

$$\frac{V_{out}}{V_{in}} = \frac{b_2 s^3 + 0 + a_0}{a_3 s^3 + a_2 s^2 + a_1 s + a_0} \quad (5\text{-}1)$$

Cross multiplying Eq. (5-1), and dividing by $b_2 s^2$, we get $$V_{out}\left(\frac{a_3}{b_2}s + \frac{a_2}{b_2} + \frac{a_1}{b_2 s} + \frac{a_0}{b_2 s^2}\right) = V_{in}\left(1 + \frac{a_0}{b_2 s^2}\right) \quad (5\text{-}2)$$

Rearranging Eq. (5-2), we have $$V_{out}\left(\frac{a_3}{b_2}s + \frac{a_2}{b_2}\right) + V_{out}\left(\frac{a_1}{b_2 s}\right) + (V_{out} - V_{in})\left(\frac{a_0}{b_2 s^2}\right) = V_{in} \quad (5\text{-}3)$$

Since $$V_{out}\left(\frac{a_1}{b_2 s}\right) + (V_{out} - V_{in})\left(\frac{a_0}{b_2 s^2}\right) = \left(\frac{a_1}{b_2 s}\right)\left[V_{out}(1) + (V_{out} - V_{in})\left(\frac{a_0}{a_1 s}\right)\right] \quad (5\text{-}4)$$

Eq. (5-3) becomes $$V_{out}\left(\frac{a_3}{b_2}s + \frac{a_2}{b_2}\right) = V_{in} - \left(\frac{a_1}{b_2 s}\right)\left[V_{out}(1) + (V_{out} - V_{in})\left(\frac{a_0}{a_1 s}\right)\right] \quad (5\text{-}5)$$

Therefore, the following three simple equations can be derived from Eq. (5-5) by letting the new node voltages, Vn, where n=1, and 2 through the following four approaches:

Approach 1:

$$\left(\frac{a_0}{a_1}\right)(V_{out} - V_{in}) \equiv sV_1 \quad (5\text{-}6\text{-}1)$$

$$\left(\frac{a_1}{b_2}\right)(V_{out} - V_1) \equiv sV_2 \quad (5\text{-}6\text{-}2)$$

$$V_{out}\left(s + \frac{a_2}{a_3}\right) = \left(\frac{b_2}{a_3}\right)(V_{in} - V_2) \quad (5\text{-}6\text{-}3)$$

Approach 2:

$$\left(\frac{a_0}{a_1}\right)(V_{out} - V_{in}) \equiv sV_1 \quad (5\text{-}6\text{-}4)$$

$$\left(\frac{a_1}{b_2}\right)(V_{out} + V_1) \equiv -sV_2 \quad (5\text{-}6\text{-}5)$$

$$V_{out}\left(s + \frac{a_2}{a_3}\right) = \left(\frac{b_2}{a_3}\right)(V_{in} + V_2) \quad (5\text{-}6\text{-}6)$$

Approach 3:

$$\left(\frac{a_0}{a_1}\right)(V_{out} - V_{in}) \equiv -sV_1 \quad (5\text{-}6\text{-}7)$$

$$\left(\frac{a_1}{b_2}\right)(V_{out} - V_1) \equiv sV_2 \quad (5\text{-}6\text{-}8)$$

$$V_{out}\left(s + \frac{a_2}{a_3}\right) = \left(\frac{b_2}{a_3}\right)(V_{in} - V_2) \quad (5\text{-}6\text{-}9)$$

Approach 4:

$$\left(\frac{a_0}{a_1}\right)(V_{out} - V_{in}) \equiv -sV_1 \quad (5\text{-}6\text{-}10)$$

$$\left(\frac{a_1}{b_2}\right)(V_{out} - V_1) \equiv -sV_2 \quad (5\text{-}6\text{-}11)$$

$$V_{out}\left(s + \frac{a_2}{a_3}\right) = \left(\frac{b_2}{a_3}\right)(V_{in} + V_2) \quad (5\text{-}6\text{-}12)$$

Then, by employing three DDCCs, three grounded capacitors, and only four grounded resistors, voltage-mode third-order elliptic filter structures can be realized as illustrated in FIGS. 5-1, 5-2, 5-3, and 5-4 based upon (5-6-1) to (5-6-3), (5-6-4) to (5-6-6), (5-6-7) to (5-6-9), and (5-6-10) to (5-6-12), respectively.

To validate the theoretical predictions, 0.35 μm process H-spice simulations are now used. We use the CMOS implementations of the DDCC and FDCCII presented in the related art, with ±1.65 V supply voltages. The component values for the third-order one are given by C1=20 pF, C2=8 pF, C3=28 pF, and ga0=72.54 μS, ga1=163.51 μS, ga2=128.07 μS, gb2=62.85 μS, the latter four of which are correspond to the conductances a0/a1, a1/b2, a2/a3, and b2/a3, respectively, in FIG. 5-1, realizing (5-1) with a3=1, a2=0.84929, a1=1.14586, a0=0.59870, and b2=0.35225. The simulated amplitude-frequency response with a nominal fp=0.992 MHz (with error 0.77%), fs=1.20 MHz, A1=0.84, A2=1.22627, and Peak=1.005 is illustrated in FIG. 5-5, which agrees very well with the theoretical response with fp=1.000 MHz, fs=1.20 MHz, A1=0.85, A2=1.27519, and Peak=1.000, respectively.

6. Analytical Synthesis of Voltage-Mode Second-Order DDCC and FDCCII Based Universal Filter Structure The advantages of the Analytical Synthesis Methods (ASMs) in the related art have been clearly and effectively demonstrated recently in the realization of high-order current/voltage-mode Operational Trans-conductance Amplifier and Capacitor (OTA-C) filters, where a complicated nth-order transfer function is manipulated and decomposed by a succession of innovative algebra operations until a set of simple equations are produced, which are then realized using n integrators and a constraint circuitry. In fact, the new Analytical Synthesis Method can be used in the design of any kind of linear system with a stable transfer function. The ASM is carried out according to the following steps. At step 1, the "decomposition" of a complicated nth-order function is transferred into a set of simple and realizable equations. At step 2, the "realization" of each simple equation obtained from step 1 are corresponded to simple sub-circuitries. At step 3, all of the simple sub-circuitries are combined for constructing the whole complicated circuit structure. This section describes new ASMs for the realization of the second-order voltage-mode Differential Difference Current Conveyor (DDCC) and Fully Differential Current Conveyor (FDCCII)-grounded Resistor and Capacitor universal (i.e., low-pass, band-pass, high-pass, band-reject, and all-pass) filter structure. Since (i) grounded resistors and capacitors are with much lower parasitics than floating resistors and capacitors, and (ii) the minimum number of active and passive components lead to the lowest total parasitics, power consumption, noise, and integrated circuit area, both of which simultaneously achieve the two features of an ASM: (i) higher output performance, and (ii) lower manufacture cost and energy consumption, without tradeoff.

A voltage-mode second-order band-pass filter transfer function is given as below.

$$\frac{V_{out}}{V_{in}} = \frac{-2a_1 s}{a_2 s^2 + a_1 s + a_0} \quad (6\text{-}1)$$

Cross multiplying (6-1) yields $$V_{out}(a_2 s^2 + a_1 s + a_0) = V_{in}(-2a_1 s) \quad (6\text{-}2)$$

Dividing (6-2) by a1s yields $$V_{out}\left(\frac{a_2}{a_1}s + 1 + \frac{a_0}{a_1 s}\right) = -2V_{in} \quad (6\text{-}3)$$

(6-3) is re-arranged and replaced by (6-4) as below.

$$V_{out}\left(\frac{a_2}{a_1}s + 1\right) + V_{out}\left(\frac{a_0}{a_1 s}\right) = -2V_{in} \quad (6\text{-}4)$$

If we let $$V_{out}\left(\frac{a_0}{a_1 s}\right) = -V_1 \quad (6\text{-}5)$$

(6-4) becomes $$V_{out}\left(\frac{a_2}{a_1}s + 1\right) - V_1 = -2V_{in} \quad (6\text{-}6)$$

Re-combining (6-6) yields $$V_{out}\left(\frac{a_2}{a_1}s\right) + V_{out} - V_1 + 2V_{in} = 0 \quad (6\text{-}7)$$

which can be re-arranged by $$V_{out} - V_1 + 2V_{in} = -V_{out}\left(\frac{a_2}{a_1}s\right) \quad (6\text{-}8)$$

Multiplying both sides of equation (6-8) by (a1/a2) yields $$(V_{out} - V_1 + 2V_{in})\left(\frac{a_1}{a_2}\right) = -V_{out}(s) \quad (6\text{-}9)$$

Figures 1, 2, 3, 4, 5, 6:
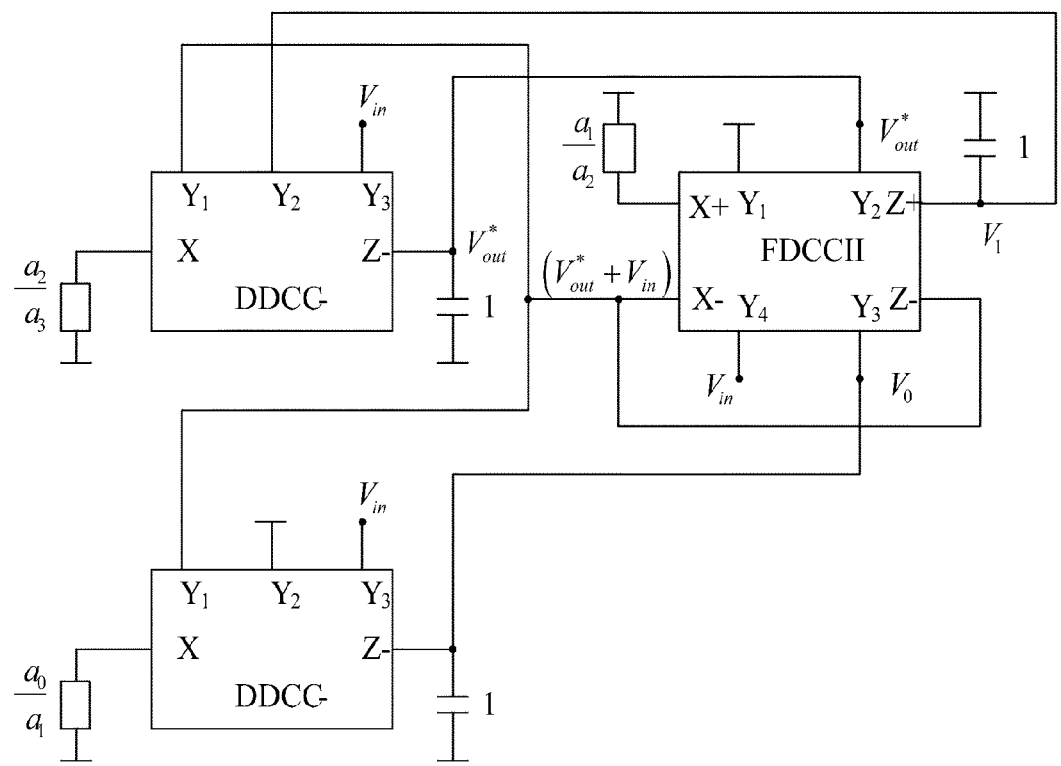

Both equations (6-5) and (6-9) are easily realized using one minus type DDCC, one FDCCII, two grounded resistors, and two unity value capacitors if producing one more node voltage Vout+Vin in the design which is illustrated in FIG. 6-1.

(6-1) is equivalent to $$V_{out} = \frac{-2a_1 s}{a_2 s^2 + a_1 s + a_0} V_{in} \quad (6\text{-}10)$$

In FIG. 6-1, $$-V_{out} = \frac{2a_1 s}{a_2 s^2 + a_1 s + a_0} V_{in} \quad (6\text{-}11)$$

$$V_1 = \frac{2a_0}{a_2 s^2 + a_1 s + a_0} V_{in} \quad (6\text{-}12)$$

$$V_{out} + V_{in} = \frac{a_2 s^2 - a_1 s + a_0}{a_2 s^2 + a_1 s + a_0} V_{in} \quad (6\text{-}13)$$

$$V_{out} - V_1 + 2V_{in} = \frac{2a_2 s^2}{a_2 s^2 + a_1 s + a_0} V_{in} \quad (6\text{-}14)$$

Equations (6-10), (6-11), (6-12), (6-13), and (6-14) represent inverting band-pass, non-inverting band-pass, non-inverting low-pass, non-inverting all-pass, and non-inverting high-pass filter transfer functions, respectively. If the input voltage signal at the Y3 terminal of the minus type DDCC be zero, FIG. 6-1 is replaced by FIG. 6-2 and equations (6-10), (6-11), (6-12), (6-13), and (6-14) are transferred to (6-15), (6-16), (6-17), (6-18), and (6-19), respectively.

$$V_{out} = \frac{-a_1 s}{a_2 s^2 + a_1 s + a_0} V_{in} \quad (6\text{-}15)$$

$$-V_{out} = \frac{a_1 s}{a_2 s^2 + a_1 s + a_0} V_{in} \quad (6\text{-}16)$$

$$V_1 = \frac{a_0}{a_2 s^2 + a_1 s + a_0} V_{in} \quad (6\text{-}17)$$

$$V_{out} + V_{in} = \frac{a_2 s^2 + a_0}{a_2 s^2 + a_1 s + a_0} V_{in} \quad (6\text{-}18)$$

$$V_{out} - V_1 + V_{in} = \frac{a_2 s^2}{a_2 s^2 + a_1 s + a_0} V_{in} \quad (6\text{-}19)$$

Equations (6-15), (6-16), (6-17), (6-18), and (6-19) represent inverting band-pass, non-inverting band-pass, non-inverting low-pass, non-inverting band-reject, and non-inverting high-pass filter transfer functions, respectively. Therefore, a voltage-mode second-order DDCC and FDCCII based universal filter structure, illustrated in FIG. 6-3, is produced from the combination of FIGS. 6-1 and 6-2.

The switch adjustment of FIG. 6-3 leads to get the filtering output signals corresponding to equations (6-10), (6-11), (6-12), (6-13), and (6-14) (resp. (6-15), (6-16), (6-17), (6-18), and (6-19)) if the switch is turned on (resp. turned off), respectively.

To verify the theoretical analysis of the proposed equal capacitance filter structures illustrated in FIG. 6-2, a second-order band-pass and band-reject filter has been simulated using the H-Spice with TSMC035 process (±1.65V supply voltages), and the CMOS implementations of the DDCC and FDCCII presented in the related art. The component values are C=50 pF (for theoretical central frequency 1 MHz) and 500 nF, 250 nF, 100 nF, and 50 nF (for theoretical central frequency 100 Hz, 200 Hz, 500 Hz, and 1000 Hz, respectively), a2/a1=2.25 kΩ, and a1/a0=4.50 kΩ. The simulated band-pass amplitude-frequency responses with theoretical central frequencies 1 MHz and 100 Hz, 200 Hz, 500 Hz, and 1000 Hz are illustrated in FIGS. 6-4 and 6-5, respectively, with simulated fo=1.0000 MHz (error 0.00%) and 100 Hz (no error), 200 Hz (no error), 501 Hz (error 0.2%), and 1000 Hz (no error), and the peaks, 1.0023, and 0.9999, 0.9999, 0.9999, and 0.9999, respectively. As can be seen, there is a close agreement between the theory and simulation.

Analytical Synthesis of High-Order Voltage-Mode DDCC and FDCCII-Grounded R and C Universal Filter Structures The advantages of the Analytical Synthesis Methods (ASMs) in references [26-30] have been clearly and effectively demonstrated recently in the realization of high-order current/voltage-mode Operational Trans-conductance Amplifier and Capacitor (OTA-C) filters, where a complicated nth-order transfer function is manipulated and decomposed by a succession of innovative algebraic operations until a set of simple equations are produced, which are then realized using n integrators and a constraint circuitry. In fact, the new Analytical Synthesis Method can be used in the design of any kind of linear system with a stable transfer function. This section describes new ASMs for the realization of the voltage-mode high-order Differential Difference Current Conveyor (DDCC) and Fully Differential Current Conveyor (FDCCII)-grounded Resistor and Capacitor universal (namely, low-pass, band-pass, high-pass, band-reject, and all-pass) filter structures although the relative all-pass and band-reject filter structures were published recently in reference [31].

Part I: Analytical Synthesis of Voltage-Mode Even–Nth-Order DDCC and FDCCII-Based Universal Filter Structure The general transfer function of a voltage-mode nth-order high-pass filter is:

$$\frac{V_{out}}{V_{in}} = \left( \frac{a_n s^n}{\sum_{i=0}^{i=n} a_i s^i} \right) \quad (7.1)$$

Let $$V_{out} - V_{in} \equiv V_{out}^* = \frac{\left( \begin{array}{c} -a_{n-1}s^{n-1} - a_{n-2}s^{n-2} - \ldots - \\ a_i s^i - \ldots - a_1 s - a_0 \end{array} \right) V_{in}}{a_n s^n + a_{n-1}s^{n-1} + a_{n-2}s^{n-2} + \ldots + a_3 s^3 + a_2 s^2 + a_1 s + a_0} \quad (7.2)$$

Cross multiply (7.2), and divide it by $a_{n-1}s^{n-1}$, $$\left( \frac{a_n}{a_{n-1}}s + 1 + \frac{a_{n-2}}{a_{n-1}s} + \ldots \ldots + \frac{a_2}{a_{n-1}s^{n-3}} + \frac{a_1}{a_{n-1}s^{n-2}} + \frac{a_0}{a_{n-1}s^{n-1}} \right) V_{out}^* = \left( -1 - \frac{a_{n-2}}{a_{n-1}s} - \frac{a_{n-3}}{a_{n-1}s^2} - \ldots - \frac{a_i}{a_{n-1}s^{n-1-i}} \ldots - \frac{a_1}{a_{n-1}s^{n-2}} - \frac{a_0}{a_{n-1}s^{n-1}} \right) V_{in} \quad (7.3)$$

Rearrange (7.3), $$\left( \frac{a_n}{a_{n-1}}s + 1 \right) V_{out}^* + \left( \frac{a_{n-2}}{a_{n-1}s} + \frac{a_{n-3}}{a_{n-1}s^2} + \ldots \ldots + \frac{a_1}{a_{n-1}s^{n-2}} + \frac{a_0}{a_{n-1}s^{n-1}} \right) V_{out}^* + \left( \frac{a_{n-2}}{a_{n-1}s} + \frac{a_{n-3}}{a_{n-1}s^2} + \ldots + \frac{a_i}{a_{n-1}s^{n-1-i}} + \ldots + \frac{a_1}{a_{n-1}s^{n-2}} + \frac{a_0}{a_{n-1}s^{n-1}} \right) V_{in} = -V_{in} \quad (7.4)$$

Since $$\left( \frac{a_{n-2}}{a_{n-1}s} \right) V_{out}^* + \left( \frac{a_{n-2}}{a_{n-1}s} \right) V_{in} + \left( \frac{a_{n-3}}{a_{n-1}s^2} \right) V_{out}^* + \left( \frac{a_{n-3}}{a_{n-1}s^2} \right) V_{in} = \left( \frac{a_{n-2}}{a_{n-1}s} \right) (V_{out}^* + V_{in}) + \left( \frac{a_{n-2}}{a_{n-1}s} \right) \left( \frac{a_{n-3}}{a_{n-2}s} \right) (V_{out}^* + V_{in}) = \left( \frac{a_{n-2}}{a_{n-1}s} \right) \left[ (V_{out}^* + V_{in}) + \left( \frac{a_{n-3}}{a_{n-2}s} \right) (V_{out}^* + V_{in}) \right] \quad (7.5)$$

applying the combination of (7.5), (7.4) becomes $$\left( \frac{a_n}{a_{n-1}}s + 1 \right) V_{out}^* + \left( \frac{a_{n-2}}{a_{n-1}s} \right) \left[ \begin{array}{l} (V_{out}^* + V_{in}) + \\ \ldots \left( \frac{a_i}{a_{i+1}s} \right) \left[ \begin{array}{l} (V_{out}^* + V_{in}) + \\ \ldots \left( \frac{a_1}{a_2 s} \right) \left[ \begin{array}{l} (V_{out}^* + V_{in}) + \\ \left( \frac{a_0}{a_1 s} \right) (V_{out}^* + V_{in}) \end{array} \right] \end{array} \right] \ldots \right] = -V_{in} \quad (7.6)$$

Therefore, we can obtain the following n simple equations derived from (7.6) by letting the new node voltages, $V_n$, where $n = 1, 2, \ldots,$ and $n-1$.

$$\left( \frac{a_0}{a_1} \right)(V_{out}^* + V_{in}) \equiv -sV_1 \quad (7.7\text{-}1)$$

$$\left( \frac{a_{i-1}}{a_i} \right)[V_{out}^* + V_{in} - V_{i-1}] \equiv -sV_1 \text{ for } i = 2, 3, \ldots, n-2 \quad (7.7\text{-}i)$$

$$\left( \frac{a_{n-2}}{a_{n-1}} \right)(V_{out}^* + V_{in} - V_{i-2}) \equiv -sV_{n-1} \quad (7.7\text{-}n\text{-}1)$$

Then, Eq. (7) is simplified as $$\left( \frac{a_n}{a_{n-1}}s + 1 \right) V_{out}^* - V_{n-1} = -V_{in}$$

which can be re-arranged as $$\left( \frac{a_{n-1}}{a_n} \right)[V_{out}^* + V_{in} - V_{n-1}] \equiv -sV_{out}^* \quad (7.7\text{-}n)$$

Based upon the input-output characteristics of a DDCC: $V_X = V_{Y1} - V_{Y2} + V_{Y3}$, $I_{Y1} = I_{Y2} = I_{Y3} = 0$, and $I_Z = \pm I_X$, the realized sub-circuitries of (7.7-1), (7.7-n-1), and (7.7-n) are shown in FIGS. 1 to 3, respectively.

Figures 1, 2, 3, 4, 5, 6, 7:
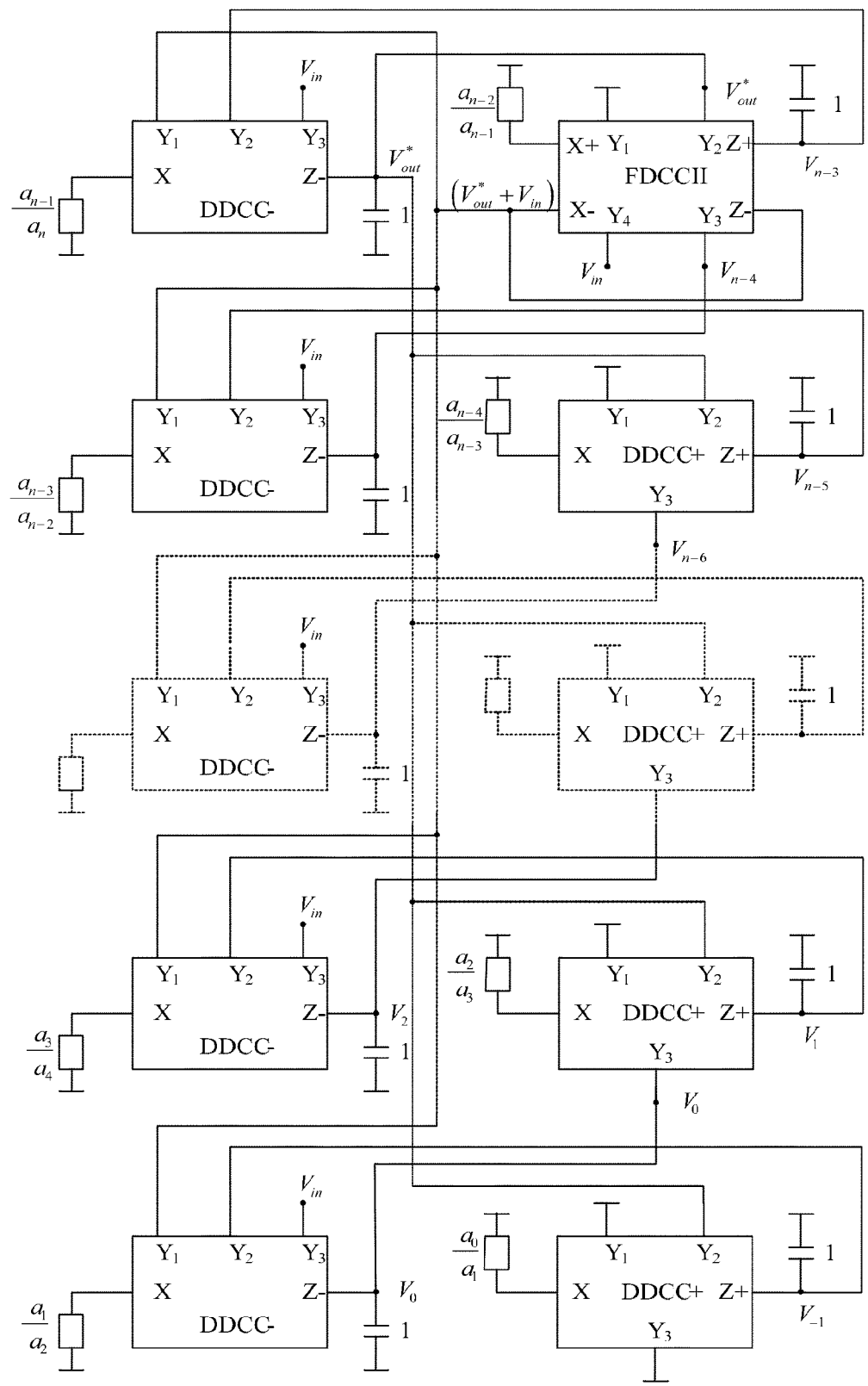
Figures 1, 2, 3, 4, 5, 6, 7, 8:
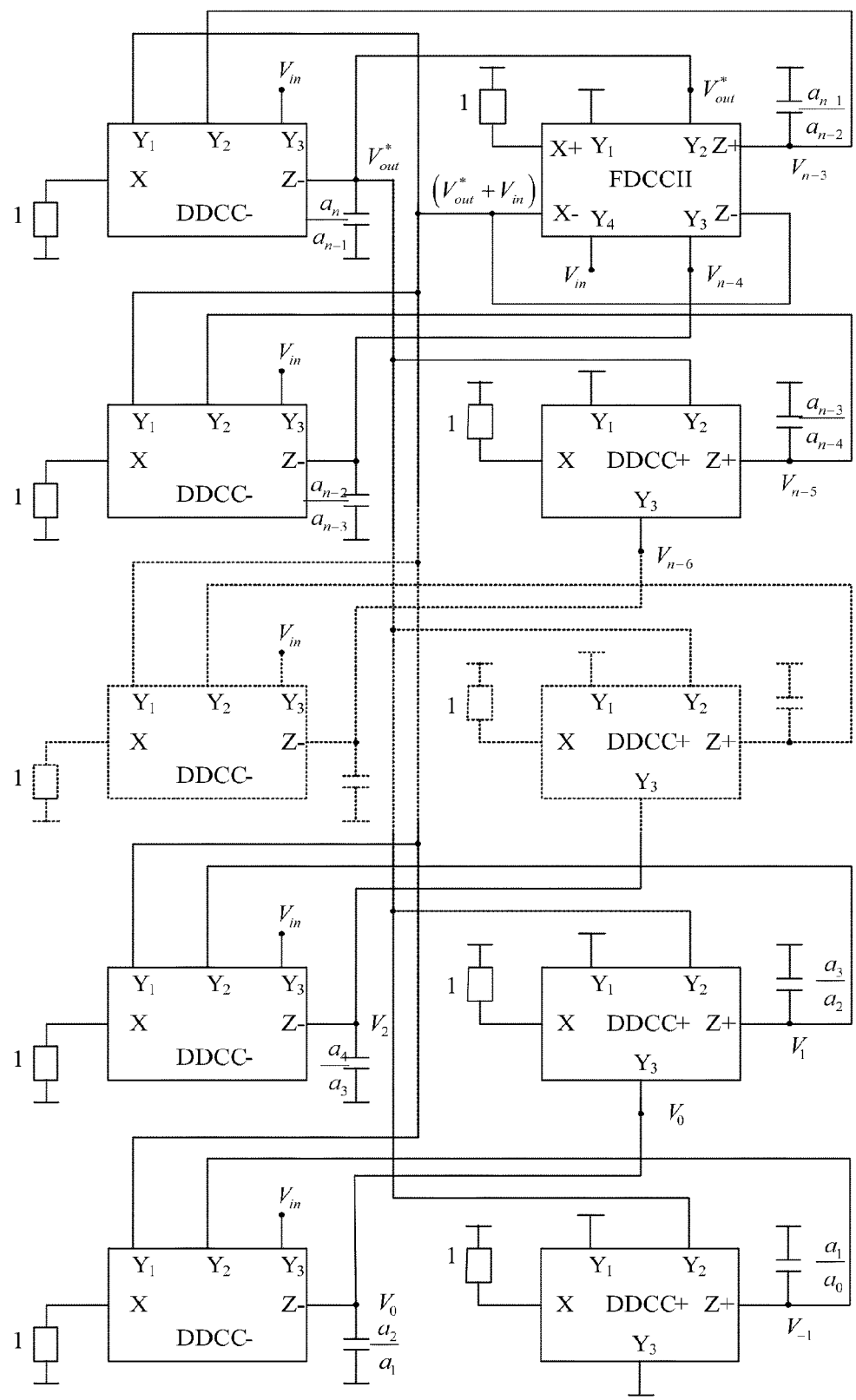
Figures 1, 2, 3, 4, 5, 6, 7, 8, 9:
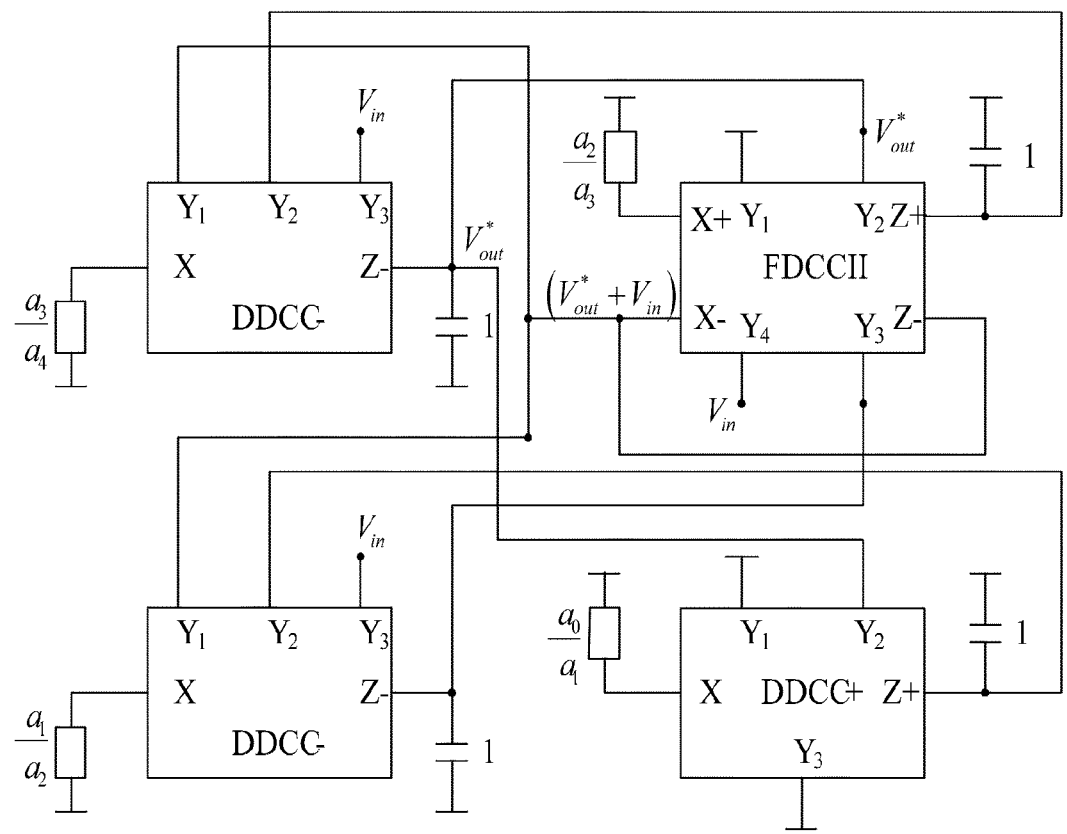
Figures 1, 2, 3, 4, 5, 6, 7, 8, 9, 10:
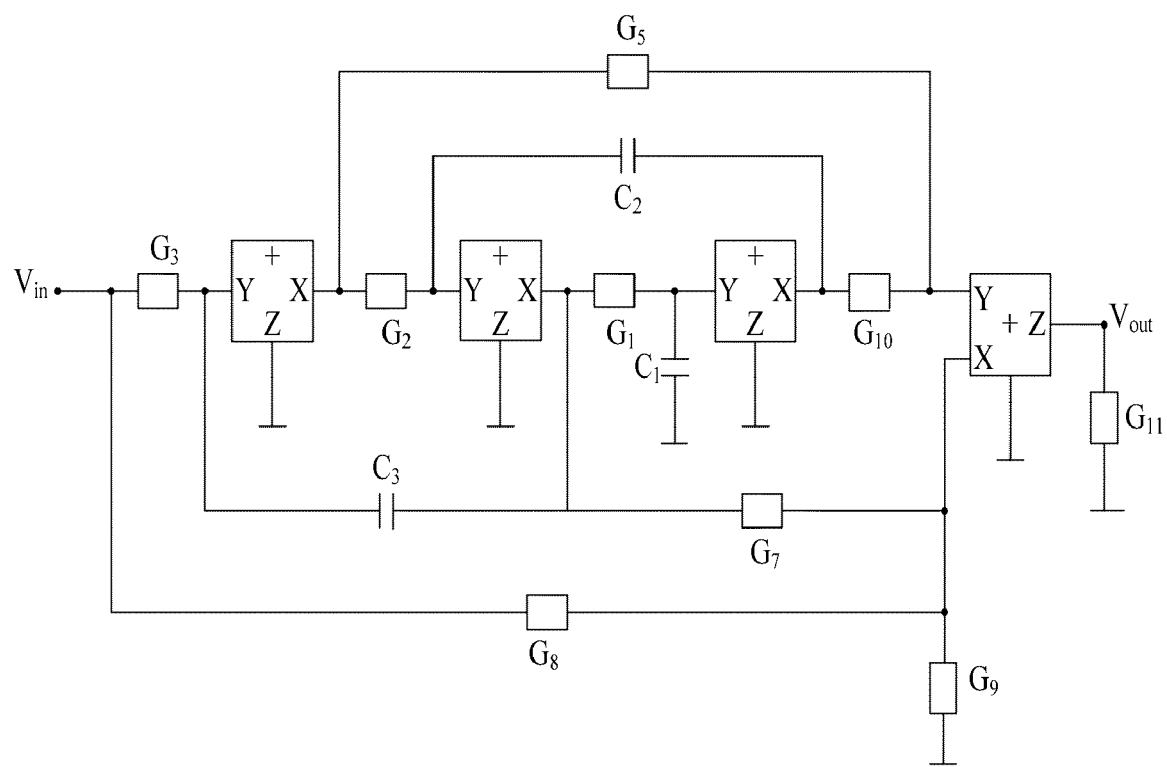
Figures 1, 2, 3, 4, 5, 6, 7, 8, 9, 10, 11:
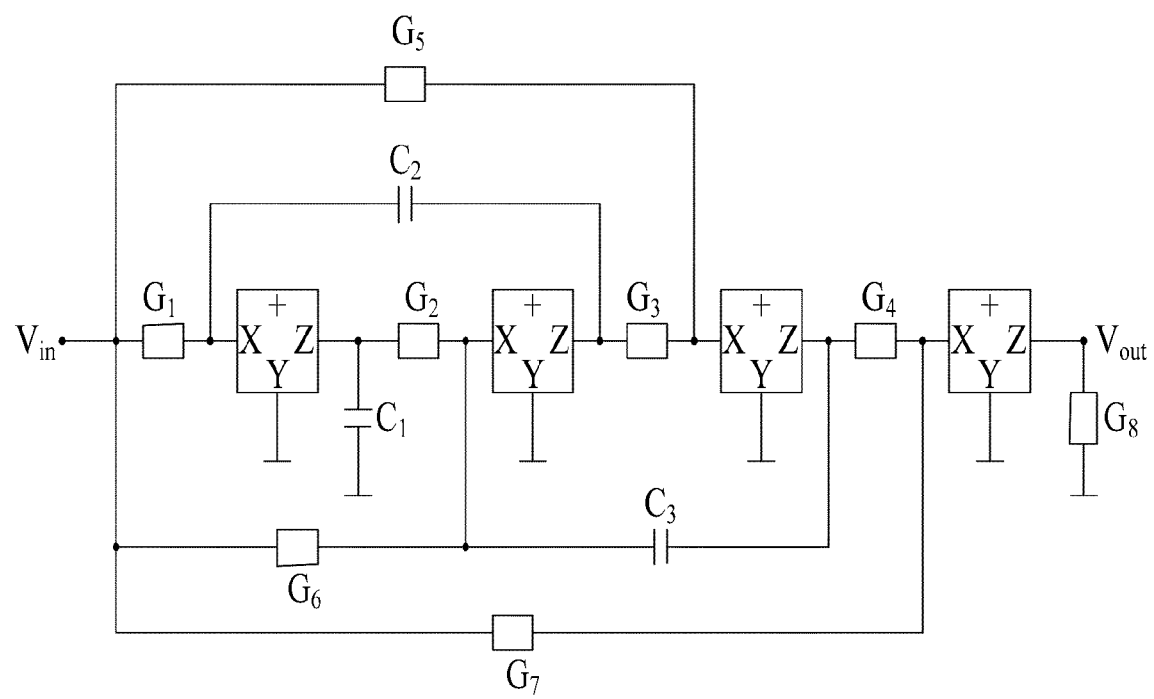
Figures 1, 2, 3, 4, 5, 6, 7, 8, 9, 10, 11, 12:
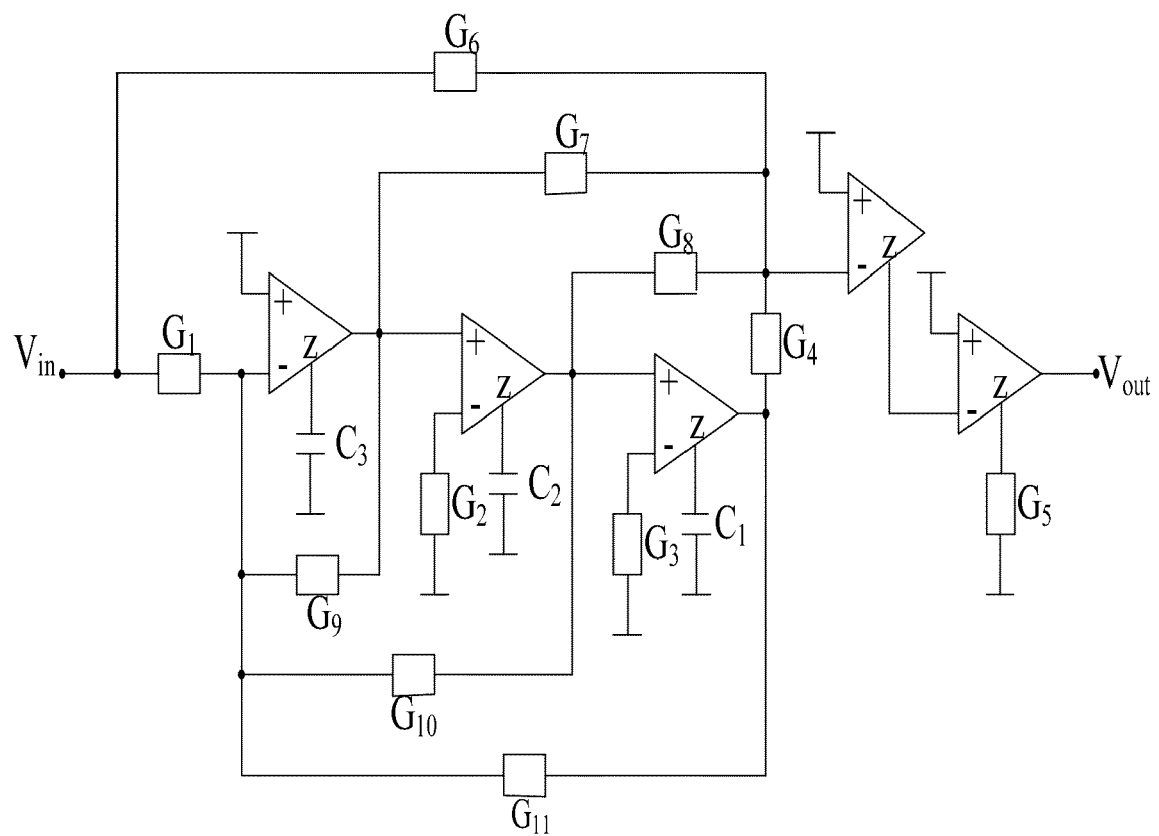
Figures 1, 2, 3, 4, 5, 6, 7, 8, 9, 10, 11, 12, 13:
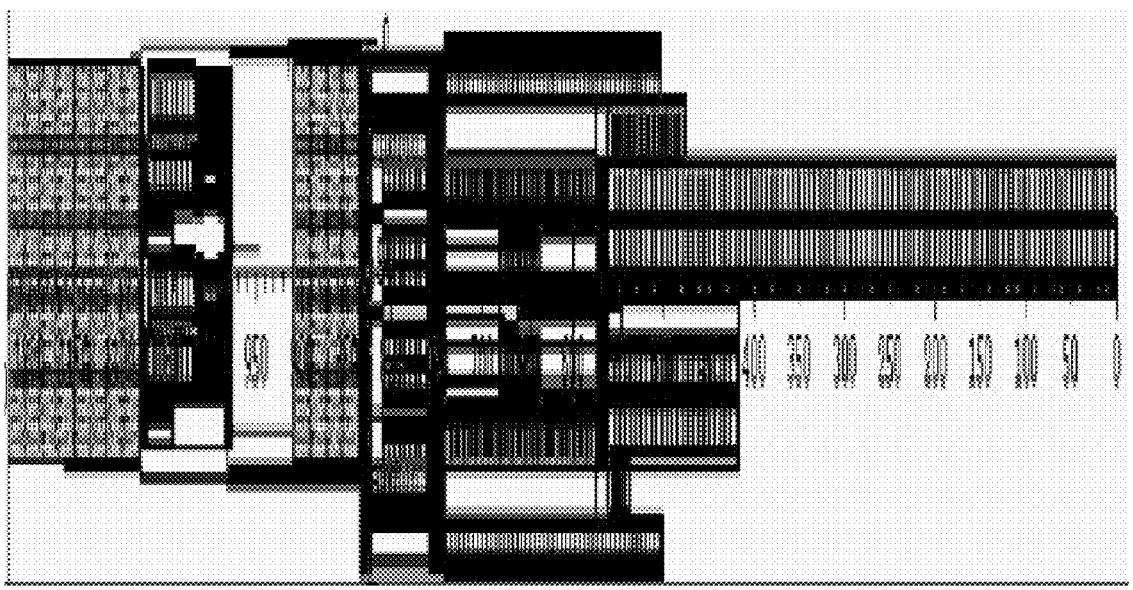
Figures 1, 2, 3, 4, 5, 6, 7, 8, 9, 10, 11, 12, 13, 14:
Figures 1, 2, 3, 4, 5, 6, 7, 8, 9, 10, 11, 12, 13, 14, 15:
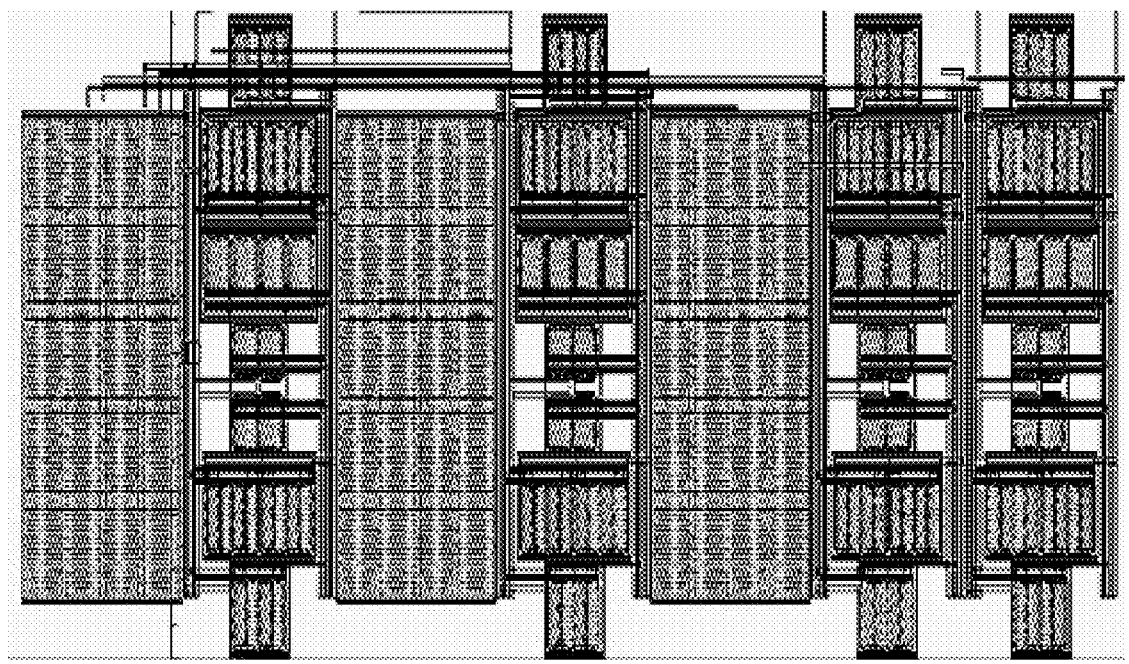
Figures 1, 2, 3, 4, 5, 6, 7, 8, 9, 10, 11, 12, 13, 14, 15, 16:
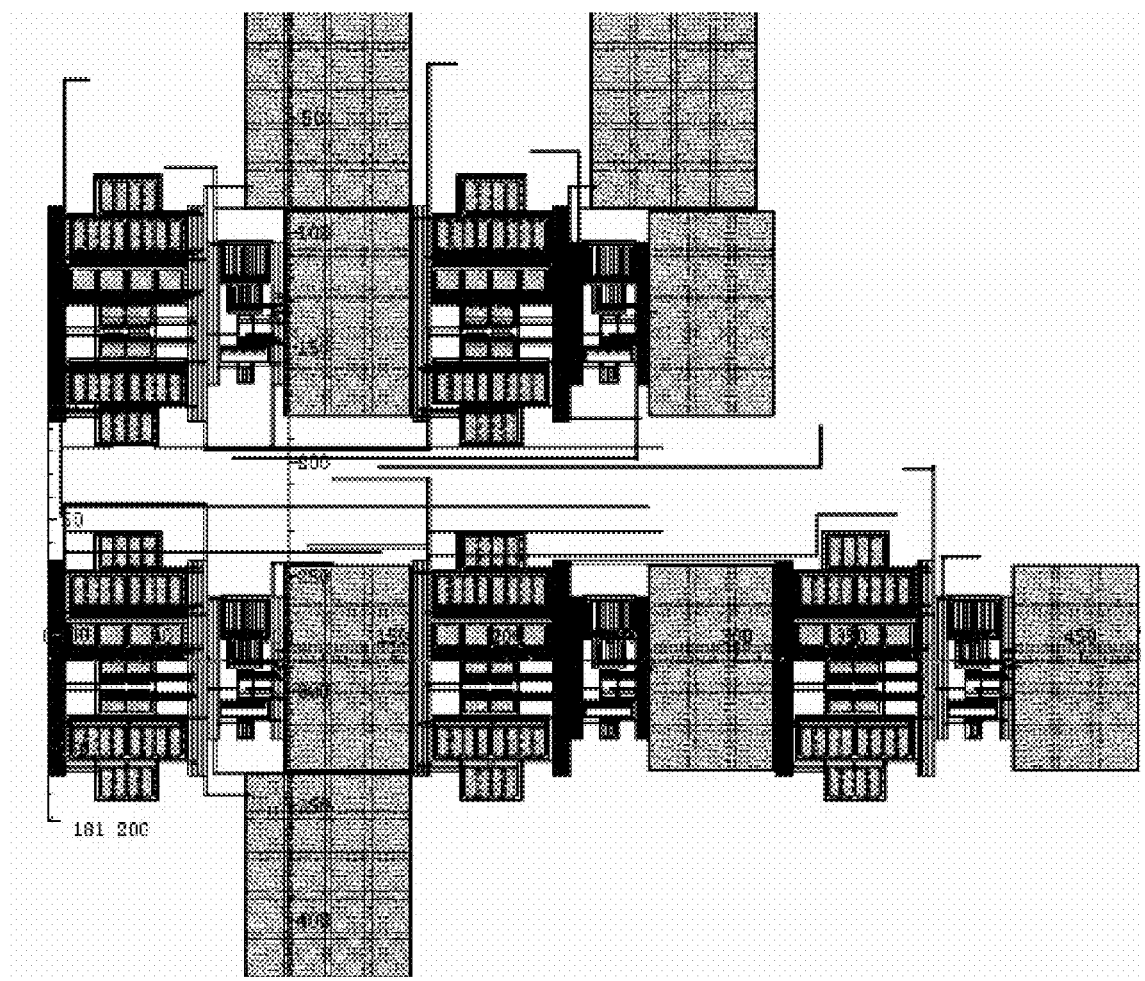
Figures 1, 2, 3, 4, 5, 6, 7, 8, 9, 10, 11, 12, 13, 14, 15, 16, 17:
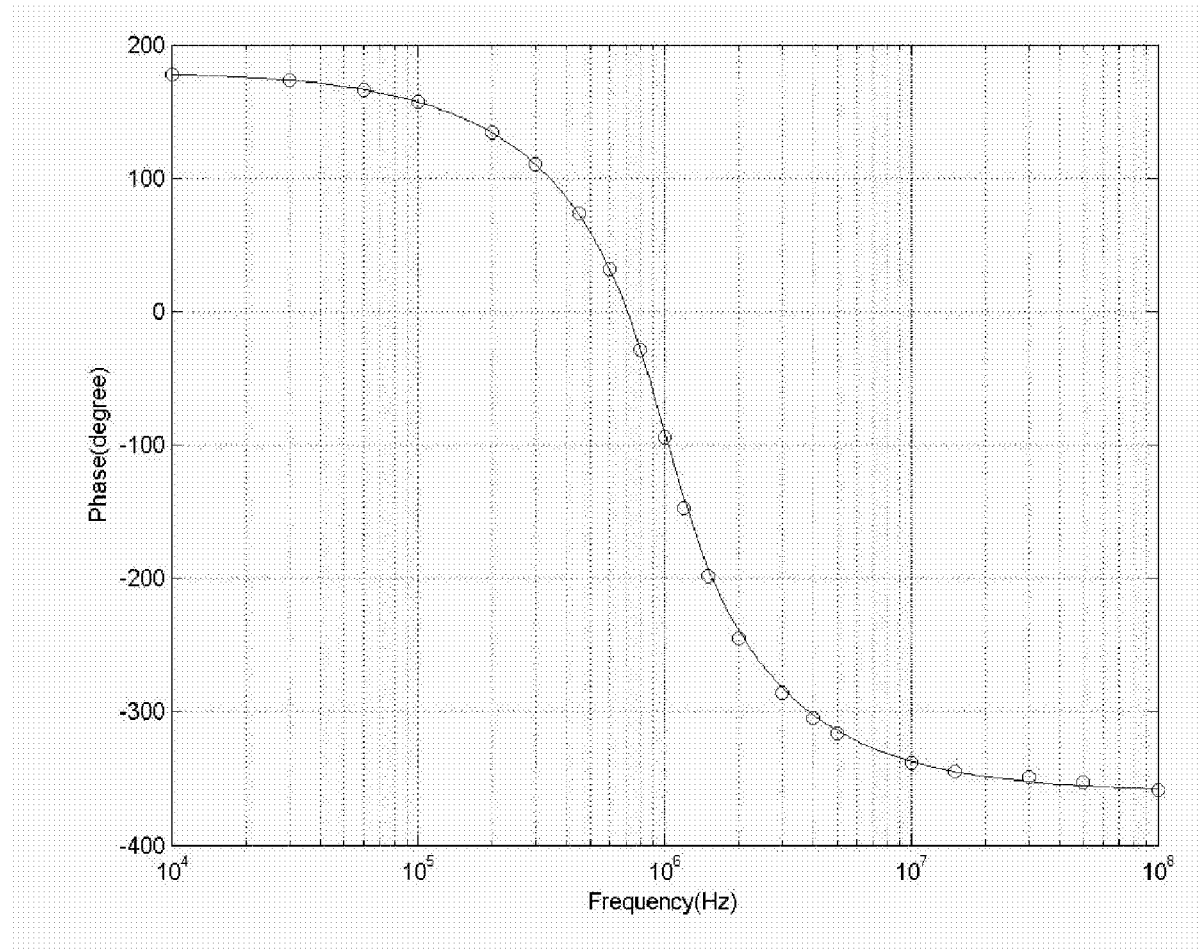
Figures 1, 2, 3, 4, 5, 6, 7, 8, 9, 10, 11, 12, 13, 14, 15, 16, 17, 18:
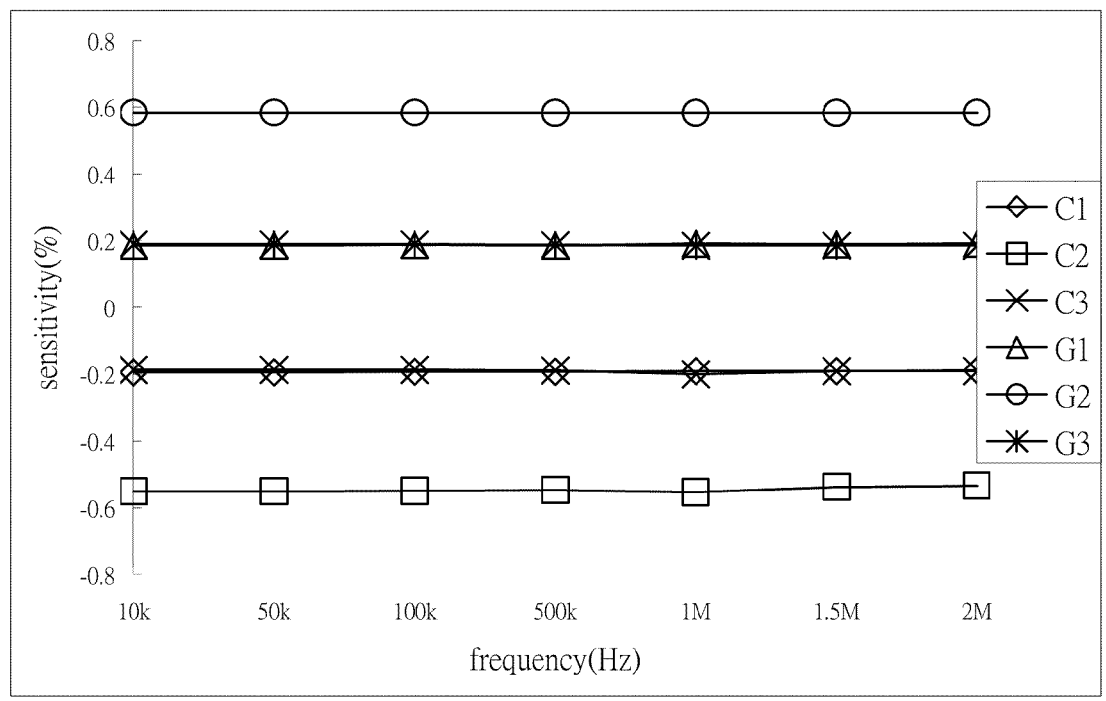
Figures 1, 2, 3, 4, 5, 6, 7, 8, 9, 10, 11, 12, 13, 14, 15, 16, 17, 18, 19:
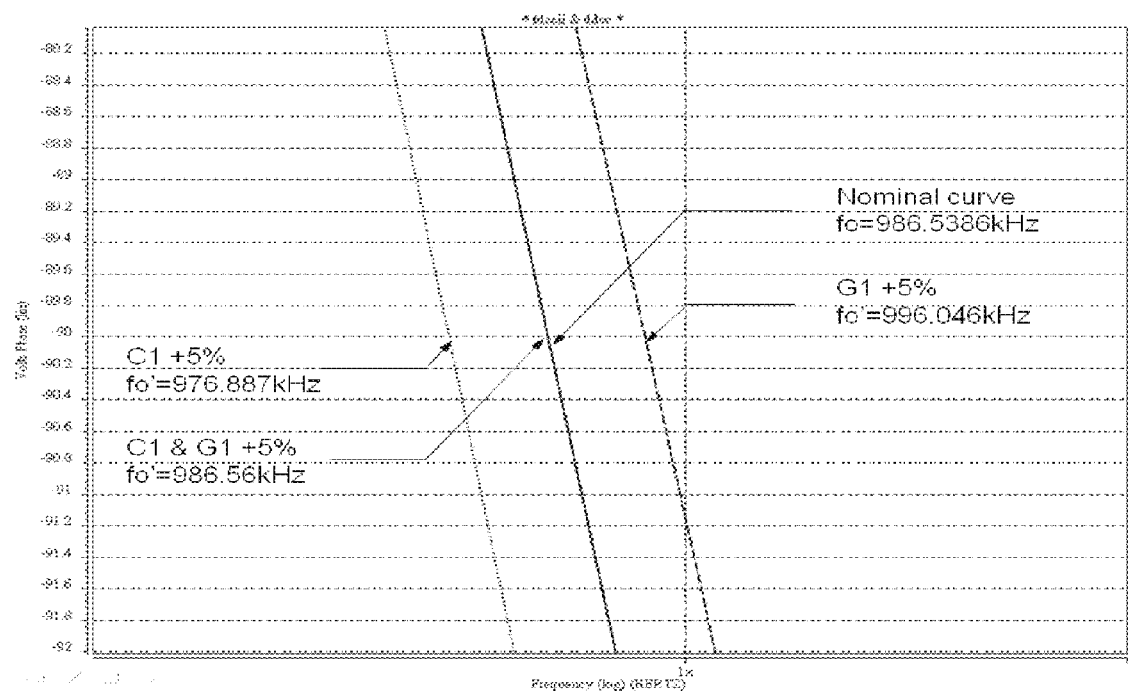
Figures 1, 2, 3, 4, 5, 6, 7, 8, 9, 10, 11, 12, 13, 14, 15, 16, 17, 18, 19, 20:
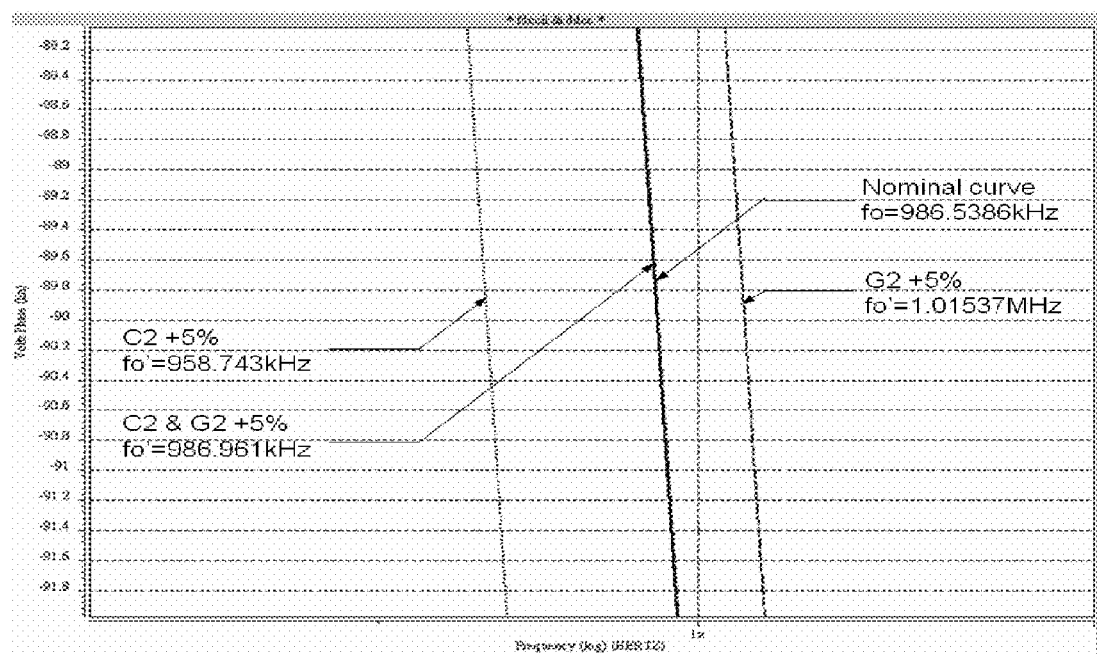
Figures 1, 2, 3, 4, 5, 6, 7, 8, 9, 10, 11, 12, 13, 14, 15, 16, 17, 18, 19, 20, 21:
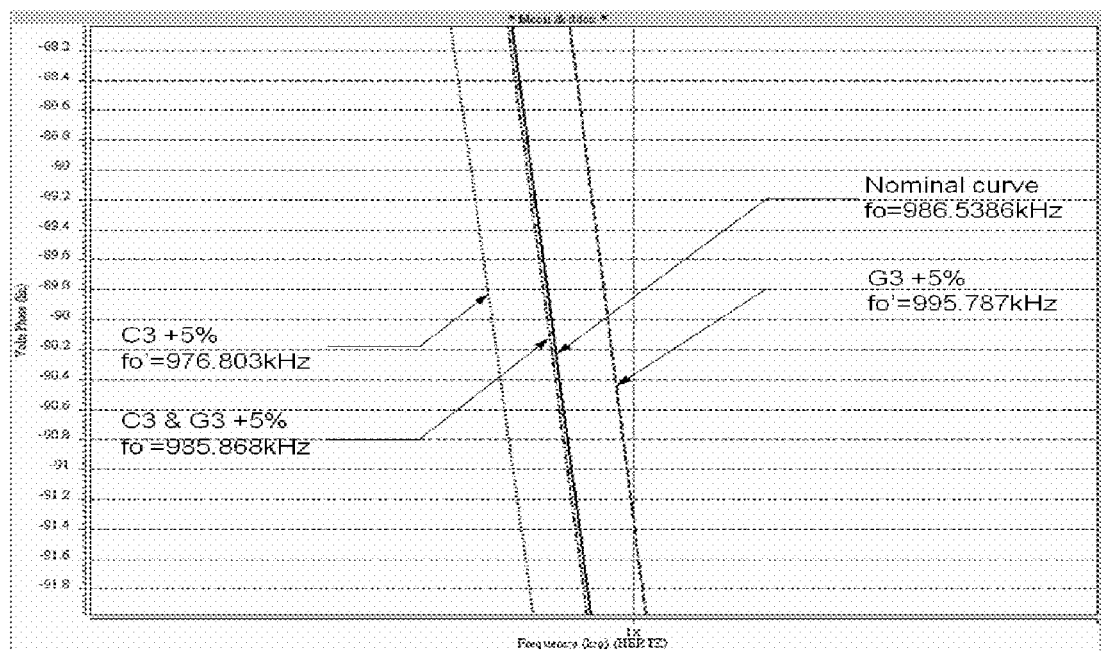
Figures 1, 2, 3, 4, 5, 6, 7, 8, 9, 10, 11, 12, 13, 14, 15, 16, 17, 18, 19, 20, 21, 22:
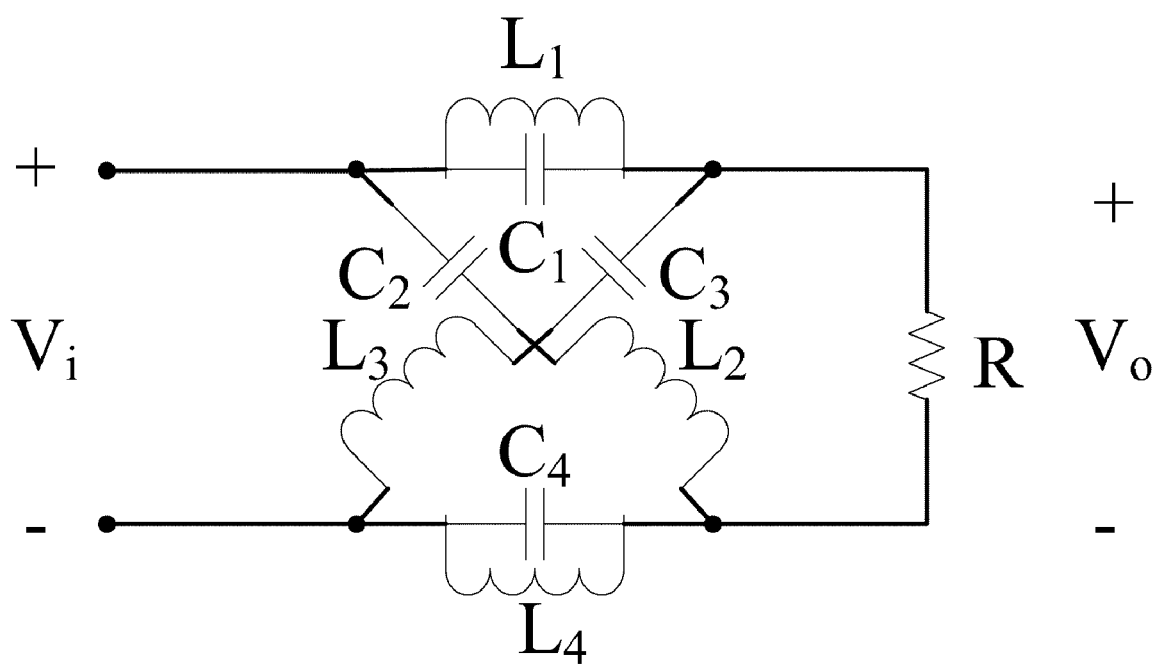
Figures 1, 2, 3, 4, 5, 6, 7, 8, 9, 10, 11, 12, 13, 14, 15, 16, 17, 18, 19, 20, 21, 22, 23:
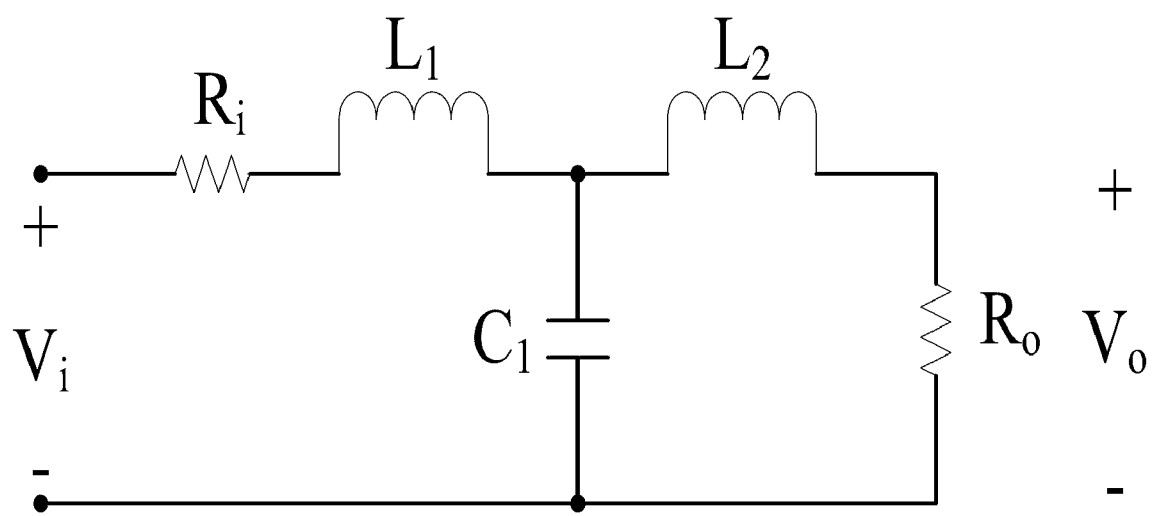
Figures 1, 2:
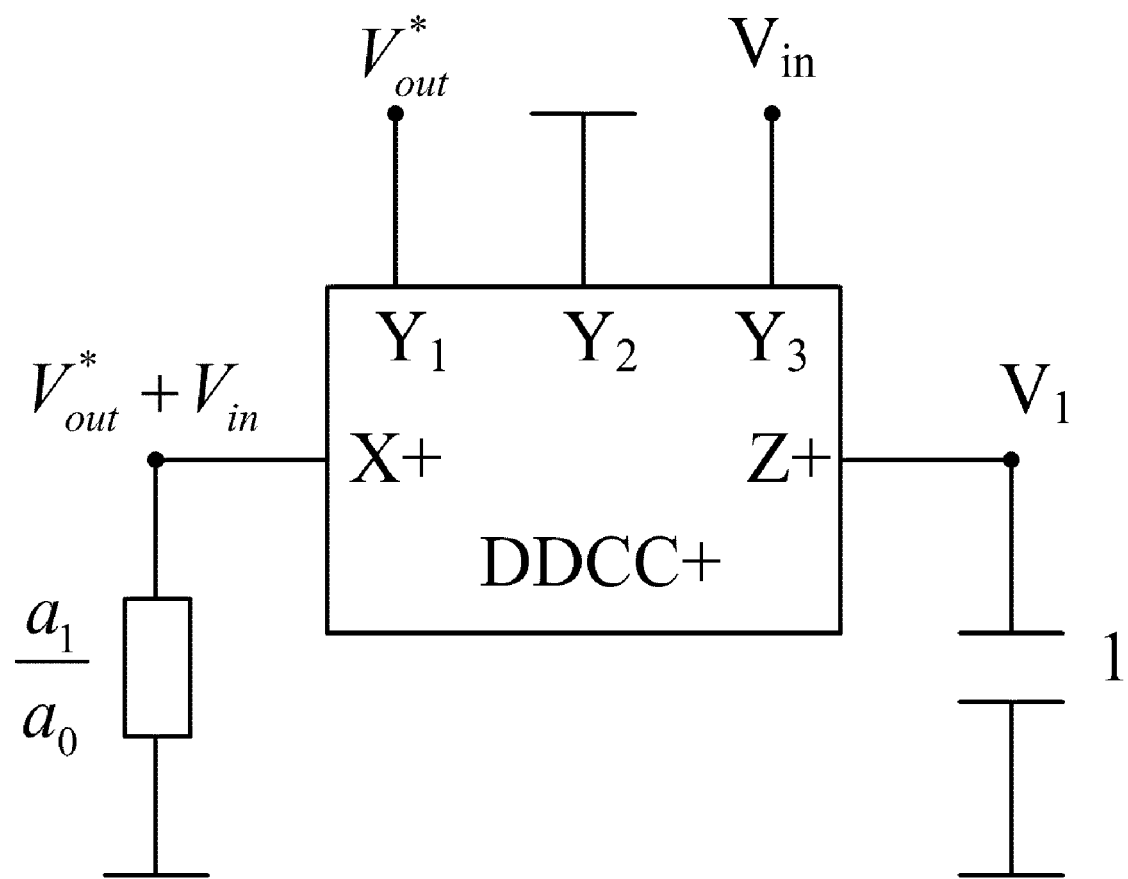
Figure 2:
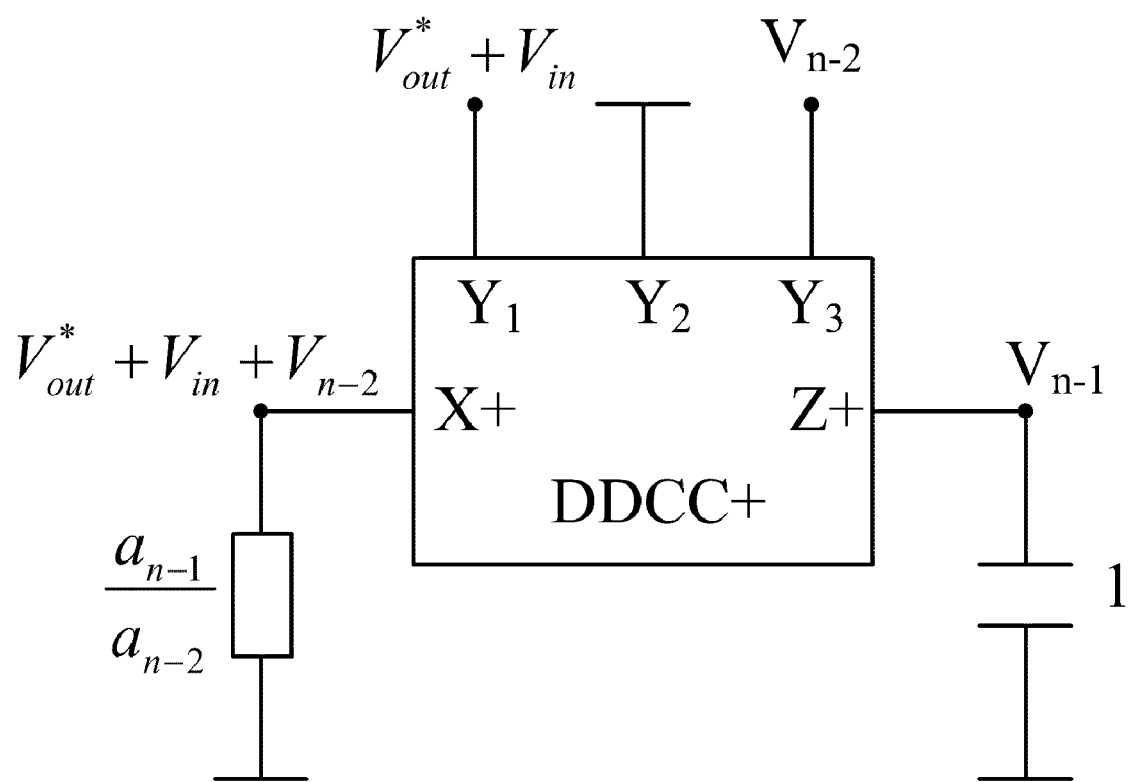
Figures 2, 3:
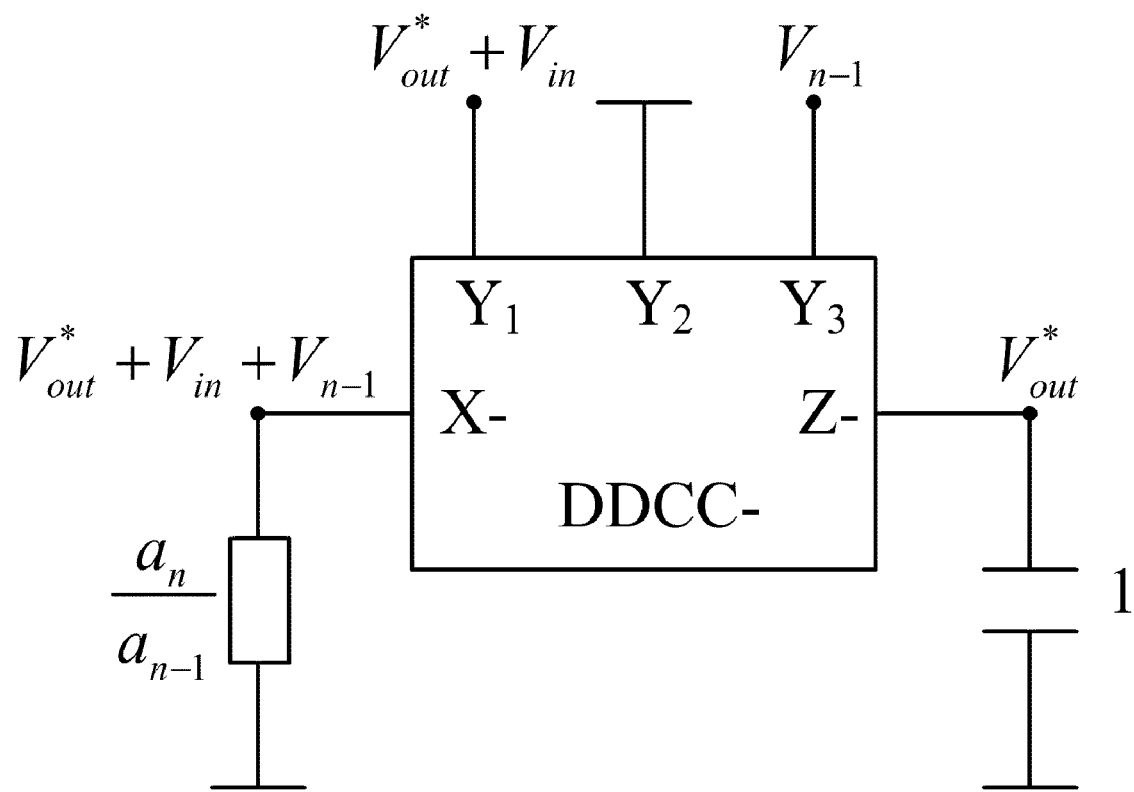
Figures 2, 3, 4:
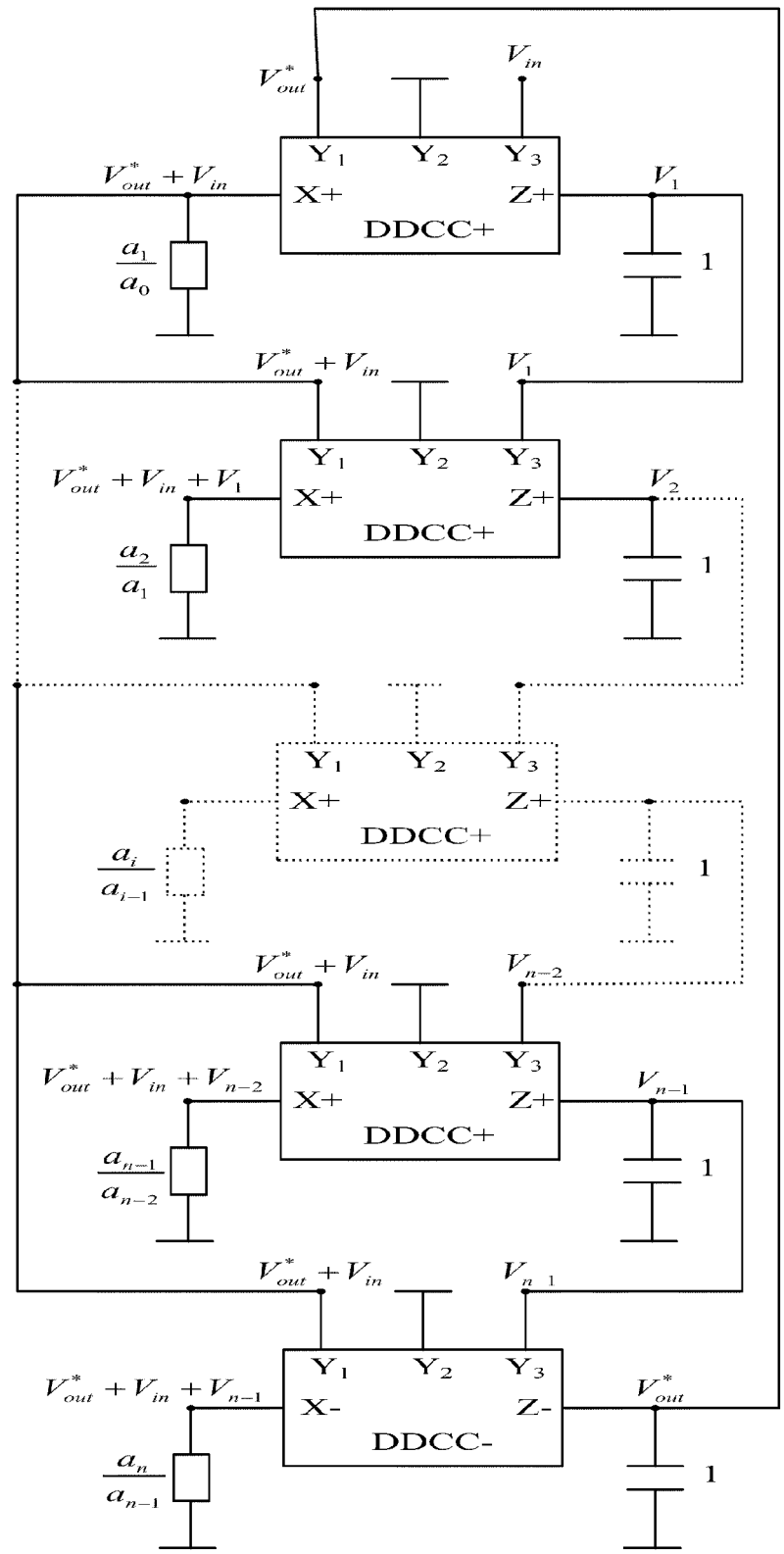
Figures 2, 3, 4, 5:
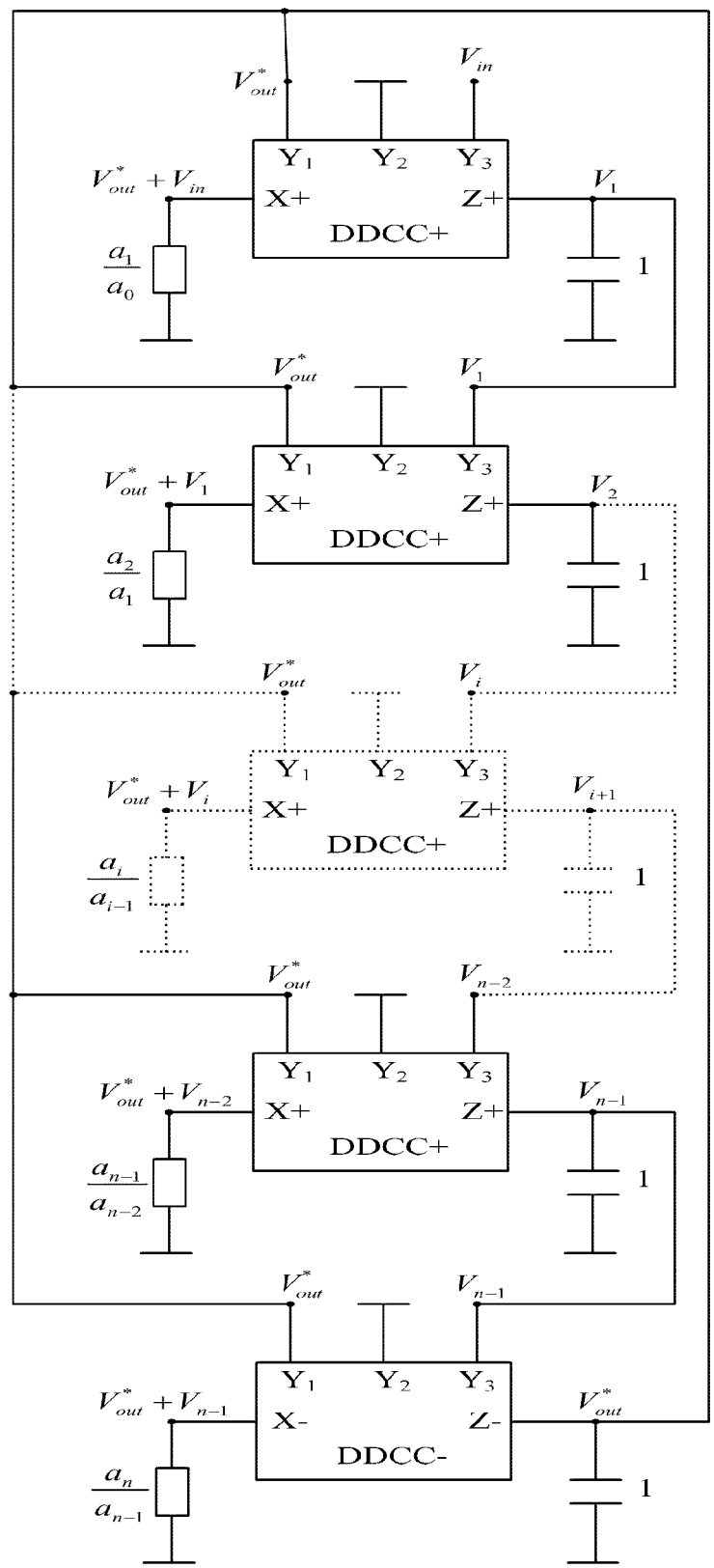
Figures 2, 3, 4, 5, 6:
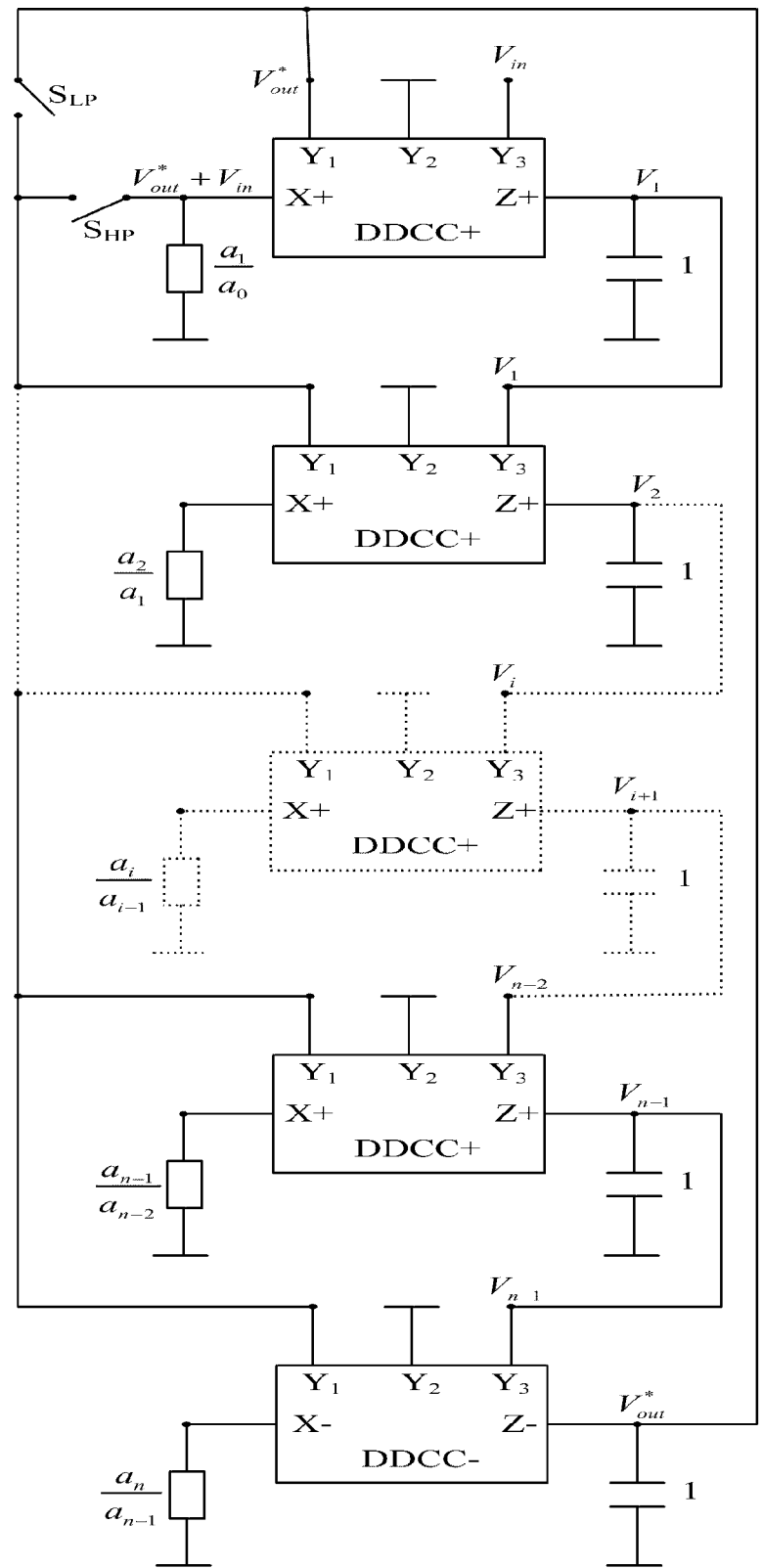
Figures 1, 3:
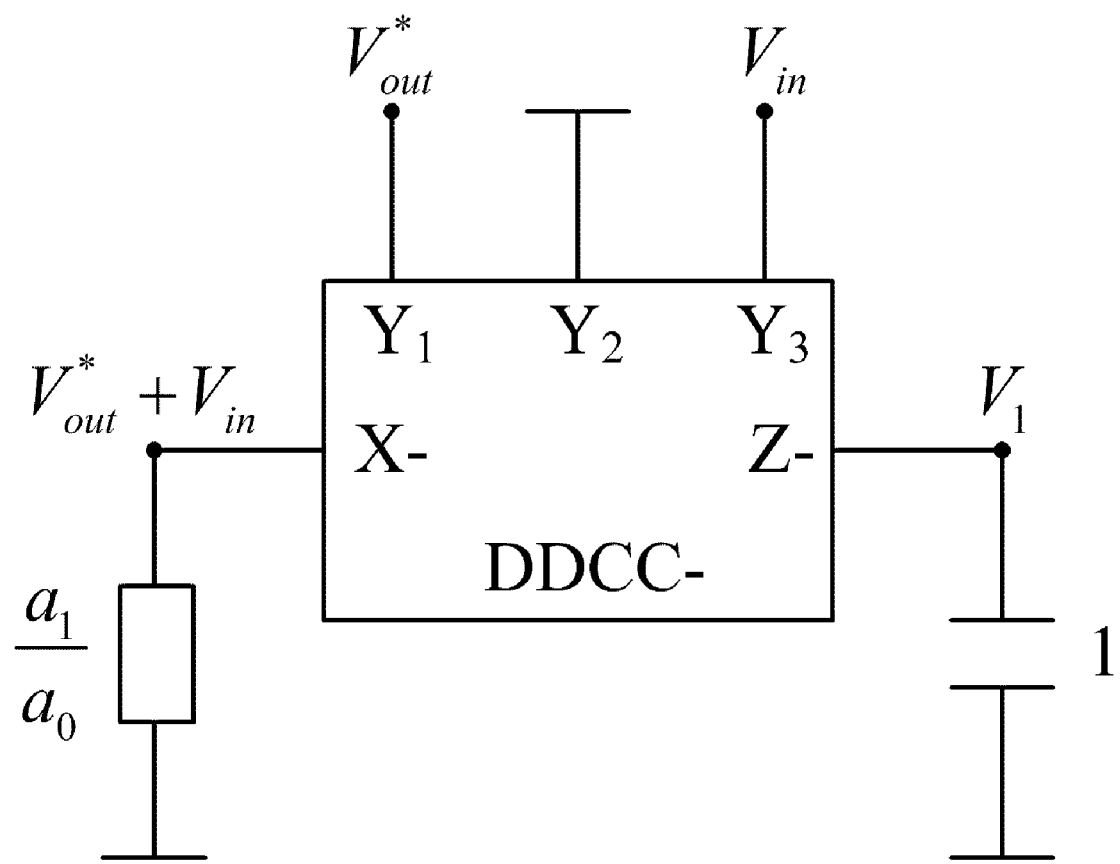
Figures 2, 3:
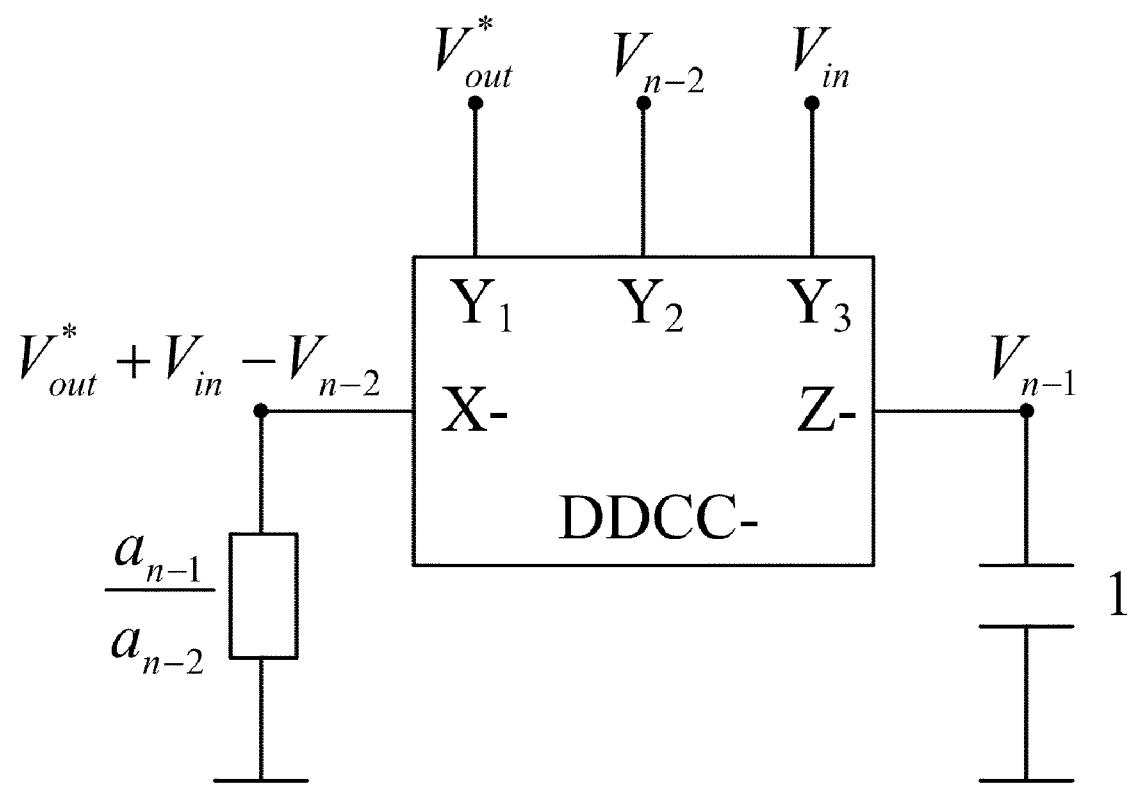
Figure 3:
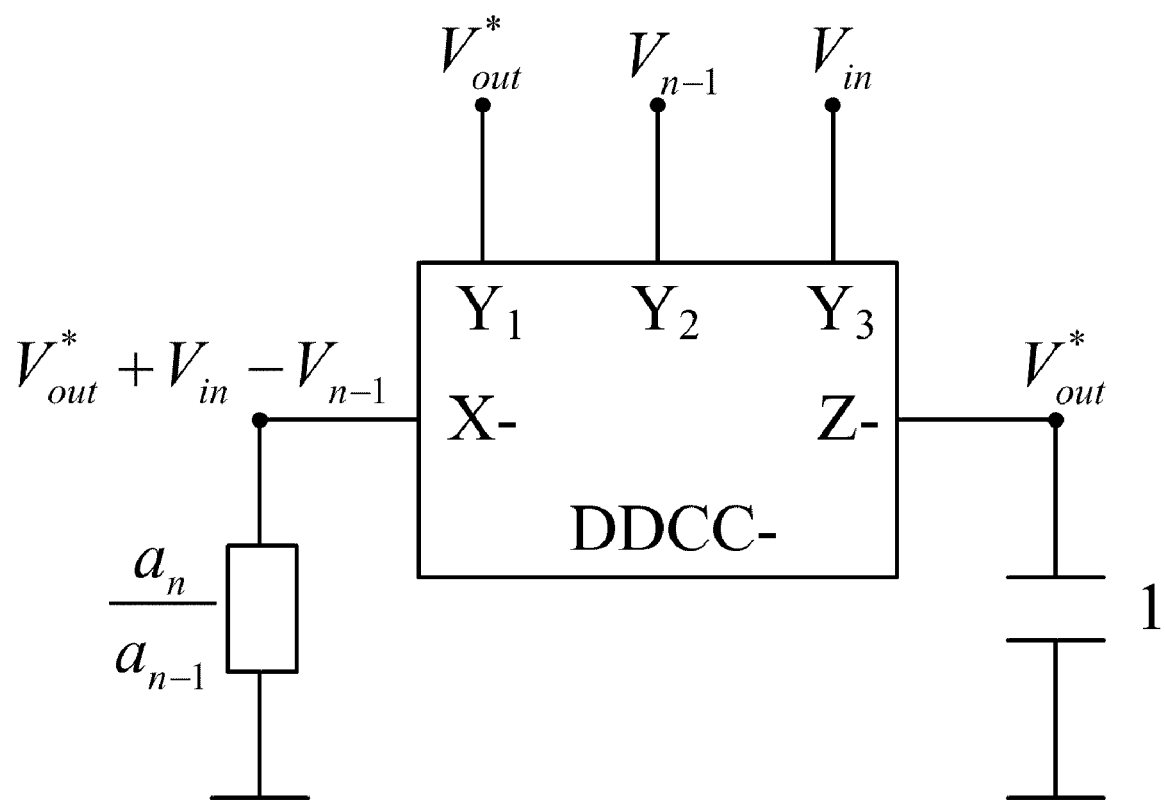
Figures 3, 4:
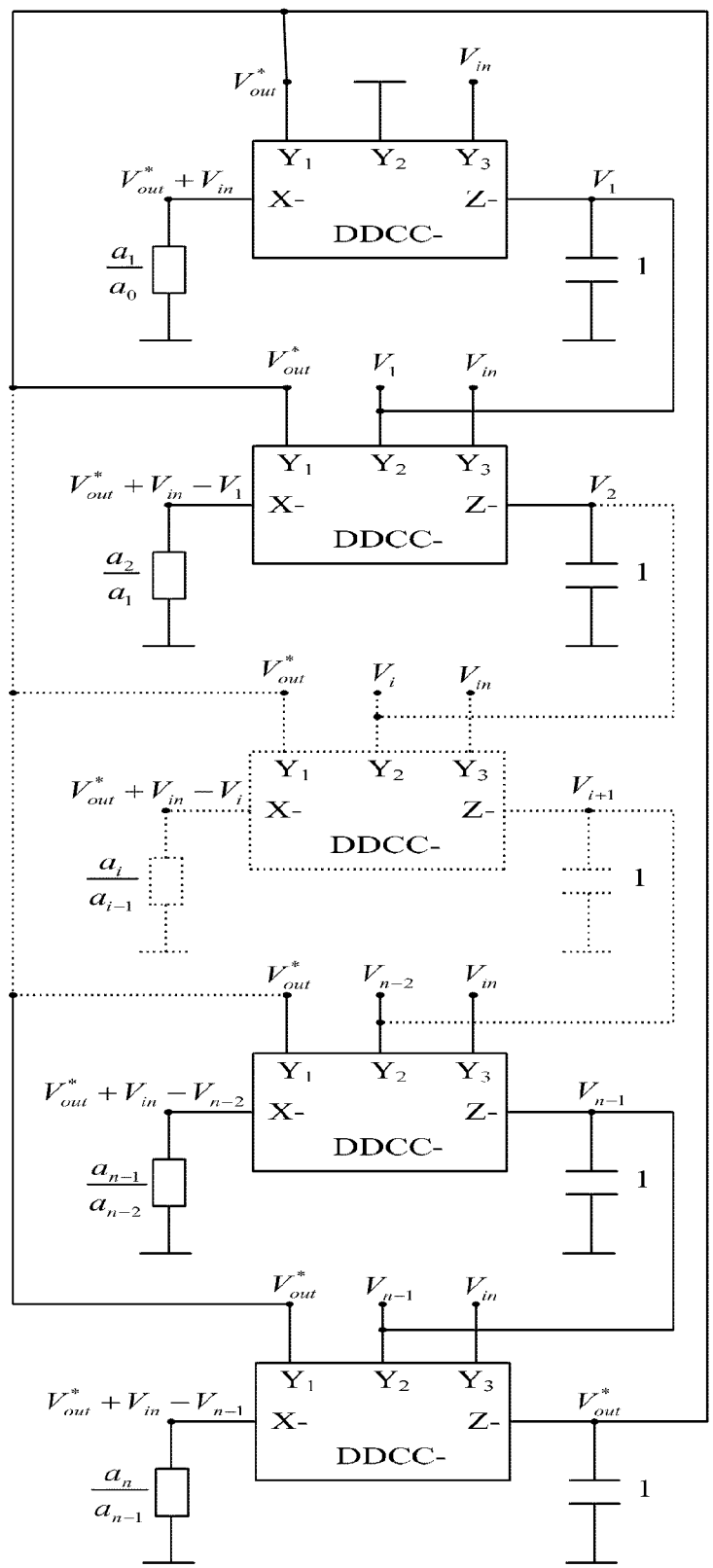
Figures 3, 4, 5:
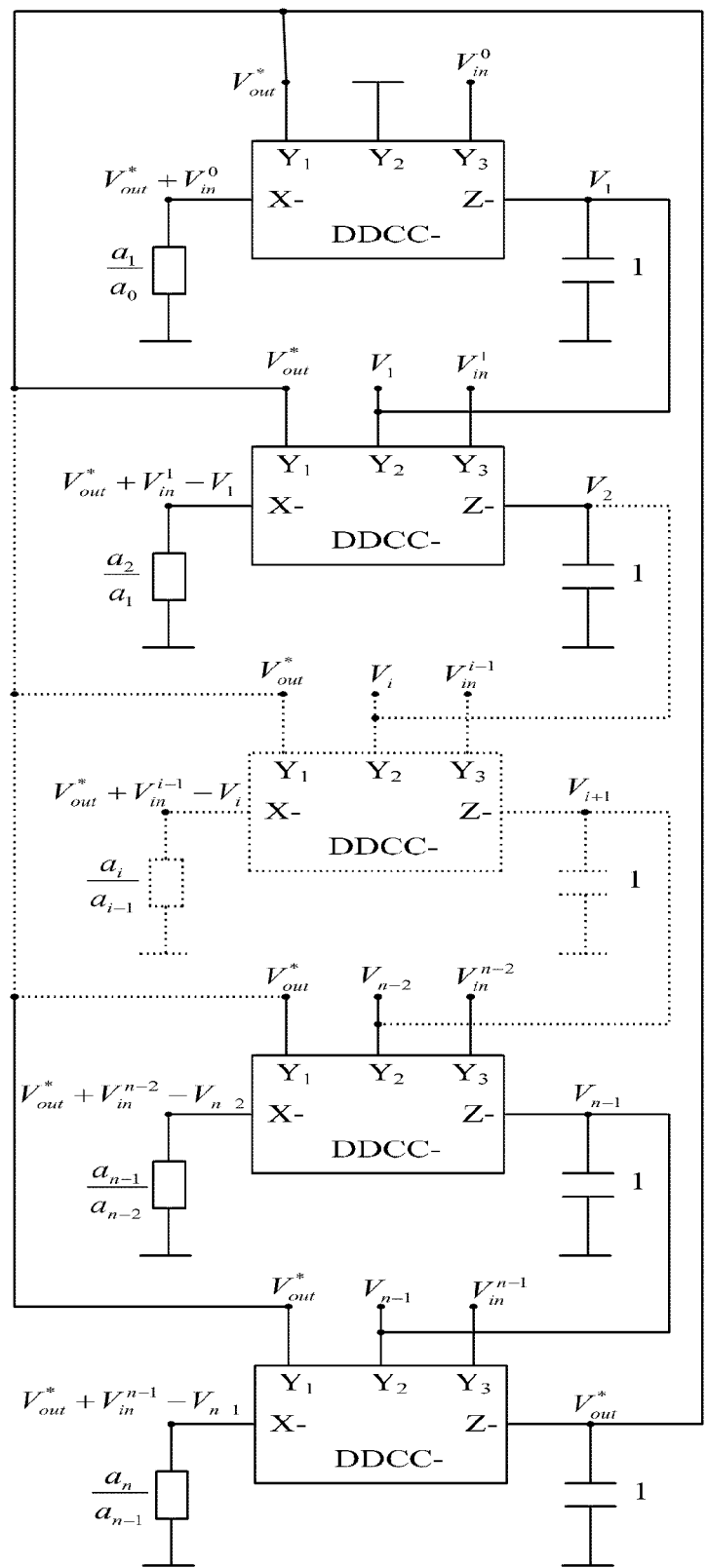
Figures 3, 4, 5, 6:
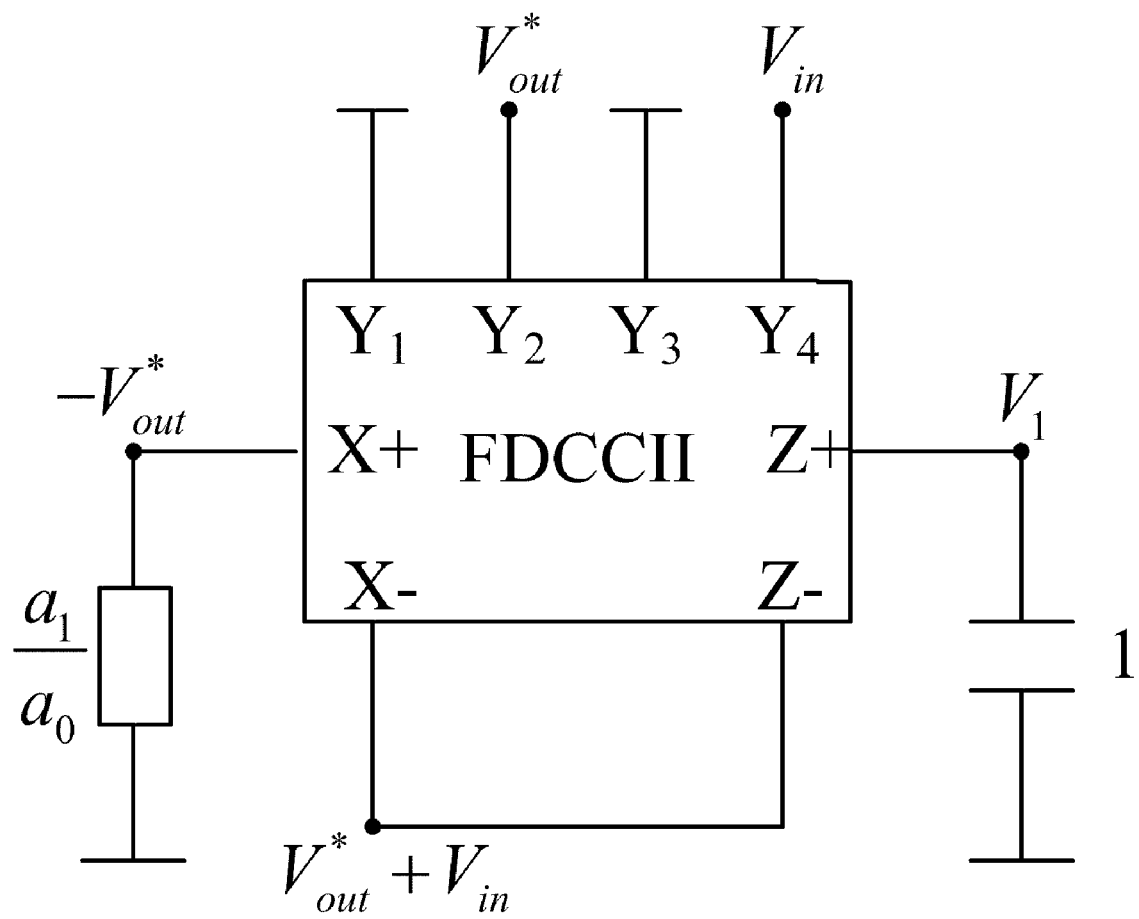
Figures 3, 4, 5, 6, 7:
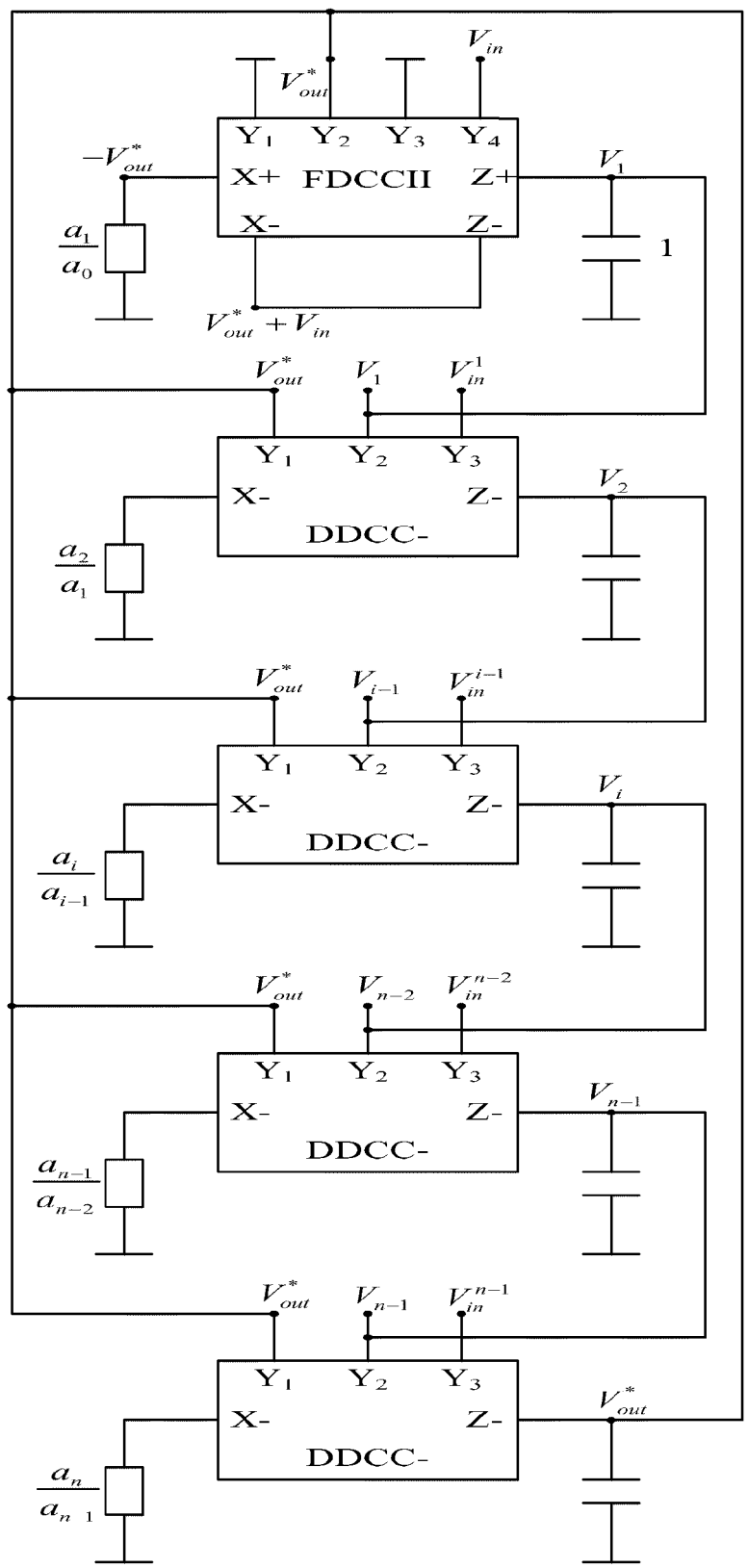
Figures 3, 4, 5, 6, 7, 8:
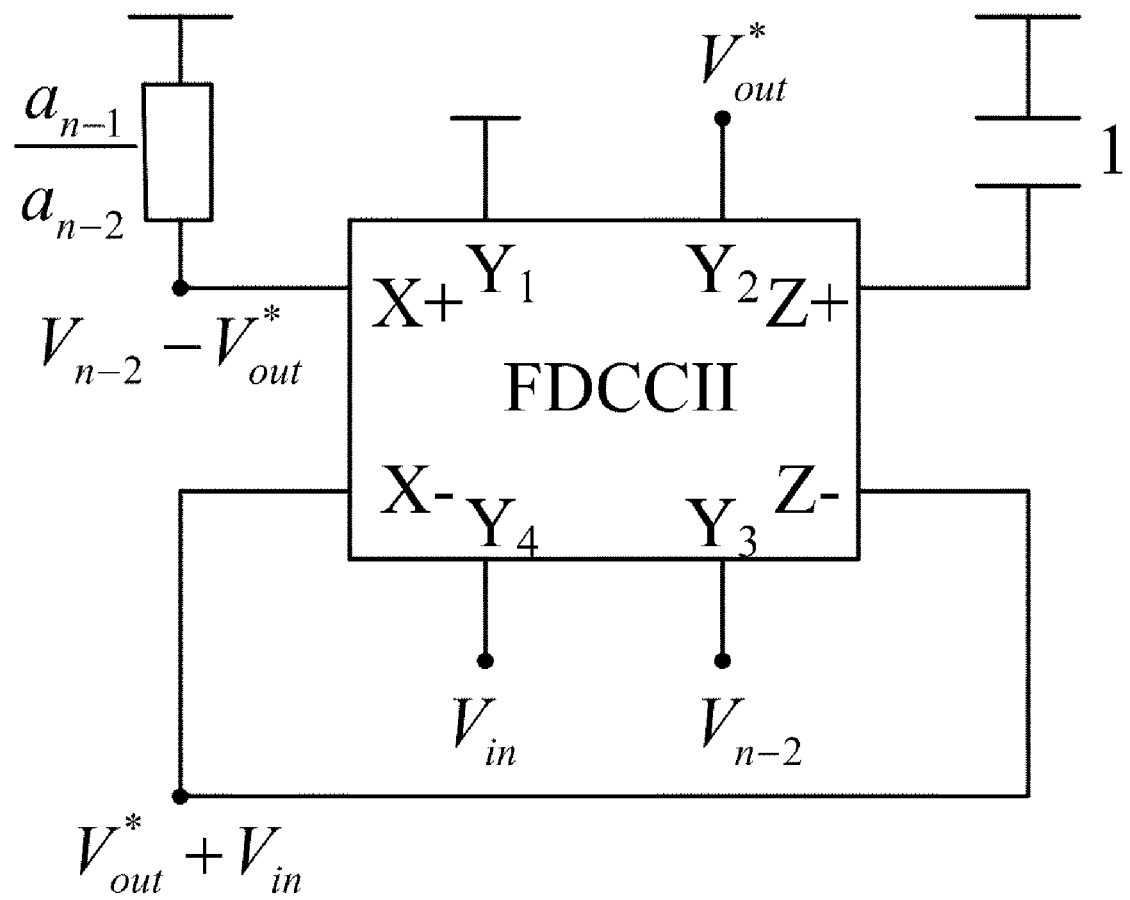
Figures 3, 4, 5, 6, 7, 8, 9:
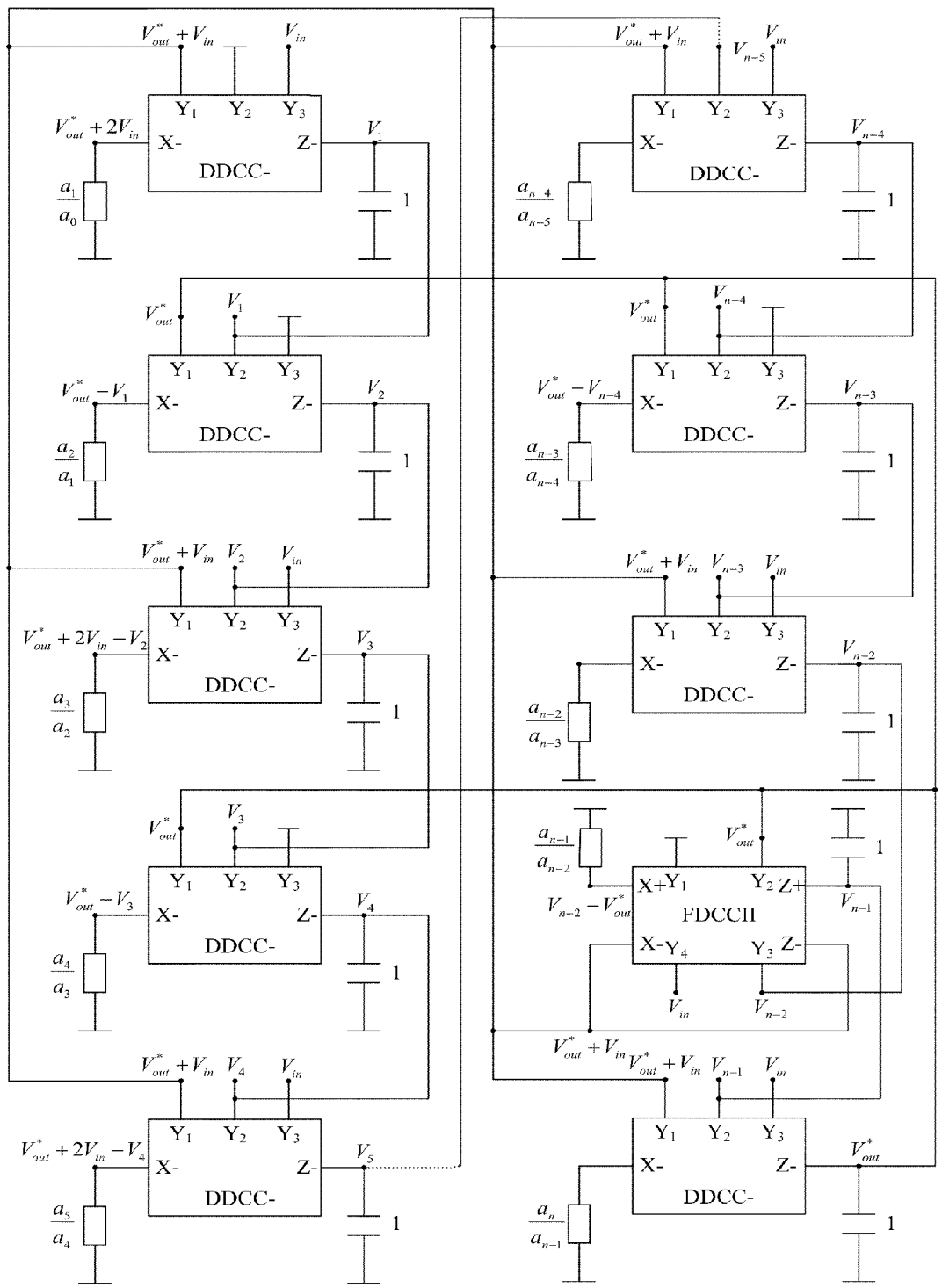
Figures 3, 4, 5, 6, 7, 8, 9, 10:
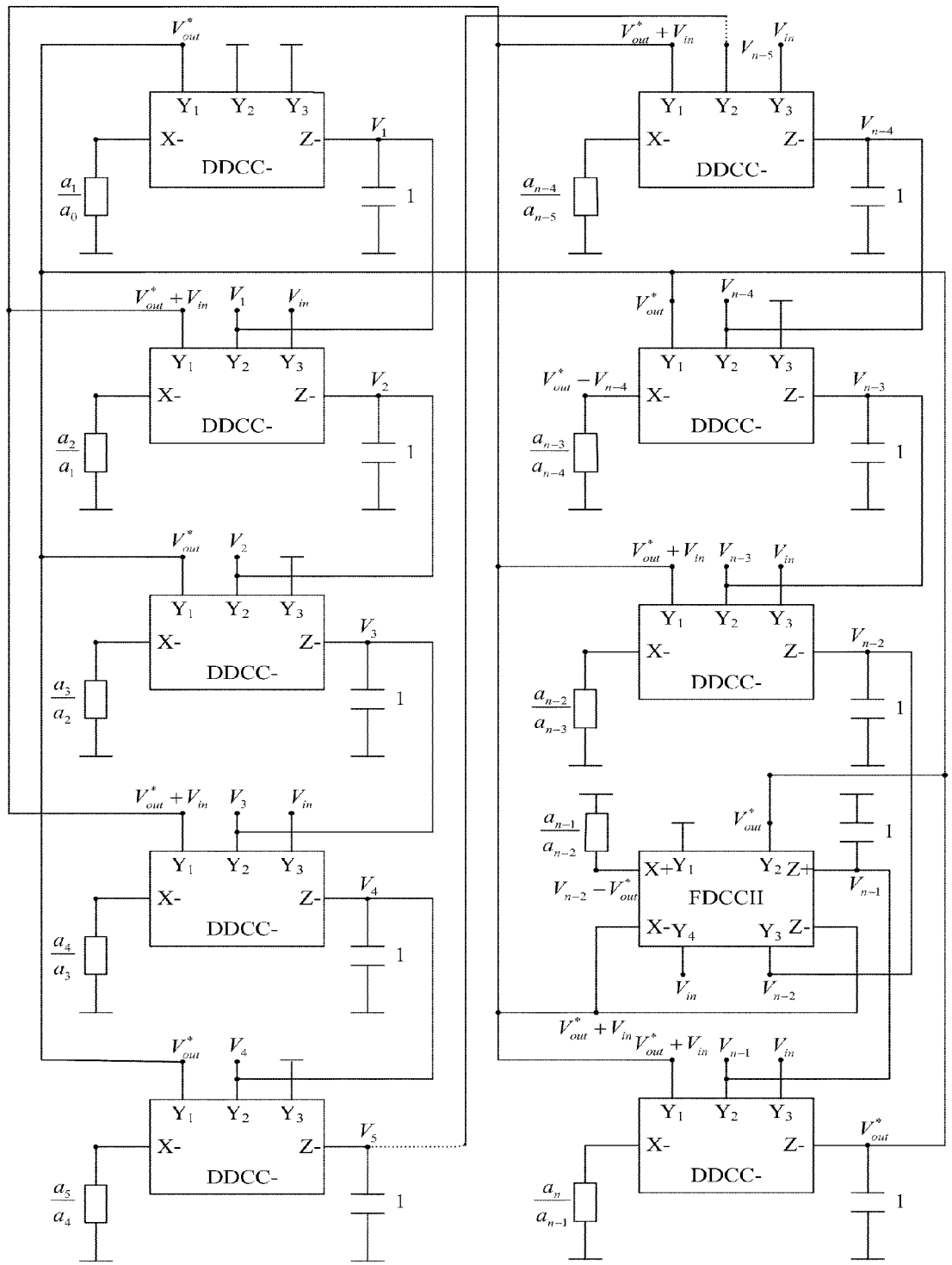
Figures 3, 4, 5, 6, 7, 8, 9, 10, 11:
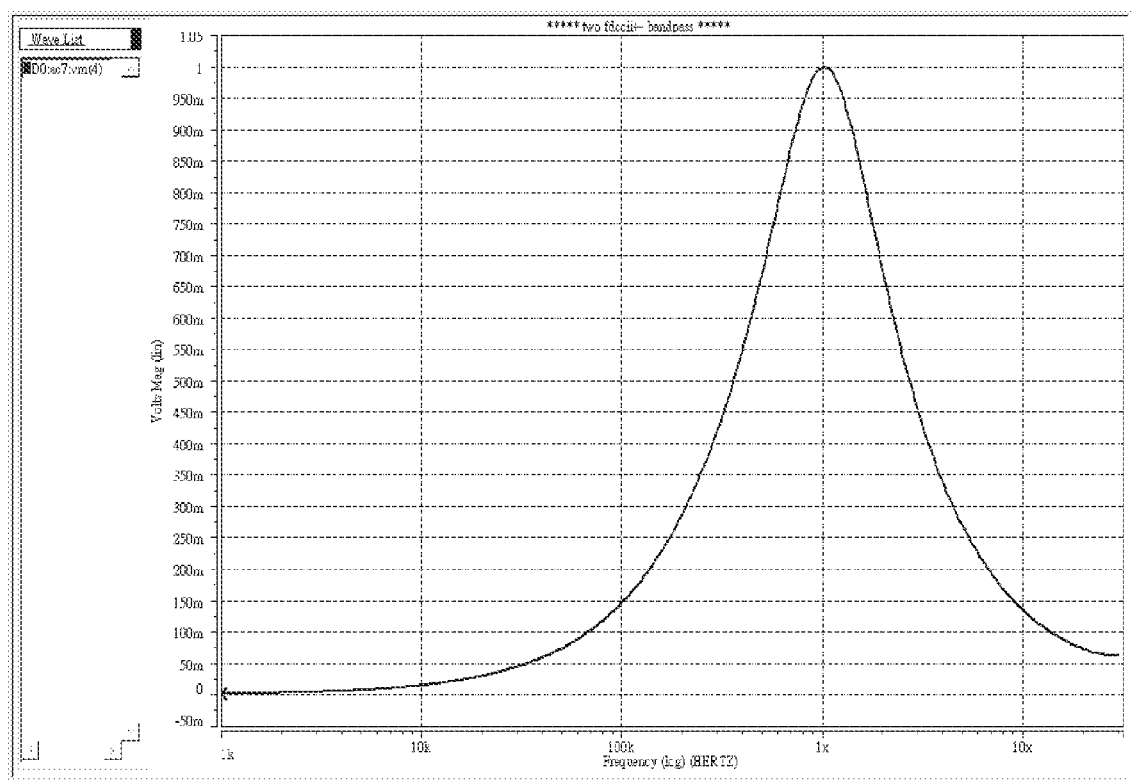
Figures 3, 4, 5, 6, 7, 8, 9, 10, 11, 12:
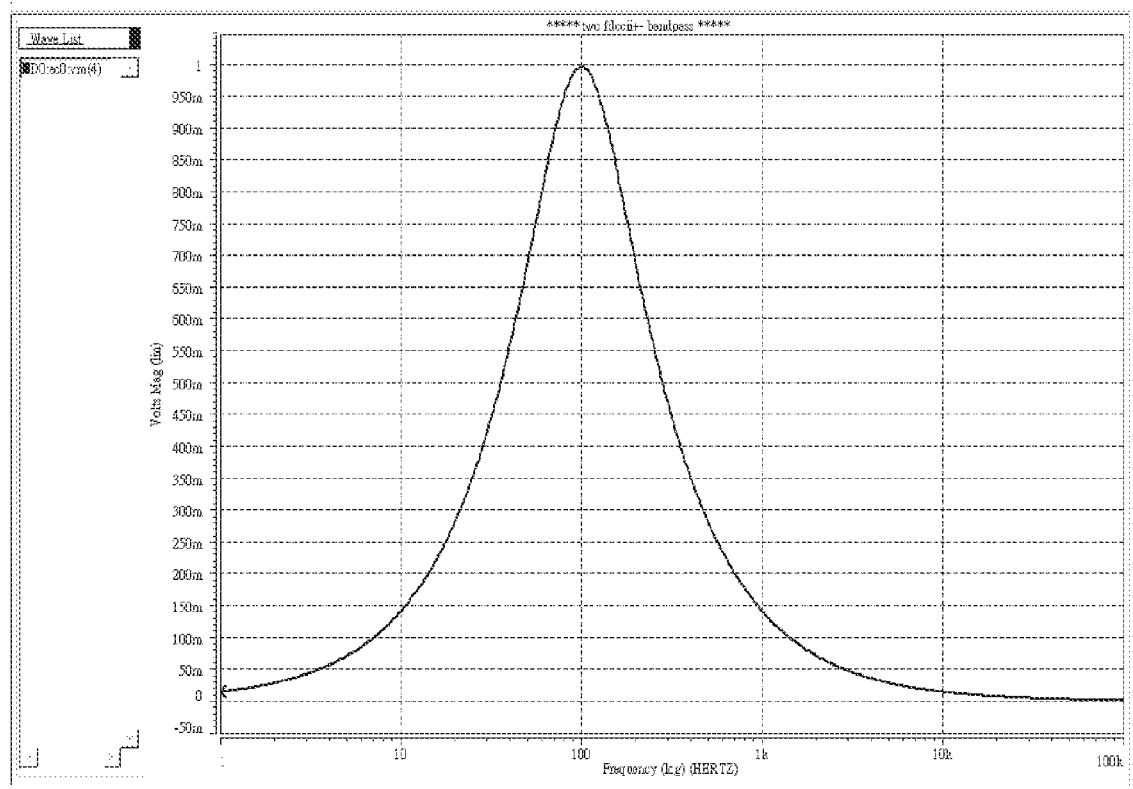
Figures 3, 4, 5, 6, 7, 8, 9, 10, 11, 12, 13:
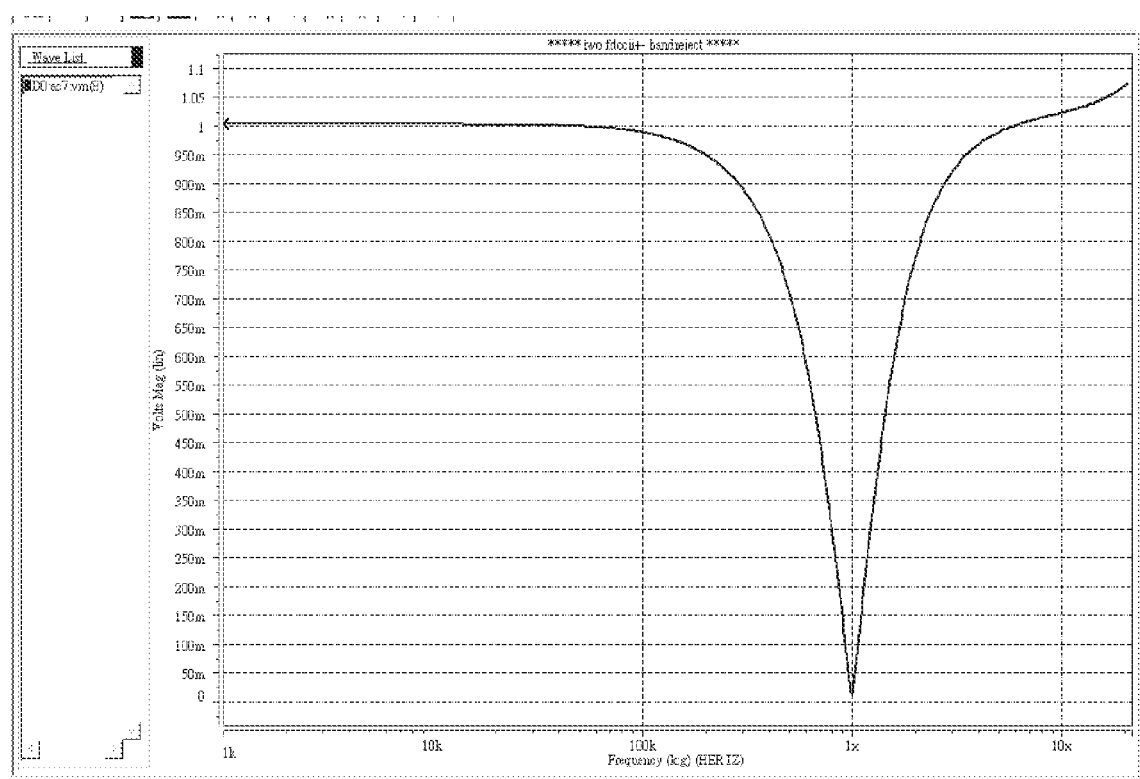
Figures 3, 4, 5, 6, 7, 8, 9, 10, 11, 12, 13, 14:
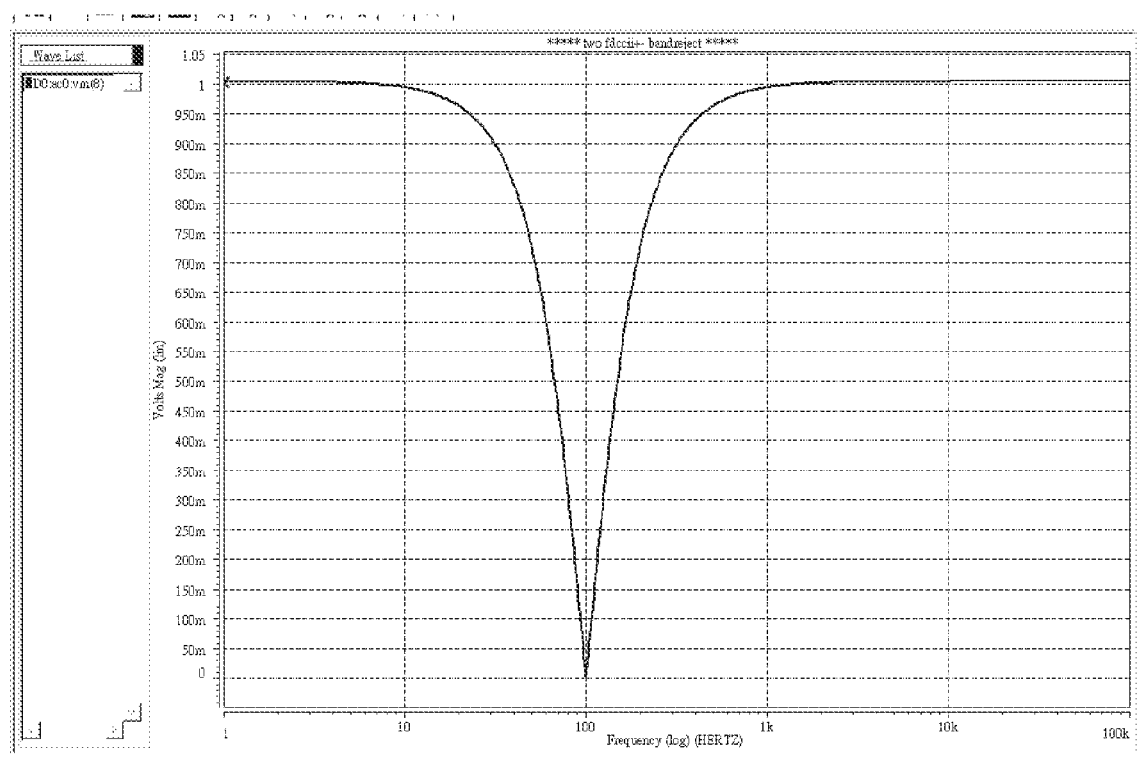
Figures 3, 4, 5, 6, 7, 8, 9, 10, 11, 12, 13, 14, 15:
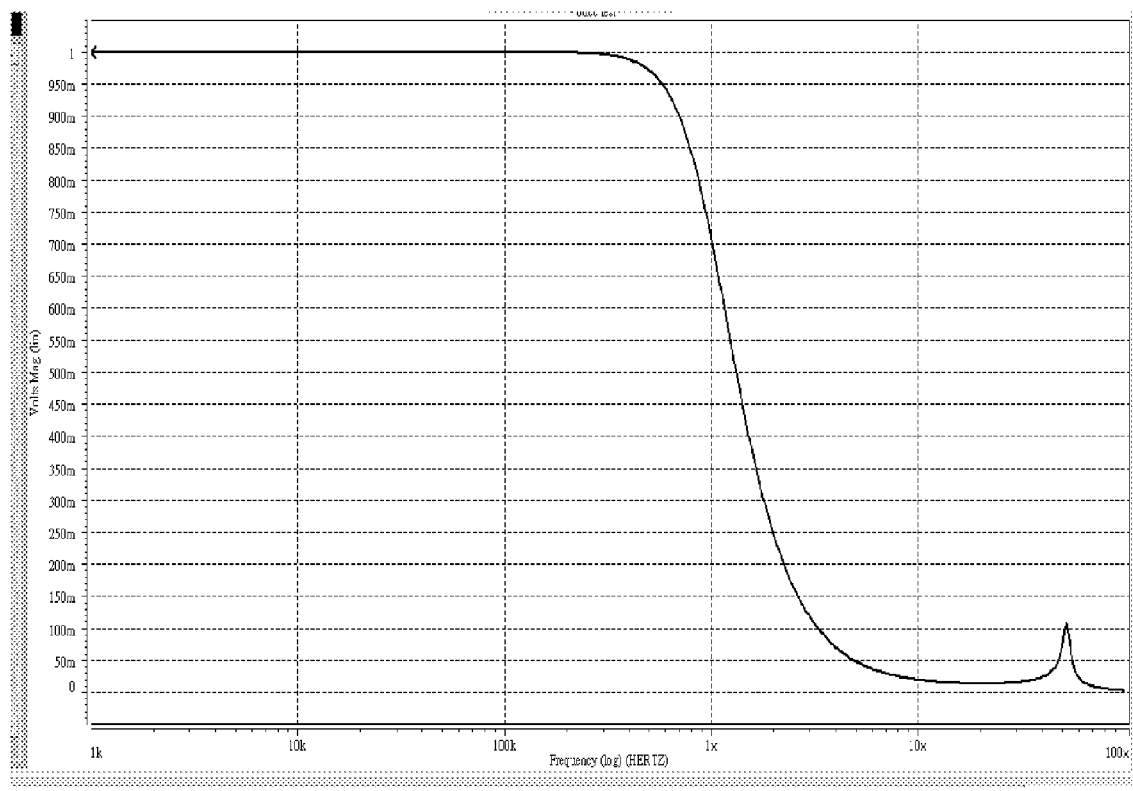
Figures 3, 4, 5, 6, 7, 8, 9, 10, 11, 12, 13, 14, 15, 16:
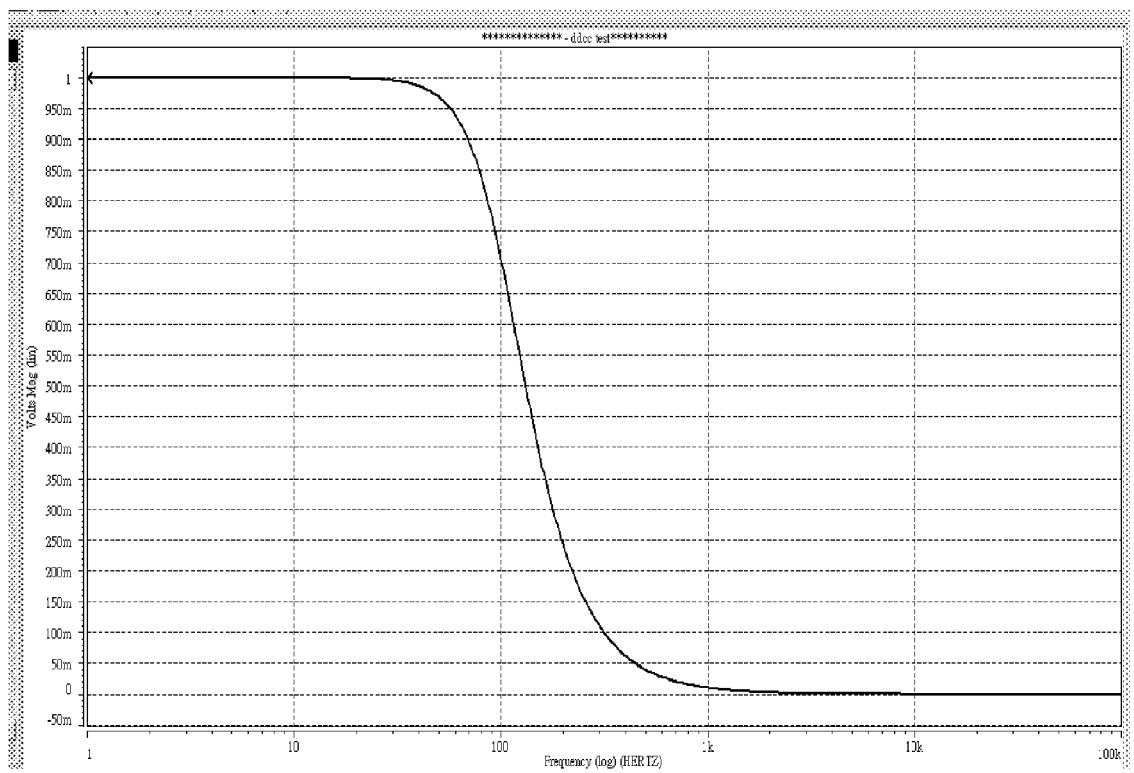
Figures 3, 4, 5, 6, 7, 8, 9, 10, 11, 12, 13, 14, 15, 16, 17:
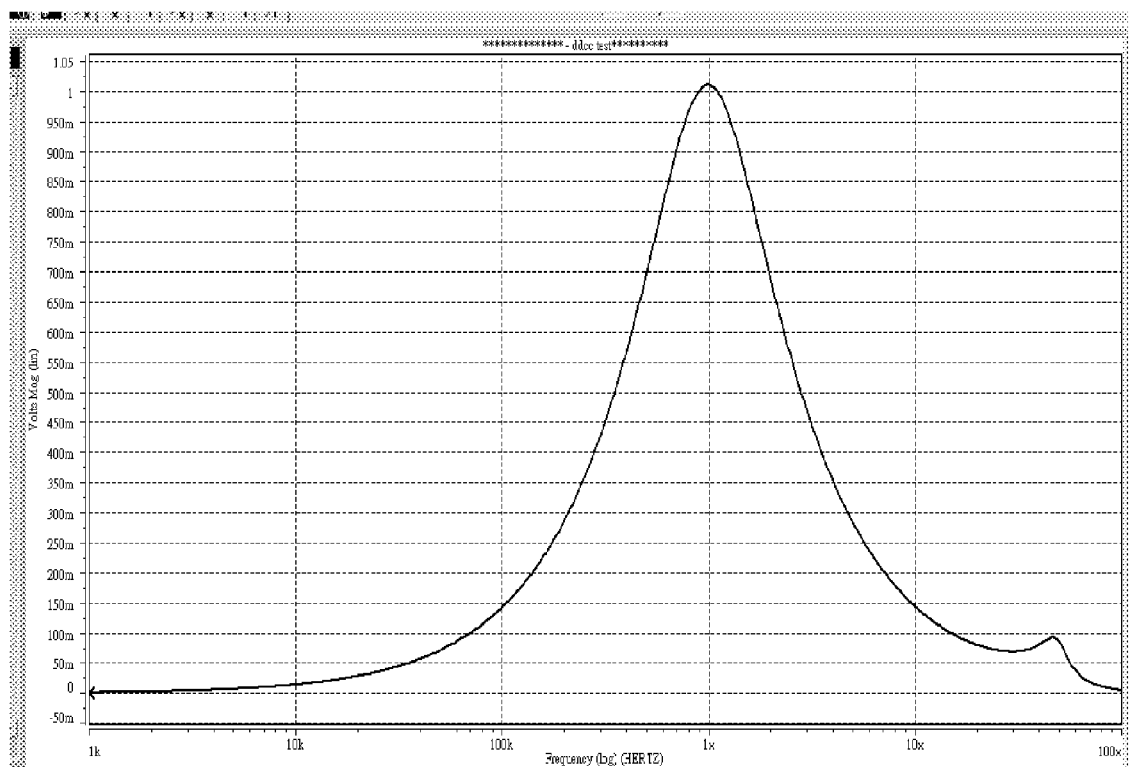
Figures 3, 4, 5, 6, 7, 8, 9, 10, 11, 12, 13, 14, 15, 16, 17, 18:
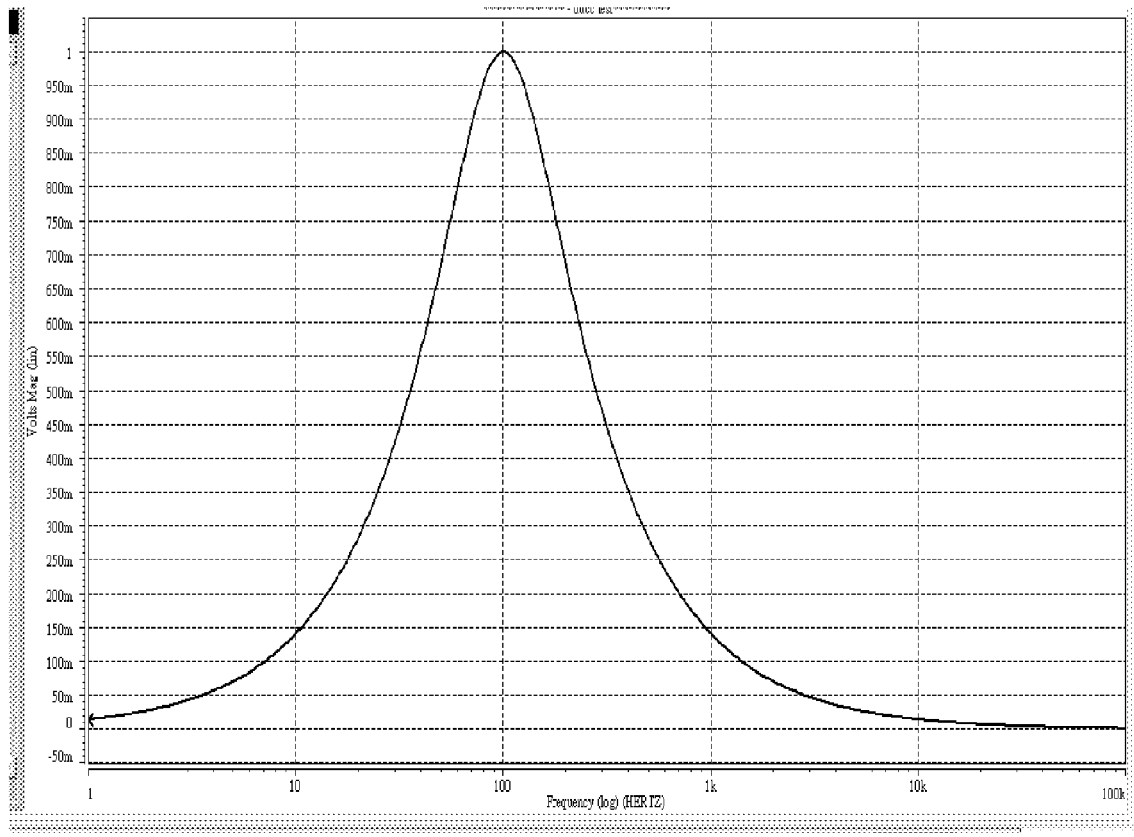
Figures 3, 4, 5, 6, 7, 8, 9, 10, 11, 12, 13, 14, 15, 16, 17, 18, 19:
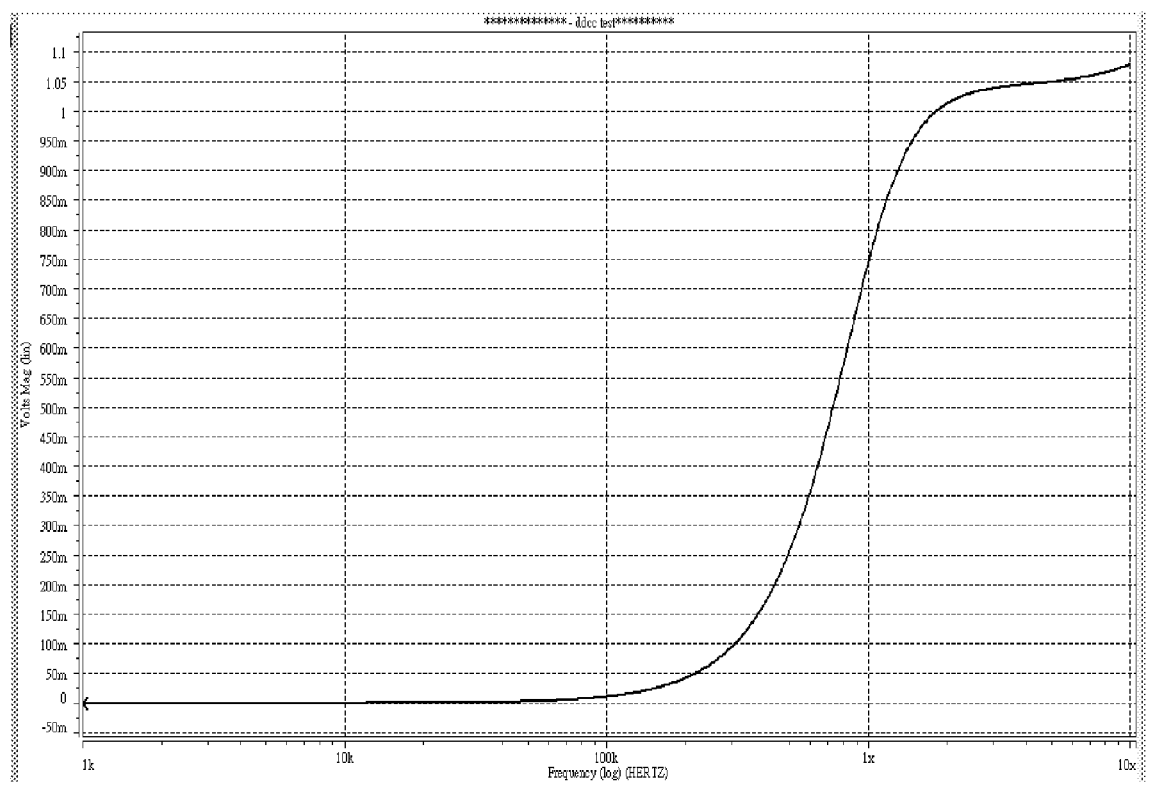
Figures 3, 4, 5, 6, 7, 8, 9, 10, 11, 12, 13, 14, 15, 16, 17, 18, 19, 20:
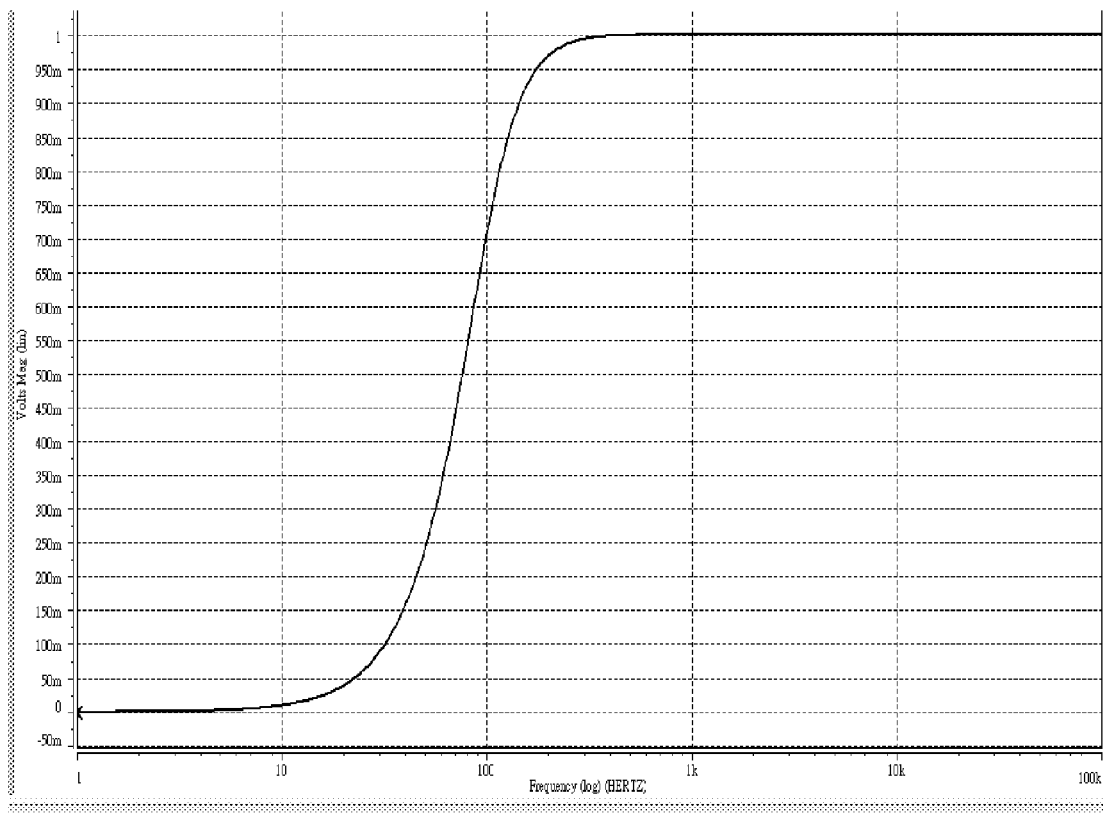
Figures 3, 4, 5, 6, 7, 8, 9, 10, 11, 12, 13, 14, 15, 16, 17, 18, 19, 20, 21:
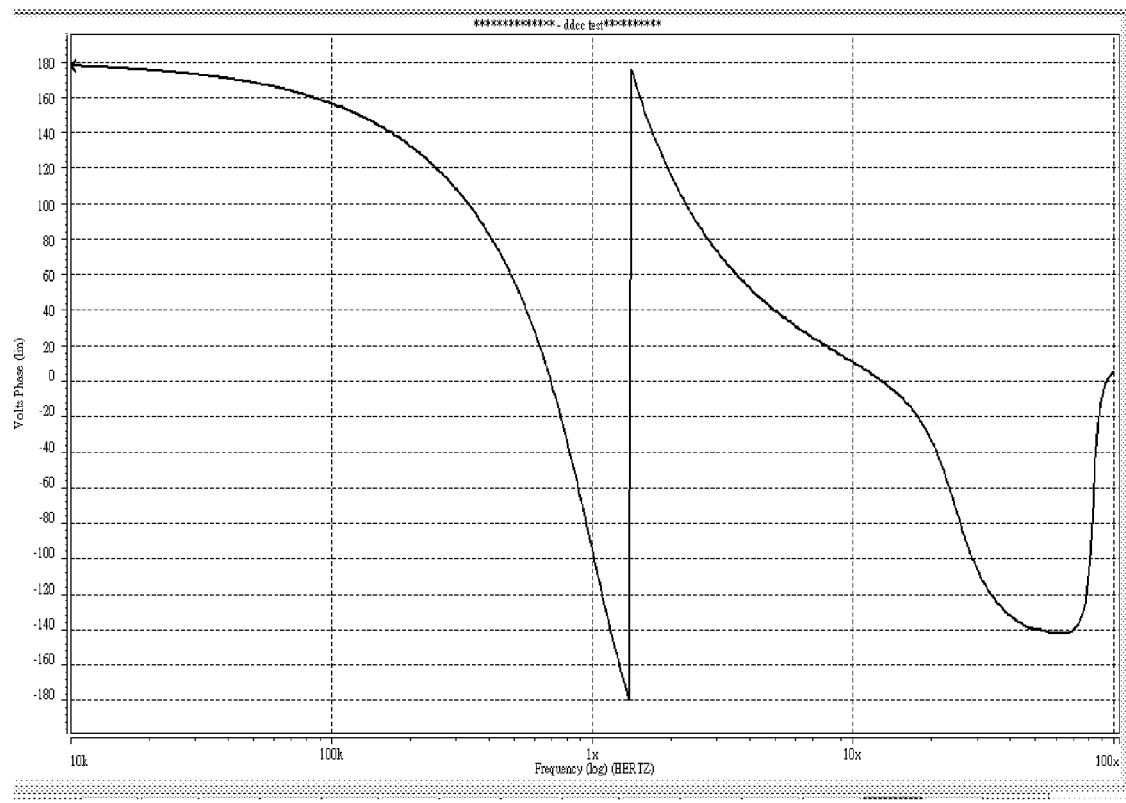
Figures 3, 4, 5, 6, 7, 8, 9, 10, 11, 12, 13, 14, 15, 16, 17, 18, 19, 20, 21, 22:
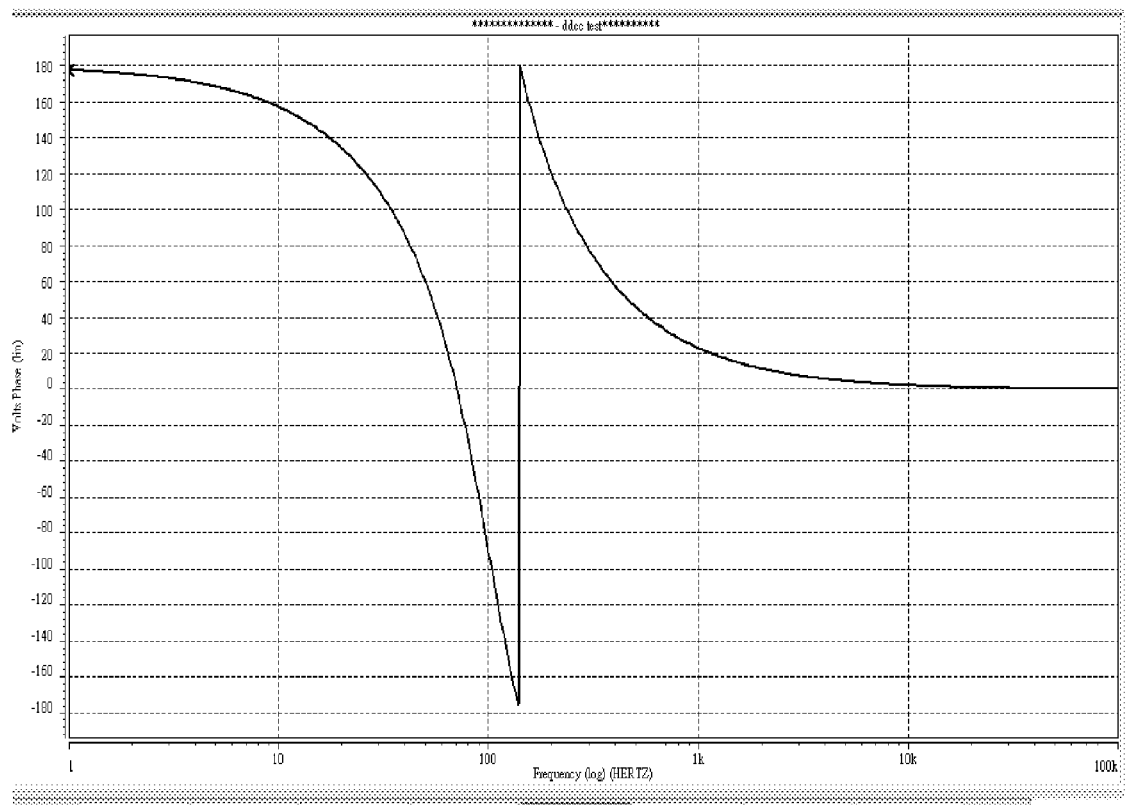
Figures 1, 4:
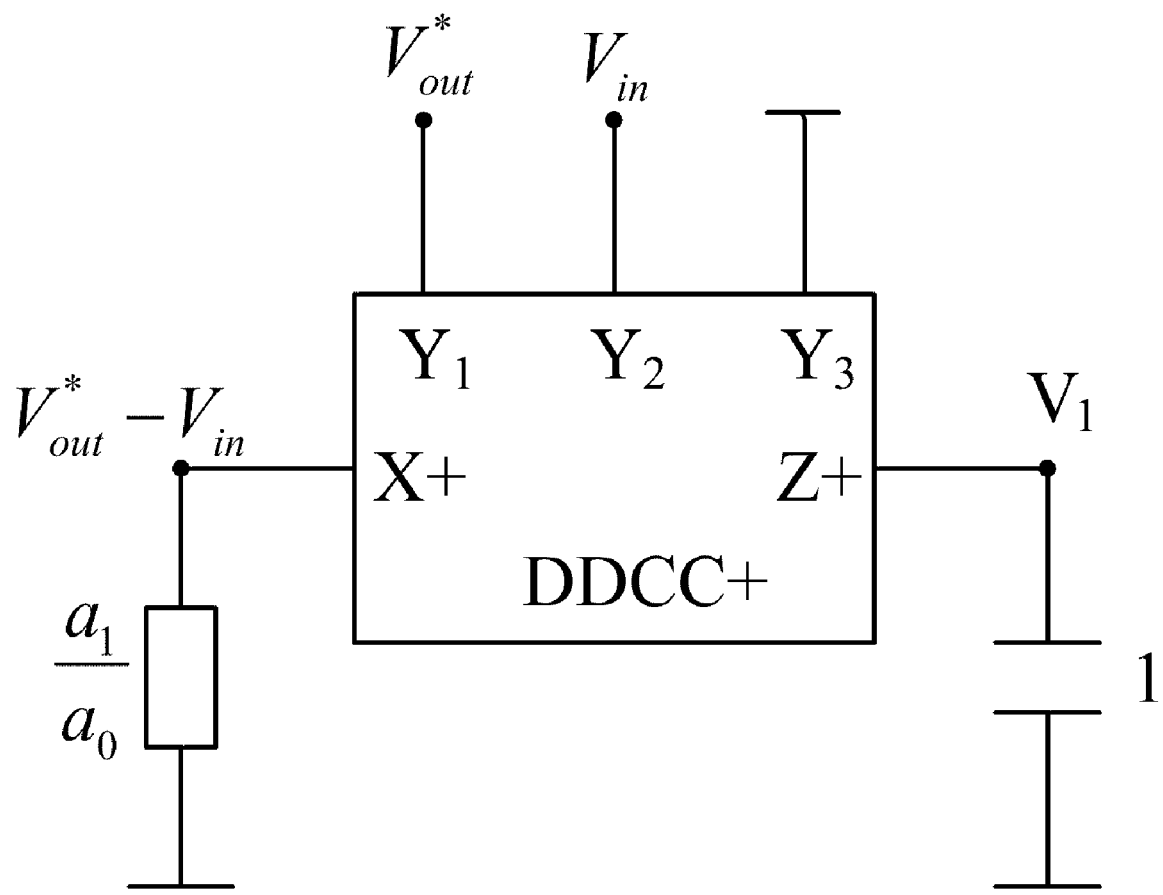
Figures 2, 4:
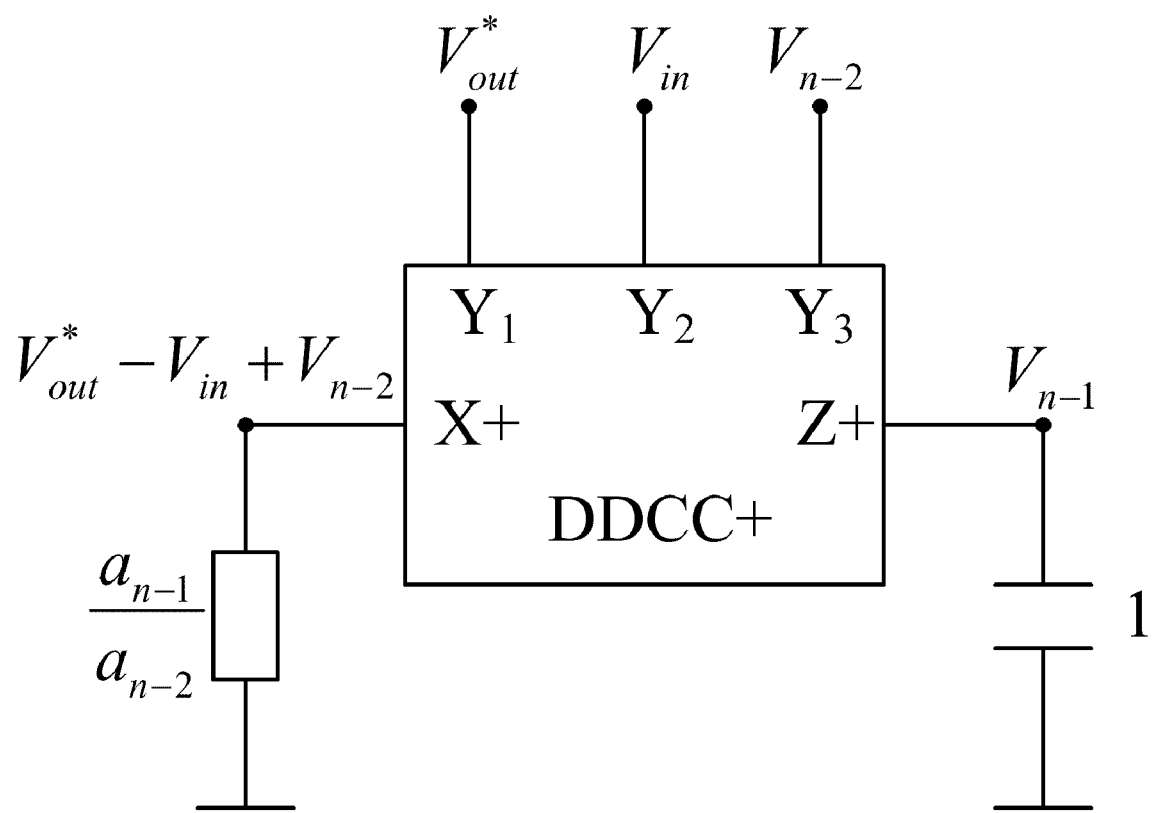
Figures 3, 4:
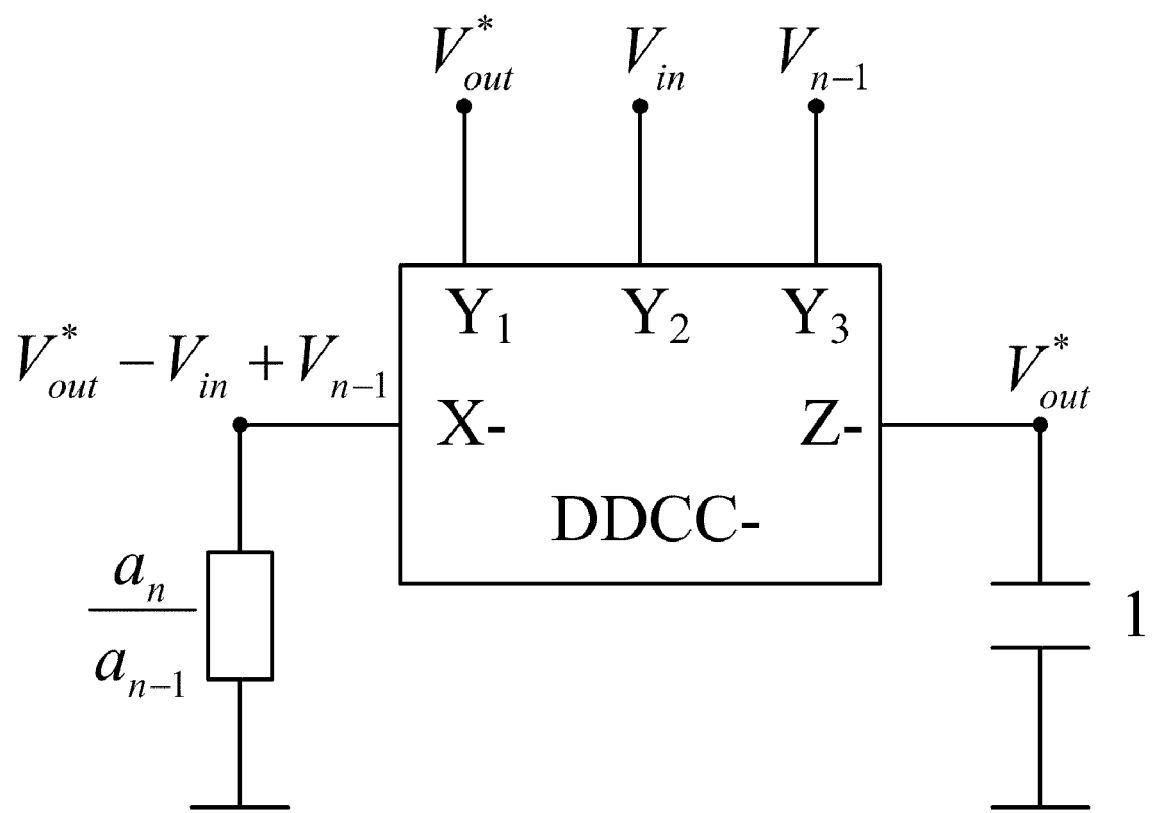
Figure 4:
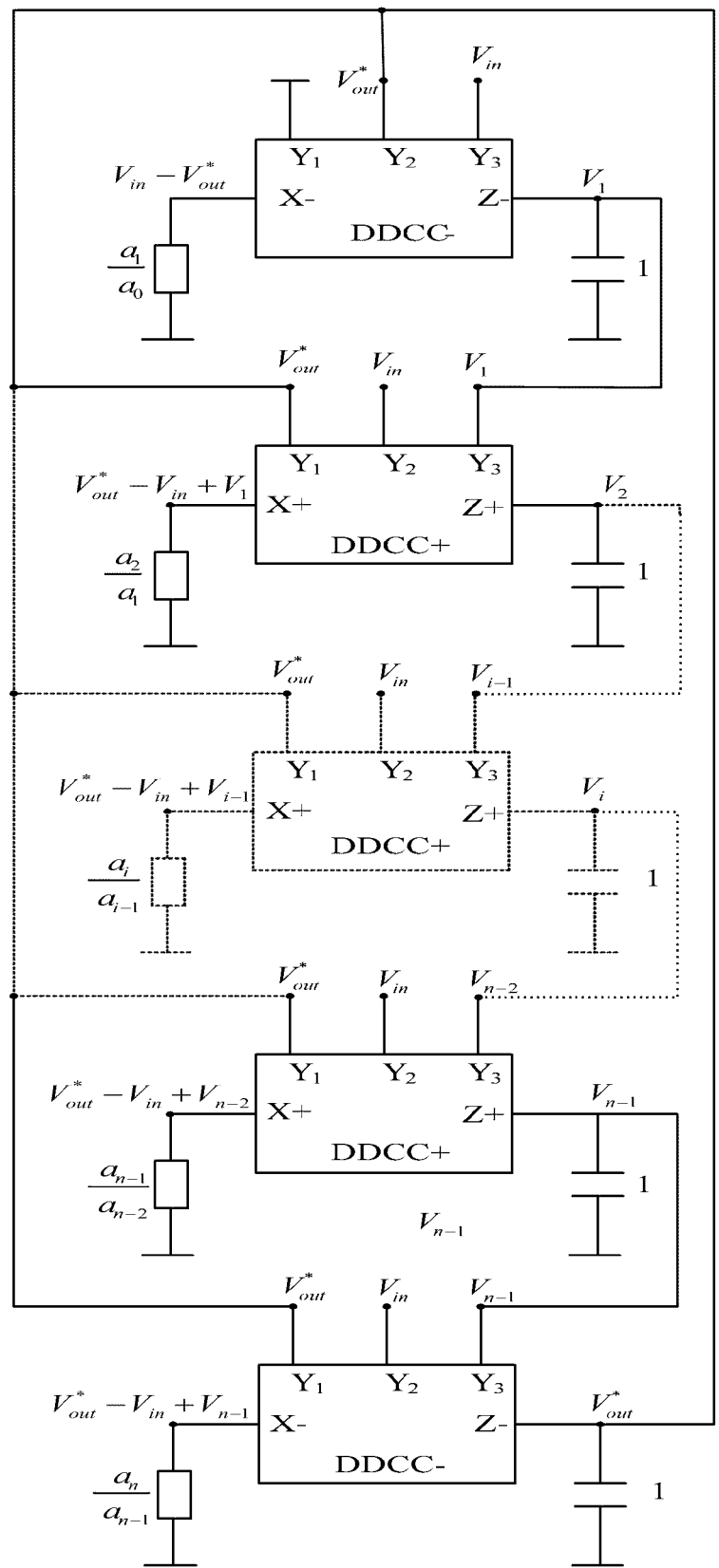
Figures 4, 5:
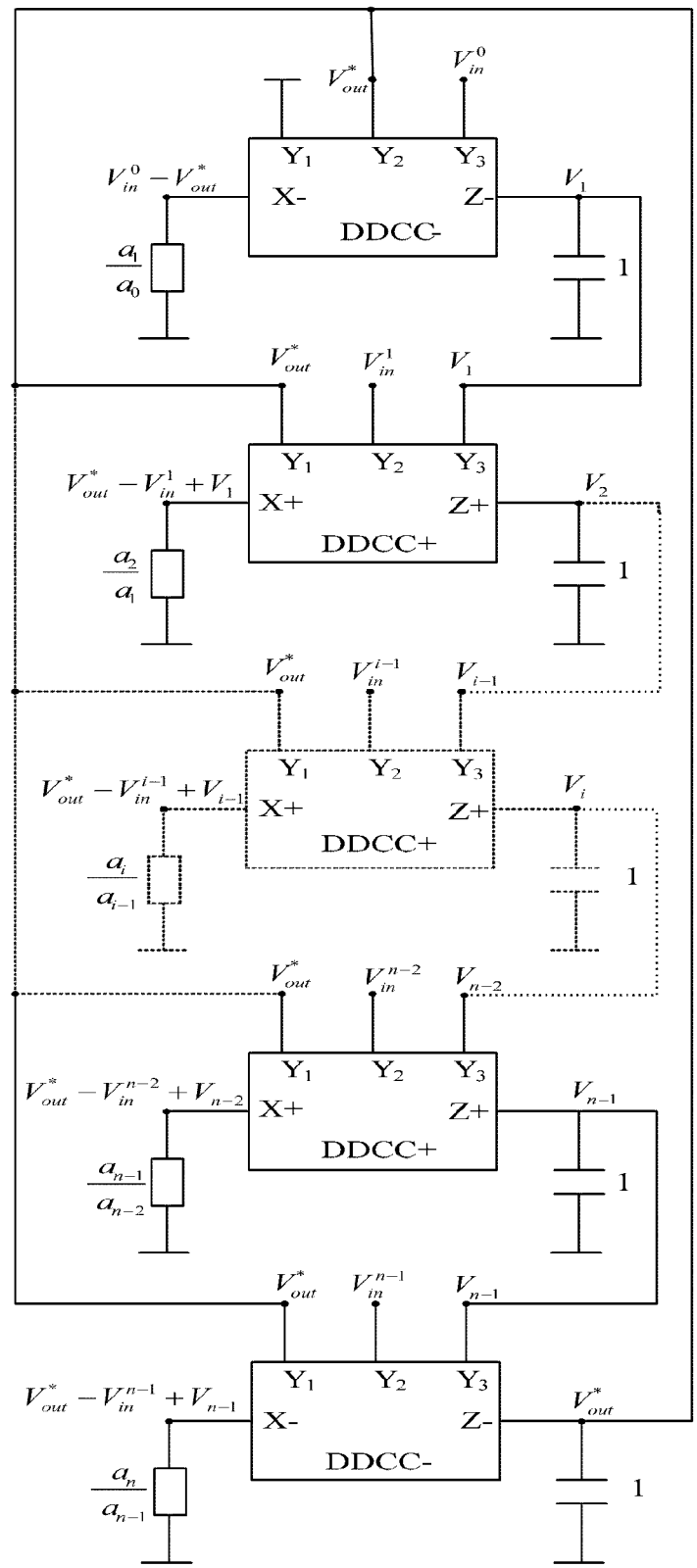
Figures 4, 5, 6:
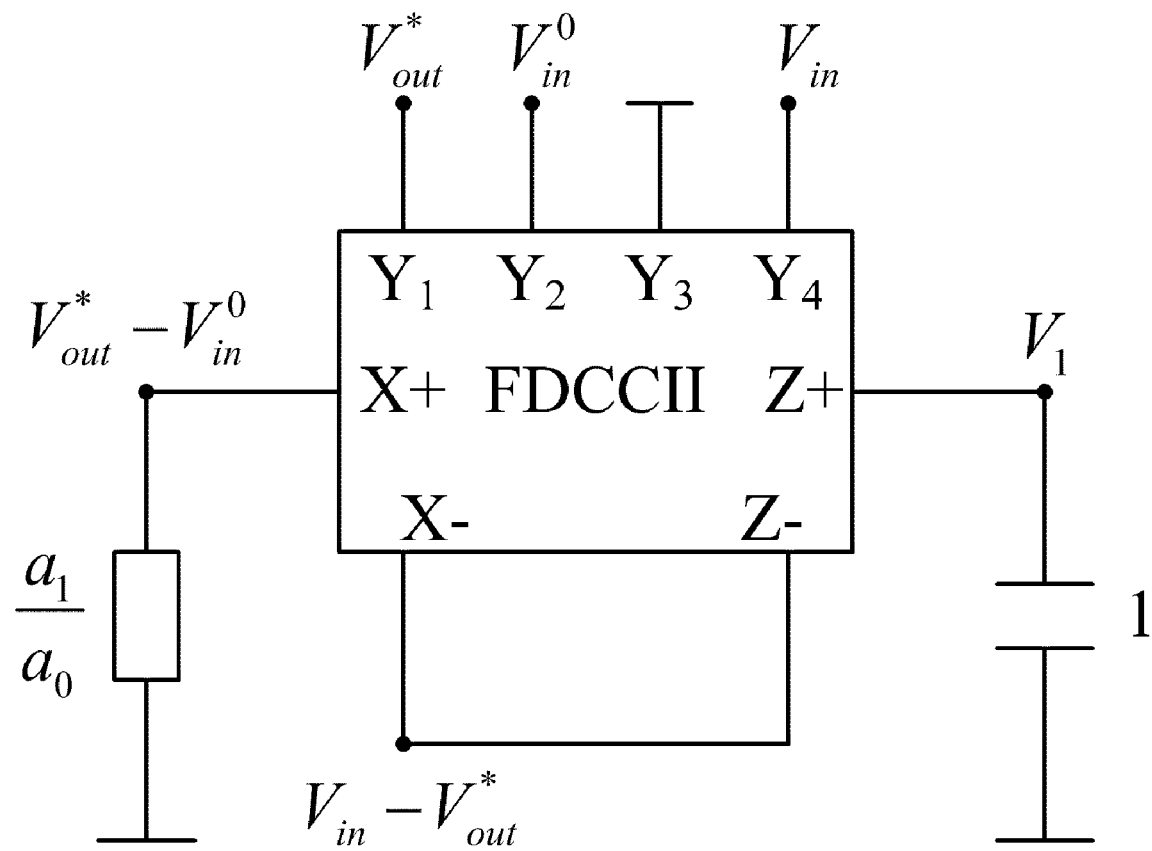
Figures 4, 5, 6, 7:
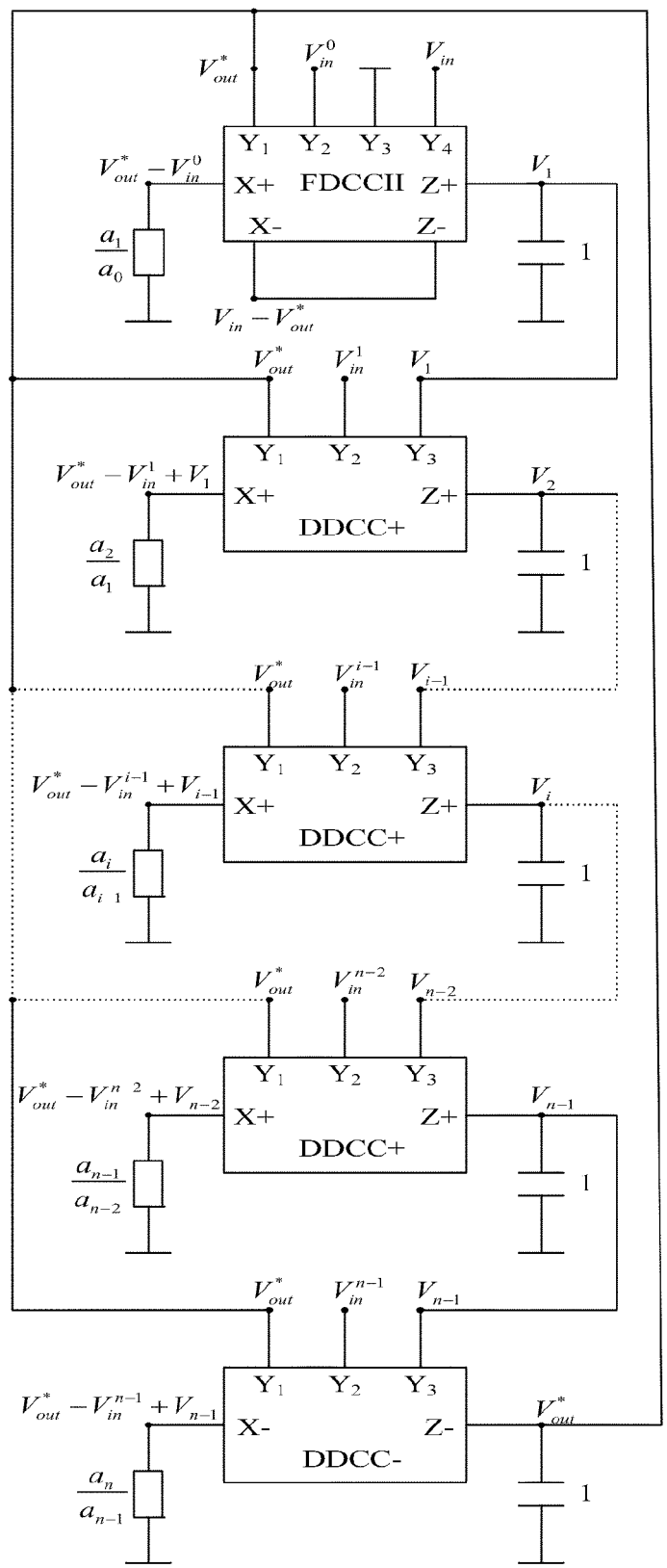
Figures 4, 5, 6, 7, 8:
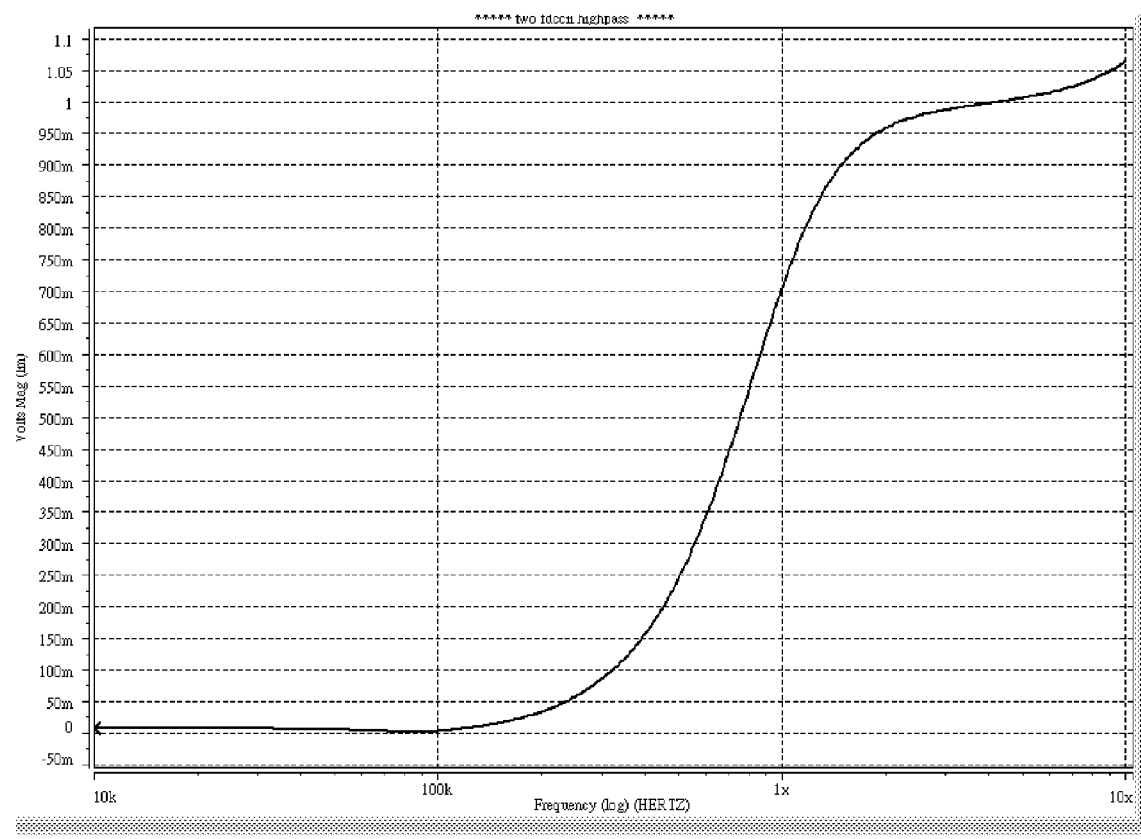
Figures 4, 5, 6, 7, 8, 9:
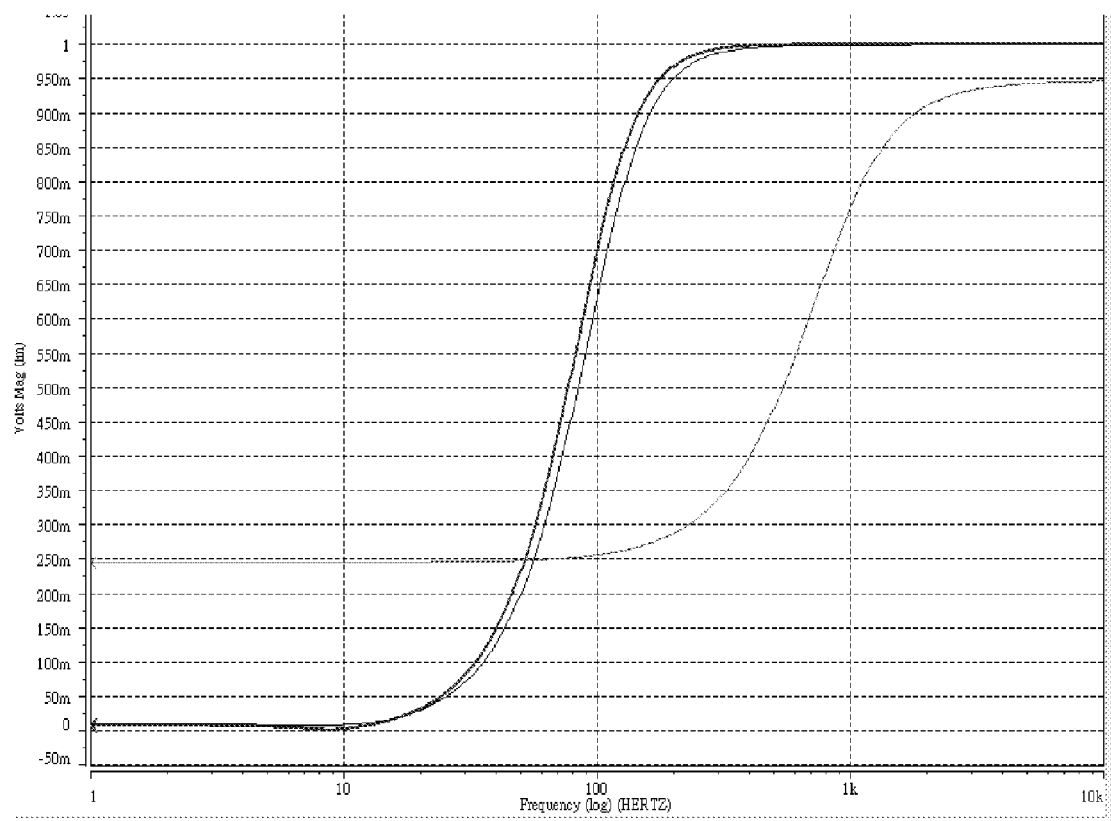
Figures 4, 5, 6, 7, 8, 9, 10:
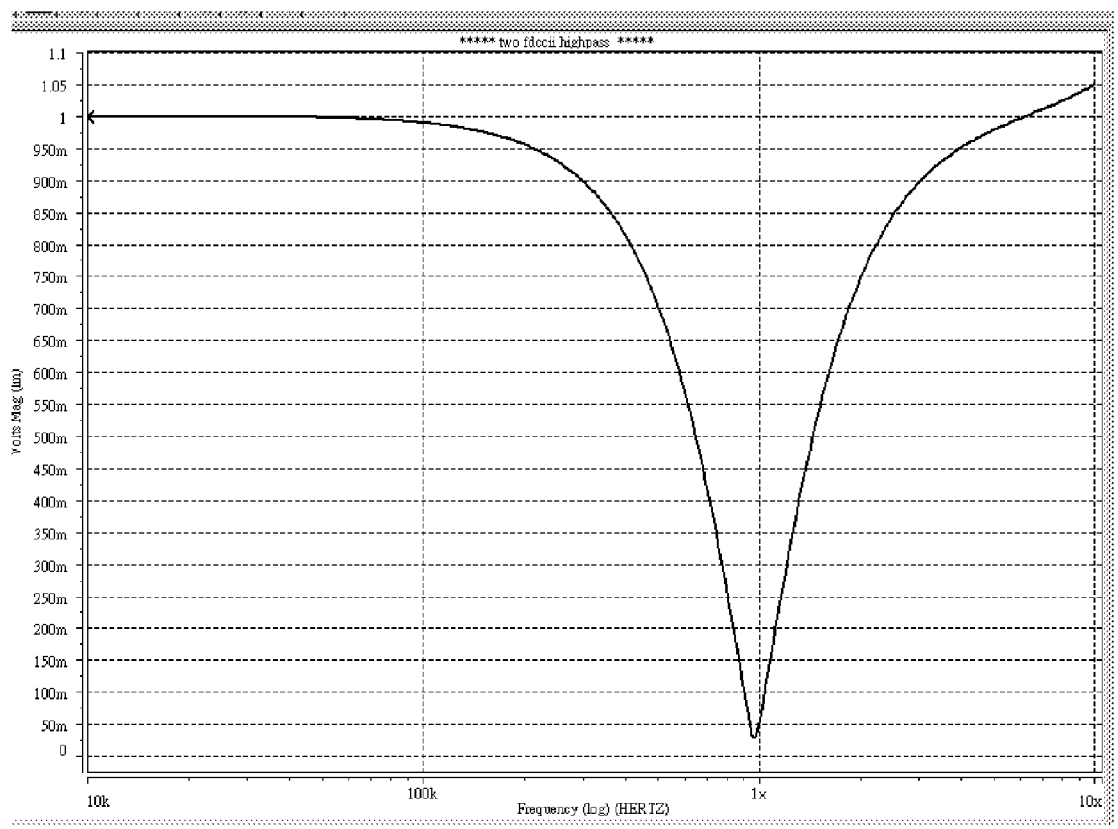
Figures 4, 5, 6, 7, 8, 9, 10, 11:
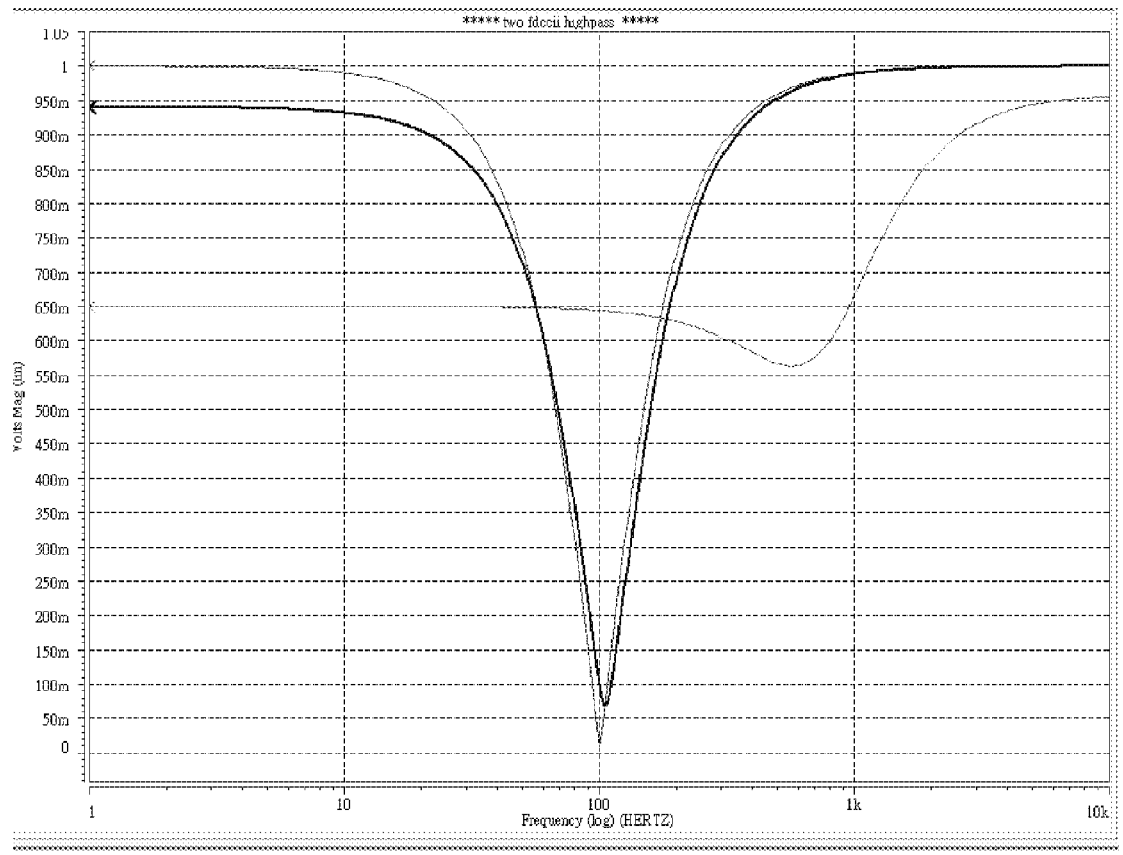
Figures 1, 5:
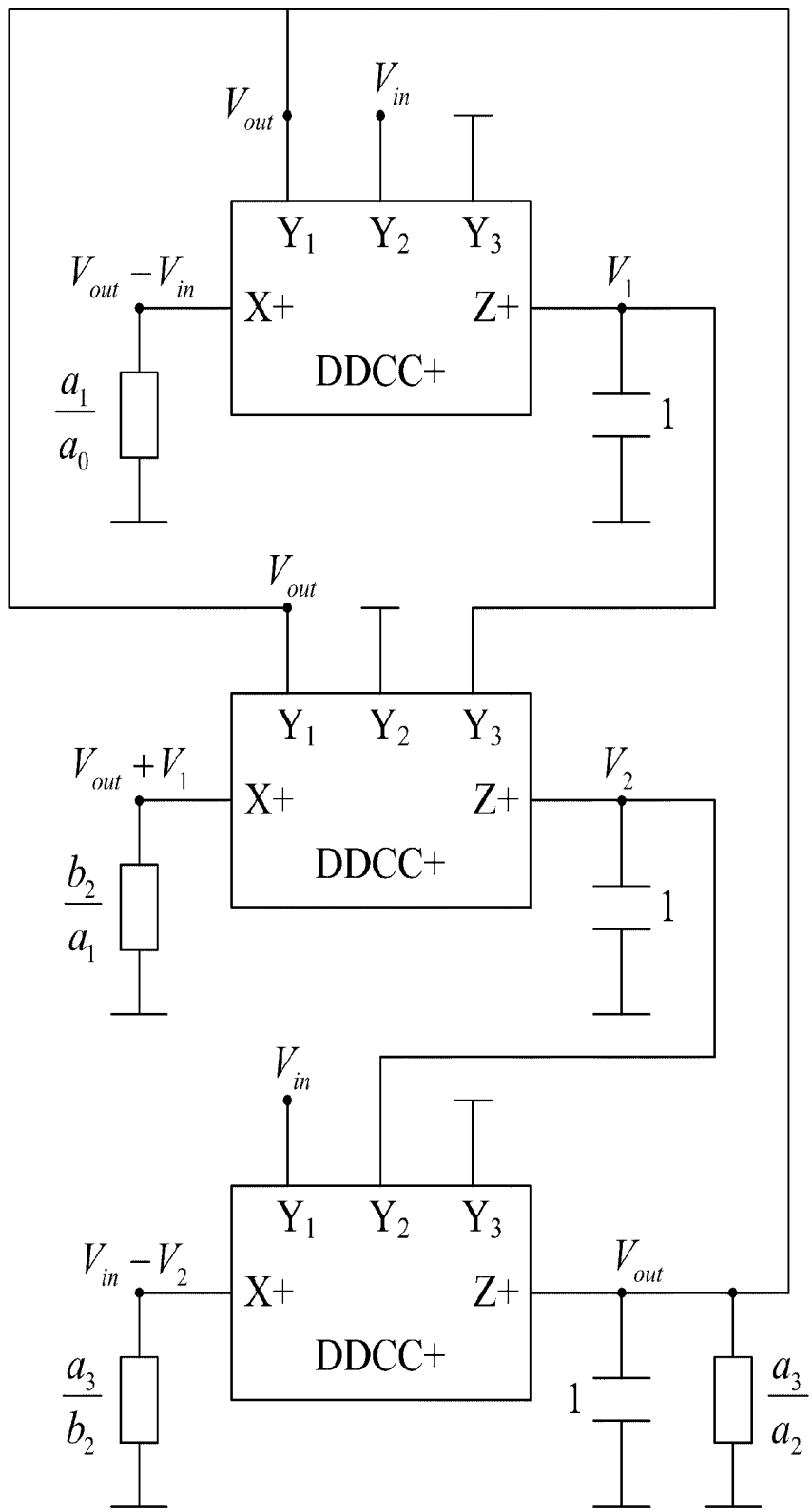
Figures 2, 5:
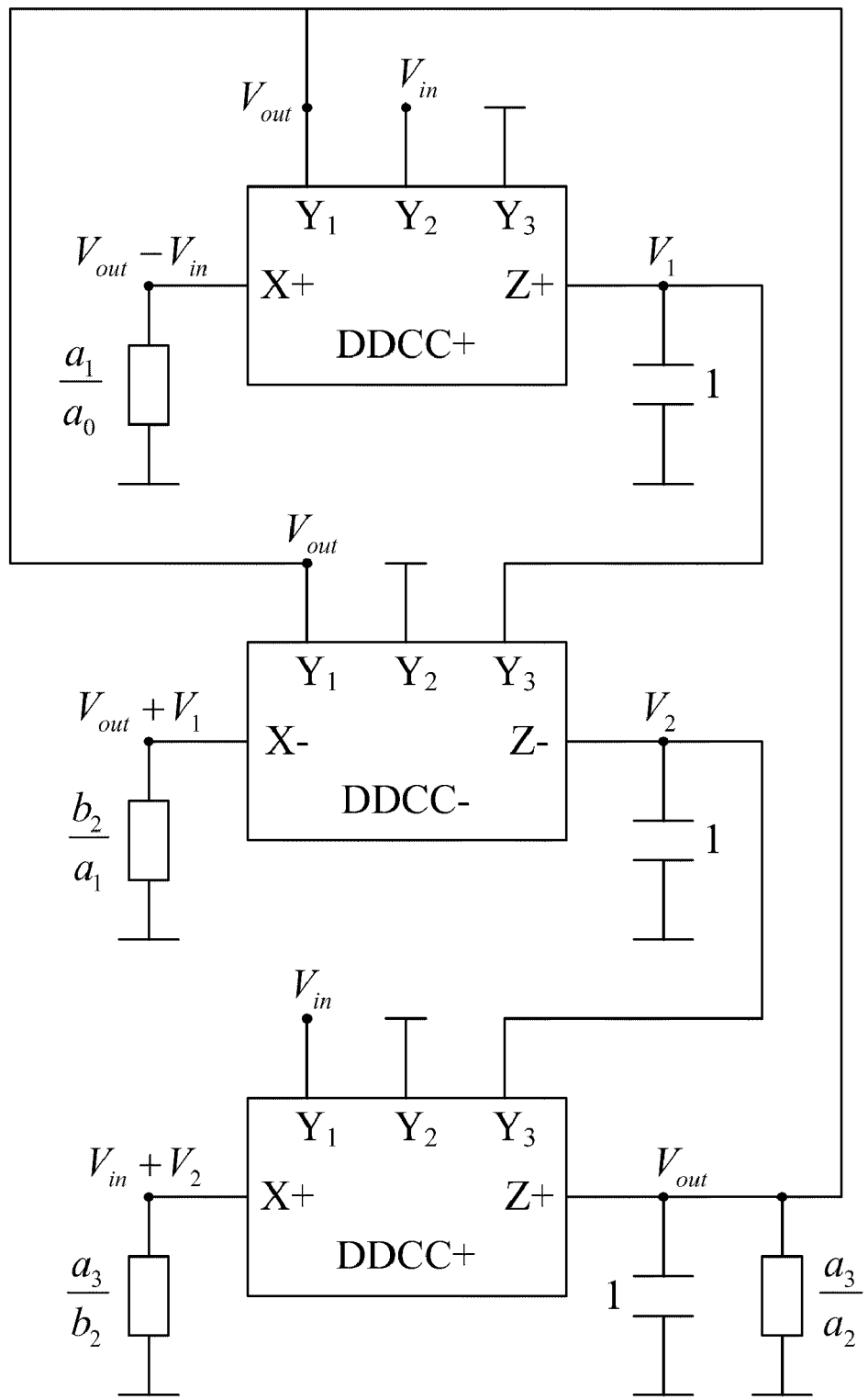
Figures 3, 5:
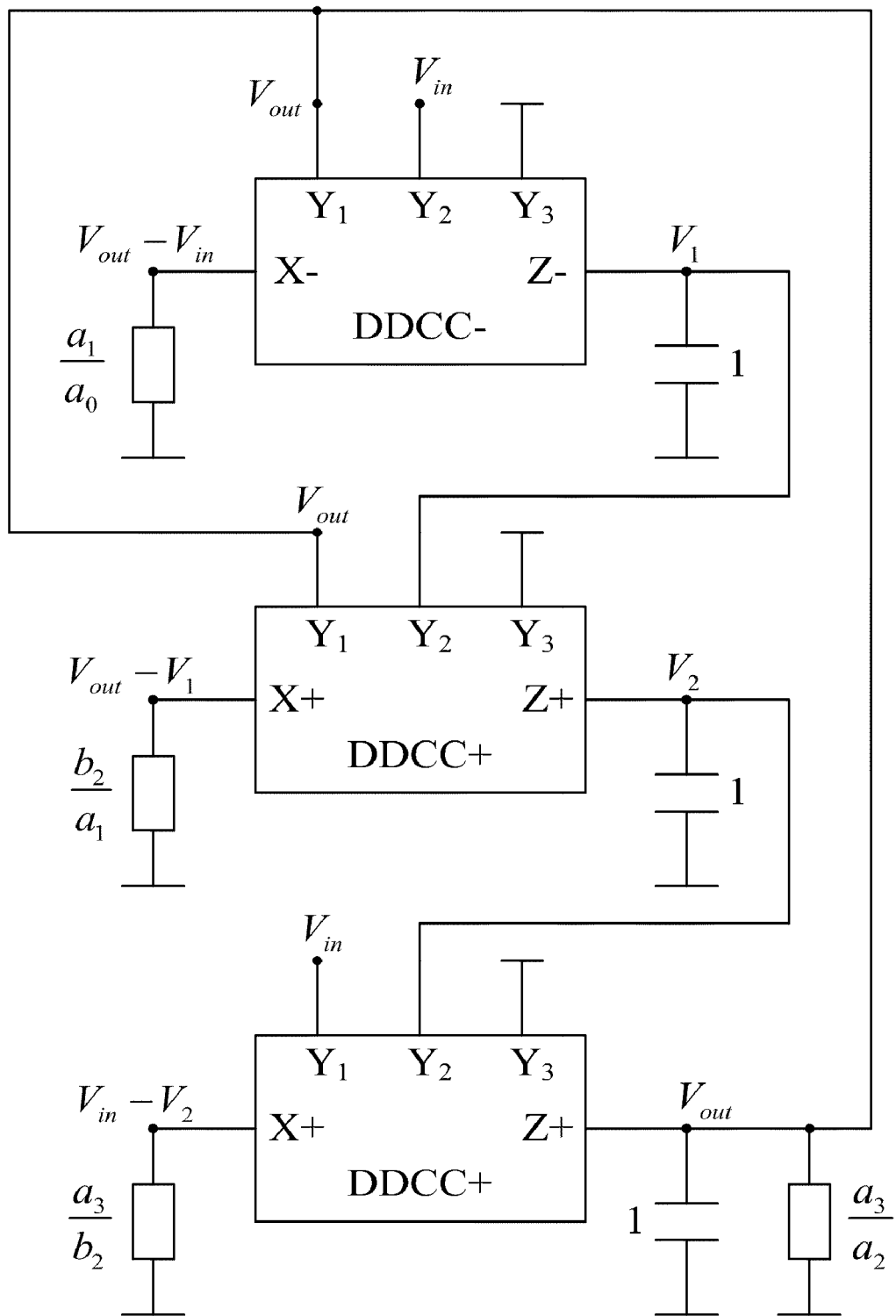
Figures 4, 5:
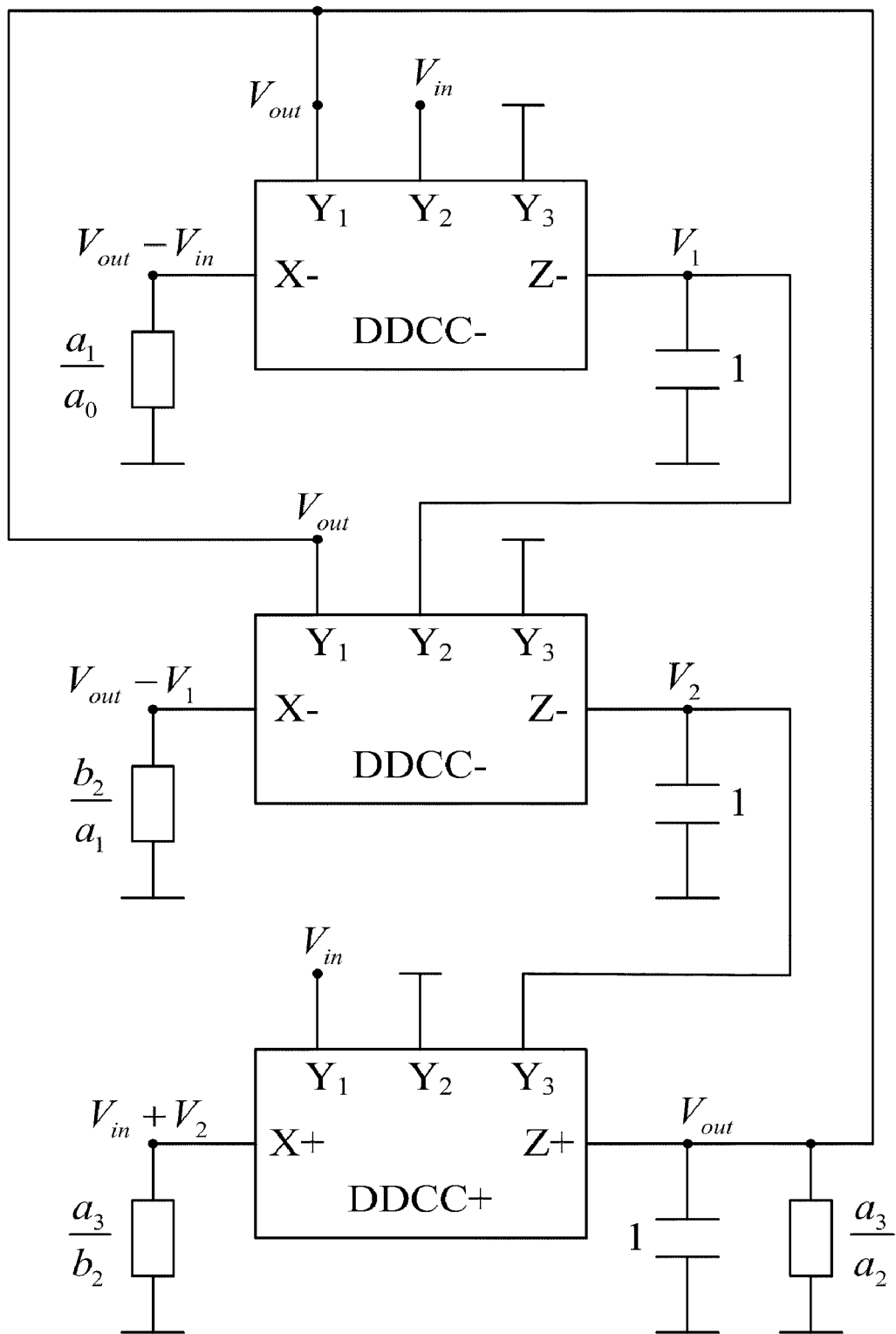
Figure 5:
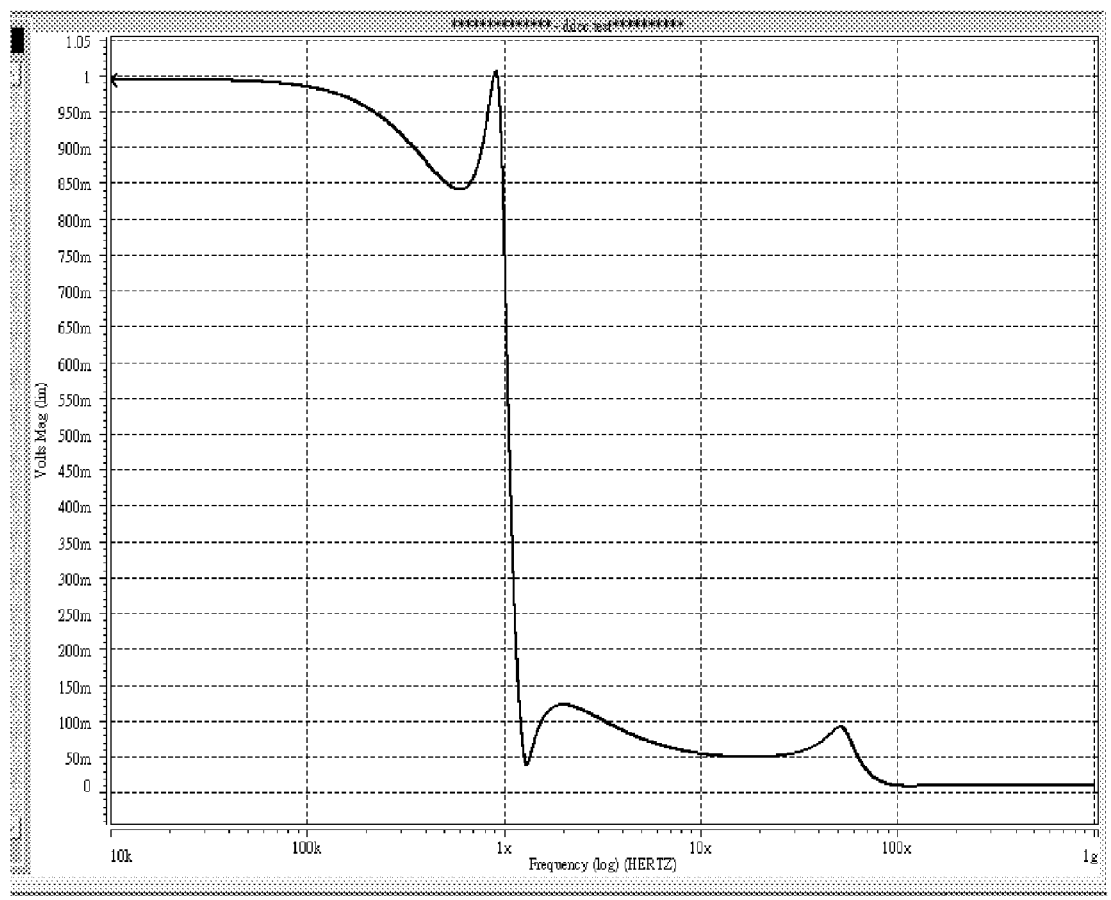
Figures 1, 6:
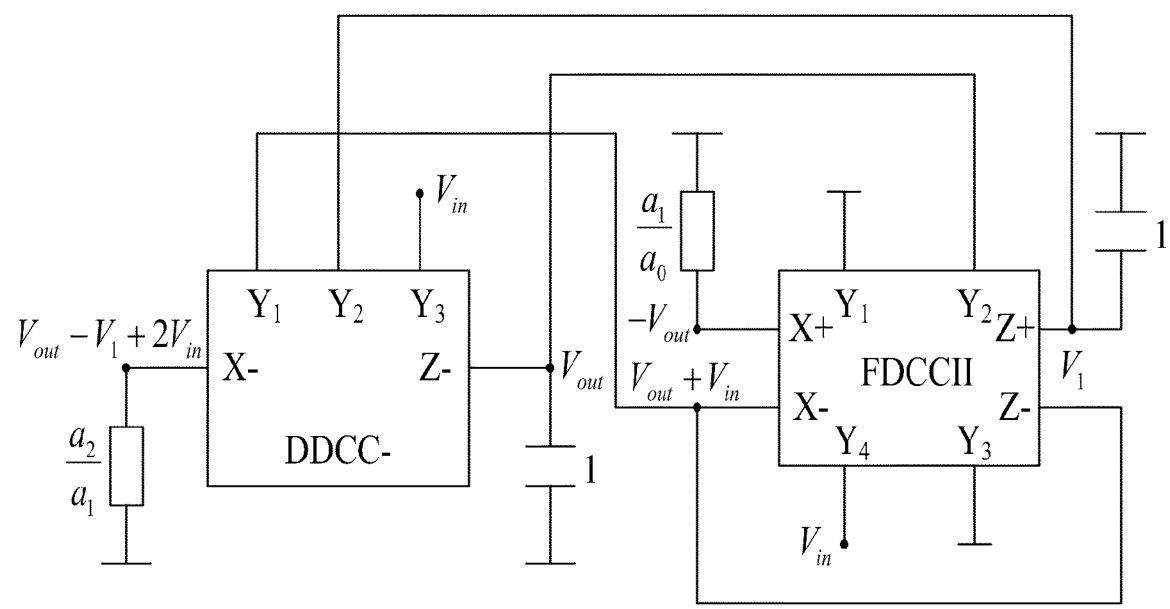
Figures 2, 6:
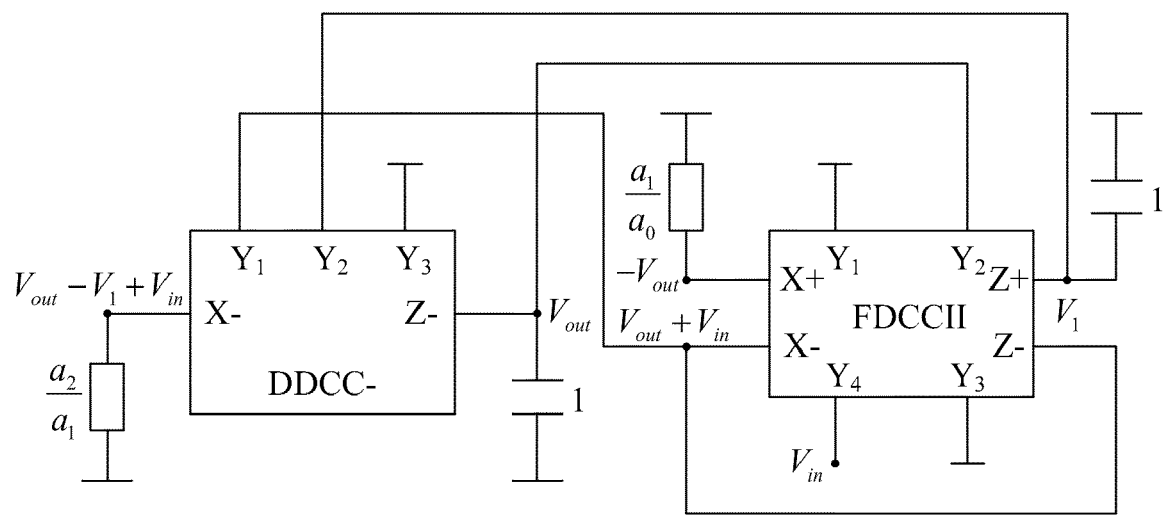
Figures 3, 6:
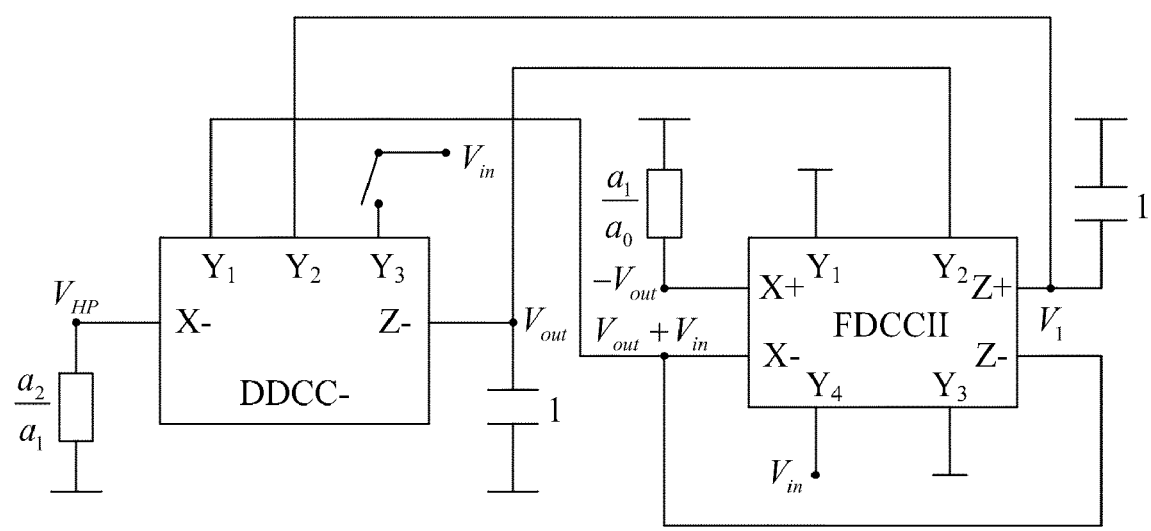
Figures 4, 6:
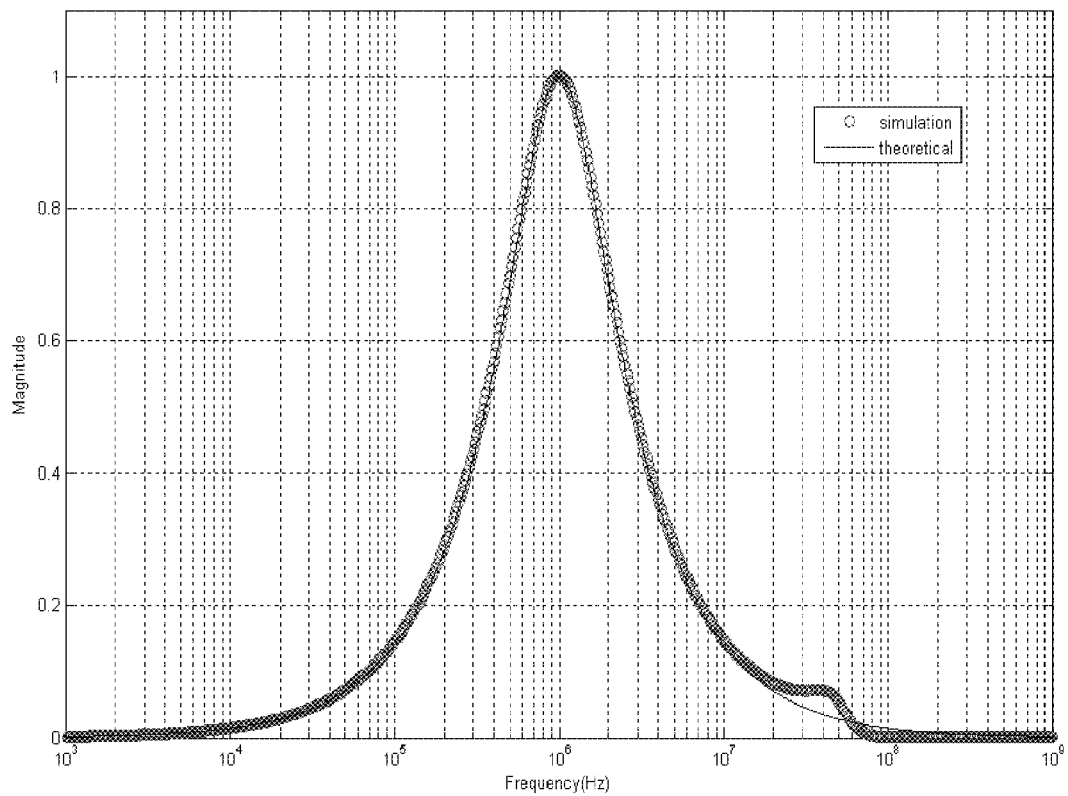
Figures 5, 6:
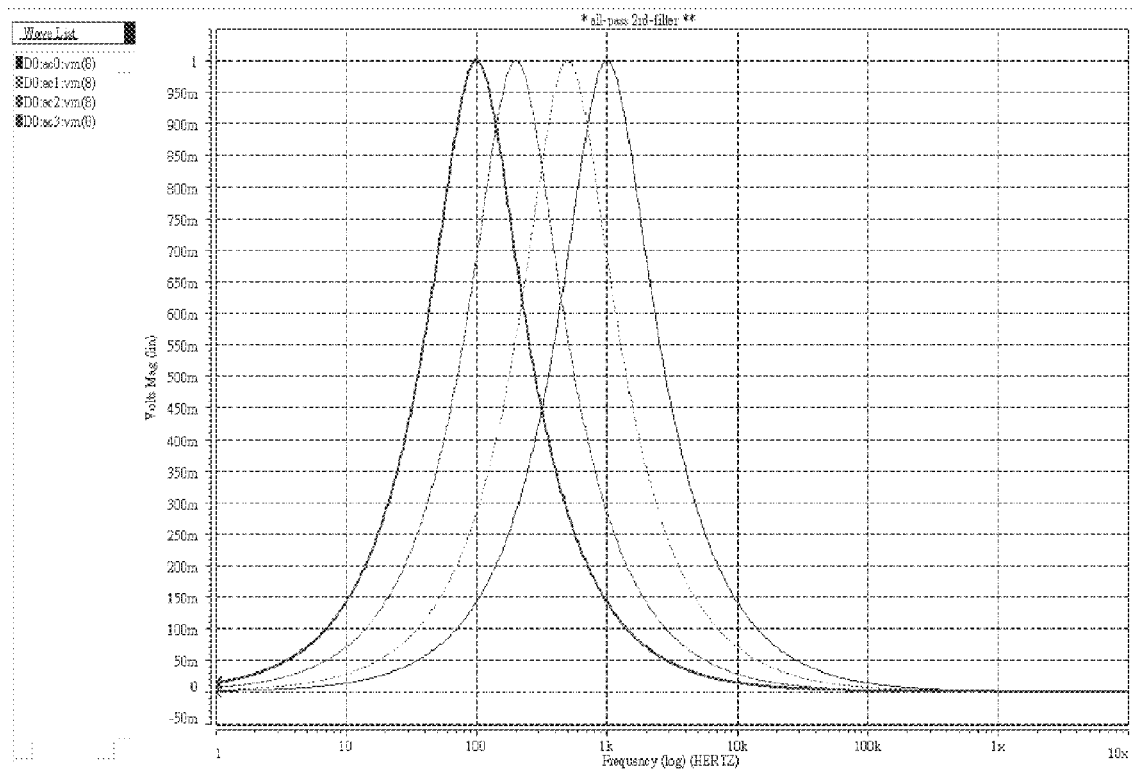
Figures 1, 7:
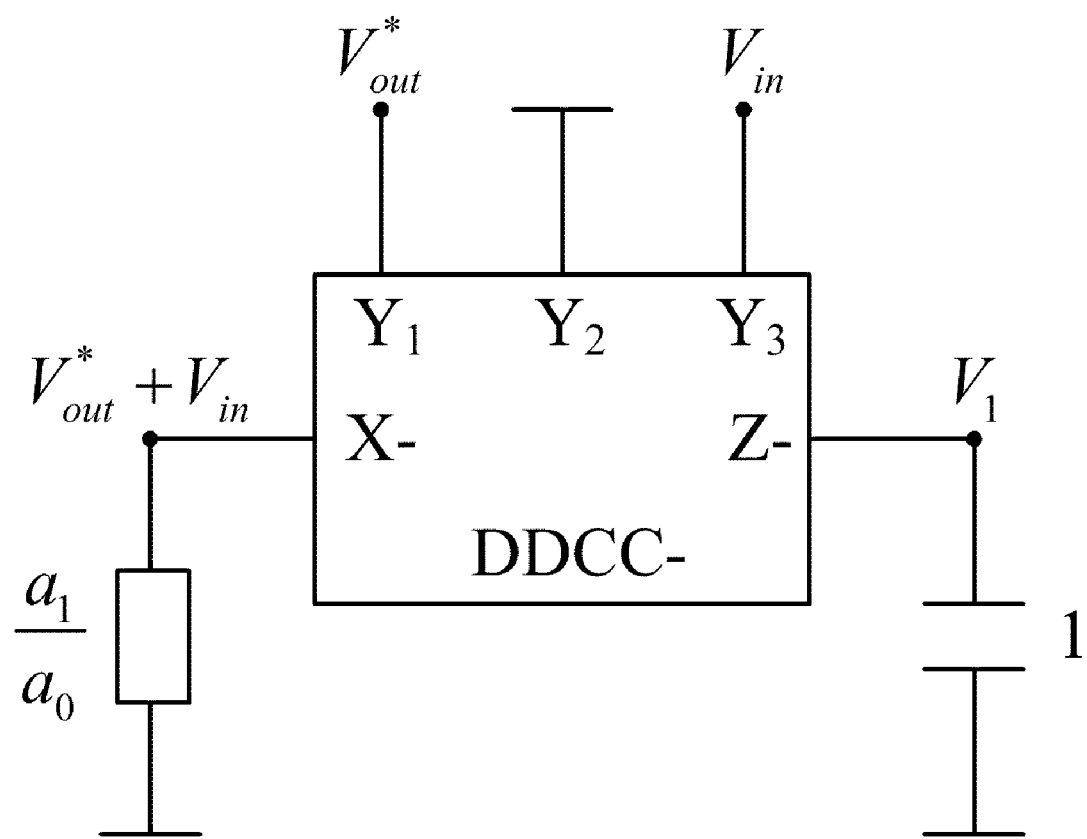
Figures 2, 7:
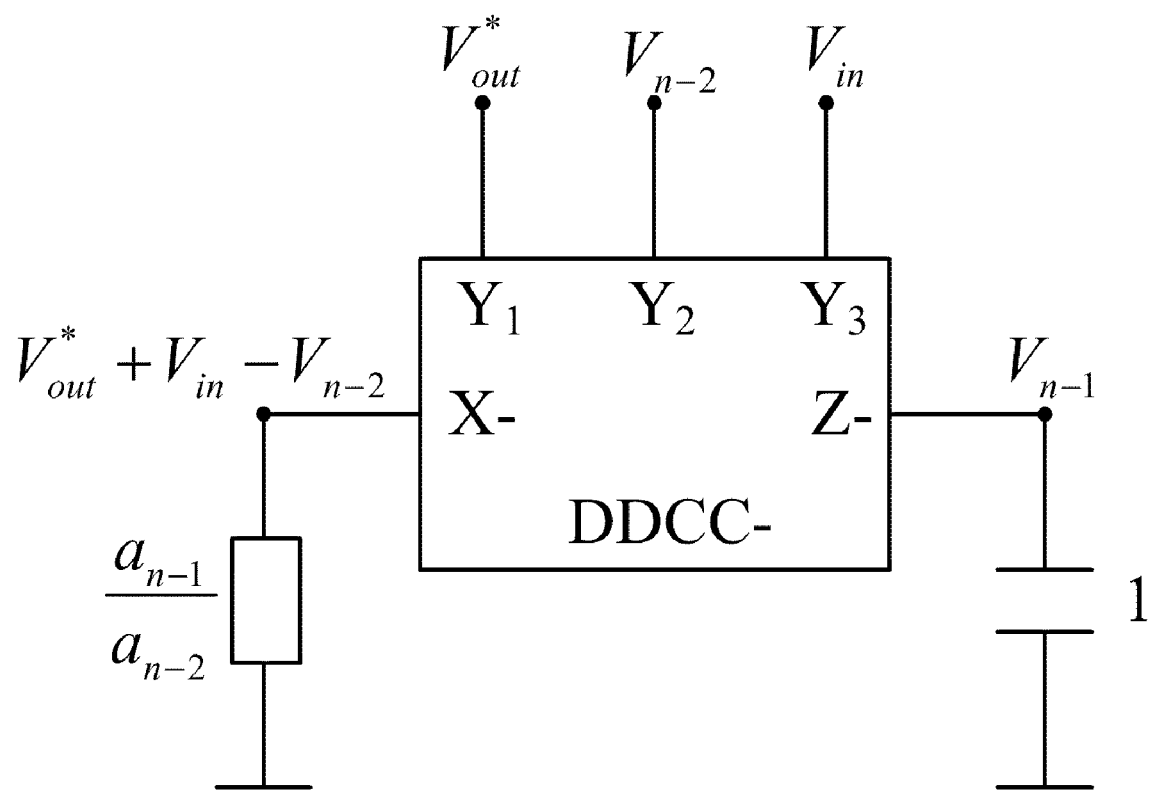
Figures 3, 7:
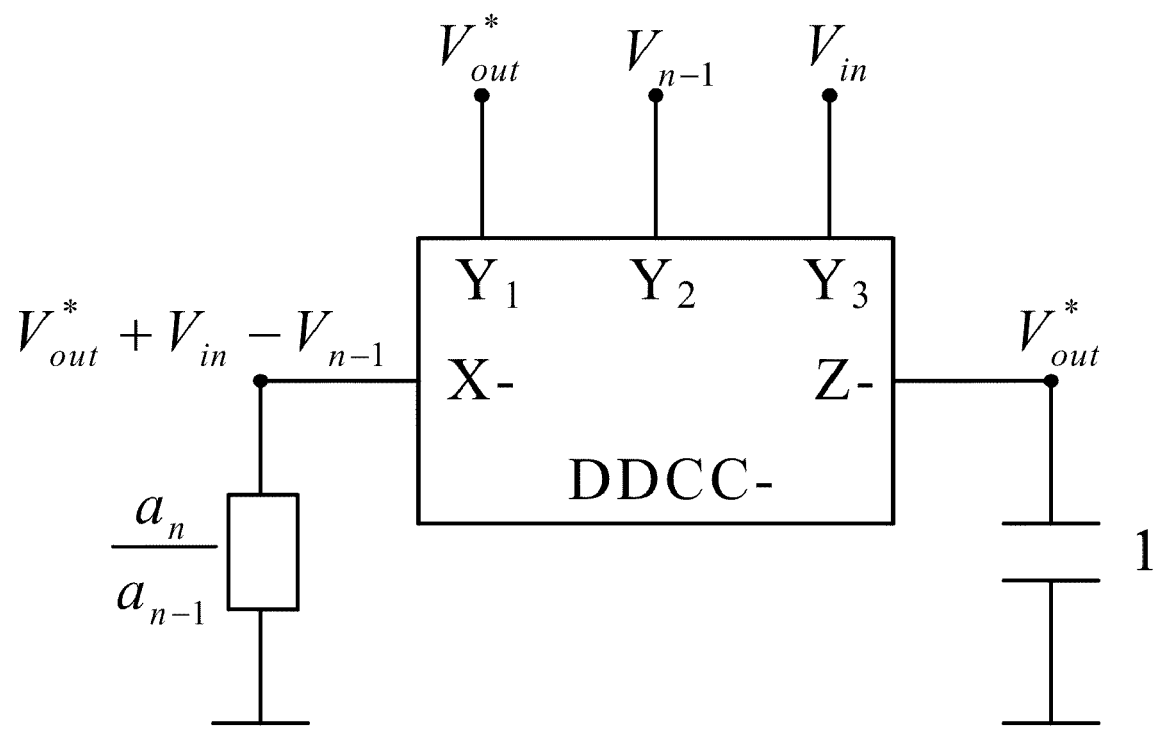
Figures 4, 7:
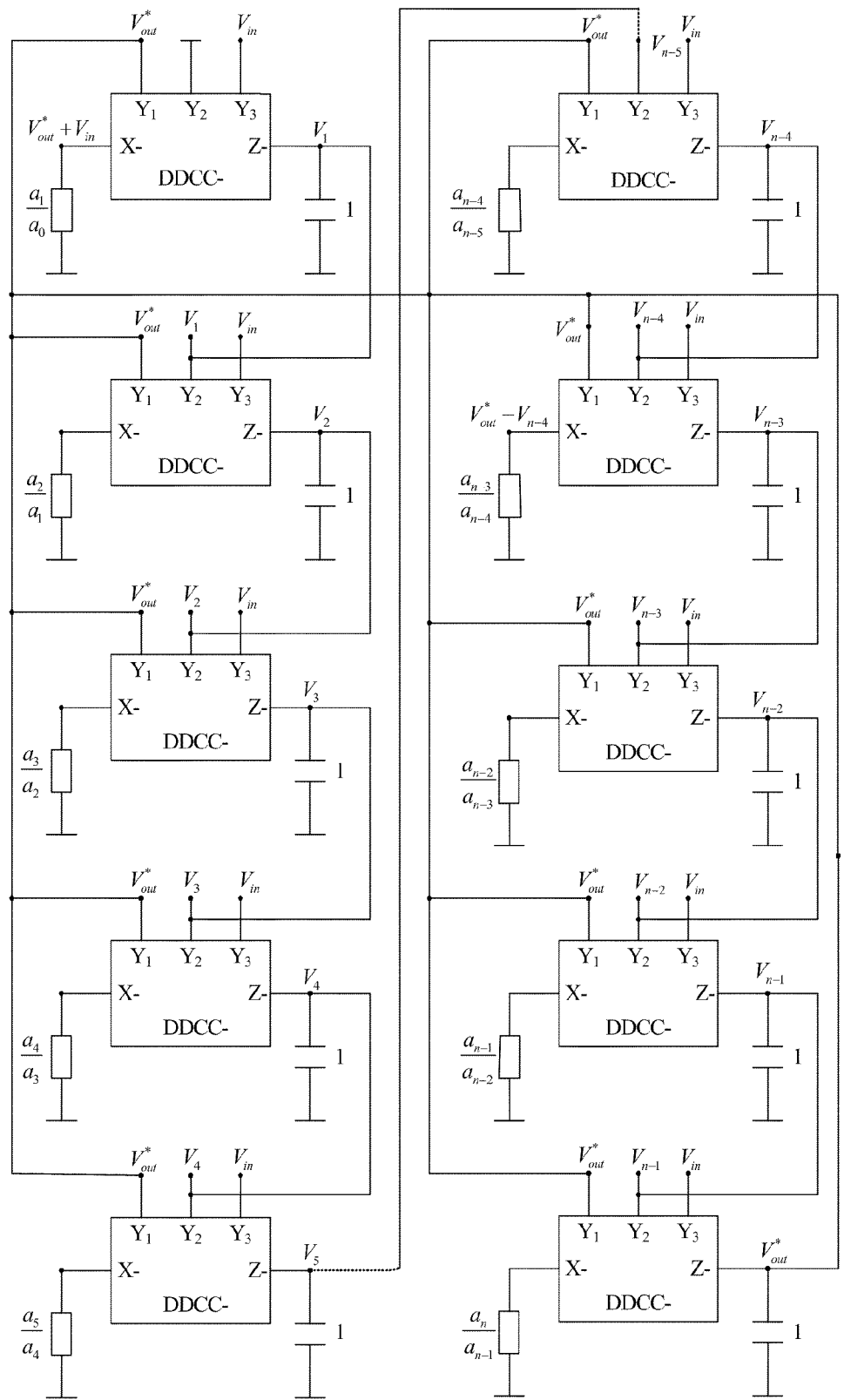
Figures 5, 7:
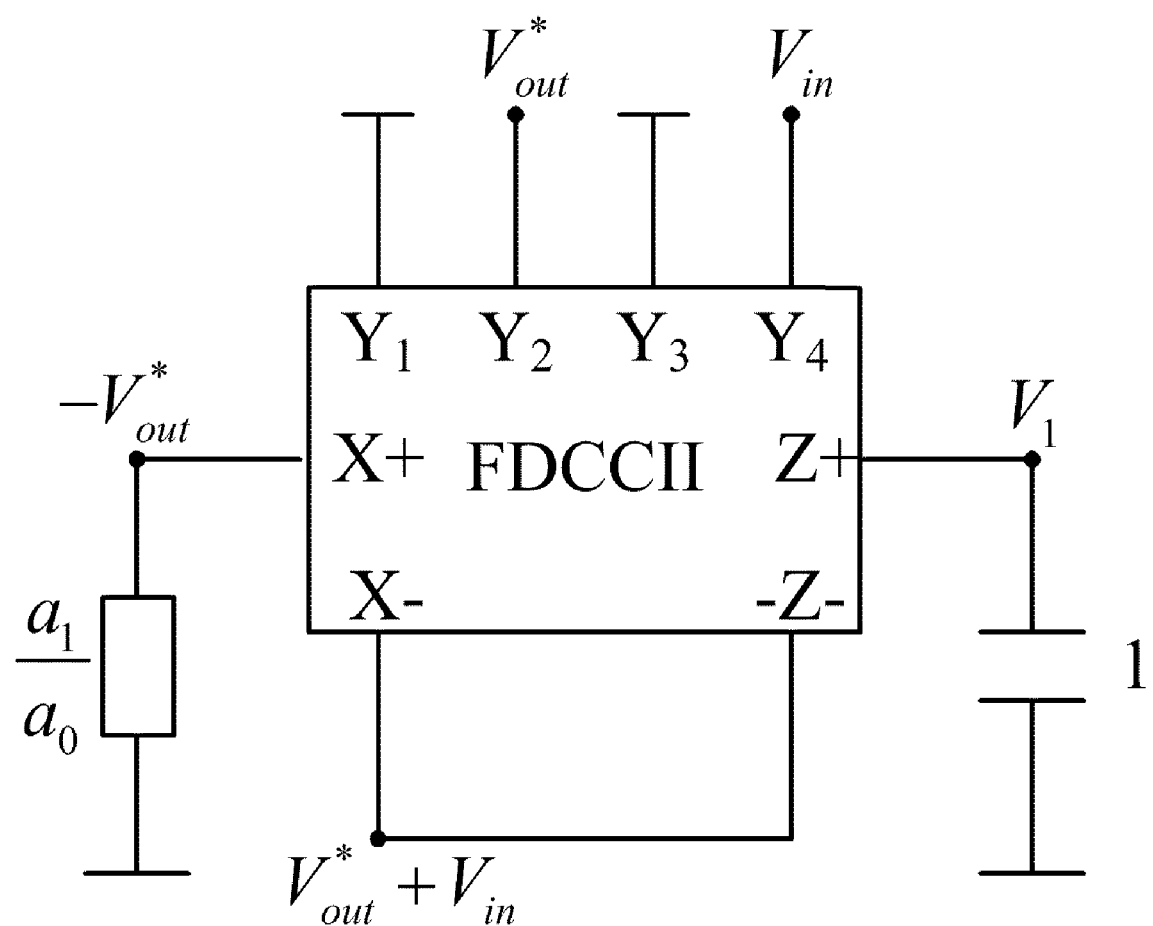
Figures 6, 7:
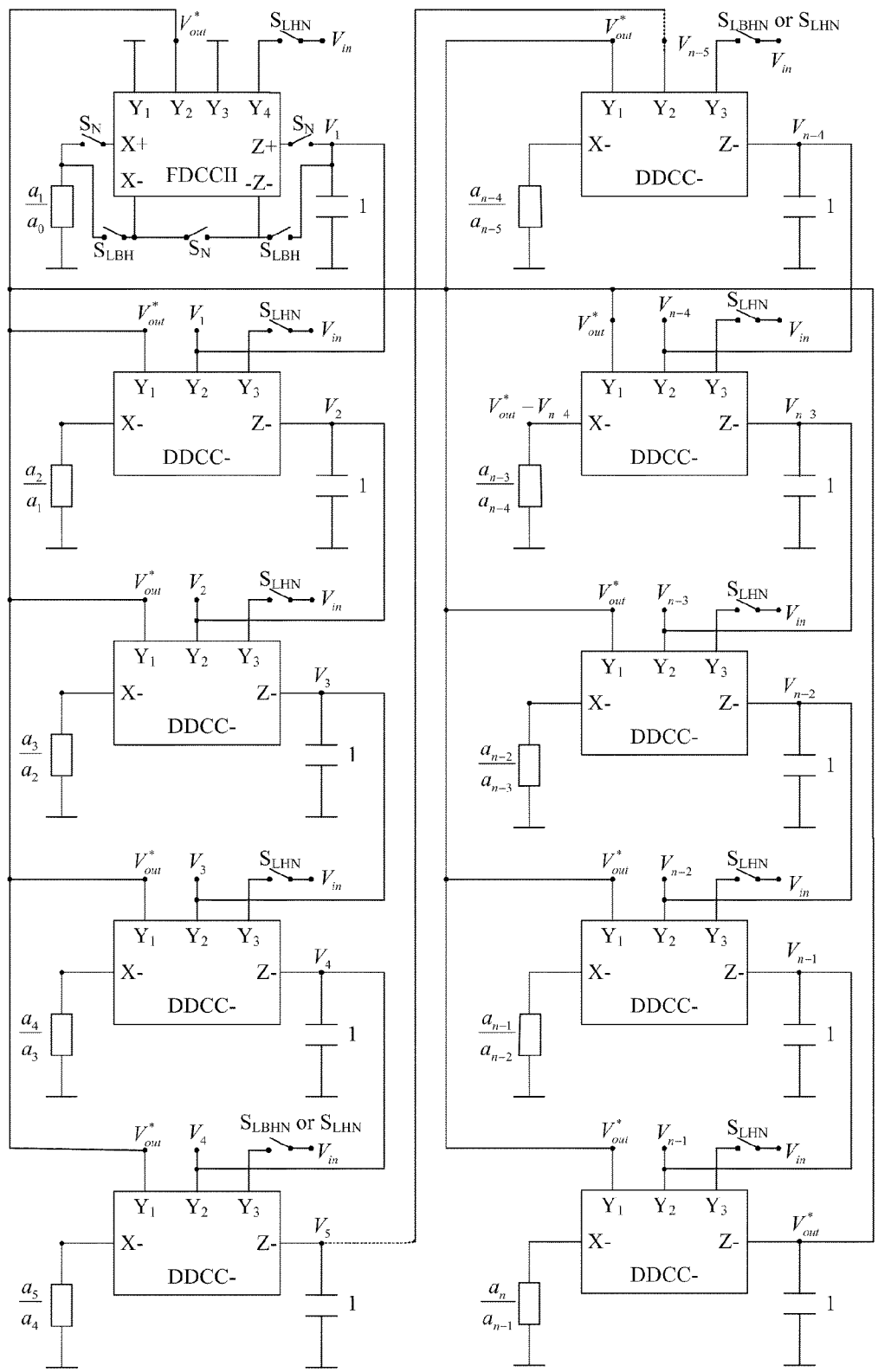
Figure 7:
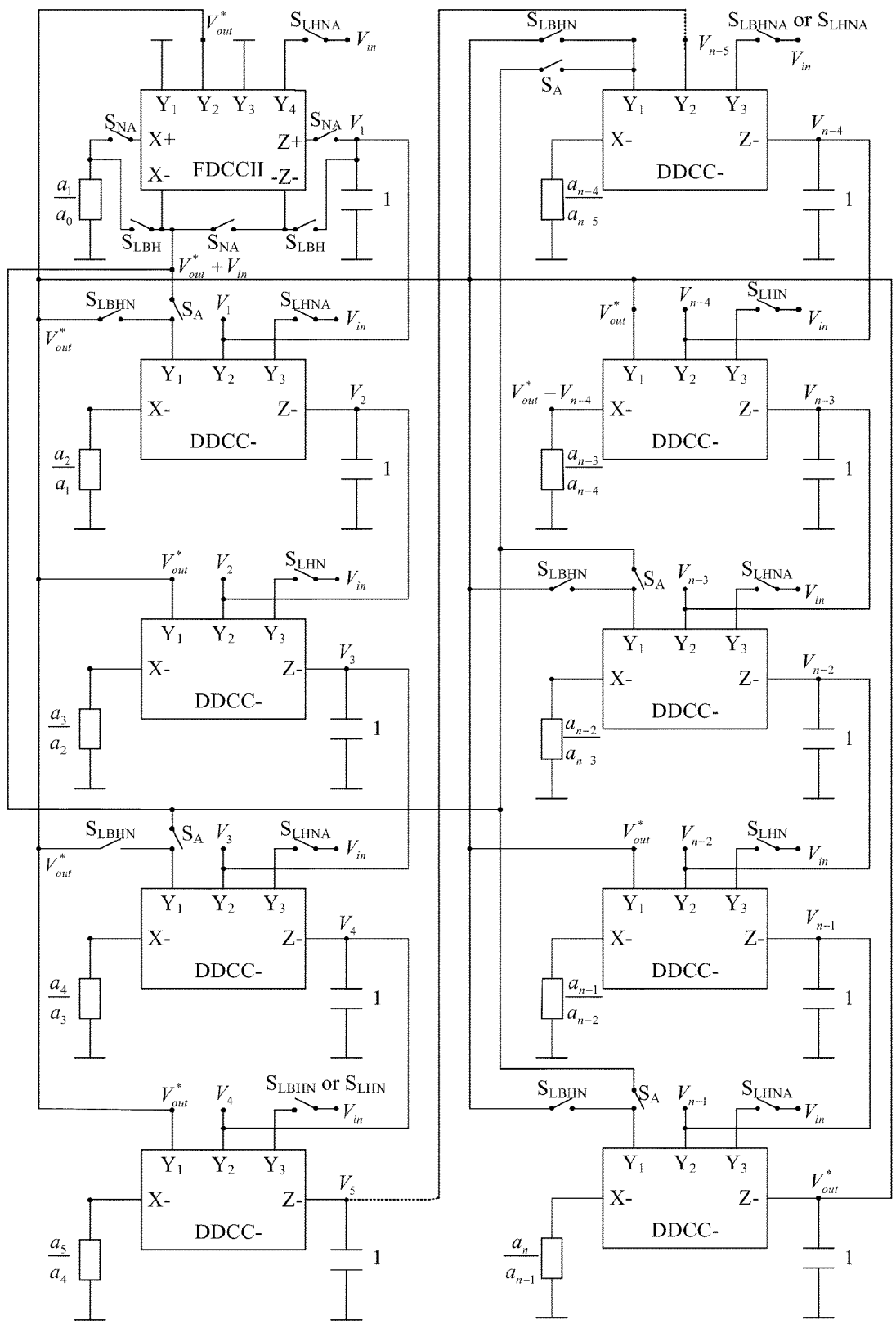
Figures 7, 8:
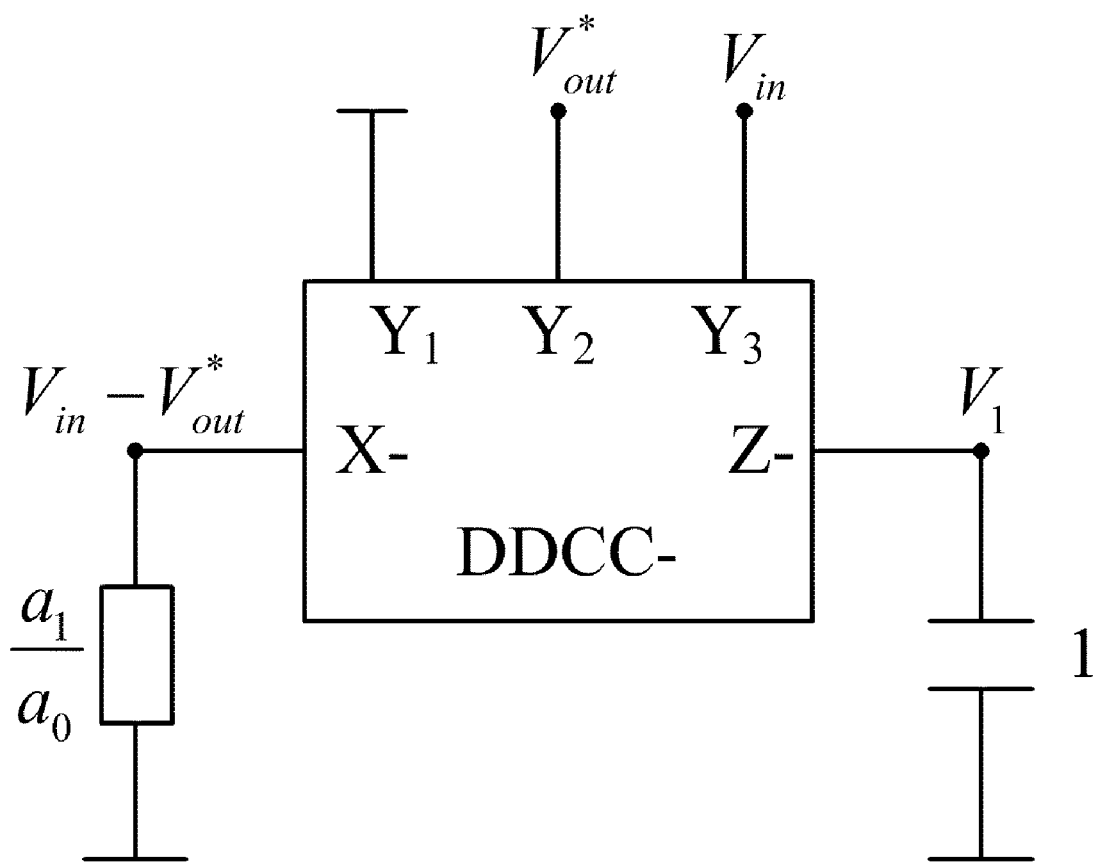
Figures 7, 8, 9:
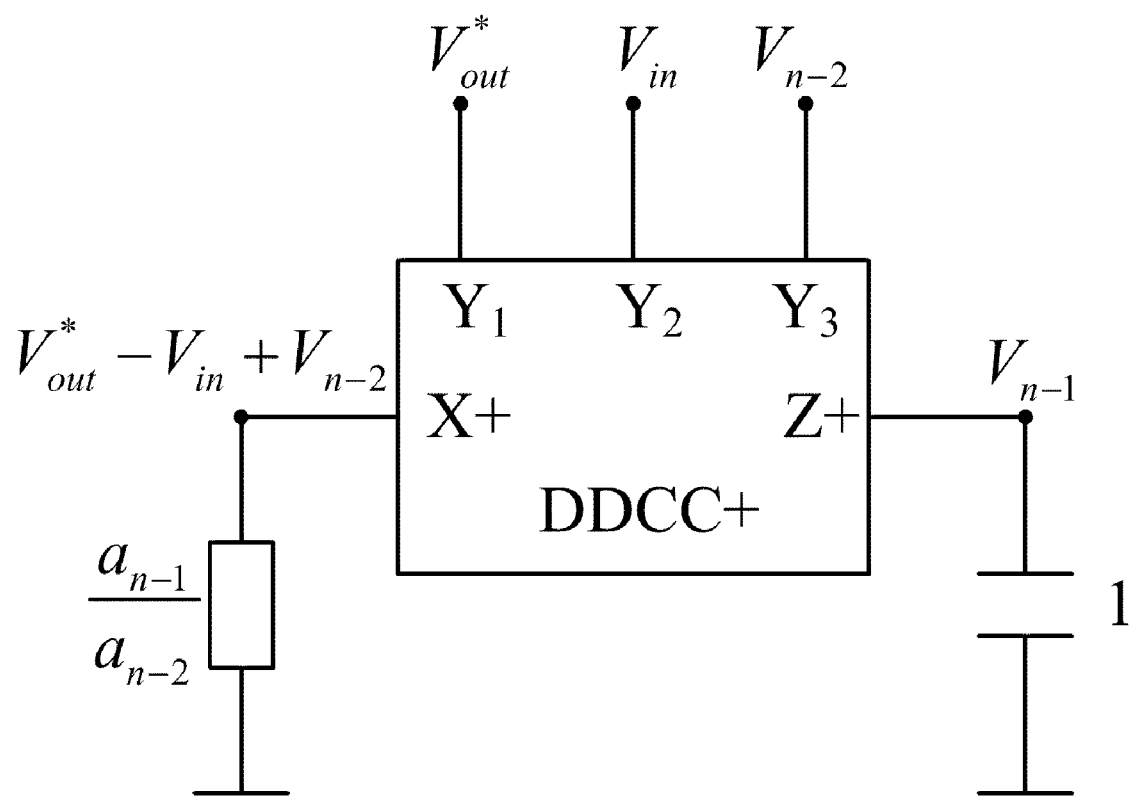
Figures 7, 8, 9, 10:
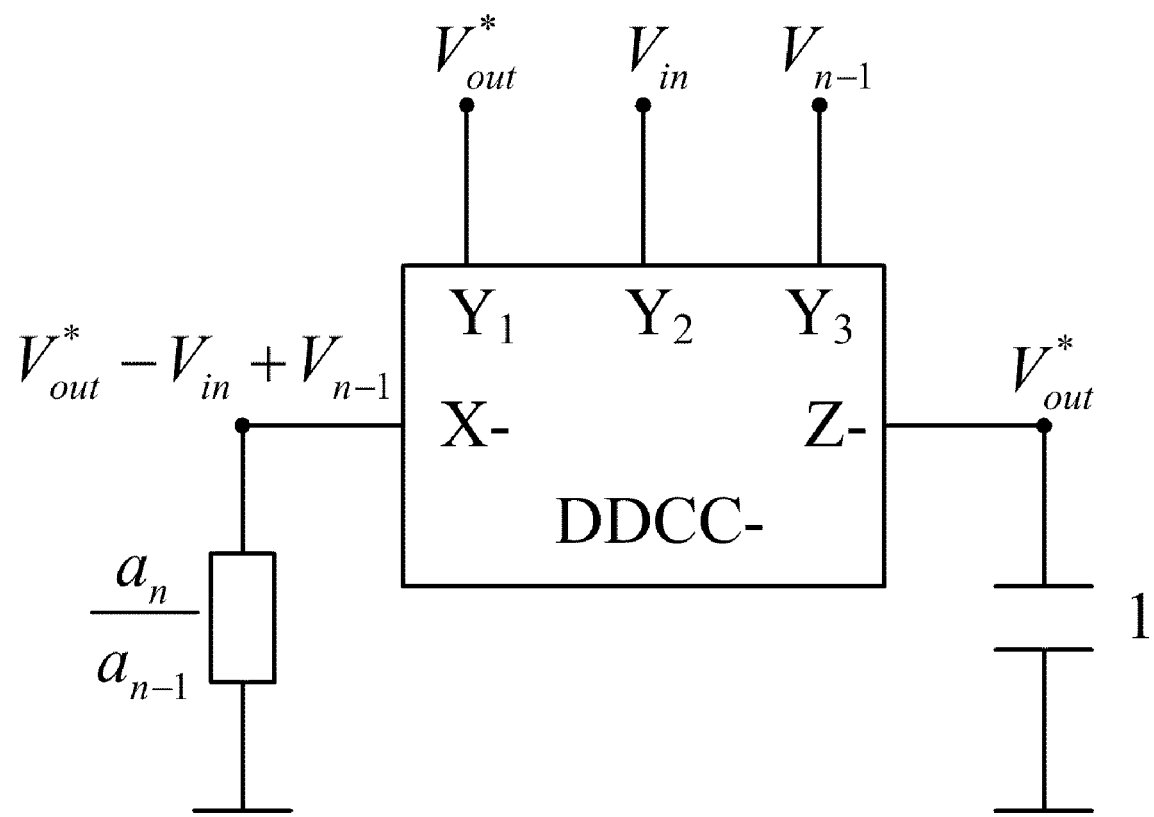
Figures 7, 8, 9, 10, 11:
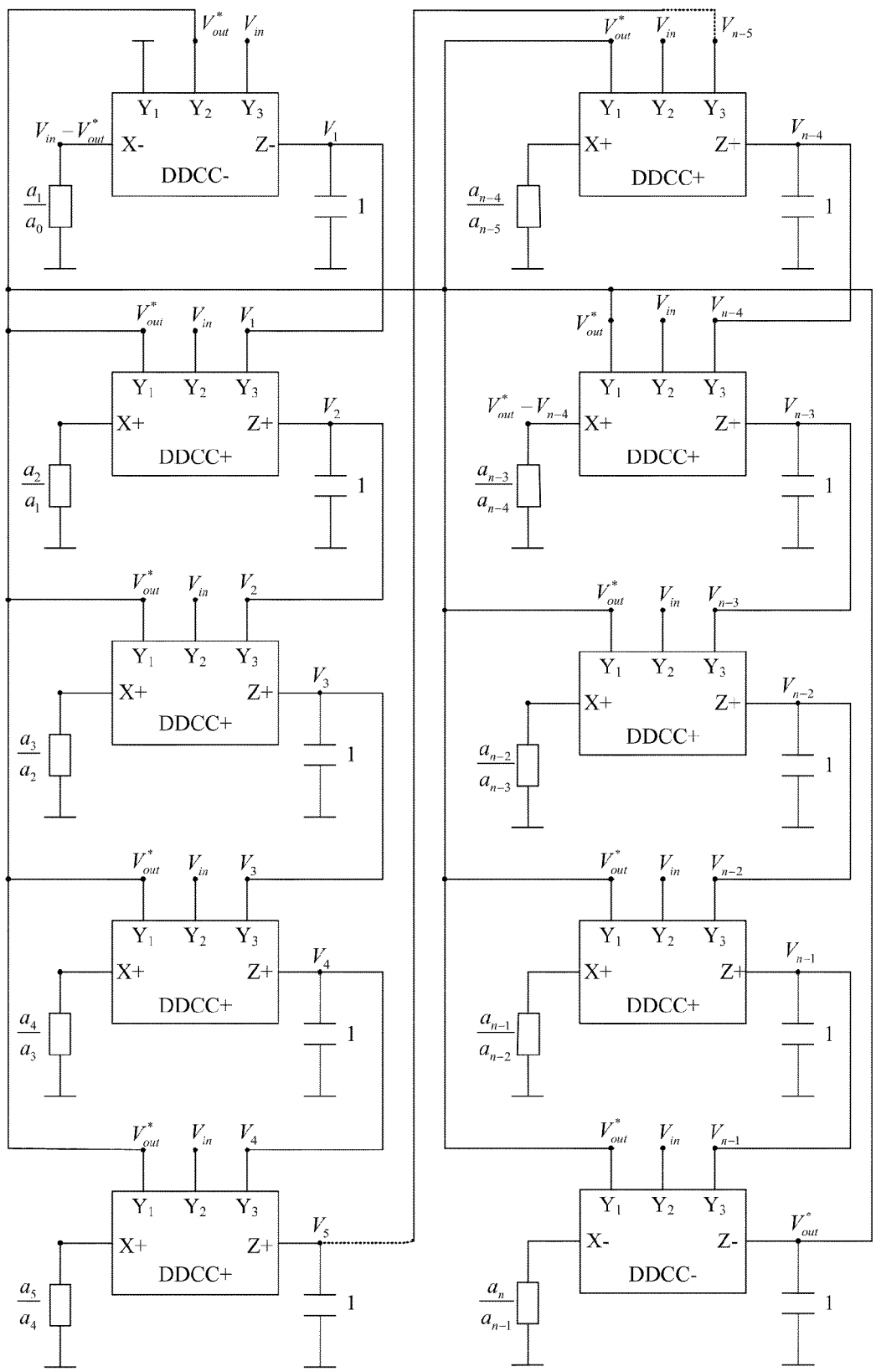
Figures 7, 8, 9, 10, 11, 12:
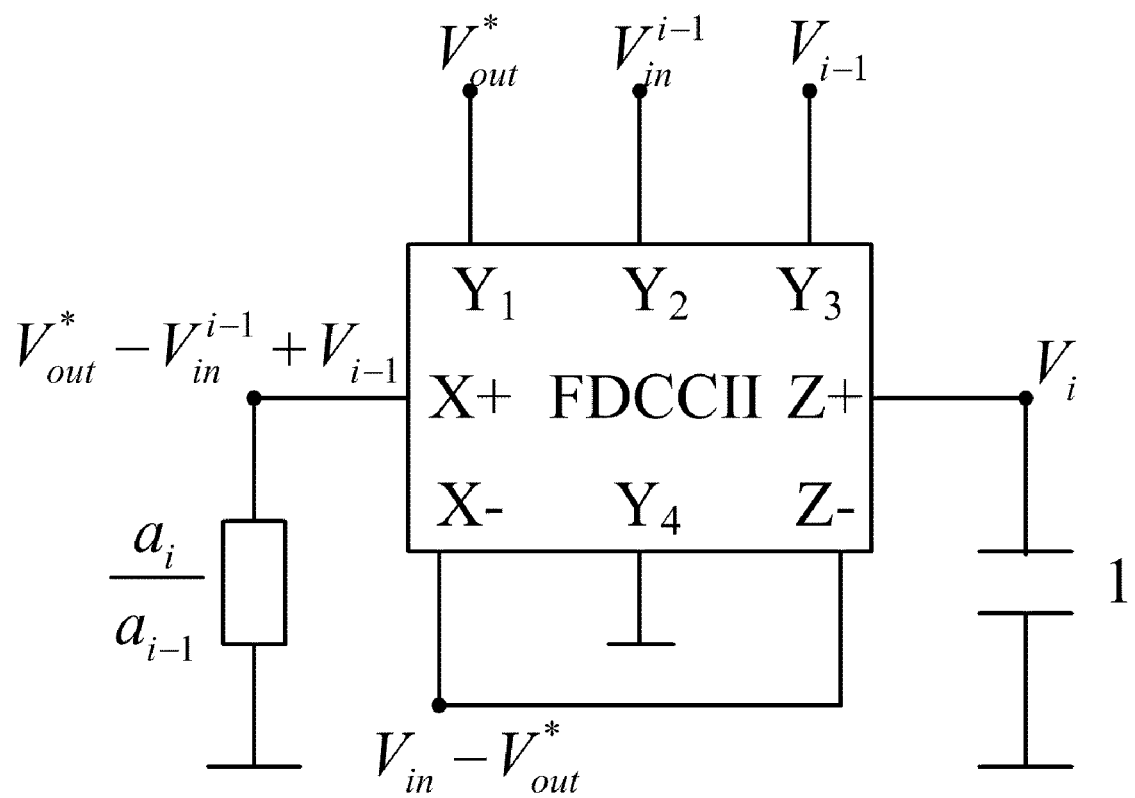
Figures 7, 8, 9, 10, 11, 12, 13:
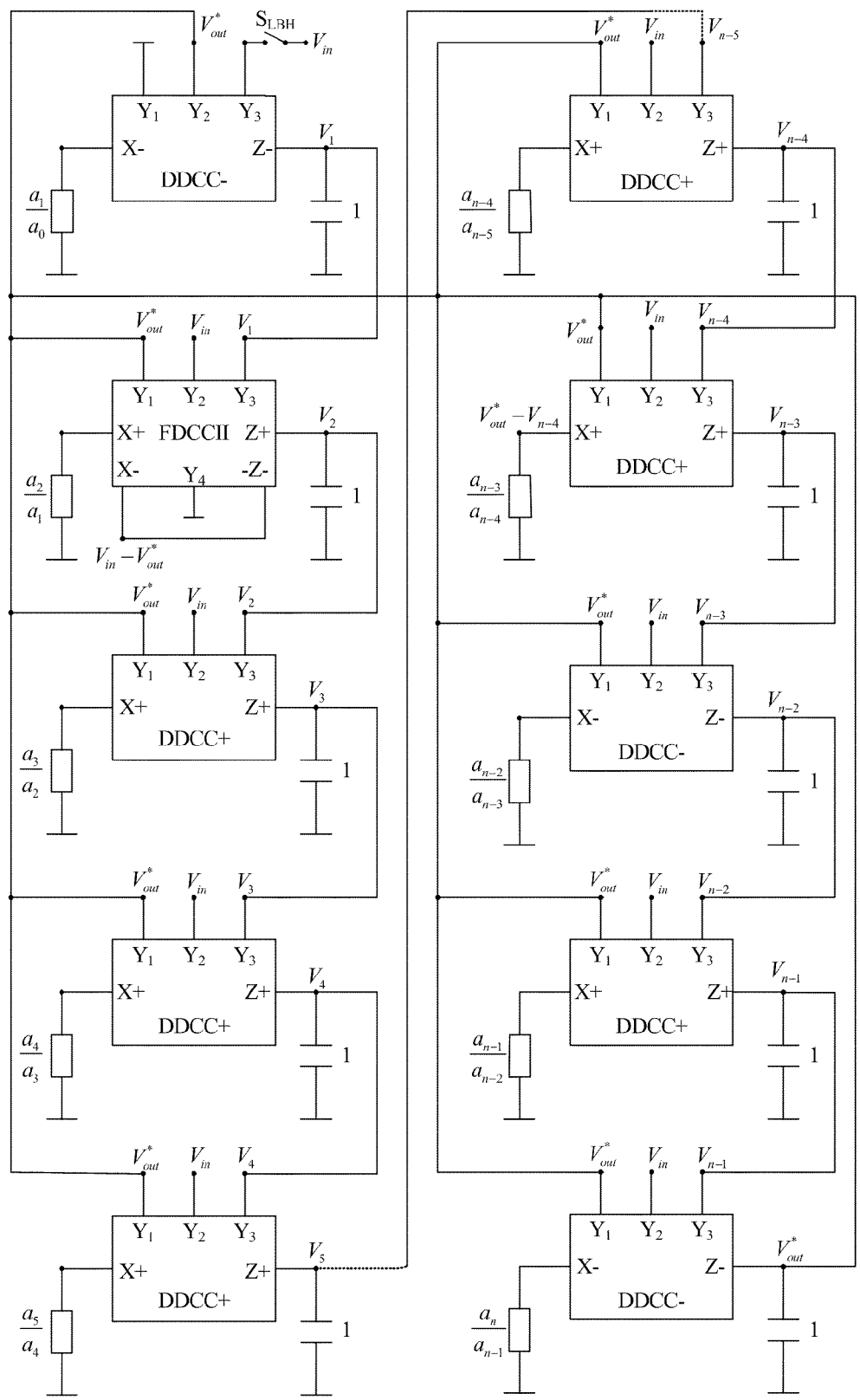
Figures 7, 8, 9, 10, 11, 12, 13, 14:
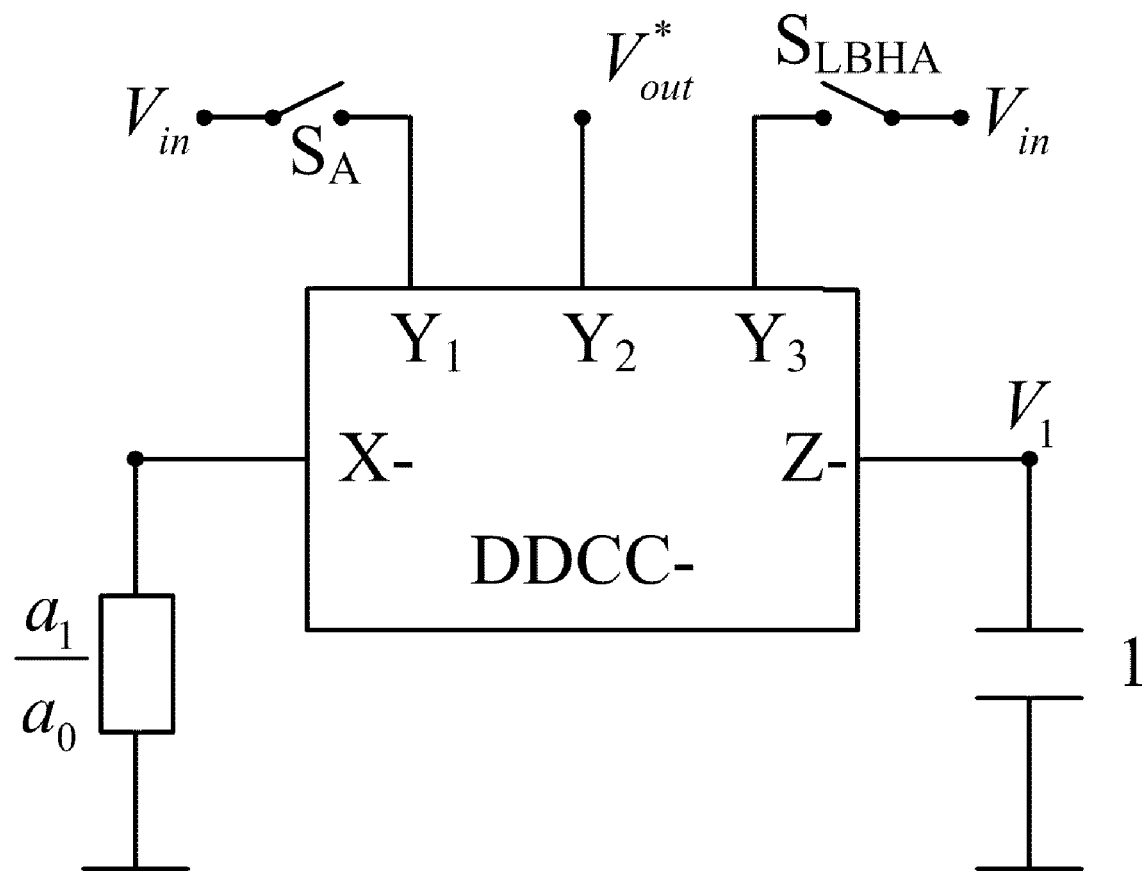
Figures 7, 8, 9, 10, 11, 12, 13, 14, 15:
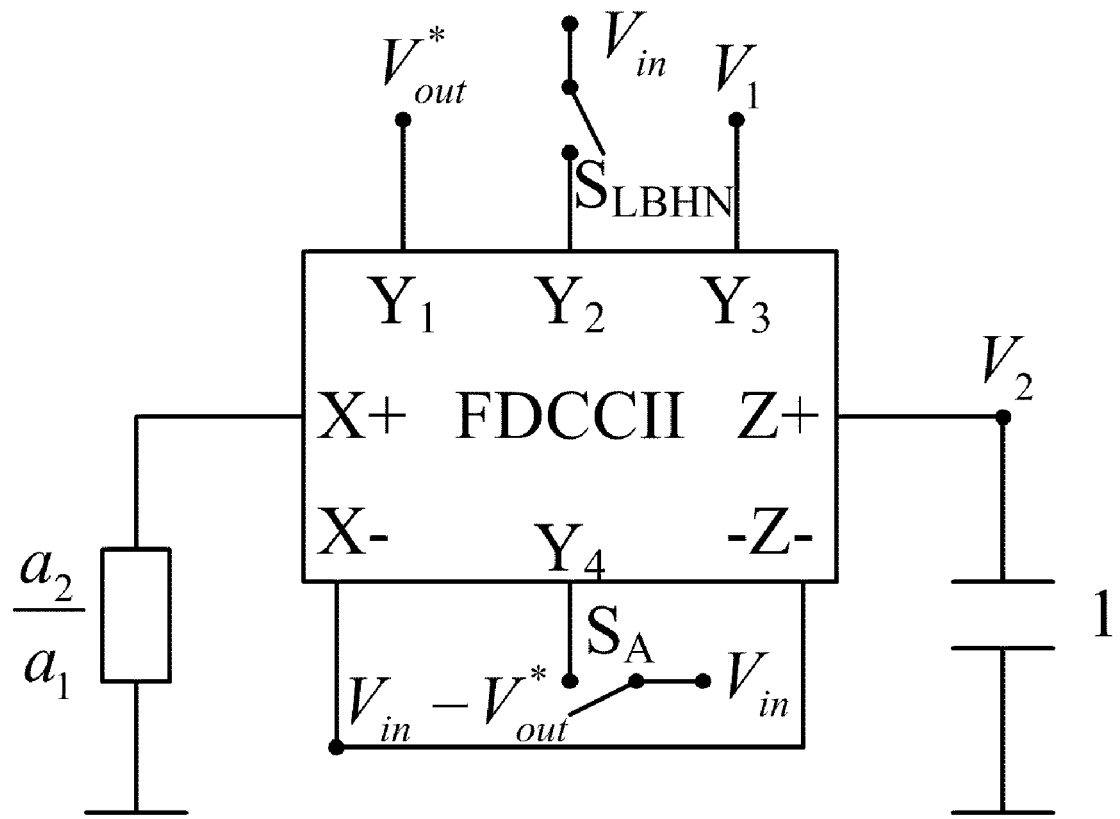
Figures 7, 8, 9, 10, 11, 12, 13, 14, 15, 16:
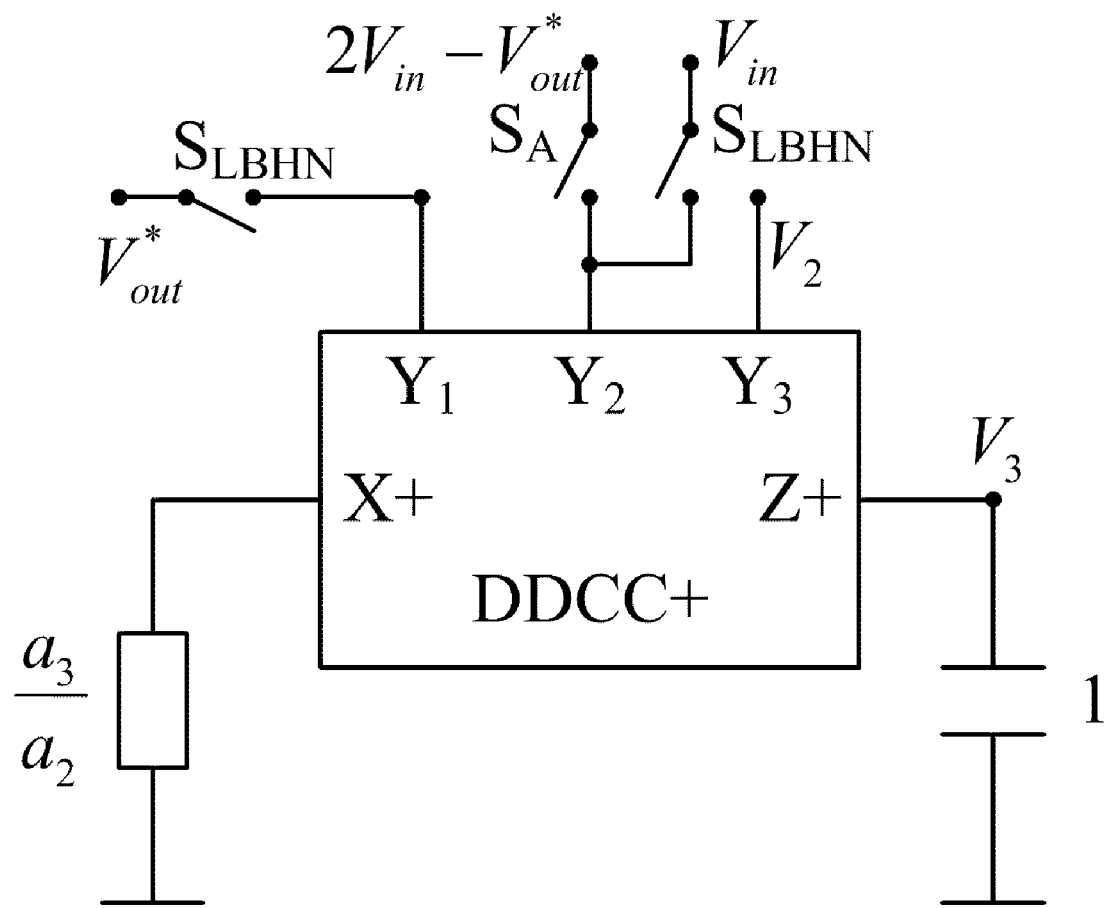
Figures 7, 8, 9, 10, 11, 12, 13, 14, 15, 16, 17:
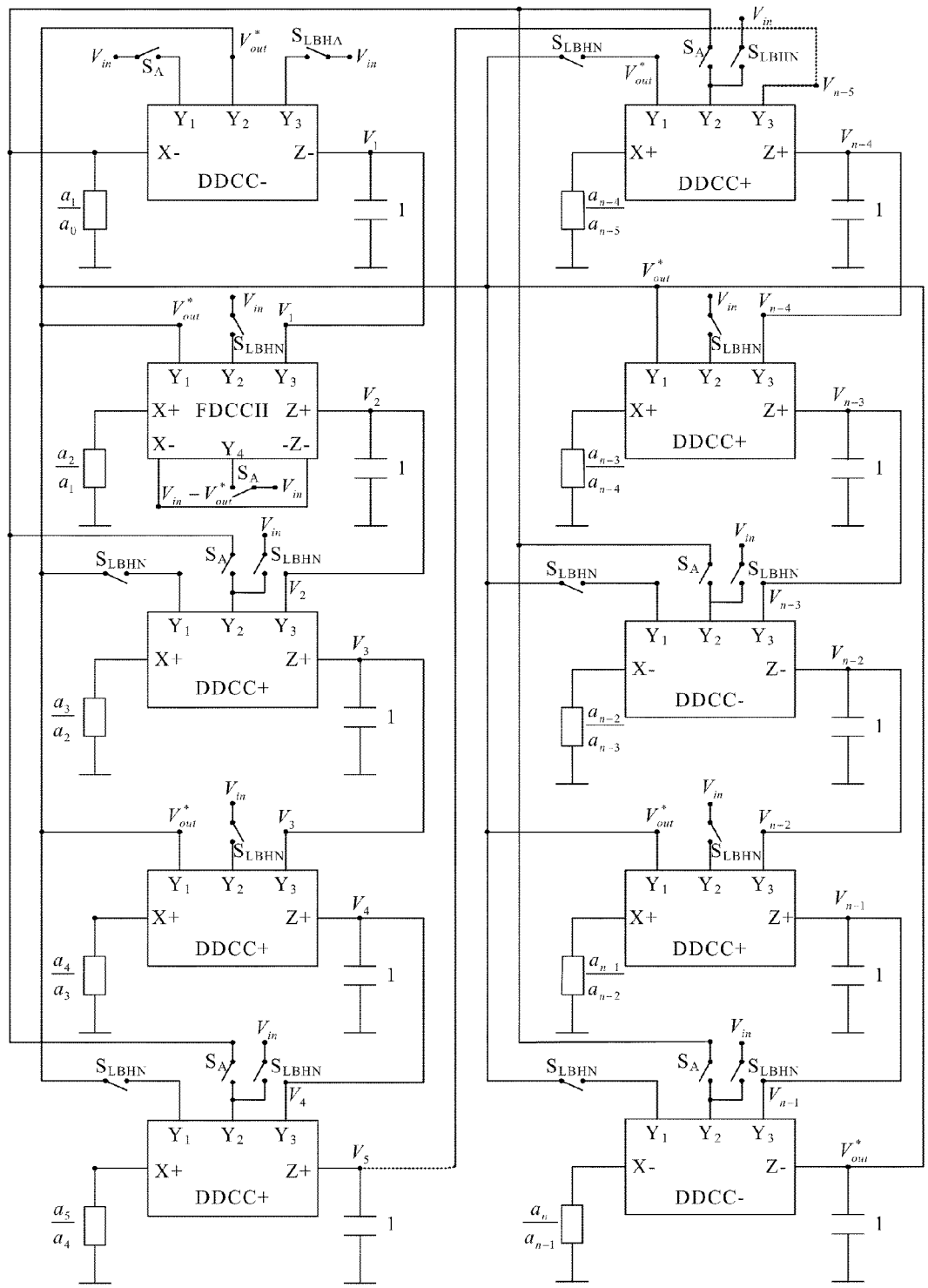

Then, the combination of the sub-circuitries realized from (7-1) to (7-n) is shown in FIG. 7-4 employing n minus-type DDCCs, n grounded capacitors, and n grounded resistors. The two output voltages, $V^*_{out}$ and $V^*_{out} + V_{in}$, supply the nth-order low-pass (if the input voltage signal $V_{in}$ is supplied to the $Y_3$ terminal of only the top DDCC) or band-pass (if the input voltage signal $V_{in}$ is supplied to the $Y_3$ terminal of only the middle i-th DDCC where i is not 0 or n), and high-pass (if the input voltage signal $V_{in}$ is supplied to the $Y_3$ terminal of all the DDCCs) filtering output signals, respectively.

An nth-order band-reject filtering transfer function I can be represented as $$\frac{V_{out}}{V_{in}} = \left( \frac{a_n s^n + a_0}{\sum_{i=0}^{i=n} a_i s^i} \right) \quad (7.8)$$

Let (7.9)

$$V_{out} - V_{in} \equiv V_{out}^*$$

$$= \frac{\begin{bmatrix} (-a_{n-1}s^{n-1})V_{in} + (-a_{n-2}s^{n-2})V_{in} + \ldots + \\ (-a_i s^i)V_{in} + \ldots + (-a_2 s^2)V_{in} + (-a_1 s)V_{in} \end{bmatrix}}{a_n s^n + a_{n-1}s^{n-1} + a_{n-2}s^{n-2} + \ldots + a_3 s^3 + a_2 s^2 + a_1 s + a_0}$$

(7.9) is similar to (7.2) but without the constant ($s^0$) term in the numerator and can be decomposed into (7.7-2) to (7.7-n) but (7.7-1) which should be replaced by $$\left(\frac{a_0}{a_1}\right)(V_{out}^*) \equiv -sV_1 \tag{7.10}$$

Note that the output voltage, $V^*_{out}+V_{in}$, for obtaining the band-reject signal is still needed although it is not appeared in (7.10). Hence, the top DDCC-based sub-circuitry shown in FIG. 7-4 should be replaced by a fully differential current conveyor (FDCCII)-based sub-circuitry shown in FIG. 7-5 using the input-output characteristics of an FDCCII in reference [25]:

$$\begin{bmatrix} V_{X+} \\ V_{X-} \\ I_{Z+} \\ I_{Z-} \end{bmatrix} = \begin{bmatrix} 0 & 0 & 1 & -1 & 1 & 0 \\ 0 & 0 & -1 & 1 & 0 & 1 \\ 1 & 0 & 0 & 0 & 0 & 0 \\ 0 & -1 & 0 & 0 & 0 & 0 \end{bmatrix} \begin{bmatrix} I_{X+} \\ I_{X-} \\ V_{Y1} \\ V_{Y2} \\ V_{Y3} \\ V_{Y4} \end{bmatrix} \tag{7.11}$$

Therefore, the voltage-mode even-nth-order DDCC and FDCCII-based low-pass, band-pass, high-pass, and band-reject filter structure is shown in FIG. 7-6 by combining both FIGS. 7-4 and 7-5.

The subscripts N, LBH, LHN, and LBHN of the four distinct switches $S_N$, $S_{LBH}$, $S_{LHN}$ and $S_{LBHN}$ shown in FIG. 7-6 represent "notch (or band-reject)", "low-pass, band-pass, and high-pass", "low-pass, high-pass, and notch", and "low-pass, band-pass, high-pass and notch" respectively. For example, the switch, $S_{BR}$, needs to be closed when the whole circuit shown in FIG. 7-6 is used as only notch (or band-reject) filter. And the another switch, $S_{LBH}$, needs to be closed when the whole circuit shown in FIG. 7-6 is used as one of low-pass, band-pass, and high-pass filters.

Now, let us consider the part relevant to all-pass filter structures. The general transfer function of an nth-order all-pass filter is:

$$\frac{V_{out}}{V_{in}} = \frac{\left(\sum_{i=0}^{i=n} (-1)^i a_i s^i\right)}{(-1)^n \sum_{i=0}^{i=n} a_i s^i} \tag{7.12}$$

If n is even, let $$V_{out} - V_{in} \equiv V_{out}^* \tag{7.13}$$

$$= \frac{-2a_{n-1}s^{n-1} - 2a_{n-3}s^{n-3} - \ldots - 2a_3 s^3 - 2a_1 s}{a_n s^n + a_{n-1}s^{n-1} + a_{n-2}s^{n-2} + \ldots + a_3 s^3 + a_2 s^2 + a_1 s + a_0} V_{in}$$

(7.13) can be decomposed into (7.14).

$$\left(\frac{a_2}{a_{n-1}}s+1\right)V_{out}^* + \left(\frac{1}{a_{n-1}s}\right)\left[\left(\frac{a_{n-3}}{s}\right)\left(\frac{1}{a_{n-3}s}\right)\left[\cdots\left[\left(\frac{a_1}{s}\right)\left(\frac{1}{a_1 s}\right)\begin{bmatrix}\left(\frac{0}{s}\right)(2V_{in}+V_{out}^*)+\\ a_0 V_{out}^*\end{bmatrix}+(2V_{in}+V_{out}^*)\right]\cdots\right]+\begin{bmatrix}\cdots\\ a_2 V_{out}^*\\ \cdots\end{bmatrix}\right]+a_{n-2}V_{out}^* = -2V_{in} \tag{7.14}$$

Then, we can obtain the following n simple equations from (7.14) by letting the new node voltages, $V_i$, where i=1, 2 ..., n-2, and n-1.

$$\left(\frac{a_0}{a_1}\right)[-0 + V_{out}^*] \equiv -sV_1 \tag{7.15-1}$$

$$\left(\frac{a_1}{a_2}\right)[-V_1 + 2V_{in} + V_{out}^*] \equiv -sV_2 \tag{7.15-2}$$

$$\left(\frac{a_2}{a_3}\right)[-V_2 + V_{out}^*] \equiv -sV_3 \tag{7.15-3}$$

$$\left(\frac{a_3}{a_4}\right)[-V_3 + (2V_{in} + V_{out}^*)] \equiv -sV_4 \tag{7.15-4}$$

...

$$\left(\frac{a_{n-4}}{a_{n-3}}\right)[-V_{n-4} + V_{out}^*] \equiv -sV_{n-3} \tag{7.15-n-3}$$

$$\left(\frac{a_{n-3}}{a_{n-2}}\right)[-V_{n-3} + (2V_{in} + V_{out}^*)] \equiv -sV_{n-2} \tag{7.15-n-2}$$

$$\left(\frac{a_{n-2}}{a_{n-1}}\right)[-V_{n-2} + V_{out}^*] \equiv -sV_{n-1} \tag{7.15-n-1}$$

Then, Eq. (7.14) becomes $$\left(\frac{a_n}{a_{n-1}}s+1\right)V_{out}^* - V_{n-1} = -2V_{in}$$

which can be re-arranged as $$\left(\frac{a_{n-1}}{a_n}\right)[-V_{n-1} + (2V_{in} + V_{out}^*)] \equiv -sV_{out}^* \quad (7.15\text{-}n)$$

Since (7.15-1) is the same as (7.10), the single FDCCII-based sub-circuitry shown in FIG. 7-6 can also be effective for the all-pass realization. Then, the switch $S_N$ can be replaced by the switch $S_{NA}$ in which the subscript NA represents "notch and all-pass" or "band-reject and all-pass". Comparing (7.15) with (7.7), we found that $V^*_{out}+V_{in}$ in (7.7) is replaced by $V^*_{out}+2V_{in}$ for (7.15-2), (7.15-4), (7.15-6), ..., (7.15-n-2), and (7.15-n), or replaced by only $V^*_{out}$ for (7.15-1), (7.15-3), ..., (7.15-n-3), and (7.15-n-1). Hence, for realizing all-pass signals we need to (i) replace $V^*_{out}$ at $Y_1$ terminal by $V^*_{out}+V_{in}$ for the DDCCs corresponding to (7.15-2), (7.15-4), (7.15-6), ..., (7.15-n-2), and (7.15-n), and (ii) get rid of the $V_{in}$ signal at $Y_3$ terminal of the DDCCs corresponding to (7.15-1), (7.15-3), ..., (7.15-n-3), and (7.15-n-1). Therefore, two distinct switches $S_A$ and $S_{LBHN}$ are used in the design. The former one needs to be closed when the circuit is used for realizing all-pass filters. The latter one need be closed when the circuit is used for realizing low-pass, band-pass, high-pass and notch (or band-reject) filters. The realized voltage-mode even-nth-order DDCC and FDCCII-based universal filter structure is shown in FIG. 7-7

Part II: Analytical Synthesis of Voltage-Mode Odd-Nth-Order DDCC and FDCCII-Based Universal Filter Structure If we let $$V_{in} - V_{out} \equiv V_{out}^* = \frac{(a_{n-1}s^{n-1} + a_{n-2}s^{n-2} + \ldots + a_2s^2 + a_1s + a_0)V_{in}}{a_ns^n + a_{n-1}s^{n-1} + a_{n-2}s^{n-2} + \ldots + a_3s^3 + a_2s^2 + a_1s + a_0} \quad (7.16)$$

Cross multiply (7.16), and divide it by $a_{n-1}s^{n-1}$, we get $$\left(\frac{a_n}{a_{n-1}}s + 1 + \frac{a_{n-2}}{a_{n-1}s} + \ldots + \frac{a_2}{a_{n-1}s^{n-3}} + \frac{a_1}{a_{n-1}s^{n-2}} + \frac{a_0}{a_{n-1}s^{n-1}}\right)V_{out}^* = \quad (7.17)$$
$$\left(1 + \frac{a_{n-2}}{a_{n-1}s} + \frac{a_{n-3}}{a_{n-1}s^2} + \ldots + \frac{a_2}{a_{n-1}s^{n-3}} + \frac{a_1}{a_{n-1}s^{n-2}} + \frac{a_0}{a_{n-1}s^{n-1}}\right)V_{in}$$

Rearrange (7.17), we have $$\left(\frac{a_n}{a_{n-1}}s + 1\right)V_{out}^* + \quad (7.18)$$
$$\left(\frac{a_{n-2}}{a_{n-1}s} + \frac{a_{n-3}}{a_{n-1}s^2} + \ldots + \frac{a_1}{a_{n-1}s^{n-2}} + \frac{a_0}{a_{n-1}s^{n-1}}\right)V_{out}^* +$$
$$\left(-\frac{a_{n-2}}{a_{n-1}s} - \frac{a_{n-3}}{a_{n-1}s^2} - \ldots - \frac{a_2}{a_{n-1}s^{n-3}} - \frac{a_1}{a_{n-1}s^{n-2}} - \frac{a_0}{a_{n-1}s^{n-1}}\right)V_{in} = V_{in}$$

Since $$\left(\frac{a_{n-2}}{a_{n-1}s}\right)V_{out}^* + \left(-\frac{a_{n-2}}{a_{n-1}s}\right)V_{in} + \left(\frac{a_{n-3}}{a_{n-1}s^2}\right)V_{out}^* + \left(-\frac{a_{n-3}}{a_{n-1}s^2}\right)V_{in} = \quad (7.19)$$
$$\left(\frac{a_{n-2}}{a_{n-1}s}\right)(V_{out}^* - V_{in}) + \left(\frac{a_{n-2}}{a_{n-1}s}\right)\left(\frac{a_{n-3}}{a_{n-2}s}\right)(V_{out}^* - V_{in}) =$$
$$\left(\frac{a_{n-2}}{a_{n-1}s}\right)\left[(V_{out}^* - V_{in}) + \left(\frac{a_{n-3}}{a_{n-2}s}\right)(V_{out}^* - V_{in})\right]$$

applying the combination of (7.19), (7.18) becomes $$\left(\frac{a_n}{a_{n-1}}s + 1\right)V_{out}^* + \quad (7.20)$$
$$\left(\frac{a_{n-2}}{a_{n-1}s}\right)\begin{bmatrix}(V_{out}^* - V_{in}) + \\ \left(\frac{a_{n-3}}{a_{n-2}s}\right)\begin{bmatrix}(V_{out}^* - V_{in}) + \ldots + \\ \left(\frac{a_1}{a_2s}\right)\begin{bmatrix}(V_{out}^* - V_{in}) + \\ \left(\frac{a_0}{a_1s}\right)(V_{out}^* - V_{in})\end{bmatrix}\ldots\end{bmatrix}\end{bmatrix} = V_{in}$$

Therefore, we can obtain the following n simple equations from Eq. (20) by letting the new node voltages, $V_n$, where $n=1, 2 \ldots$, and $n-1$, as follows.

$$\left(\frac{a_0}{a_1}\right)(V_{out}^* - V_{in}) \equiv sV_1 \quad (7.21\text{-}1)$$

$$\left(\frac{a_{i-1}}{a_i}\right)[V_{out}^* - V_{in} + V_{i-1}] \equiv sV_i \text{ for } i = 2, 3, \ldots, n-1 \quad (7.21\text{-}i)$$

Then, Eq. (20) becomes $$\left(\frac{a_n}{a_{n-1}}s + 1\right)V_{out}^* + V_{n-1} = V_{in}$$

which can be re-arranged as $$\left(\frac{a_{n-1}}{a_n}\right)[V_{out}^* - V_{in} + V_{n-1}] \equiv -sV_{out}^* \quad (7.21\text{-}n)$$

(7.21-1), (7.21-n-1), and (7.21-n) can be realized using the single DDCC-based sub-circuitries shown in FIGS. 7-8 to 7-10, respectively.

The combination of the sub-circuitries realized from (21-1) to (21-n) is shown in FIG. 7-11 which can synthesize (i) the non-inverting low-pass filtering signal from the output voltage, $V^*_{out}$, by only letting the input voltage at the terminal $V_{Y2}$ of the top DDCC be $V_{in}$ and the other input voltages at $V_{Y2}$'s be zero, and (ii) the non-inverting band-pass filtering signal from the output voltage, $V^*_{out}$, by only letting one (which is neither the top nor the bottom one) of the input voltages at the $V_{Y2}$'s be $V_{in}$ and the other input voltages at $V_{Y2}$'s be zero, (iii) the non-inverting high-pass filtering signal from the second output voltage, $V_{in}-V^*_{out}$, by letting all the $V_{Y2}$'s be $V_{in}$.

An nth-order band-reject filtering transfer function can be represented as $$\frac{V_{out}}{V_{in}} = \left(\frac{a_ns^n + a_0}{\sum_{i=0}^{i=n} a_is^i}\right) \quad (7.22)$$

Let $$V_{out} - V_{in} \equiv V_{out}^* = \frac{[(a_{n-1}s^{n-1})V_{in} + (a_{n-2}s^{n-2})V_{in} + \ldots + (a_is^i)V_{in} + \ldots + (a_2s^2)V_{in} + (a_1s)V_{in}]}{a_ns^n + a_{n-1}s^{n-1} + a_{n-2}s^{n-2} + \ldots + a_3s^3 + a_2s^2 + a_1s + a_0} \quad (7.23)$$

(7.23) is similar to (7.16) but without the constant ($s^0$) term in the numerator and can be decomposed into (7.21-2) to (7.21-n) but (7.21-1) which should be replaced by $$\left(\frac{a_0}{a_1}\right)(V_{out}^*) \equiv sV \tag{7.24}$$

Comparing (7.24) with (7.21-1), the top DDCC-based sub-circuitry shown in FIG. 7-11 should be replaced by the same one but getting rid of the $V_{in}$ signal from $Y_3$ terminal for realizing band-reject filtering signals. Moreover, the output voltage, $V_{in}-V^*_{out}$, for obtaining the band-reject signal, is still needed although it is not appeared in (7.24). Hence, a fully differential current conveyor (FDCCII)-based sub-circuitry shown in FIG. 7-12 is used to replace the second (from top) DDCC-based sub-circuitry shown in FIG. 7-11 for producing the output voltage, $V_{in}-V^*_{out}$, at the X− terminal of the FDCCII. Hence, the new voltage-mode odd-nth-order DDCC and FDCCII-based low-pass, band-pass, high-pass, and band-reject filter structure is shown in FIG. 7-13.

Now, let us consider the part relevant to all-pass filter structures. The general transfer function of an nth-order all-pass filter is:

$$\frac{V_{out}}{V_{in}} = \left(\frac{\sum_{i=0}^{i=n}(-1)^i a_i s^i}{(-1)^n \sum_{i=0}^{i=n} a_i s^i}\right) \tag{7.25}$$

If n is odd, let $$V_{in}-V_{out} \equiv V^*_{out} = \frac{2a_{n-1}s^{n-1}+2a_{n-3}s^{n-3}+\ldots+2a_2s^2+2a_0}{a_ns^n+a_{n-1}s^{n-1}+a_{n-2}s^{n-2}+\ldots+a_3s^3+a_2s^2+a_1s+a_0}V_{in} \tag{7.26}$$

Cross multiplying (7.26), and dividing by $a_{n-1}s^{n-1}$, we get $$\left(\frac{a_n}{a_{n-1}}s+1+\frac{a_{n-2}}{a_{n-1}s}+\ldots+\frac{a_2}{a_{n-1}s^{n-3}}+\frac{a_1}{a_{n-1}s^{n-2}}+\frac{a_0}{a_{n-1}s^{n-1}}\right)V^*_{out} = \tag{7.27}$$

$$\left(2+\frac{2a_{n-3}}{a_{n-1}s^2}+\ldots+\frac{2a_2}{a_{n-1}s^{n-3}}+\frac{2a_0}{a_{n-1}s^{n-1}}\right)V_{in}$$

Rearrange (7.27), we have $$\left(\frac{a_n}{a_{n-1}}s+1\right)V^*_{out}+ \tag{7.28}$$

$$\left(\frac{a_{n-2}}{a_{n-1}s}+\frac{a_{n-3}}{a_{n-1}s^2}+\ldots+\frac{a_1}{a_{n-1}s^{n-2}}+\frac{a_0}{a_{n-1}s^{n-1}}\right)V^*_{out}-$$

$$\left(\frac{2a_{n-3}}{a_{n-1}s^2}+\frac{2a_{n-5}}{a_{n-1}s^4}+\ldots+\frac{2a_2}{a_{n-1}s^{n-3}}+\frac{2a_0}{a_{n-1}s^{n-1}}\right)V_{in}=2V_{in}$$

Since $$\left(\frac{a_{n-2}}{a_{n-1}s}+\frac{a_{n-3}}{a_{n-1}s^2}\right)V^*_{out}-\left(\frac{2a_{n-3}}{a_{n-1}s^2}\right)V_{in}+ \tag{7.29}$$

$$\left(\frac{a_{n-3}}{a_{n-1}s^2}+\frac{a_{n-5}}{a_{n-1}s^4}\right)V^*_{out}-\left(\frac{2a_{n-5}}{a_{n-1}s^4}\right)V_{in}=$$

$$\left(\frac{1}{a_{n-1}s}\right)\left[\left(\frac{a_{n-3}}{s}\right)\left[\left(\frac{1}{a_{n-3}s}\right)\left[\begin{array}{l}\left(\frac{a_{n-5}}{s}\right)(-2V_{in}+V^*_{out})+\\ a_{n-4}V^*_{out}\end{array}\right]+\right.\\ \left.(-2V_{in}+V^*_{out})\right]\\ a_{n-2}V^*_{out}\right]$$

applying the combination of (29), (28) becomes $$\left(\frac{a_n}{a_{n-1}}s+1\right)V^*_{out}+ \tag{7.30}$$

$$\left(\frac{1}{a_{n-1}s}\right)\left[\left(\frac{a_{n-3}}{s}\right)\left(\frac{1}{a_{n-3}s}\right)\left[\begin{array}{l}\ldots\\ \left[\left(\frac{a_2}{s}\right)\left[\left(\frac{1}{a_2s}\right)\left[\begin{array}{l}\left(\frac{a_0}{s}\right)(-2V_{in}+V^*_{out})+\\ a_1V^*_{out}\end{array}\right]+\\ (-2V_{in}+V^*_{out})\end{array}\right]+\right.\\ a_3V^*_{out}\\ \ldots\\ (-2V_{in}+V^*_{out})\end{array}\right]\\ a_{n-2}V^*_{out}\right]=-2V_{in}$$

Therefore, we can obtain the following n simple equations from Eq. (7.30) by letting the new node voltages, $V_n$, where $n=1, 2 \ldots,$ and $n-1,$ as follows.

$$\left(\frac{a_0}{a_1}\right)(-2V_{in} + V^*_{out}) \equiv sV_1 \qquad (7.31\text{-}1)$$

$$\left(\frac{a_1}{a_2}\right)(V^*_{out} + V_1) \equiv sV_2 \qquad (7.31\text{-}2)$$

$$\left(\frac{a_2}{a_3}\right)[V_2 + (-2V_{in} + V^*_{out})] \equiv sV_3 \qquad (7.31\text{-}3)$$

$$\left(\frac{a_3}{a_4}\right)(V^*_{out} + V_3) \equiv sV_4 \qquad (7.31\text{-}4)$$

$$\left(\frac{a_4}{a_5}\right)[V_4 + (-2V_{in} + V^*_{out})] \equiv sV_5 \qquad (7.31\text{-}5)$$

...

$$\left(\frac{a_{n-4}}{a_{n-3}}\right)(V^*_{out} + V_{n-4}) \equiv sV_{n-3} \qquad (7.31\text{-}n\text{-}3)$$

$$\left(\frac{a_{n-3}}{a_{n-2}}\right)[V_{n-3} + (-2V_{in} + V^*_{out})] \equiv sV_{n-2} \qquad (7.31\text{-}n\text{-}2)$$

$$\left(\frac{a_{n-2}}{a_{n-1}}\right)(V^*_{out} + V_{n-2}) \equiv sV_{n-1} \qquad (7.31\text{-}n\text{-}1)$$

Then, Eq. (7.30) becomes $$\left(\frac{a_n}{a_{n-1}}s + 1\right)V^*_{out} + V_{n-1} = -2V_{in}$$

which can be re-arranged as $$\left(\frac{a_{n-1}}{a_n}\right)[V_{n-1} + (-2V_{in} + V^*_{out})] \equiv -sV^*_{out} \qquad (7.31\text{-}n)$$

After comparing (7.31-1) with (7.21-1) and (7.24), we found that there is one more $-V_{in}$ in (7.21-1) than those in (7.24), and there is also one more $-V_{in}$ in (7.31-1) than those in (7.21-1). Then, we need use two switches, $S_A$ and $S_{LBHA}$ (both of which need to be closed when the circuit is operated as an all-pass filter and a low-pass, band-pass, high-pass, and band-reject filter, respectively), for inserting two $-V_{in}$'s into the all-pass design and one $-V_{in}$ into the low-pass, band-pass, and high-pass design. FIG. 7-14 shows the single DDCC-based sub-circuitry realized from all of (7.31-1), (7.21-1), and (7.24), simultaneously. Note that the voltage at X− terminal is $2V_{in}-V^*_{out}$ when the sub-circuitry is used for realizing an all-pass signal.

Comparing (7.31-2) with (7.21-2), there is one more $-V_{in}$ in (7.21-2) than those in (7.31-2). Then, we use the switch $S_{LBHN}$ which needs to be closed except in the all-pass operation. The node voltage, $V_{in}-V^*_{out}$, is always needed for realizing band-reject and all-pass signals. Although the $V_{in}$ disappears at $Y_2$ terminal when operated in the all-pass mode, the terminal $Y_4$ needs to be inserted by an extra $V_{in}$ for keeping the existence of the node voltage, $V_{in}-V^*_{out}$, at the X− terminal of the FDCCII in the design. FIG. 7-16 shows the single FDCCII-based sub-circuitry realized from (7.31-2) and (7.21-2), simultaneously.

And then, compare (7.31-3) with (7.21-3). The $V^*_{out}-V_{in}+V_2$ is easy to be synthesized using a DDCC active element. Just let $V_{Y1}=V^*_{out}$, $V_{Y2}=V_{in}$, and $V_{Y3}=V_2$, and then obtain $V_{X+}=V^*_{out}-V_{in}+V_2$ for the realization of a low-pass, band-pass, high-pass, and band-reject response. But in the all-pass mode, since the output signal $2V_{in}-V^*_{out}$ produced from FIG. 14 can be inserted into the $Y_2$ terminal of the DDCC for the replacement of original $V_{in}$ and leads to a signal $V^*_{out}-2V_{in}+V_2$ occurred at the X+ terminal of the DDCC+ provided that we give $V_2$ to the $Y_3$ terminal and get rid of any signals from the $Y_1$ terminal. The single DDCC-based realization of both (7.31-3) and (7.21-3) is then shown in FIG. 7-16. The sub-circuitries of FIGS. 7-15 and 7-16 can be applied to the realizations of the remaining feasible equations, (7.31-4) to (7.31-n) and (7.21-4) to (7.21-n). The combination of all above sub-circuitries is shown in FIG. 7-17 which is the voltage-mode odd-nth-order DDCC and FDCCII-based universal filter structure. Only one FDCCII, n−1 DDCCs, (the minimum number of active elements for realizing an nth-order structure) n grounded resistors, and n grounded capacitors (the minimum number of passive elements for realizing an nth-order structure) are employed in the design.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A computer-implemented analytical synthesis method for designing a differential difference current conveyor and fully differential current conveyor grounded resistor and capacitor (DDCC and FDCCII-grounded R and C) filter structure with a stable transfer function, comprising:
    converting, by a computer, a decomposition of a complicated nth-order transfer function into a set of equations corresponding a set of sub-circuitries; and
    combining the sub-circuitries for constructing a circuit structure with a plurality of grounded resistors and capacitors,
    wherein said DDCC and FDCCII-grounded R and C filter structure comprises n−1 DDCCs, one FDCCII, n grounded resistors, and n grounded capacitors.

2. The method as claimed in claim 1, wherein said DDCC and FDCCII-grounded R and C filter structure serves as a voltage-mode nth-order DDCC-grounded R and C band-pass, and band-reject filter structure.

3. The method as claimed in claim 1, wherein said DDCC and FDCCII-grounded R and C filter structure serves as a voltage-mode nth-order DDCC-grounded R and C all-pass filter structure.

4. The method as claimed in claim 1, wherein said DDCC and FDCCII-grounded R and C filter structure is a voltage-mode nth-order DDCC-grounded R and C low-pass, band-pass, high-pass and band-reject filter structure.

5. The method as claimed in claim 4, further comprising an additional grounded resistor, wherein said DDCC and FDCII-grounded R and C filter structure comprises three DDCCs, four grounded resistors, and three grounded capacitors, and is a voltage-mode third-order DDCC-grounded R and C elliptic filter structure.

6. The method as claimed in claim 1, wherein said DDCC and FDCCII-grounded R and C filter comprises one DDCC, one FDCCII, two grounded resistors, and two grounded capacitors and serves as a voltage-mode second-order DDCC and FDCCII-grounded R and C low-pass, band-pass, high-pass and all-pass filter structure.

7. The method as claimed in claim 1, wherein said DDCC and FDCCII-grounded R and C filter structure comprises one DDCC, one FDCCII, two grounded resistors, and two grounded capacitors and serves as a voltage-mode second-order DDCC and FDCCII-grounded R and C low-pass, band-pass, high-pass and band-reject filter structure.

8. The method as claimed in claim 1, wherein said DDCC and FDCCII-grounded R and C filter structure comprises one DDCC, one FDCCII, two grounded resistors, and two grounded capacitors and serves as a voltage-mode second-order DDCC and FDCCII-grounded R and C low-pass, band-pass, high-pass, band-reject, and all-pass (universal) filter structure.

9. A computer-implemented analytical synthesis method for designing a differential difference current conveyor and fully differential current conveyor grounded resistor and capacitor (DDCC and FDCCII-grounded R and C) filter structure with a stable transfer function, comprising:
    converting, by a computer, a decomposition of a complicated nth-order transfer function into a set of equations corresponding a set of sub-circuitries; and
    combining the sub-circuitries for constructing a circuit structure with a plurality of grounded resistors and capacitors,
    wherein said DDCC and FDCCII-grounded R and C filter structure comprises n DDCCs, n grounded resistors, and n grounded capacitors.

10. The method as claimed in claim 9, wherein said DDCC and FDCCII-grounded R and C filter structure serves as a voltage-mode nth-order DDCC-grounded R and C high-pass, low-pass, and band-pass filter structure.

11. The method as claimed in claim 9, wherein said DDCC-grounded R and C filter structure serves as a voltage-mode nth-order DDCC-grounded R and C high-pass and low-pass filter structure.

12. A computer-implemented analytical synthesis method for designing a differential difference current conveyor and fully differential current conveyor grounded resistor and capacitor (DDCC and FDCCII-grounded R and C) filter structure with a stable transfer function, comprising:
    converting, by a computer, a decomposition of a complicated nth-order transfer function into a set of equations corresponding a set of sub-circuitries; and
    combining the sub-circuitries for constructing a circuit structure with a plurality of grounded resistors and capacitors,
    wherein said DDCC and FDCCII-grounded R and C filter structure comprises n−1 DDCCs, one FDCCII, n grounded resistors, and n−1 grounded capacitors.

* * * * *